United States Patent
Liu et al.

(10) Patent No.: US 11,271,398 B2
(45) Date of Patent: Mar. 8, 2022

(54) VOLTAGE STABILITY ASSESSMENT, CONTROL AND PROBABILISTIC POWER FLOW BASED ON MULTI-DIMENSIONAL HOLOMORPHIC EMBEDDING TECHNIQUES

(71) Applicant: University of Tennessee Research Foundation, Knoxville, TN (US)

(72) Inventors: Chengxi Liu, Knoxville, TN (US); Kai Sun, Knoxville, TN (US); Bin Wang, College Station, TX (US); Xin Xu, Knoxville, TN (US)

(73) Assignee: University of Tennessee Research Foundation, Knoxville, TN (US)

( * ) Notice: Subject to any disclaimer, the term of this patent is extended or adjusted under 35 U.S.C. 154(b) by 662 days.

(21) Appl. No.: 16/120,022

(22) Filed: Aug. 31, 2018

(65) Prior Publication Data

US 2020/0021133 A1    Jan. 16, 2020

Related U.S. Application Data

(60) Provisional application No. 62/697,907, filed on Jul. 13, 2018.

(51) Int. Cl.
*H02J 3/12* (2006.01)
*G01R 19/25* (2006.01)
*H02J 3/00* (2006.01)

(52) U.S. Cl.
CPC ............ *H02J 3/12* (2013.01); *G01R 19/2513* (2013.01); *H02J 3/0012* (2020.01); *H02J 2203/20* (2020.01); *Y04S 40/20* (2013.01)

(58) Field of Classification Search
CPC ........ H02J 3/12; H02J 13/0006; H02J 3/0012; H02J 2203/20; G01R 19/2513; Y02E 60/00; Y04S 40/20
See application file for complete search history.

(56) References Cited

U.S. PATENT DOCUMENTS

| | | | |
|---|---|---|---|
| 7,519,506 B2* | 4/2009 | Trias ................ | H02J 3/00 703/18 |
| 7,979,239 B2* | 7/2011 | Trias ................ | H02J 3/00 703/18 |

(Continued)

OTHER PUBLICATIONS

Liu, C., et al. "Probabilistic Power Flow Analysis Using Multidimensional Holomorphic Embedding and Generalized Cumulants" IEEE Transactions on Power Systems, vol. 33, issue 6, pp. 7132-7142 (Jun. 11, 2018) available from <https://ieeexplore.ieee.org/document/8378262> (Year: 2018).*

(Continued)

*Primary Examiner* — Jay Hann
(74) *Attorney, Agent, or Firm* — Brooks Kushman P.C.

(57) ABSTRACT

A multi-dimensional holomorphic embedding method for voltage control of an AC power system includes embedding multiple independent symbolic variables representing multiple control elements of the AC power system into AC power flow equations that describe the AC power system, analytically solving voltages for targeted buses of the AC power system in a form of multivariate power series or multivariable Padé approximants about the multiple independent symbolic variables such that coefficients of the multivariate power series or multivariable Padé approximants are obtained non-iteratively, and jointly adjusting the multiple control elements according to the multivariate power series or multivariable Padé approximants to control voltages of the targeted buses.

13 Claims, 63 Drawing Sheets
(55 of 63 Drawing Sheet(s) Filed in Color)

(56) References Cited

U.S. PATENT DOCUMENTS

| | | | |
|---|---|---|---|
| 8,849,614 B2* | 9/2014 | Trias | H02J 3/00 703/18 |
| 10,796,037 B1* | 10/2020 | Trias | G06F 30/20 |
| 2017/0177016 A1* | 6/2017 | Chiang | G05F 1/12 |

OTHER PUBLICATIONS

Rao, S., et al. "The Holomorphic Embedding Method Applied to the Power-Flow Problem" IEEE Transactions on Power Systems, vol. 31, issue 5 (2016) available from <https://ieeexplore.ieee.org/document/7352383> (Year: 2016).*

Santos, A.C., et al. "Holomorphic Embedding Approach as an Alternative Method for Solving the Power Flow Problem" IEEE Workshop on Communication Networks & Power Systems (Nov. 2017) available from <https://ieeexplore.ieee.org/document/8252933> (Year: 2017).*

Wang, B., et al. "Multi-Stage Holomorphic Embedding Method for Calculating the Power-Voltage Curve" IEEE Transactions on Power Systems, vol. 33, issue 1, pp. 1127-1129 (Jun. 2, 2017) available from <https://ieeexplore.ieee.org/abstract/document/7938341> (Year: 2017).*

Santos, A.C., et al. "Load Flow Problem Formulation as a Holomorphic Embedding Method" Simposio Brasileiro de Sistemas Eletricos (Jun. 28, 2018) available from <https://ieeexplore.ieee.org/abstract/document/8395855> (Year: 2018).*

Aien, M., et al. "A Comprehensive Review on Uncertainty Modeling Techniques in Power System Studies" Renewable & Sustainable Energy Reviews, vol. 57, pp. 1077-1089 (2016) available from <https://www.sciencedirect.com/science/article/pii/S1364032115014537> (Year: 2016).*

Schellenberg, A., et al. "Cumulant-Based Probabilistic Optimal Power Flow (P-OPF) With Gaussian and Gamma Distributions" IEEE Transactions on Power Systems, vol. 20, No. 2, pp. 773-781 (2005) (Year: 2005).*

Fan, M., et al. "Probabilistic Power Flow Studies for Transmission Systems With Photovoltaic Generation Using Cumulants" IEEE Transactions on Power Systems, vol. 27, No. 4, pp. 2251-2261 (2012) available from <https://ieeexplore.ieee.org/abstract/document/6185718> (Year: 2012).*

Viviani, G. & Heydt, G. "Stochastic Optimal Energy Dispatch" IEEE Transactions on Power Apparatus & Sys., vol. PAS-100, No. 7 (1981) (Year: 1981).*

A. Trias, "The Holomorphic Embedding Load Flow Method," IEEE PES GM, San Diego, CA, Jul. 2012.

A. Trias, "System and method for monitoring and managing electrical power transmission and distribution networks," U.S. Pat. Nos. 7,519,506 and 7,979,239, 2009-2011.

A. Trias, "Fundamentals of the holomorphic embedding load-flow method" arXiv: 1509.02421v1, Sep. 2015.

S. S. Baghsorkhi and S. P. Suetin, "Embedding AC Power Flow with Voltage Control in the Complex Plane: The Case of Analytic Continuation via Padé Approximants," arXiv:1504.03249, Mar. 2015.

M. K. Subramanian, Y. Feng and D. Tylavsky, "PV bus modeling in a holomorphically embedded power-flow formulation," North American Power Symposium (NAPS), Manhattan, KS, 2013.

M. K. Subramanian, "Application of Holomorphic Embedding to the Power-Flow Problem," Master Thesis, Arizona State Univ., Aug. 2014.

I. Wallace, D. Roberts, A. Grothey and K. I. M. McKinnon, "Alternative PV bus modelling with the holomorphic embedding load flow method," arXiv:1607.00163, Jul. 2016.

S. S. Baghsorkhi and S. P. Suetin, "Embedding AC power flow in the complex plane part I: modelling and mathematical foundation," arXiv:1604.03425, Jul. 2016.

A. Trias and J. L. Marin, "The holomorphic embedding loadflow method for DC power systems and nonlinear DC circuits," IEEE Trans, on Circuits and Systems-I: regular papers, vol. 63, No. 2, pp. 322-333, Sep. 2016.

Y. Feng and D. Tylavsky, "A novel method to converge to the unstable equilibrium point for a two-bus system," North American Power Symposium (NAPS), Manhattan, KS, 2013.

Y. Feng, "Solving for the low-voltage-angle power-flow solutions by using the holomorphic embedding method," Ph.D. Dissertation, Arizona State Univ., Jul. 2015.

S. Rao and D. Tylavsky, "Nonlinear network reduction for distribution networks using the holomorphic embedding method," North American Power Symposium (NAPS), Denver, CO, USA, 2016.

S. Rao, Y. Feng, D. J. Tylavsky and M. K. Subramanian, "The holomorphic embedding method applied to the power-flow problem," IEEE Trans, on Power Syst., vol. 31, No. 5, pp. 3816-3828, Sep. 2016.

S. S. Baghsorkhi, S. P. Suetin, "Embedding AC power flow in the complex plane part II: a reliable framework for voltage collapse analysis," arXiv:1609.01211, Sep. 2016.

R. Narasimhan and Y. Nievergelt, Complex Analysis in One Variable, 2nd Edition, Birkhäuser, ISBN 0-8176-4164-5, 1985.

S. Rao, D. J. Tylavsky and Y. Feng, "Estimating the saddle-node bifurcation point of static power systems using the holomorphic embedding method," International Journal of Electrical Power and Energy Systems, vol. 84, No. x, pp. 1-12, 2017.

T. Sihvo and J. Niittylahti, "Row-column decomposition based 2D transform optimization on subword parallel processors," pp. 99-102, International Symposium on Signal, Circuits and Systems, ICSSCS 2005.

N. Mostafa and S. Mauricio, "Multidimensional convolution via a 10 convolution algorithm," The Leading Edge, pp. 1336-1337, Nov. 2009.

J. Claerbout, "Multidimensional recursive filters via a Helix," Geophysicas, 1998.

H. Stahl, "The convergence of Padé approximants to functions with branch points," Journal of Approximation Theory, vol. 91, No. 2, pp. 139-204, 1997.

J. S. R. Chisholm, "Rational approximants defined from double power series", Mathematics of Computation, vol. 27. No. 124, pp. 841-848, 1973.

Y. Zhu and D. Tylavsky, "Bivariate holomorphic embedding applied to the power flow problem," North American Power Symposium (NAPS), Denver, CO, 2016.

R. Hughes Jones, "General rational approximants in n-variables", Journal of Approximation Theory, vol. 16, No. 3, pp. 201-223, 1976.

A.A. Gonar, "On the Convergence of Generalized Pade Approximants of Meromorphic Functions", Math. USSR Sbornik, vol. 27 (1975), No. 4, 13 pgs.

Raghavan Narasimhan et al., "Complex Analysis in One Variable", Springer Science+ Business Media, LLC, 2nd Edition, ISBN 978-1-4612-6647-1, 1985, 379 pgs.

* cited by examiner

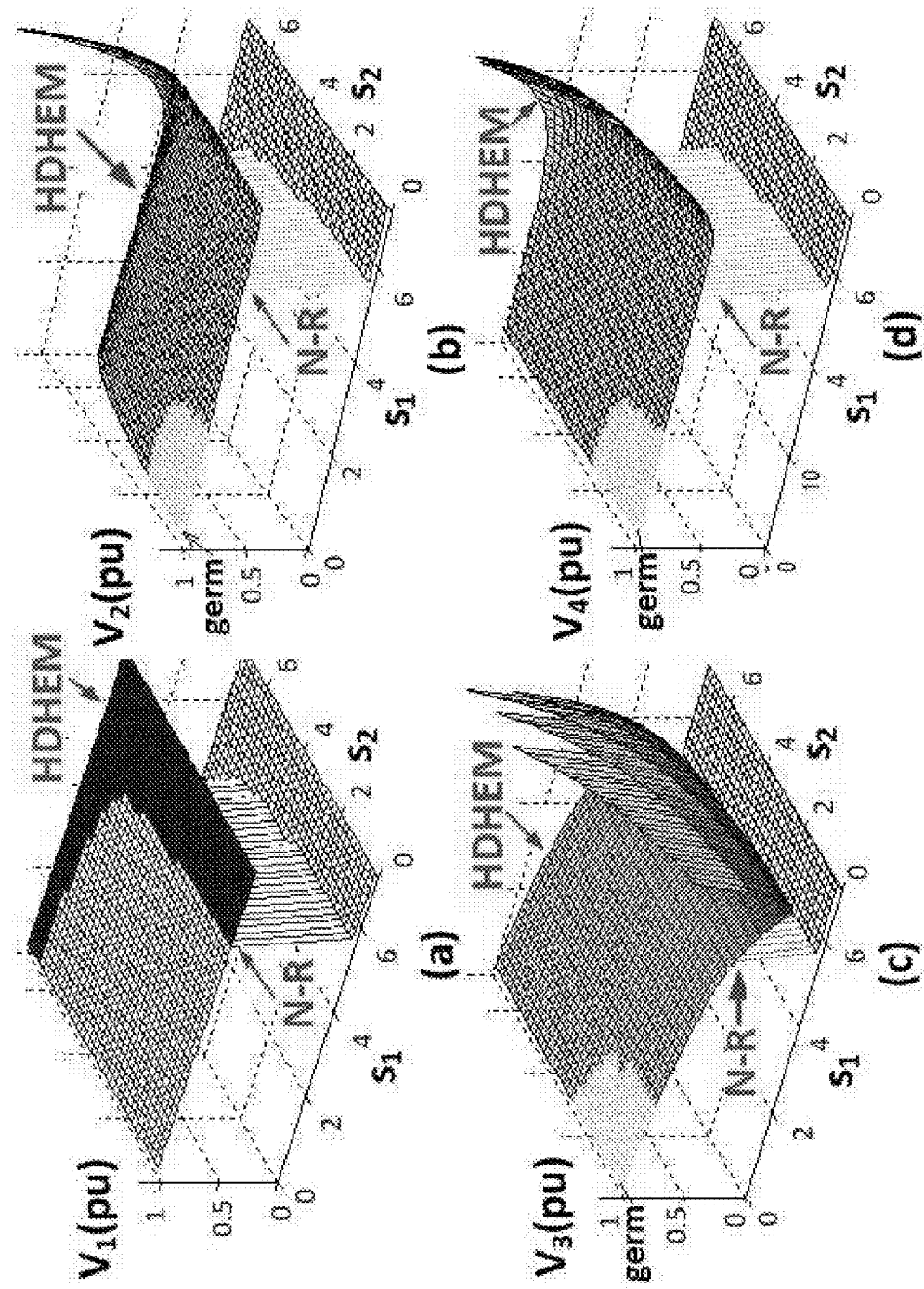

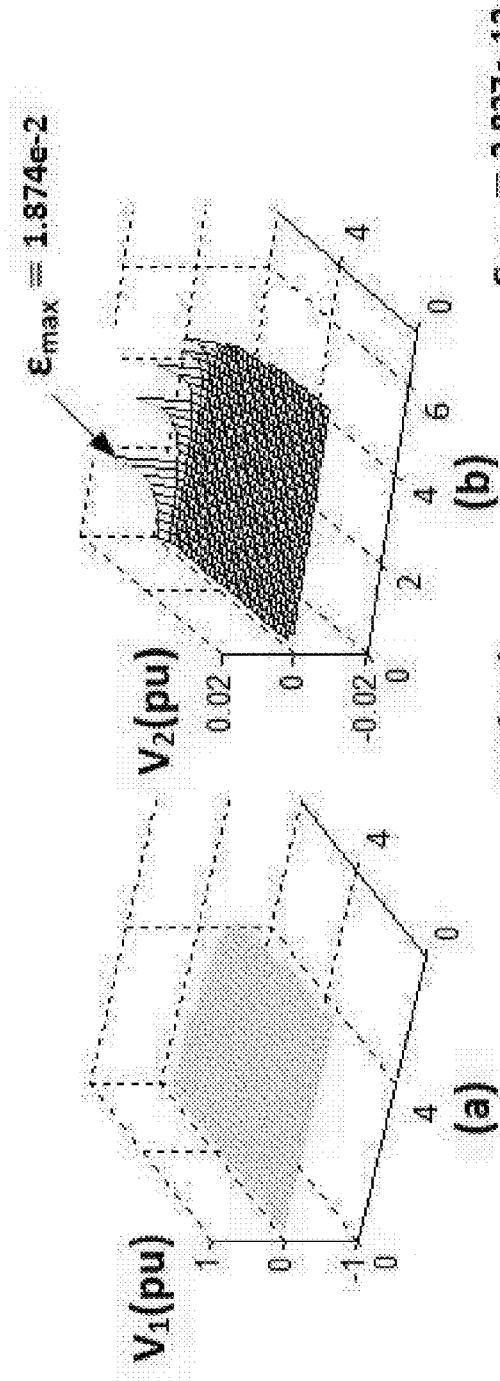
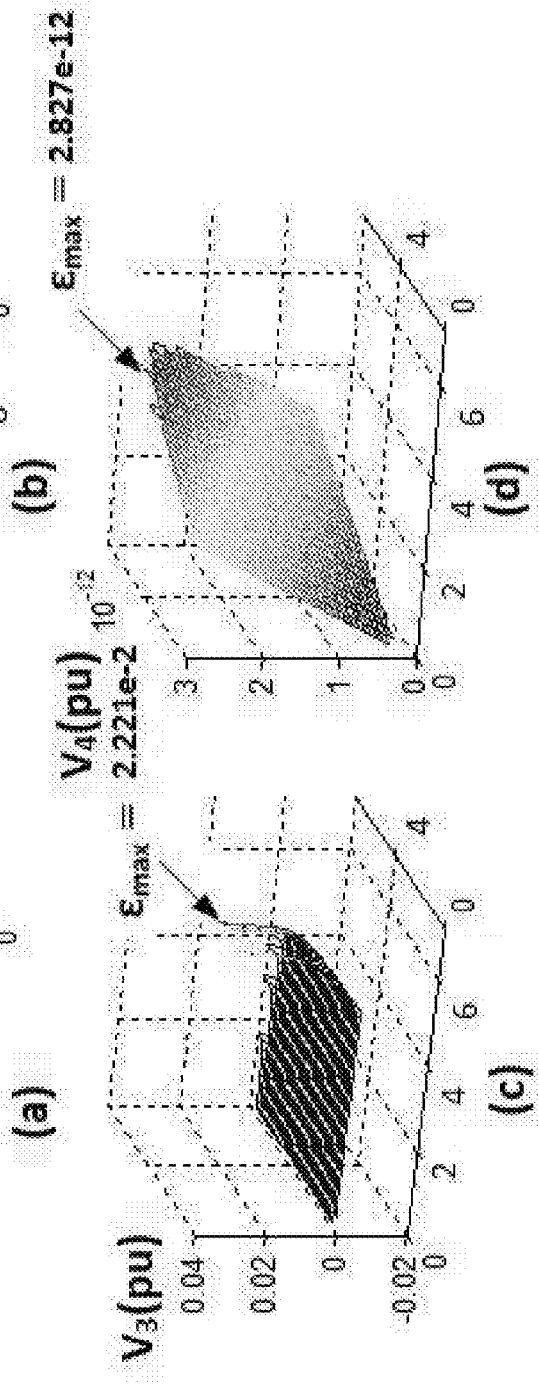
FIG. 10A  FIG. 10B  FIG. 10C  FIG. 10D

FIG. 12A
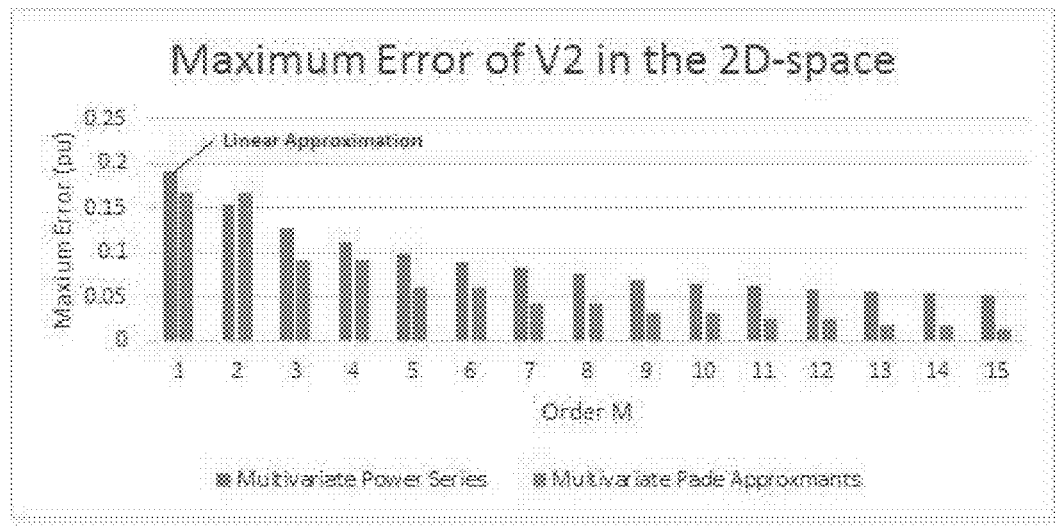
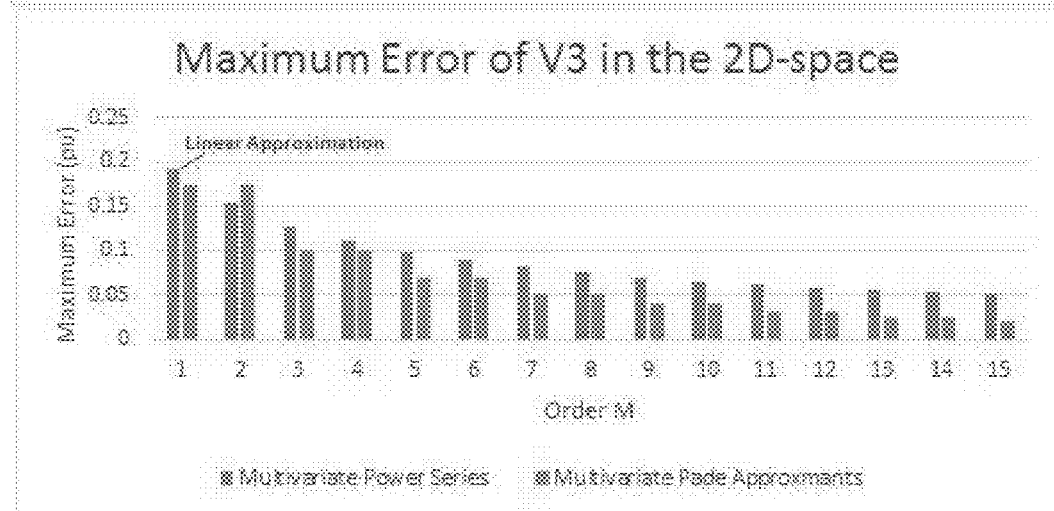
FIG. 12B

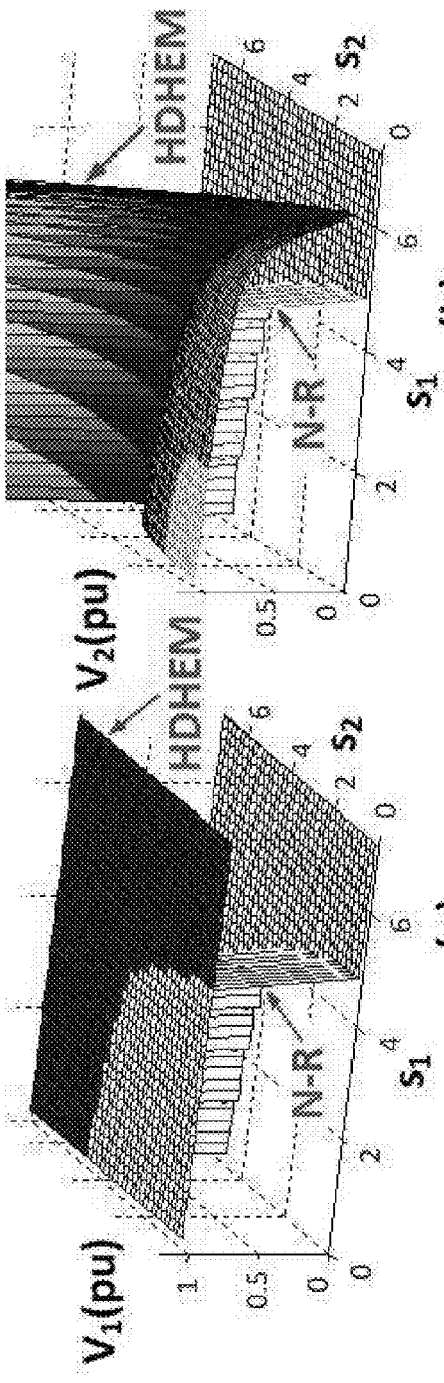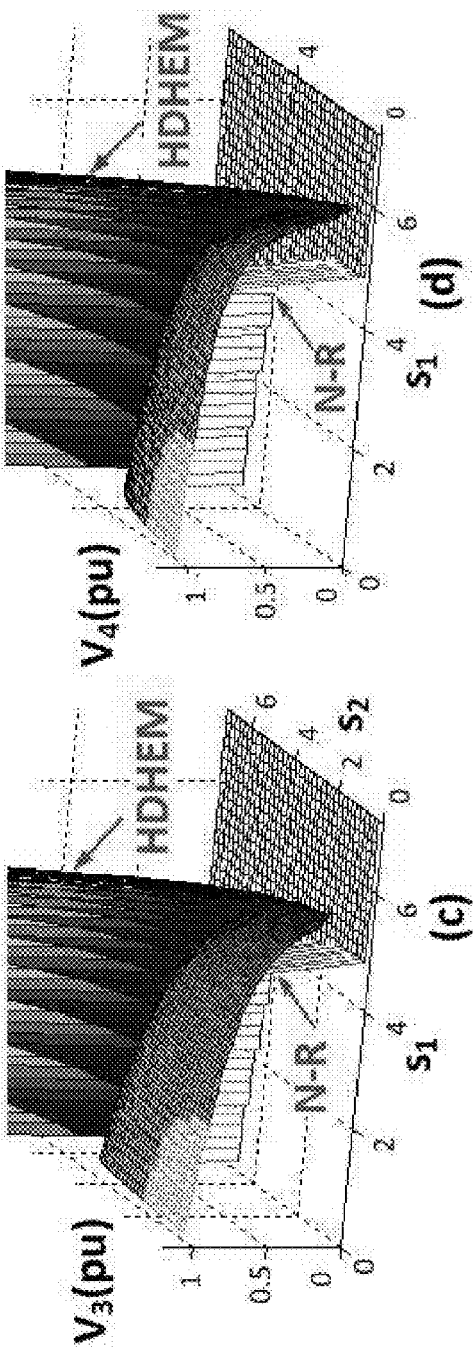
FIG. 13A  FIG. 13B  FIG. 13C  FIG. 13D

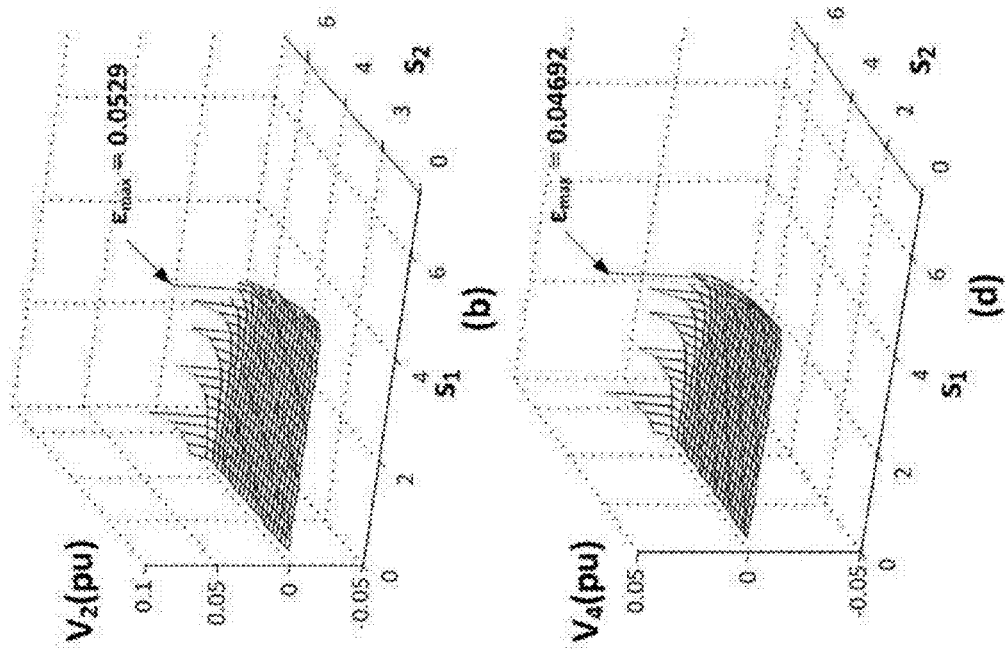
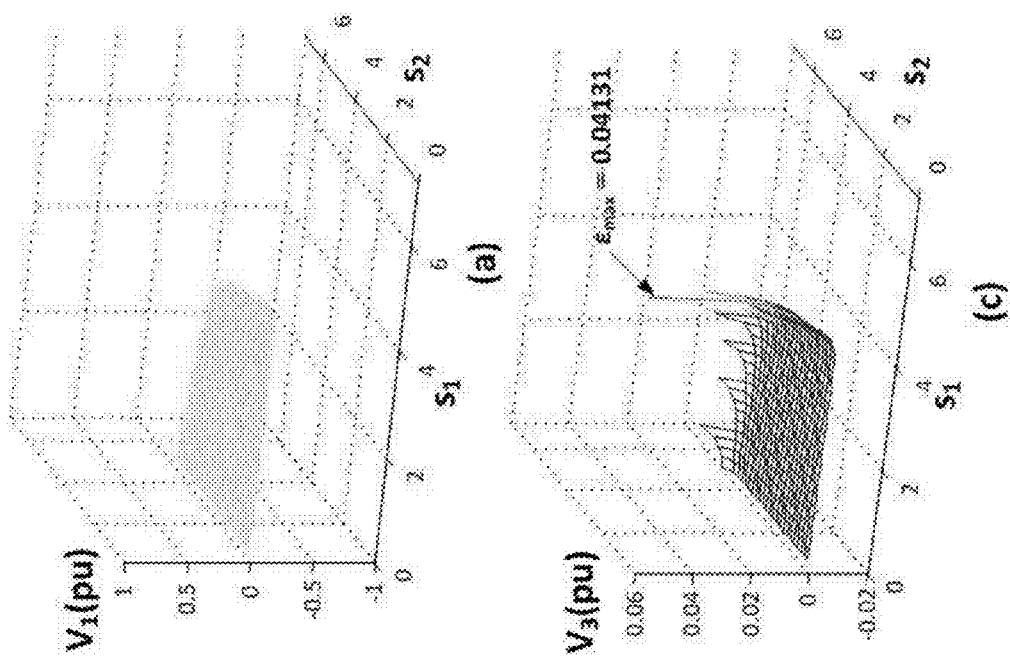
FIG. 14A  FIG. 14B  FIG. 14C  FIG. 14D (a) Analytical expression (Order $K = 1$)

(b) Error (Order $K = 1$)

(c) Analytical expression (Order $K = 2$)

(d) Error (Order $K = 2$)

(e) Analytical expression (Order $K = 3$)

(f) Error (Order $K = 3$)

FIG. 34A
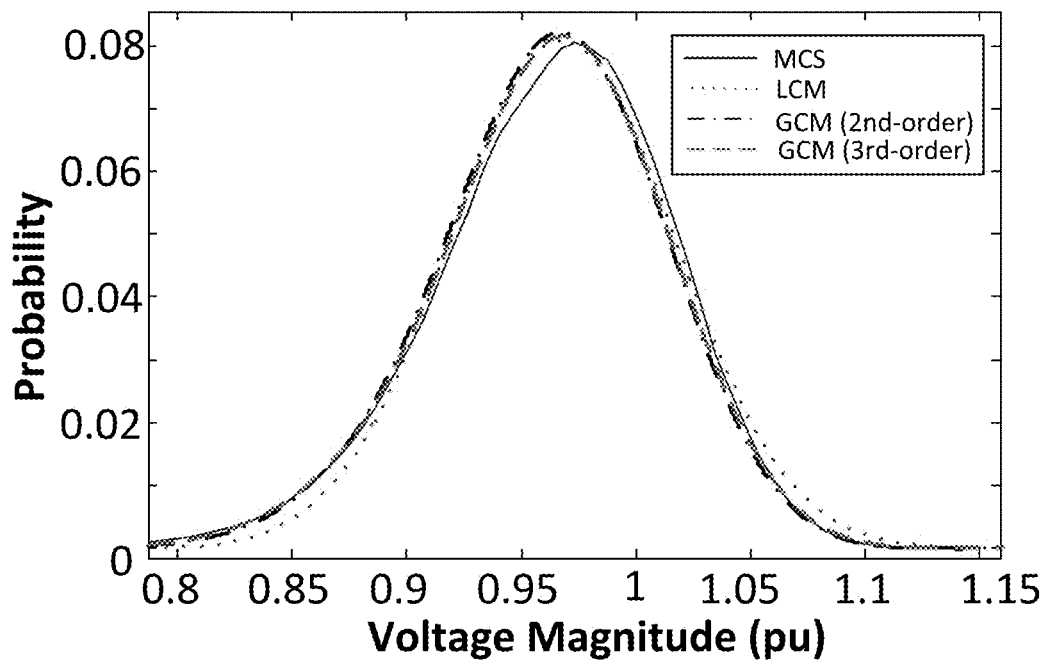
(a) PDF curves of voltage magnitude at Bus 9
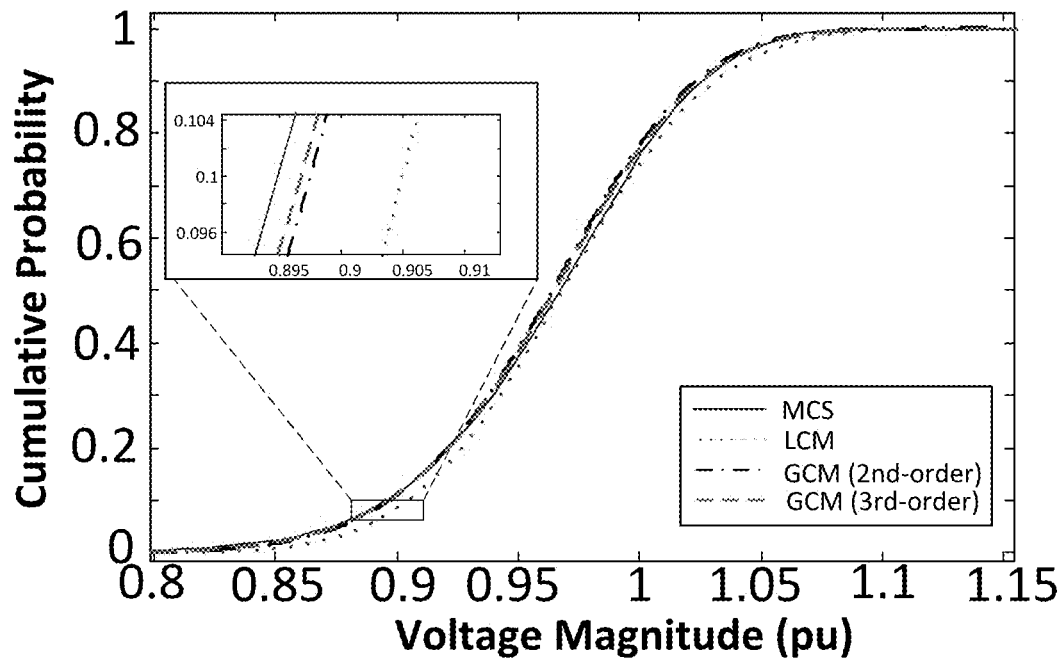
(b) CDF curves of voltage magnitude at Bus 9
FIG. 34B

FIG. 36A
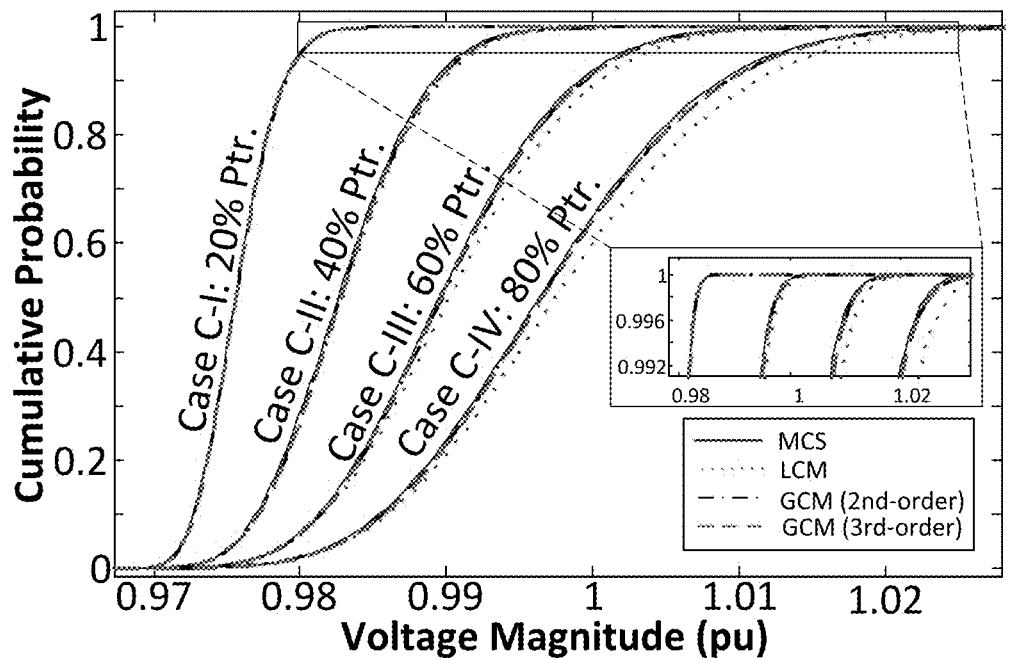
(a) CDF curves of voltage magnitude at Bus 9
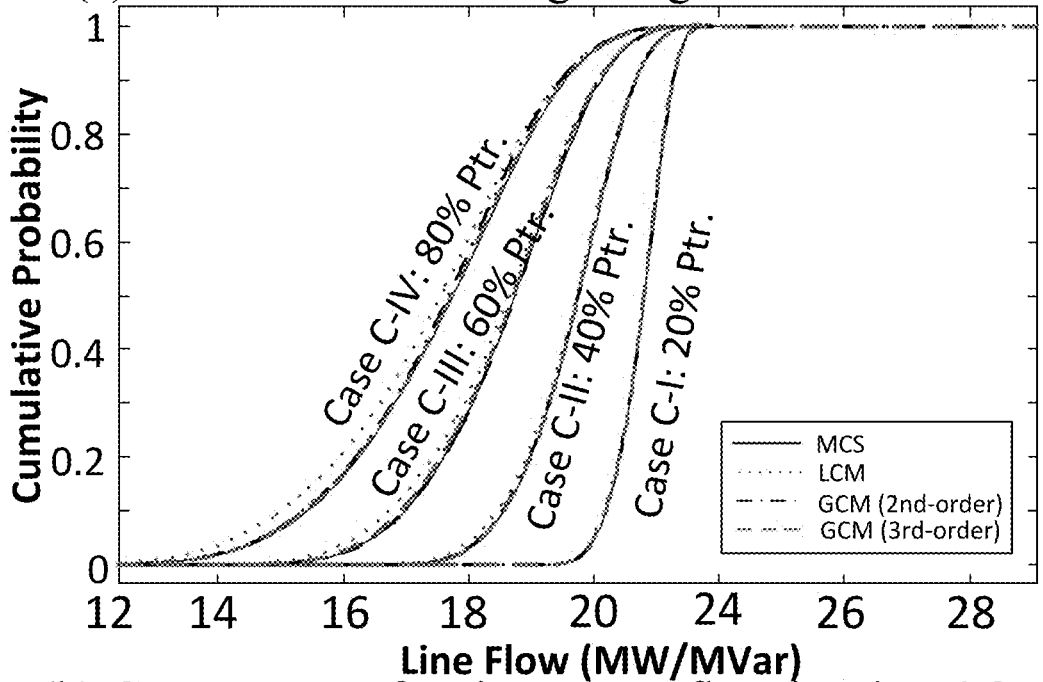
(b) CDF curves of active power flow in Line 6-8
FIG. 36B $$\begin{bmatrix} \Delta P_m \\ \hline \Delta Q_n \end{bmatrix} = \begin{bmatrix} \dfrac{\partial P_m}{\partial \delta_{pv}} & \dfrac{\partial P_m}{\partial \delta_{pq}} & \dfrac{\partial P_m}{\partial \delta_p} & \dfrac{\partial P_m}{\partial \delta_{pvq}} & \dfrac{\partial P_m}{\partial V_{pq}} & \dfrac{\partial P_m}{\partial V_p} \\ \hline \dfrac{\partial Q_n}{\partial \delta_{pv}} & \dfrac{\partial Q_n}{\partial \delta_{pq}} & \dfrac{\partial Q_n}{\partial \delta_p} & \dfrac{\partial Q_n}{\partial \delta_{pvq}} & \dfrac{\partial Q_n}{\partial V_{pq}} & \dfrac{\partial Q_n}{\partial V_p} \end{bmatrix} \begin{bmatrix} \Delta \delta_{pv} \\ \Delta \delta_{pq} \\ \Delta \delta_p \\ \Delta \delta_{pvq} \\ \Delta V_{pq} \\ \Delta V_p \end{bmatrix} \quad (60)$$

$m \in \{pv, \ pq, \ p, \ pvq\}$ $m \in \{pq, \ pvq_r, \ p_{r,2}, L, p_{r,i}, L, p_{r,Np}\}$ and $r = 1L \ N_{pvq}$

Fig. 62

$$\mathbf{K}_{p,pvq} = \begin{bmatrix} \mathbf{K}_1 & & & \\ \mathbf{K}_2 & \mathbf{O} & & \\ & \mathbf{K}_i & & \\ & & \mathbf{O} & \mathbf{K}_{N_{bus}} \end{bmatrix}_{N_p \times N_{pvq}} \quad (85)$$

$$\mathbf{K}_{p,pvq} \begin{bmatrix} G_{pq,pq} & -B_{pq,pq} & G_{pq,pv} & 0 & 0 & G_{pq,pv} & -B_{pq,pv} & G_{pq,p} & -B_{pq,p} \\ B_{pq,pq} & G_{pq,pq} & B_{pq,pv} & 0 & 0 & B_{pq,pv} & G_{pq,pv} & B_{pq,p} & G_{pq,p} \\ G_{pv,pq} & -B_{pv,pq} & G_{pv,pv} & \mathbf{I}_{pv,pv} & 0 & G_{pv,pv} & -B_{pv,pv} & G_{pv,p} & -B_{pv,p} \\ G_{pvq,pq} & -B_{pvq,pq} & G_{pvq,pv} & 0 & 0 & G_{pvq,pv} & -B_{pvq,pv} & G_{pvq,p} & -B_{pvq,p} \\ B_{pvq,pq} & G_{pvq,pq} & B_{pvq,pv} & 0 & 0 & B_{pvq,pv} & G_{pvq,pv} & B_{pvq,p} & G_{pvq,p} \\ G_{p,pq} & -B_{p,pq} & G_{p,pv} & 0 & 0 & G_{p,pv} & -B_{p,pv} & G_{p,p} & -B_{p,p} \\ B_{p,pq} & G_{p,pq} & B_{p,pv} & 0 & 0 & B_{p,pv} & G_{p,pv} & B_{p,p} & G_{p,p} \end{bmatrix} \begin{bmatrix} V_{pq,re}[n] \\ V_{pq,im}[n] \\ V_{pv,im}[n] \\ \mathbf{Q}_{pv}[n] \\ V_{pvq,im}[n] \\ \mathbf{Q}_{p}[n] \\ V_{p,re}[n] \\ V_{p,im}[n] \end{bmatrix}$$

$$= \begin{bmatrix} \text{Re}(PQ[n-1]) \\ \text{Im}(PQ[n-1]) \\ \text{Im}(PV[n-1]) \\ \text{Re}(PV[n-1]) \\ \text{Im}(PVQ[n-1]) \\ \text{Re}(PVQ[n-1]) \\ \text{Re}(P[n-1]) \\ \text{Im}(P[n-1]) \end{bmatrix} - \begin{bmatrix} G_{pq,pv} \\ B_{pq,pv} \\ B_{pv,pv} \\ G_{pv,pv} \\ B_{pvq,pv} \\ G_{pvq,pv} \\ G_{p,pv} \\ B_{p,pv} \end{bmatrix} \cdot V_{pv,re}[n] - \begin{bmatrix} G_{pq,pvq} \\ B_{pq,pvq} \\ B_{pv,pvq} \\ G_{pv,pvq} \\ B_{pvq,pvq} \\ G_{pvq,pvq} \\ G_{p,pvq} \\ B_{p,pvq} \end{bmatrix} \cdot V_{pvq,re}[n] \quad (86)$$

Fig. 63

VOLTAGE STABILITY ASSESSMENT, CONTROL AND PROBABILISTIC POWER FLOW BASED ON MULTI-DIMENSIONAL HOLOMORPHIC EMBEDDING TECHNIQUES

CROSS-REFERENCE TO RELATED APPLICATION

This application claims the benefit of U.S. Provisional Application No. 62/697,907, filed Jul. 13, 2018, the disclosure of which is incorporated in its entirety by reference herein.

STATEMENT REGARDING FEDERALLY SPONSORED RESEARCH OR DEVELOPMENT

The invention was made with Government support under Contract No. EEC 1041877 awarded by the National Science Foundation (NSF). The Government has certain rights to the invention.

TECHNICAL FIELD

This disclosure relates to voltage control of alternating current power systems.

BACKGROUND

Fast growing electricity markets and relatively slow upgrades on transmission infrastructure have pushed many power systems to occasionally operate close to power transfer limits and raised concerns about potential voltage instability. Voltage stability assessment is traditionally conducted by solving AC power-flow equations (PFEs) of a power system with or without contingencies. Iterative numerical methods such as the Gauss-Seidel method, Newton-Raphson (N-R) method, and fast decoupled method have been widely adopted by commercialized power system software to analyze power flows and voltage stability of power systems. A major concern of these numerical methods is that the divergence of their numerical iterations is often interpreted as the happening of voltage collapse. This, however, does not necessarily indicate the non-existence of a power flow solution with acceptable bus voltages theoretically speaking. Also, there is a probability for these numerical methods to converge to "ghost" solutions that do not physically exist. These concerns influence the performance of numerical methods especially in online applications, e.g. real-time voltage stability assessment.

As an alternative, a non-iterative approach for power flow analysis, the holomorphic embedding load flow method (HELM), was previously proposed. The basic idea is to design a holomorphic function and adopt its analytical continuation in the complex plane to find a solution of PFEs. Recently, many derivative algorithms and applications based on the HELM were developed, such as the HELM with non-linear static load models, the HELM used in AC/DC power systems, and the HELM used to find the unstable equilibrium points, network reduction, and analysis of saddle-node bifurcation.

With the growing energy crisis and increasingly severe environmental pollution on the earth, more and more distributed energy resources (DERs) are integrated into electric power systems. It is envisioned that in the next 10-20 years, more than 35% of DERs will be integrated into the bulk power systems in the United States. Under this trend, not only the active power resources, but also the ancillary service, previously provided by conventional power plants, are gradually being replaced by DERs-based power plants. The voltage control at specified buses, as one of the most important ancillary services, will be an obligation in modern power systems for the DERs-based power plants. Moreover, DERs-based power plants are coordinated by the grid-level Automatic Voltage Control (AVC) systems that typically apply a hierarchical structure to maintain voltages at remote "pilot buses" by dispatching the set points of a variety of reactive power resources.

Accurate, fast, online remote voltage control is critical in the operational environment for the utilities to provide system operators with first-hand advice on control actions. The power flow calculation considering remote control is one of the most fundamental measures to maintain the voltage magnitudes of specific buses in power grids.

A more general systematic remote voltage control strategy provided by multiple reactive power resources should be considered and integrated into the power flow calculation. For the existing Newton-Raphson (N-R) methods, remote voltage control requires an extension of the Jacobian matrix to include sensitivities on reactive power mismatches at the controlled buses with respect to the voltage at the controlling buses. Moreover, if a bus voltage is maintained by reactive power resources at several buses, then distribution factors among them need to be determined, which significantly reduces the convergence speed as the quadratic convergence of the N-R method itself is downgrade to a linear convergence rate. In addition, the tractability can be weaker with a conventional power flow method with remote voltage control functions.

Iterative power flow calculation methods, such as the N-R method, have been widely adopted by many commercialized power system software tools. It is a tangent-based searching method that iteratively calculates the adjustment quantities for unknown voltage vectors based on the known power mismatch values, which require that initial guesses for the unknown variables are sufficiently close to the solutions. Poor initial guesses, high R/X ratios and heavy load can lead to an ill-conditioned Jacobian matrix, resulting in poor tractability.

In order to better fit online applications, some power flow methods can solve the power-flow equations (PFEs) in closed form. More specifically, the analytical power flow solution can be derived offline and then evaluated online by parameterization according to the actual conditions. For example, the Groebner Basis approach uses the polynomial elimination technique. However, it can only be implemented in small networks with few buses, due to the memory limitations and the heavy computation burden. The series load flow is another approach to solve PFEs, which expands the voltage variables as functions of all the specified parameters at an initial point. Nevertheless, the accuracy of this approach is limited by the radius of convergence.

The holomorphic embedding load flow method (HELM) is a non-iterative method to solve the AC PFEs. In contrast to the traditional N-R method and the existing analytical methods, the HELM provides an analytical solution in a recursive manner, which is independent of initial guesses. It can guarantee to find a power flow solution corresponding to the stable system equilibrium if it physically exists. The HELM was firstly demonstrated on systems having only PQ buses and a slack bus, and then on systems having PV buses as well. Researchers derive other holomorphic embedding methods for different applications, including online voltage stability assessment, calculating the power-voltage curves, power flow analysis of hybrid AC/DC systems, finding unstable equilibrium points and network reduction, etc.

Many distributed energy resources (DERs) such as renewable generation and responsive load are being increasingly installed in many electric power systems during recent decades. It is anticipated that in the next two decades, the penetration level of DER may reach 30-50% in North American power grids. In Denmark, the penetration level of wind energy is planned to achieve 85% by 2035. With the growing penetration of DER and the deregulation of power systems, power system operations will face new challenges due to drastically increasing uncertainties. System operators should monitor a power grid in real time and take proactive control actions whenever necessary to ensure system reliability. Probabilistic power flow (PPF) methods are traditionally applied to characterize power system uncertainties in terms of probabilistic distributions under various system conditions. The increasing integration of DERs brings new challenges to PPF analysis. First, most DERs are non-dispatchable and influenced by ever-changing weather factors, e.g. wind speed and solar irradiation, and their power generations in the same geographical area are often highly correlated, increasing wide-area uncertainties in the power flows of a power grid. Second, the power inverters with many DERs can either supply or absorb reactive power, increasing the diversity of the grid's voltage profile.

Since the proposal of PPF in 1974, there have been three mainstreams of PPF methods, i.e. numerical methods, point estimate methods and analytical methods. A numerical method such as the Monte-Carlo simulation (MCS) generates random input variables to compute probability distributions of desired output variables via a large number of repetitive power flow calculations. Although the number of calculation can be reduced to some extent by some sophisticated sampling methods, the efficiency of a numerical method is still low, especially on large scale power systems with many random inputs. However, the MCS method is usually used as the reference for comparison and validation studies with other methods because of its high accuracy. Point estimate methods calculate power flows at many deliberated operating conditions and can preserve some system nonlinearities. However, their accuracy is low in estimating high order moments of probability distributions, especially for complex systems with many inputs.

Existing analytical methods generally apply a linearized AC power flow model or a DC power flow model. As a representative analytical method, the cumulant method is to obtain cumulants of outputs from cumulants of inputs by a simple arithmetic process. Then, expansion techniques are used to recover the distribution of outputs from the obtained cumulants of outputs. Such a method is very suitable for large power systems with many inputs since its computation burden can be significantly suppressed without compromising the accuracy. The cumulant method was first introduced into the field of power systems in 1986. The main drawback of conventional cumulant-based methods is linearization of the power flow equations (PFEs) at a certain operating condition. With high penetration of DERs, accuracies of their solutions will decline due to ignored power system nonlinearities.

The increase of electrical energy demand and the obstacle of concomitant infrastructure upgrading have driven electrical power systems operated closer to their stability limits. At present, electricity utilities are more concerned about the issues of voltage stability. A reliable, accurate, fast, online voltage stability assessment (VSA) is critical in the operational environment for the utilities to not only identify areas vulnerable to voltage instability, especially under stressed system conditions, but also provide system operators with first-hand advices on control actions.

Based on the online state estimation of operating conditions and the dependable power system models, many model-based VSA methods are utilized to estimate the voltage stability margin (VSM) of a power system, such as the modal analysis method, singular value decomposition method, voltage sensitivity method, bifurcation theory-based method, and continuation power flow (CPF). In CPF, the system load is increased in a certain way until the maximum loading point is reached. By iteratively performing a prediction-correction scheme, the CPF can preserve the nonlinearity of power flow equations (PFEs) and overcome the singularity problem. However, its computational burden due to iterations is a major concern for online applications.

At present, many utilities have also deployed synchronized phasor measurement units (PMUs) on transmission systems to provide the real-time voltage stability monitoring. Many measurement-based VSA approaches approximate the external system by estimating parameters of a Thevenin equivalent circuit. They rely on real-time synchronized phasor data from PMUs placed on the boundary of a load area. Because the full observability on all buses in the load area in real time is often unavailable, a widely adopted approach is to offline reduce the load area to either an equivalent load bus or an equivalent simplified network and to online identify the parameters including those for the external system using PMU data. These measurement-based methods can assess voltage stability of a load area on its boundary but lack the monitoring of each bus in the area and depend on the accurate identification of equivalent parameters, which is often difficult in the case of fast load variations.

SUMMARY

It is well known that AC power flows of a power system do not have a closed-form analytical solution in general. Among other things, we propose a multi-dimensional holomorphic embedding method that derives an analytical multivariate power series to approach true power flow solutions. This method embeds multiple independent variables into power flow equations and hence can respectively scale power injections or consumptions of selected buses or groups of buses. Then, via a physical germ solution, the method can represent each bus voltage as a multivariate power series about symbolic variables on the system condition to derive approximate analytical power flow solutions. This method has a non-iterative mechanism unlike the traditional numerical methods for power flow calculation. Its solution can be derived offline and then evaluated in real time by plugging values into symbolic variables according to the actual condition, so the method fits better into online applications such as voltage stability assessment. The method is first illustrated in detail on a 4-bus power system and then demonstrated on the IEEE 14-bus power system considering independent load variations in four regions.

We also propose a new remote voltage control approach based on the non-iterative holomorphic embedding load flow method (HELM). A participation factor matrix is applied together with the HELM to distribute reactive power injections among multiple remote reactive power resources such that the approach can remotely control the voltage magnitudes of desired buses. The proposed method is compared with a conventional approach based on the Newton-Raphson method by study cases on the IEEE New England 39-bus system. The results show that the proposed approach has a larger convergence region.

Further, we propose a new analytical probabilistic power flow (PPF) approach for power systems with high penetration of distributed energy resources. The approach solves probability distributions of system variables about operating conditions. Unlike existing analytical PPF algorithms in literature, it can preserve nonlinearities of AC power flows and retain more accurate tail effects of the probability distributions. The approach firstly employs a Multi-Dimensional Holomorphic Embedding Method to obtain a nonlinear analytical AC power flow solution about concerned outputs such as bus voltages and line flows. The embedded symbolic variables of the analytical solution are the inputs such as power injections. Then, it derives cumulants of the outputs by generalized cumulant method, and recovers their distributions by Gram-Charlier expansions. The proposed PPF approach can accept both parametric and non-parametric distributions of random inputs and the covariance between them. Case studies implemented on the IEEE 30-bus power system validate the effectiveness of the proposed approach.

Finally, we propose an online steady-state voltage stability assessment scheme to evaluate the proximity to voltage collapse at each bus of a load area. Using a non-iterative holomorphic embedding method (HEM) with a proposed physical germ solution, an accurate loading limit at each load bus can be calculated based on online state estimation on the entire load area and a measurement-based equivalent for the external system. The HEM employs a power series to calculate an accurate P-V curve at each load bus and accordingly evaluates the voltage stability margin considering load variations in the next period. An adaptive two-stage Padé approximant method is proposed to improve the convergence of the power series for accurate determination of the nose point on the P-V curve with moderate computational burden. The proposed method is first illustrated in detail on a 4-bus test system and then demonstrated on a load area of the Northeast Power Coordinating Council 48-generator, 140-bus power system.

A multi-dimensional holomorphic embedding method for voltage control of an AC power system includes, by one or more processors, embedding multiple independent symbolic variables representing multiple control elements of the AC power system into AC power flow equations that describe the AC power system, analytically solving voltages for targeted buses of the AC power system in a form of multivariate power series or multivariable Padé approximants about the multiple independent symbolic variables such that coefficients of the multivariate power series or multivariable Padé approximants are obtained non-iteratively, and jointly adjusting the multiple control elements according to the multivariate power series or multivariable Padé approximants to control voltages of the targeted buses.

The method may further include performing probabilistic power flow analysis on status of the AC power system based on the multivariate power series. The multiple independent symbolic variables may be input random variables describing power injections to the AC power system. The method may further include deriving cumulants of the voltages or line power of the AC power system by a generalized cumulant method. The method may further include obtaining distributions of the voltages or line power of the AC power system based on the cumulants by Gram-Charlier method, Edgeworth method, or Cornish-Fisher method. The multiple control elements may include generators, shunt capacitors, shunt reactors, static synchronous compensators, or static VAR compensators. The analytically solving may include identifying a physical germ solution describing initial physical conditions of the AC power system. The analytically solving may include expressing variables of the AC power flow equations in the form of the multivariate power series. The analytically solving may include recursively obtaining the coefficients of the multivariate power series. The analytically solving may include transforming the multivariate power series into multivariable Padé approximants to increase a radius of convergence of analytical solutions of all variables in the AC power flow equations.

A method for voltage stability assessment and control for AC power system load areas to prevent voltage collapse includes, by one or more processors, embedding at least one independent symbolic variable representing a next-period load increase for all load buses of the AC power system load areas into AC power flow equations, analytically expressing power-voltage curves for the load buses in a form of power series or Padé approximants to identify a voltage stability margin for each of the load buses, and controlling load consumption of the load buses according to minima of the voltage stability margins to prevent voltage collapse on the load buses.

The Padé approximants may be adaptive two-stage Padé approximants.

A method for distributing reactive power among a plurality of reactive power resources of an AC power system to remotely control voltages of the AC power system includes, by one or more processors, modifying bus-types of buses of AC power flow equations describing remote voltage control functionality of the AC power system such that each of the bus-types corresponds to a unique embedding method of the AC power flow equations, embedding participation factors, that define how the reactive power is to be distributed among the plurality of reactive power resources, into the AC power flow equations, and solving the AC power flow equations in a form of power series or Padé approximants such that coefficients of the power series or Padé approximants are obtained non-iteratively. References of the plurality of reactive power resources are calculated form the coefficients. The method further includes controlling outputs of the plurality of reactive power resources in an operational environment according to the references to maintain bus voltage magnitudes of selected ones of the buses.

The plurality of reactive power resources includes condensers, generators, static synchronous compensators, static VAR compensators, or voltage source converters-high voltage direct current.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIGS. 7A, 7B, 7C and 7D are a comparison of results with a PV bus between N-R and MDHEM.

FIGS. 10A, 10B, 10C and 10D show the difference between MDHEM using MPA and N-R in Case 1 with a PV bus (MDHEM+MPA).

FIGS. 12A and 12B show, respectively, the maximum error of V2 and V3 in the 2D-space with respect to the order M.

FIGS. 13A, 13B, 13C and 13D are a comparison of results without a PV bus between N-R and MDHEM.

FIGS. 14A, 14B, 14C and 14D show the difference between MDHEM and N-R Case 2 without PV bus.

FIGS. 33A, 33C and 33E are the analytical expressions and FIGS. 33B, 33D and 33F are the errors of the 1st, 2nd and 3rd order multivariate power series, respectively.

FIGS. 34A and 34B show, respectively, the PDF and CDF curves of voltage magnitude at Bus 9 for Case A.

FIGS. 36A and 36B show the CDF curves of voltage magnitude at Bus 9 for Case C.

FIG. 62 introduces equation (60).

FIG. 63 introduces equations (85) and (86).

DETAILED DESCRIPTION

Figure 1:
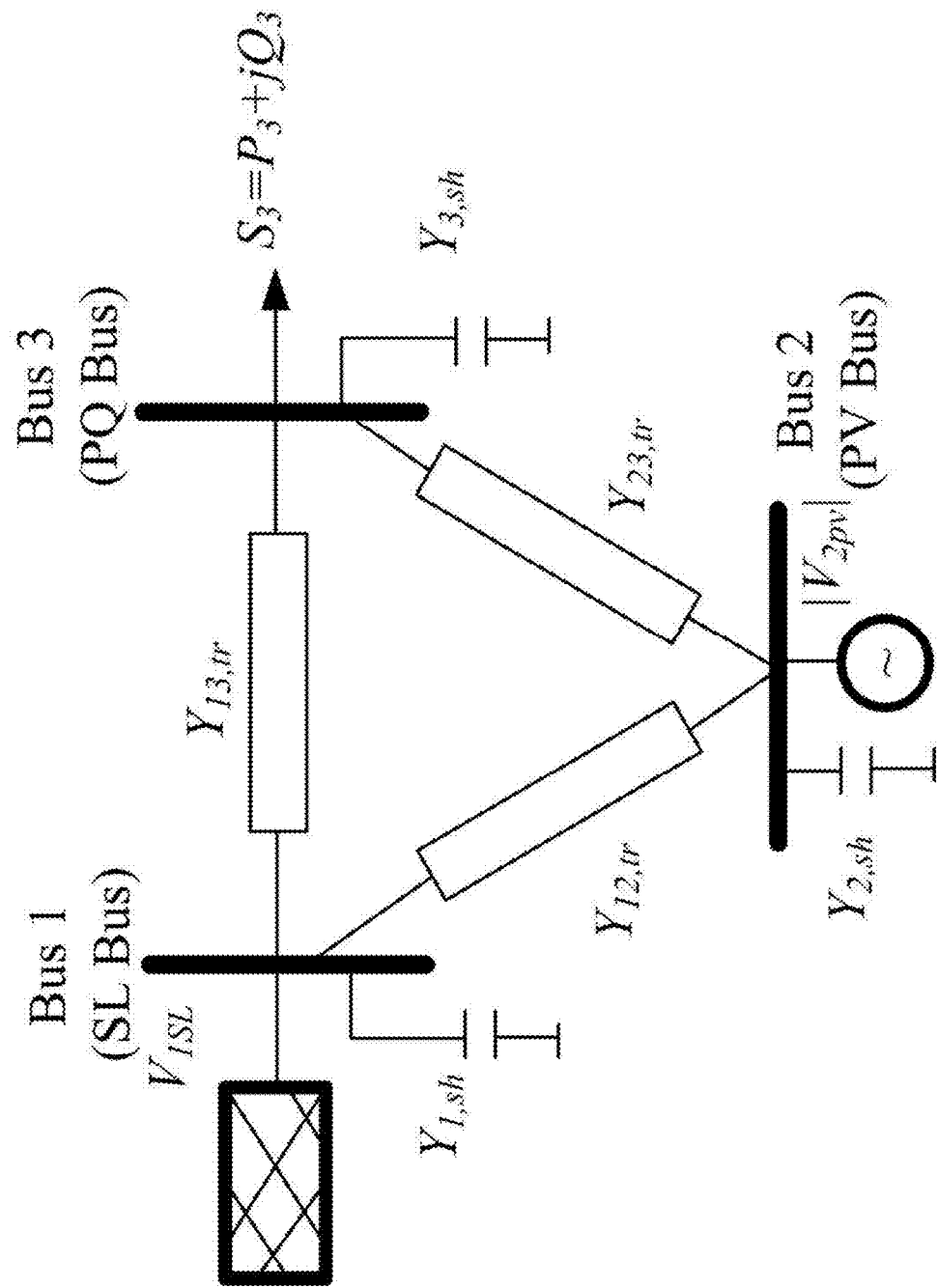
FIG. 1 is a one-line diagram of the demonstrative 3-bus system.

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

I. A Multi-Dimensional Holomorphic Embedding Method to Solve AC Power Flows

We propose a novel multi-dimensional holomorphic embedding method (MDHEM) to obtain an approximate analytic solution to PFEs. This method embeds multiple independent variables into PFEs to respectively scale power injections/consumptions of selected buses or groups of buses. Then, by means of a physical germ solution, the method represents each bus voltage as a multivariate power series of symbolic variables on the system conditions to derive the analytical solution expressed in a recursive form. This MDHEM has a non-iterative mechanism unlike traditional numerical methods. Its solution can be derived offline and then evaluated in real time by plugging values into symbolic variables according to the actual condition, so the method fits better into online applications for power flow or voltage stability analysis.

II. Introduction of the Conventional Holomorphic Embedding Load Flow Method

In the context of complex analysis, a holomorphic function is a complex function, defined on an open subset of the complex plane, which is continuous-differentiable in the neighborhood of every point in its domain. Define a complex function $f(z)$ whose domain and range are subsets of the complex plane, $$f(z) = f(x+iy) = u(x,y) + i \cdot v(x,y) \quad (1)$$

where x and y are real variables and $u(x, y)$ and $v(x, y)$ are real-valued functions. The derivative of function $f$ at $z_0$ is $$f'(z_0) = \lim_{z \to z_0} \frac{f(z) - f(z_0)}{z - z_0}, \quad z \in C \quad (2)$$

An important property that characterizes holomorphic functions is the relationship between the partial derivatives of their real and imaginary parts, known as the Cauchy-Riemann condition, defined in (3). However, based on the Looman-Menchoff theorem, functions satisfying Cauchy-Riemann conditions are not necessarily holomorphic unless the continuity is met.

$$\frac{\partial f}{\partial x} + i \frac{\partial f}{\partial y} = 0 \quad (3)$$

The conventional HELM is founded on the theory of complex analysis, whose main advantages are its non-iterative nature. It can mathematically guarantee the convergence to a set of meaningful power flow solutions (e.g. the upper branch of the power-voltage curve on a bus) from a given correct germ solution. Additionally, assisted by Padé approximants, it is able to sufficiently and necessarily indicate the condition of voltage collapse when the solution does not exist.

For power flow calculation of a power grid having PV buses, the conventional HELM decomposes the admittance matrix $Y_{ik}$ to a series admittance matrix $Y_{ik,tr}$ and a shunt admittance matrix $Y_{i,sh}$. $Y_{ik,tr}$ is for the admittances between different buses, while $Y_{i,sh}$ is for the admittances of shunt components and off-nominal tap transformers. The advantage of this process mainly lies on the simplification of the white germ solution that has all bus voltages equal directly $1 \angle 0°$ for the no-load, no-generation and no-shunt condition. See the conventional HELM of PFEs in Table I, where the $2^{nd}$ and $3^{rd}$ columns are the original PFEs and the HELM equations for PQ, PV and slack buses respectively. The germ solution can be obtained by plugging s=0 into expressions on the $3^{rd}$ column of Table I, while the final solution of PFEs can be achieved with s=1. Thus, under this circumstance, if the original implicit PFEs regarding voltage vectors can be transformed to the explicit form as a power series like (4), the final solution can be obtained by plugging s=1 into the power series if only s=1 is in the convergence region.

$$V(s) = \sum_{n=0}^{\infty} V[n] s^n \quad (4)$$

There are several other methods of embedding the complex value to solve the original PFEs. The embedding method in Table I does not consider the $P_{load}$ and $Q_{load}$ on PV buses. The common idea of the solving process is to express each quantity embedded with s by a power series (4), e.g. V(s) and Q(s), and then equate both sides of the complex-valued equations with the same order to solve the coefficients of power series terms. Theoretically, similar to the mathematical induction method, the coefficients can be calculated term by term from low orders to high orders under a precondition that each complex-valued nonlinear holomorphic function embedded with s can be approximated by a power series in s.

TABLE I

The embedding of power flow equations for slack, PQ and PV buses with the conventional HELM.

| Type | Original PFEs | Holomorphic Embedding Method |
|---|---|---|
| SL | $V_i(s) = V_i^{SL}$ | $V_i(s) = 1 + (V_i^{SL} - 1)s$ |
| PQ | $\sum_{k=1}^{N} Y_{ik} V_k(s) = \frac{S_i^*}{V_i^*}$ | $\sum_{k=1}^{N} Y_{ik,tr} V_k(s) = \frac{sS_i^*}{V_i^*(s^*)} - sY_{i,sh}V_i(s)$ |
| PV | $P = \text{Re}\left(V_i \sum_{k=1}^{N} Y_{ik}^* V_k^*\right)$ | $\sum_{k=1}^{N} Y_{ik,tr} V_k(s) = \frac{sP_i - jQ_i(s)}{V_i^*(s^*)} - sY_{i,sh}V_i(s)$ |
|  | $|V_i| = |V_i^{sp}|$ | $V_i(s) \cdot V_i^*(s^*) = 1 + (|V_i^{sp}|^2 - 1)s$ |

For the sake of simplification, use a simple three-bus system in FIG. 1 to illustrate the procedure of the conventional HELM. The system is made of one slack bus, one PQ bus, and one PV bus. Quantities on both sides of the PV bus equation (i.e. column 3 and row 4 of Table I) can be replaced by power series ins as shown by (5). Then by equating both sides of (5) with the same order of $s^n$, formula (6) is obtained to calculate the $n^{th}$ terms on voltage from their $(n-1)^{th}$ terms.

$$\sum_{k=1}^{N} Y_{ik,tr}(V_k[0] + V_k[1]s + V_k[2]s^2 L) = \tag{5}$$
$$(sP_i - j(Q_i[0] + Q_i[1]s + L)) \cdot (W_i^*[0] + W_i^*[1]s + L) - sY_{i,sh}(V_i[0] + V_i[1]s + L)$$

$$\sum_{k=1}^{N} Y_{ik,tr} V_k[n] = \tag{6}$$
$$P_i \cdot W_i^*[n-1] - j\left(Q_i[n] + \overset{n-1}{\underset{1}{\text{Conv}}}(Q_i * W_i^*)\right) - Y_{i,sh} V_i[n-1]$$

where $W_i^*(s)$ is defined as the reciprocal power series of $V_i^*(s^*)$.

$$W_i^*(s) = \frac{1}{V_i^*(s^*)} = W_i^*[0] + W_i^*[1]s + W_1^*[2]s^2 + L \tag{7}$$

Thus, given the germ solution $V[0]=1$ for this embedding method, the coefficients of $W_i^*[n]$ can be calculated by the convolution between $W^*(s)$ and $V^*(s^*)$.

$$\begin{cases} W_i^*[0] = 1/V_i^*[0] & \text{for } n = 0 \\ W_i^*[n] = -\sum_{\tau=0}^{n-1} W_i^*[\tau] V_i^*[n-\tau]/V_i^*[0] & \text{for } n \geq 1 \end{cases} \tag{8}$$

Similarly, the coefficients of $Q(s)$ can also be solved by the convolution between $W^*(s)$ and $Q(s)$ based on (6). Finally, the s-embedded PFEs of this three-bus system can be separated into the real part and imaginary part, and expressed as the mathematical induction form, where the $n^{th}$ term on the left hand side is dependent on the $1^{st}$ to $(n-1)^{th}$ terms on the right hand side of equation (9).

$$\begin{bmatrix} 1 & & & & & \\ & 1 & & & & \\ G_{21} & -B_{21} & 0 & -B_{22} & G_{23} & -B_{23} \\ B_{21} & G_{21} & 1 & G_{22} & B_{23} & G_{23} \\ G_{31} & -B_{31} & 0 & -B_{32} & G_{33} & -B_{33} \\ B_{31} & G_{31} & 0 & G_{32} & B_{33} & G_{33} \end{bmatrix} \begin{bmatrix} V_{1re}[n] \\ V_{1im}[n] \\ Q_2[n] \\ V_{2im}[n] \\ V_{3re}[n] \\ V_{3im}[n] \end{bmatrix} = \tag{9}$$

$$\begin{bmatrix} \delta_{n0} + \delta_{n1}(V_1^{SL} - 1) \\ 0 \\ \text{Re}\left(P_2 W_2^*[n-1] - j\overset{n-1}{\underset{1}{\text{Conv}}}(Q_2 * W_2^*) - Y_{2,sh} V_2[n-1]\right) \\ \text{Im}\left(P_2 W_2^*[n-1] - j\overset{n-1}{\underset{1}{\text{Conv}}}(Q_2 * W_2^*) - Y_{2,sh} V_2[n-1]\right) \\ \text{Re}(S_3^* W_3^*[n-1] - Y_{3,sh} V_3[n-1]) \\ \text{Im}(S_3^* W_3^*[n-1] - Y_{3,sh} V_3[n-1]) \end{bmatrix} -$$

$$\begin{bmatrix} 0 \\ 0 \\ G_{22} \\ B_{22} \\ G_{32} \\ B_{32} \end{bmatrix} V_{2re}[n]$$

In (9), $V_{2re}[n]$ is the real part of the PV bus, also dependent on the $1^{st}$ to $(n-1)^{th}$ terms of $V_2$, expressed as (10), $$V_{2re}[n] = \delta_{n0} + \delta_{n1} \frac{(V_2^{sp})^2 - 1}{2} - \frac{1}{2} \sum_{\tau=1}^{n-1} V_2[\tau] V_2^*[n-\tau] \tag{10}$$

where $\delta_{ni}$ is the Kronecker delta function that equals 1 only for the order $i=n$ and vanishes for other orders.

$$\delta_{ni} = \begin{cases} 1 & \text{if } i = n \\ 0 & \text{otherwise} \end{cases} \tag{11}$$

III. Proposed Multi-Dimensional Holomorphic Embedding Method

Theoretically, given enough precision digits in numeric arithmetic, a conventional HELM can find the power flow solution at one required operating condition with high accuracy using the power series with a number of terms. However, the main drawback is that it does not give the expression of the power flow solution at any other operating condition, so the explicit expression is not for the whole solution space of the PFEs.

The proposed new MDHEM first finds a physical germ solution, which serves as an original point in the solution space instead of a virtual germ solution with voltage $1\angle 0°$. In this way, it can extend from the physical germ solution by endowing the embedded variables with physical meanings, e.g. the loading scales to control the loading levels of load buses. Each loading scale can be either bound with each power, each load, or each group of loads. A detailed procedure of the MDHEM is introduced as follows.

A. Physical Germ Solution

The proposed physical germ solution is an original point of the solution at an operating condition with physical meaning. Theoretically, any power flow solution can be defined as a physical germ solution. In this paper, the physical germ solution is the operating condition in which each load bus (PQ bus) has neither load nor generation and each generator bus (PV bus) has specified active power output with reactive power output adjusted to control the voltage magnitude to the specified value. Such a physical germ solution has two advantages although other germ solutions can also be defined. First, it represents a condition having no load at all PQ buses. Second, the embedded variables can represent physical loading scales starting from zero and extendable to the whole solution space. If such a solution violates transmission capacity limits or bus voltage limits of the network, an acceptable light-load condition whose PQ buses have low consumptions may be used as a physical germ solution.

Therefore, to find the physical germ, the s-embedded equations on PQ buses, PV buses, and SL buses are expressed as in (12)-(14) respectively, where notations with subscript gi indicate the physical germ solution of bus i and $S$, $\mathcal{P}$, $\mathcal{V}$ stand for the set of slack buses, PQ buses, and PV buses, respectively.

$$V_{gi}(s) = V_i^{SL}, \forall i \in S \tag{12}$$

$$\sum_{k=1}^{N} Y_{ik} V_{gk}(s) = 0, \forall i \in \mathcal{P} \tag{13}$$

$$\begin{cases} \sum_{k=1}^{N} Y_{ik} V_{gk}(s^*) = \dfrac{sP_{gi} - jQ_{gi}(s)}{V_{gi}^*(s^*)} \\ V_{gi}(s)V_{gi}^*(s^*) = |V_{STi}|^2 + (|V_i^{sp}|^2 - |V_{STi}|^2)s \end{cases}, \forall i \in \mathcal{V} \tag{14}$$

Figures 2A, 2B:
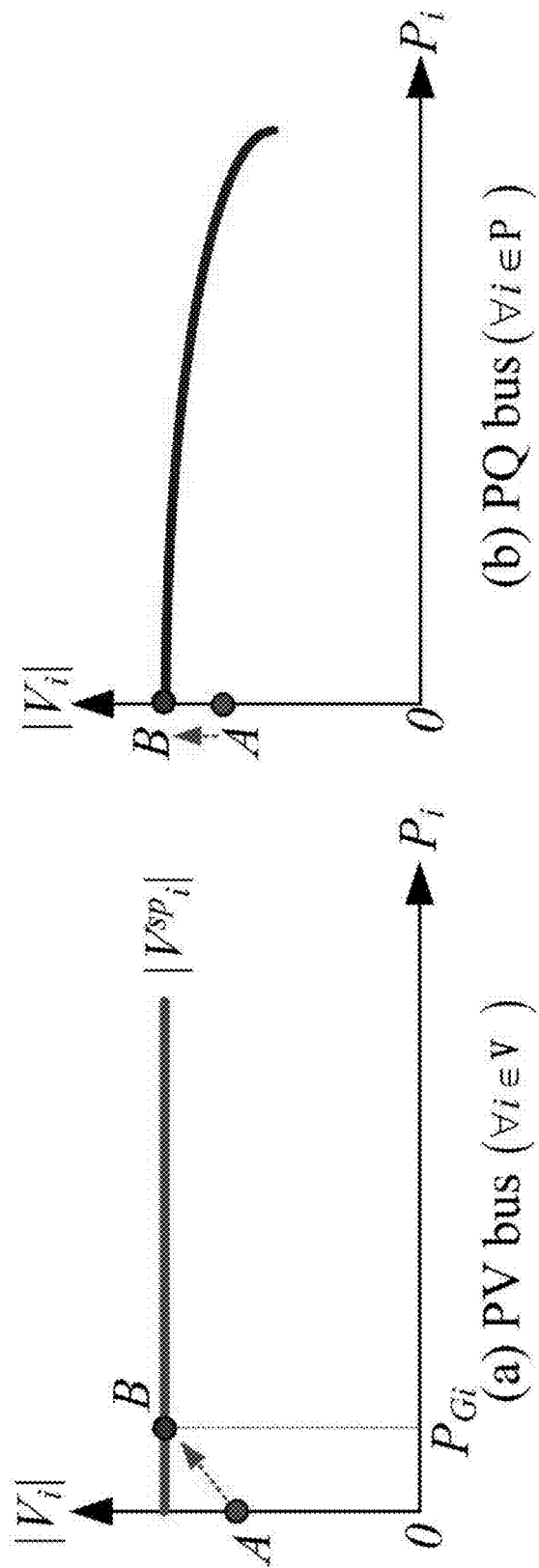
FIGS. 2A and 2B show the procedure of finding the physical germ solution.

The physical germ solution can be found by two steps illustrated in FIGS. 2(a) and 2(b). The first step is to assume all PV and PQ buses injecting zero power to the network and find the initial voltage $V_{STi}$ of every PV or PQ bus, which is indicated by Point A in FIG. 2(a) for a PV bus and Point A in FIG. 2(b) for a PQ bus. $V_{STi}$ is calculated by (15)-(16).

$$V_{STk} = V_k^{SL}, \forall k \in S \tag{15}$$

$$\sum_{k=1}^{N} Y_{ik} V_{STk} = 0, \forall k \notin S \tag{16}$$

The second step is to replace "0" in (16) by injected reactive power as a form of s-embedded function, i.e. $Q_{gi}(s)$, for all PV buses to control their voltage magnitudes from the starting voltage $|V_{STi}|$ towards the specified voltage $|V_i^{sp}|$, i.e. point B in FIG. 2(a). Meanwhile, the active power of each PV bus is controlled to the specified value, i.e. $P_{Gi}$.

Substitute power series for $V_{gi}(s)$ and $W_{gi}(s)$ in (13) and (14) and expand them as (17) and (18) for PQ buses and PV buses, respectively.

$$\sum_{k=1}^{N} Y_{ik}(V_{STk} + V_{gk}[1]s + V_{gk}[2]s^2 + L) = 0, \forall i \in \mathcal{P} \tag{17}$$

$$\begin{cases} \sum_{k=1}^{N} Y_{ik}(V_{STk} + V_{gk}[1]s + V_{gk}[2]s^2 + L) = \\ [sP_{Gi} - j(Q_{gi}[1]s + Q_{gi}[2]s^2 + L)](W_{gi}^*[0] + W_{gi}^*[1]s + L) \\ (V_{STi} + V_{gi}[1]s + V_{gi}[2]s^2 + L)(V_{STi}^* + V_{gi}^*[1]s + V_{gi}^*[2]s^2 + L) = \\ |V_{STi}|^2 + (|V_i^{sp}|^2 - |V_{STi}|^2)s \end{cases}, \forall i \in \mathcal{V} \tag{18}$$

Equate the coefficients of $s$, $s^2$, ... up to $s^n$ on both sides of (17) and (18), and then obtain $V_{gi}[n]$, $W_{gi}[n]$, and $Q_{gi}[n]$ by the terms 0 to n−1 of $W_{gi}(s)$ and $Q_{gi}(s)$ from (19) and (20) for PQ buses and PV buses, respectively.

$$\sum_{k=1}^{N} Y_{ik} V_{gk}[n] = 0, \forall i \in \mathcal{P} \tag{19}$$

$$\begin{cases} \sum_{k=1}^{N} Y_{ik} V_{gk}[n] = P_{Gi} W_{gi}^*[n-1] - j\left(Q_{gi}[n]W_{gi}^*[0] + \sum_{\tau=1}^{n-1} Q_{gi}[\tau]W_{gi}^*[n-\tau]\right) \\ V_{gi}[n]V_{gi}^*[0] + V_{gi}[n]V_{gi}^*[0] = \varepsilon_i[n-1] \end{cases}, \forall i \in \mathcal{V} \tag{20}$$

where the voltage error of PV bus $\varepsilon_i[n-1]$ is defined by (21). It will quickly converge within a small number of terms n, since it contains the high order terms of $V_{gi}[n]s^n$.

$$\varepsilon_i[n-1] = \delta_{n1} \cdot (|V_i^{sp}|^2 - |V_{STi}|^2) - \left(\sum_{\tau=1}^{n-1} V_{gi}[\tau] V_{gi}^*[n-\tau]\right) \quad (21)$$

In (20), $V_{gi}[n]$ and $W_{gi}[n]$ are unknown complex values, and $Q_{gi}[n]$ is an unknown real value. Move all unknowns of the $n^{th}$ order coefficients to the left-hand side and also break the PFEs into the equations respectively about real and imaginary parts. Then, a matrix equation similar to (9) is created containing all $V_{gi}[n]$, $W_{gi}[n]$, and $Q_{gi}[n]$. Given the N-bus network with s slack buses, p PQ buses, and v PV buses, the total number of equations is increased from 2s+2p+2v of (9) to 2s+2p+5v since a complex valued power series W(s) and a real valued power series Q(s) are added for each PV bus. The above method of finding a physical germ solution multiplies the active power generation at each PV bus by s and no-load at each PQ bus. If such a no-load germ solution does not exist due to the transmission capacity limits or bus voltage limits mentioned above, then an acceptable light-load condition may be used that sets a low active load $P_{li} \neq 0$ at each PQ bus. Then the number of equations is extended to 2s+4p+5v since W(s) is also added for each PQ bus. A 3-bus system is used to illustrate how to find a physical germ solution in detail in Appendix-B.

B. From Single-Dimension to Multi-Dimension

The conventional HELM only embeds one s into PFEs, so it may be considered a single-dimensional method. As a major drawback, it scales all loads in the system uniformly at the same rate. Loads cannot decrease, keep constant or grow at separate rates. Also, the power factor of each load is fixed. Therefore, its solutions are unable to cover all the operating conditions. Some propose a bivariate holomorphic embedding method, which extends the single-dimensional HELM to a two-dimensional method.

Here, we propose an MDHEM to obtain a wide variety of power flow solutions in the space about multiple embedded variables, i.e. $s_1, s_2, \ldots, s_D$. Here D is the number of dimensions. The analytical expression is derived from a physical germ solution by defining embedded variables as individual scaling factors. For instance, each $s_j$ (j=1~D) can control the scale of the active power or reactive power of either one load or a group of loads of interest. Thus, the conventional HELM is a special case of the MDHEM. In the following, the MDHEM will firstly be presented for a power network without PV bus and then the MDHEM for general networks will be introduced in the next sub-sections.

Suppose a network has D dimensions to scale, so a D-dimensional HEM is defined in (22), where the embedding can be done by scaling each $s_j$ separately, $$\sum_{k=1}^{N} Y_{ik} V_k(s_1, s_2, \cdots, s_j, \cdots, s_D) = \frac{s_j S_i^*}{\overline{V_i(s_1, s_2, \cdots, s_j, \cdots, s_D)}}, i \in \mathcal{P} \quad (22)$$

where $V_i(s_1, s_2, \ldots, s_j, \ldots, s_D)$ is the multivariate power series on bus i voltage given by (23). Its reciprocal is another multivariate power series $W_i(s_1, s_2, \ldots, s_1, \ldots, s_D)$.

$$V_i(s_1, s_2, \cdots, s_j, \cdots, s_D) = \sum_{n_D=0}^{\infty} \cdots \sum_{n_j=0}^{\infty} \cdots \sum_{n_1=0}^{\infty} V[n_1, \cdots, n_j, \cdots, n_D] \times \quad (23)$$

$$s_1^{n_1} \cdots s_j^{n_j} \cdots s_D^{n_D}$$

$$= \underbrace{V_i[0, 0, \cdots, 0]}_{D\text{-dimensions}} + V_i[1, 0, \cdots, 0]s_1 +$$

$$V_i[0, 1, \cdots, 0] \times$$

$$s_2 + \cdots + V_i[2, 0, \cdots, 0]s_1^2 + V_i[1, 1, \cdots, 0] \times$$

$$s_1 s_2 + V_i[0, 2, \cdots, 0]s_2^2 + \cdots$$

The conventional single-dimensional HELM has three properties, which need to be verified for a multi-dimensional HEM as well.

1) Scale Invariance of the MDHEM

As shown by (24), if every voltage $V_k(s_1, s_2, \ldots, s_j, \ldots, s_D)$ is scaled to $V_k' = \eta V_k$, the resulting equations can be recovered to the same form just with scaled injection $S_i$ by $s_j = |\eta|^2$. Therefore, scaling the power injection is equivalent to scaling all voltages by the same factor, which satisfies the property of scale invariance.

$$\sum_{k=1}^{N} Y_{ik} \frac{V_k'(s_1, s_2, \cdots, s_j, \cdots, s_D)}{\eta} = \quad (24)$$

$$\frac{S_i^*}{[V_i'(s_1, s_2, \cdots, s_j, \cdots, s_D)/\eta]^*} \Leftrightarrow$$

$$\sum_{k=1}^{N} Y_{ik} V_k'(s_1, s_2, \cdots, s_j, \cdots, s_D) =$$

$$\frac{|\eta|^2 S_i^*}{[V_i'(s_1, s_2, \cdots, s_j, \cdots, s_D)]^*}, i \in \mathcal{P}$$

2) Holomorphicity of the MDHEM

According to the generalized Cauchy-Riemann equations, if a multivariate continuous function $f(z_1, z_2, \ldots, z_n)$ defined in domain $U \subset \mathbb{C}^n$ satisfies (25) for each $z_\lambda$, then $f(z_1, z_2, \ldots, z_n)$ is holomorphic.

$$\frac{\partial f}{\partial z_\lambda^*} = 0 \quad (25)$$

This is also known as Wirtinger's derivative, meaning that the function $f$ has to be independent of $z_\lambda^*$ for holomorphicity. Obviously, $V_i$ in (22) does not depend on any $s_i^*$ since $$[V_i(s_1, s_2, \cdots, s_j, \cdots, s_D)]^* = V_i^*(s_1^*, s_2^*, \cdots, s_j^*, \cdots, s_D^*) = \quad (26)$$

$$\sum_{n_D=0}^{\infty} \cdots \sum_{n_j=0}^{\infty} \cdots \sum_{n_1=0}^{\infty} V[n_1, \cdots, n_j, \cdots, n_D] s_1^{n_1} \cdots s_j^{n_j} \cdots s_D^{n_D}$$

A detailed proof of holomorphicity with the D-dimensional HEM is given in Appendix-A.

3) Reflection Condition of the MDHEM

Since the complex conjugate of $V_i$ unnecessarily preserves holomorphicity unless (26) holds. Under that circumstance, an image equation on conjugates should be added to (22), i.e.

$$\begin{cases} \sum_{k=1}^{N} Y_{ik} V_k(s_1, s_2, \cdots, s_j, \cdots, s_D) = \dfrac{s_j S_i^*}{[V_i(s_1, s_2, \cdots, s_j, \cdots, s_D)]^*} \\ \sum_{k=1}^{N} Y_{ik}^* [V_i(s_1, s_2, \cdots, s_j, \cdots, s_D)]^* = \dfrac{s_j S_i}{V_i(s_1, s_2, \ldots, s_j, \cdots, s_D)} \end{cases} \quad (27)$$

where $V_k(s_1, s_2, \ldots, s_j, \ldots, s_D)$ and $[V_i(s_1, s_2, \ldots, s_j, \ldots, s_D)]^*$ are two sets of independent holomorphic functions and should be conjugates of each other. Each $s_j$ must be a real value for any physical solution. Their solutions can both exist only if (28) holds.

$$[V_i(s_1, s_2, \ldots, s_j, \ldots, s_D)]^* = V_i^*(s_1^*, s_2^*, \ldots, s_j^*, \ldots, s_D^*) \quad (28)$$

Hence, the reflection condition is verified.

After verifications of the above properties, the following equation can be obtained from (22) and (23) with power series appearing on both sides.

$$\sum_{k=1}^{N} Y_{ik}(V_k[0, 0, L\ 0] + V_k[1, 0, L, 0]s_1 + V_k[0, 1, L, 0]s_2 + L) = \quad (29)$$

$$s_j S_i^* \cdot (W_i^*[0, 0, L\ 0] + W_i^*[1, 0, L, 0]s_1 + W_i^*[0, 1, L, 0]s_2 + L)$$

Let $M = n_1 + n_2 + \ldots + n_D$ denote the order of recursion, so $V_k[0, 0, \ldots, 0]$ is the physical germ solution for $M=0$. Equate both sides of (29) and then extend the matrix equation to the $M^{th}$ order as (30), where $V_1$ is the slack bus.

$$[Y_{ik}]_{N \times N} = \begin{bmatrix} V_1[M, 0, L\ 0] & V_1[M-1, 1, 0, L\ 0] & L & L & V_1[0, 0, L\ M] \\ V_2[M, 0, L\ 0] & O & V_{k-1}[L, n_j, L] & M & V_2[0, 0, L\ M] \\ M & L & V_k[L, n_j, L] & M & M \\ M & O & V_{k+1}[L, n_j, L] & O & V_{N-1}[0, 0, L\ M] \\ V_N[M, 0, L\ 0] & V_N[M-1, 1, 0, L\ 0] & L & L & V_N[0, 0, L\ M] \end{bmatrix}_{N \times N_{col}} = \quad (30)$$

$$\begin{bmatrix} 0 & 0 & 0 & 0 & 0 \\ S_2^* W_i^*[M-1, 0, L, 0] & S_2^* W_i^*[M-2, 1, L\ 0] & M & M & 0 \\ 0 & S_3^* W_i^*[M-1, 0, L\ 0] & O & M & 0 \\ 0 & 0 & M & S_i^* W_i^*[L, n_j-1, L] & 0 \\ 0 & 0 & L & L & S_N^* W_N^*[0, 0, L\ M-1] \end{bmatrix}$$

Unlike the matrix equation of the conventional HELM, the number of its columns denoted by $N_{col}$ is a D-polytope number expanding with the increase of order M For a D-dimensional HEM at the $M^{th}$ order, $$N_{col} = \frac{\prod_{i=M+1}^{M+D-1} i}{(D-1)!} = \frac{(M+D-1)!}{M!(D-1)!}. \quad (31)$$

Take a 2-D HEM for example. A 2-bus system with one slack bus and one PQ bus is demonstrated. $s_1$ and $s_2$ are selected to scale the active and reactive powers of the PQ bus, respectively. The $M^{th}$ recursion of the matrix calculation is $$\begin{bmatrix} 1 & 0 & 0 & 0 \\ 0 & 1 & 0 & 0 \\ G_{21} & -B_{21} & G_{22} & -B_{22} \\ B_{21} & G_{21} & B_{22} & G_{22} \end{bmatrix}_{4 \times 4} \begin{bmatrix} V_{1re}[M, 0] & V_{1re}[M-1, 1] & \cdots & V_{1re}[n_1, n_2] & \cdots & V_{1re}[0, M] \\ V_{1im}[M, 0] & V_{1im}[M-1, 1] & \cdots & V_{1im}[n_1, n_2] & \cdots & V_{1im}[0, M] \\ V_{2re}[M, 0] & V_{2re}[M-1, 1] & \cdots & V_{2re}[n_1, n_2] & \cdots & V_{2re}[0, M] \\ V_{2im}[M, 0] & V_{2im}[M-1, 1] & \cdots & V_{2im}[n_1, n_2] & \cdots & V_{2im}[0, M] \end{bmatrix}_{4 \times (M+1)} = \quad (32)$$

$$\begin{bmatrix} 0 & \cdots & 0 & \cdots & 0 \\ 0 & \cdots & 0 & \cdots & 0 \\ \operatorname{Re}(P_2 W_2^*[M-1,0]) & \cdots & \operatorname{Re}(P_2 W_2^*[n_1-1,n_2] - jQ_2 W_2^*[n_1,n_2-1]) & \cdots & \operatorname{Re}(-jQ_2 W_2^*[0,M-1]) \\ \operatorname{Im}(P_2 W_2^*[M-1,0]) & \cdots & \operatorname{Im}(P_2 W_2^*[n_1-1,n_2] - jQ_2 W_2^*[n_1,n_2-1]) & \cdots & \operatorname{Im}(-jQ_2 W_2^*[0,M-1]) \end{bmatrix}_{4\times(M+1)}$$

where the 2-D discrete convolution between $W(s_1,s_2)$ and $V(s_1,s_2)$ from 0 to M−1 is equal to 1. Therefore, the $(M-1)^{th}$ order of $W[n_1,n_2]$ can be calculated from the obtained terms 0 to M−1 of $V[n_1,n_2]$. The matrix equation is divided into real and imaginary parts to be in consistent with the network with PV buses. The details of multi-dimensional discrete convolution used to calculate $W[n_1,n_2]$ are described below.

C. Multi-Dimensional Discrete Convolution

For the transition towards a multi-dimensional HEM and calculation of $W[n_1, n_2, \ldots, n_D]$ in (30), the single-dimensional discrete convolution on the right hand side of (9) needs to be replaced by multi-dimensional discrete convolution, which refers to rolling multiplications of two functions (e.g. $f$ and $g$) on a high-dimensional lattice to produce a third function. Generally, "*" is used for the convolution operation. The number of dimensions in the given operation is reflected in the number of "*". Take the D-dimensional HEM for example. A D-dimensional convolution is written as (33) and can be computed by summating products of corresponding terms.

$$y(n_1, n_2, \cdots n_D) = \tag{33}$$
$$f(n_1, n_2, \cdots n_D) \overset{D}{*\cdots*} g(n_1, n_2, \cdots n_D) = \sum_{\tau_1=-\infty}^{\infty} \sum_{\tau_2=-\infty}^{\infty} \cdots$$
$$\sum_{\tau_D=-\infty}^{\infty} f(n_1-\tau_1, n_2-\tau_2, \cdots, n_D-\tau_D) \cdot g(\tau_1, \tau_2 \cdots, \tau_D)$$

Figure 3:
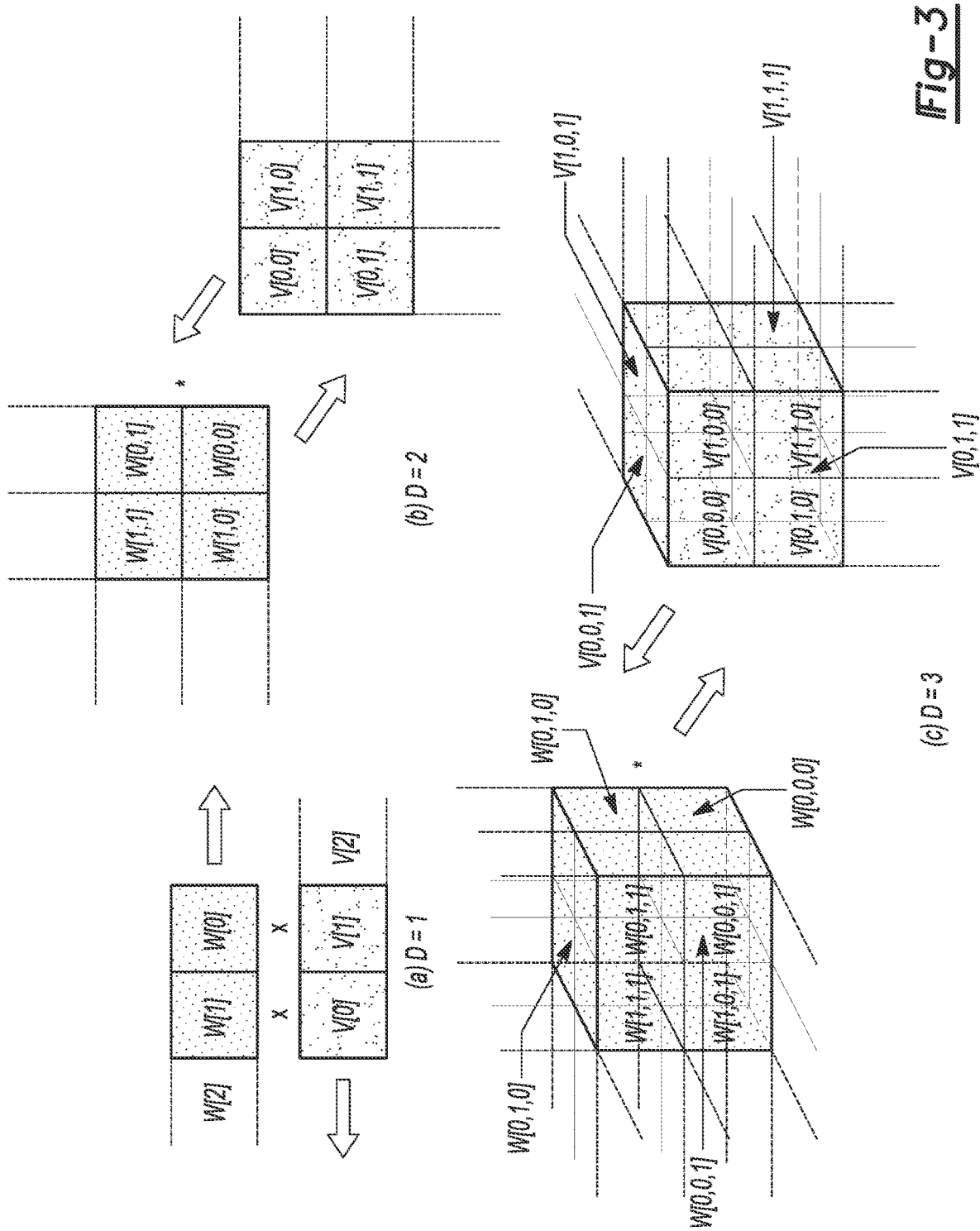
FIG. 3 shows the illustration of $W*V(2, 2, \ldots, 2)$ (a) 1-dimensional (b) 2-dimensional (c) 3-dimensional discrete convolution.

Different from the conventional multi-dimensional convolution taking terms from negative infinity to positive infinity, the D-dimensional convolution used in the MDHEM only keeps the $1^{st}$ to $(n-1)^{th}$ terms. Therefore, the convolutions of $W[n_1,n_2]$ on the right hand side of (32) are calculated by multiplication of two-dimensional arrays. FIG. 3 illustrates the 1-, 2- and 3-dimensional discrete convolutions of term 0 to term 2, in which the blue and red lattices move and overlap with each other.

The convolution is the summation of multiplications between geometrically super-positioned red lattices and blue lattices. The discrete convolution for higher dimensions is similar but in higher-dimensional spaces.

$$\underset{k_j=1, i=1 \sim D}{\overset{k_j=n_j-1}{\operatorname{Conv}}} (W * V)[k_1, k_2, L, k_D] = \tag{34}$$
$$\sum_{\tau_1=1}^{n_1-1} \sum_{\tau_2=1}^{n_2-1} L \sum_{\tau_D=1}^{n_D-1} W[k_1-\tau_1, k_2-\tau_2, L, k_D-\tau_D] \times V[\tau_1, \tau_2, L, \tau_D]$$

D. Multi-Dimensional HEM with PV Buses

For a N-bus network with v PV buses, the PFEs for PV buses are in (35), with reactive power $Q(s_i)$ also represented as a form of multivariate power series but with real coefficients $$\sum_{k=1}^{N} Y_{ik} V_k(s_1, s_2, \cdots, s_D) = \frac{P_i - jQ_i(s_1, s_2, \cdots, s_D)}{V_i^*(s_1^*, s_2^*, \cdots, s_D^*)}, i \in \mathcal{V} \tag{35}$$

The following equation is thus obtained from (35), where multivariate power series appear on both sides.

$$\sum_{k=1}^{N} Y_{ik}(V_k[0, 0, L \; 0] + V_k[1, 0, L, 0]s_1 + V_k[0, 1, L, 0]s_2 + L) = \tag{36}$$
$$(P_i - j(Q_i[0, 0, L \; 0] + Q_i[1, 0, L, 0]s_1 + Q_i[0, 1, L, 0]s_2 + L)) \cdot$$
$$(W_i^*[0, 0, L \; 0] + W_i^*[1, 0, L, 0]s_1 + W_i^*[0, 0, L, 0]s_2 + L)$$

Then, (36) can be reformed to a recursive function about $V_k[n_1, n_2, \ldots, n_D]$.

$$\sum_{k=1}^{N} Y_{ik} V_k[n_1, n_2, L, n_D] = \tag{36}$$
$$P_i W_i^*[n_1, n_2, L, n_D] - jQ_i[0, 0, L \; 0] \cdot W_i^*[n_1, n_2, L, n_D] -$$
$$jQ_i[n_1, n_2, L, n_d] \cdot W_i^*[0, 0, L \; 0] -$$
$$j \underset{k_j=1, i=1 \sim D}{\overset{k_j=n_j-1}{\operatorname{Conv}}} (Q * W_i^*)[k_1, k_2, L, k_D]$$

where $Q_i[0, 0, \ldots, 0]$ and $W_i[0, 0, \ldots, 0]$ are the obtained reactive power and the reciprocal of the voltage of the physical germ solution. Note that in (37), $V_k[n_1, n_2, \ldots, n_D]$ also depends on extra unknowns $W^*_i[n_1, n_2, \ldots, n_D]$ and $Q_i[n_1, n_2, \ldots, n_D]$ of the same order. Thus three additional equations need to be added and all unknowns are moved to the left hand side: two for real and imaginary parts of $W^*_i[n_1, n_2, \ldots, n_D]$ and the third for the real value of $Q_i[n_1, n_2, \ldots, n_D]$. For each PQ bus in the D-dimensional HEM, only one D-dimensional discrete convolution $W^* \; V$ is induced. However, for each PV bus in the D-dimensional HEM, three D-dimensional discrete convolutions, i.e. $Q*W^*$, $W^**V$ and $V*V^*$ are induced. As an example, the 3-bus system in FIG. 1 for the MDHEM, having one slack bus, one PQ bus and one PV bus, is introduced in detail in Appendix-C.

E. Considering Reactive Power Limits

Reactive power limits of generators introduce discontinuity into the holomorphic functions. That is addressed in the proposed MDHEM as follows. Let $Q_{GiMin}$ and $Q_{GiMax}$ represent the upper and lower limits of the reactive power output $Q_{Gi}$ of the generator at bus i. If $Q_{Gi}(s)<Q_{GiMin}$ or $Q_{Gi}(s)>Q_{GiMax}$ happen, the type of bus i is changed from PV to PQ and the reactive power output is then fixed at the violated limit. Since the PFEs lose holomorphicity due to such discontinuity, the MDHEM needs to be rebuilt and resolved with altered bus types. In fact, the proposed MDHEM can predict violations of reactive power limits at PV buses beforehand from $Q(s_i)$ with tested values of $s_i$.

Figure 4:
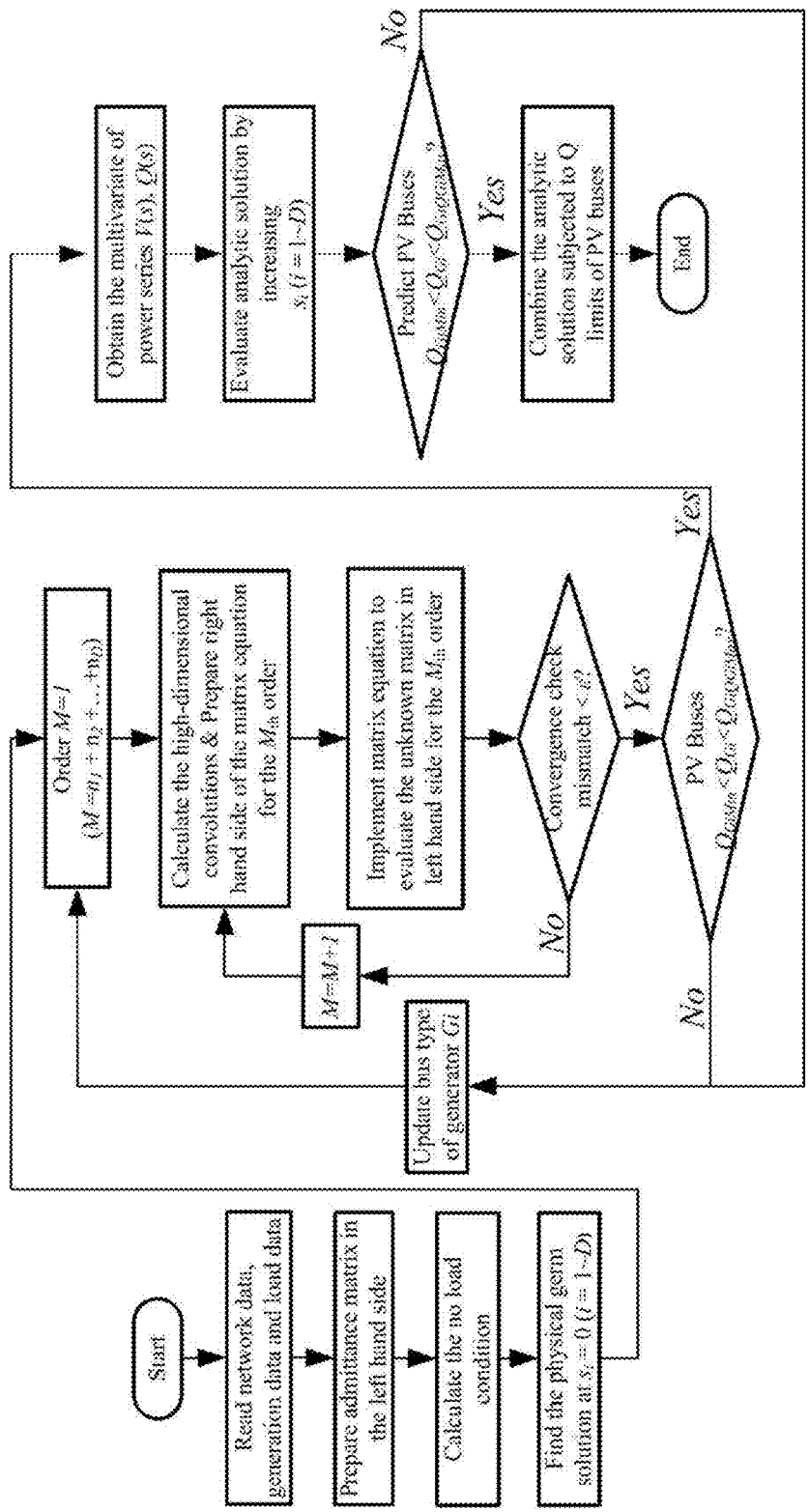
FIG. 4 shows the procedure of finding the analytical solution of PFEs using the MDHEM.

Finally, the whole MDHEM flowchart for finding a power flow solution considering reactive power limits on PV buses is shown in FIG. 4.

F. Computer Resources Required by the MDHEM

The computational resources depend on the computation burden, i.e. the number of steps necessary to solve the problem, as well as memory space, i.e. the amount of required memory storage. For a D-dimensional HEM applied to an N-bus network with s slack buses, p PQ buses, and v PV buses, $N_{col}$ terms in (31) are needed to find a solution in the form of $M^{th}$-order multivariate power series. Put the unknown coefficients for $M^{th}$ order power series on the left-hand side and known variables on the right-hand side of a matrix equation. Therefore, the left hand side of the matrix equation is a $(2s+2p+5v) \times (2s+2p+5v)$ extended admittance matrix that multiplies with a $(2s+2p+5v) \times N_{col}$ matrix for the unknown coefficients. The right-hand side of the matrix equation is also a $(2s+2p+5v) \times N_{col}$ matrix. For an $M^{th}$ order truncation of the multivariate power series, the number of coefficients for each of $V(s_i)$, $W(s_i)$, and $Q(s_i)$ is $$N_{term} = \sum_{m=0}^{M} \frac{(m+D-1)!}{m!(D-1)!}. \tag{38}$$

Here, $V(s_i)$ and $W(s_i)$ are complex valued and $Q(s_i)$ are real valued. The memory to save each of their elements depends on the digits of precision used in calculation, e.g. an element in the double-precision floating-point format taking 8 bytes. Sparse techniques can help reduce memory usage.

Most of computation burden is with multi-dimensional discrete convolution, which has totally $(p+3v) \times N_{col}$ terms for the $M^{th}$ order matrix equation. Each convolution involves $(M-1)^D-1$ multiplications. However, that can be significantly speeded up by using the row-column decomposition or direct matrix multiplication based on the Helix transform.

IV. Multivariate Padé Approximants

The above-mentioned procedure can create truncated multivariate power series for all the quantities, such as voltage $V_i(s_1, s_2, \ldots, s_D)$ and reactive power $Q_i(s_1, s_2, \ldots, s_D)$. Each multivariate power series has its convergence region, in which the power series can converge to the actual power flow solution. However, by just summing up these truncated power series, the convergence region usually can not be extended to the edge of the solution space about $s_1, s_2, \ldots s_D$, especially close to the voltage stability boundary. The Padé approximants method is an effective tool to significantly extend the convergence region. According to Stahl's theory, the diagonal Padé approximants can ensure the maximum analytic continuation of a power series to approximate an analytical function.

For a bivariate power series, the method of Chisholm approximants is adopted to calculate the coefficients of a bivariate Padé approximants. For example, some have used the Chisholm approximants in a two-dimensional HEM. For more general multivariate power series, the multivariate Padé approximants (MPA) method will be used in the proposed MDHEM.

Let $f(s_1, s_2, \ldots, s_D)$ be a function of D variables approached by a formal power series expansion.

$$f(s_1, s_2, \cdots, s_D) = \sum_{n_1=0}^{\infty} \sum_{n_2=0}^{\infty} \cdots \sum_{n_D=0}^{\infty} c[n_1, n_2, \cdots, n_D] s_1^{n_1} s_2^{n_2} \cdots s_D^{n_D} \tag{39}$$

Then the Padé approximants to $f(s_1, s_2, \ldots, s_D)$ is $$f_{L/L'}(s_1, s_2, \cdots, s_D) = \tag{40}$$

$$\frac{\sum_{n_1=0}^{L} \sum_{n_2=0}^{L} \cdots \sum_{n_D=0}^{L} a[n_1, n_2, \cdots, n_D] s_1^{n_1} s_2^{n_2} \cdots s_D^{n_D}}{\sum_{n_1=0}^{L'} \sum_{n_2=0}^{L'} \cdots \sum_{n_D=0}^{L'} b[n_1, n_2, \cdots, n_D] s_1^{n_1} s_2^{n_2} \cdots s_D^{n_D}}$$

where $L=L'$ for the diagonal MPA and $a[n_1, n_2, \ldots, n_D]$ and $b[n_1, n_2, \ldots, n_D]$ are coefficients of term $s_1^{n_1} s_2^{n_2} \ldots s_D^{n_D}$ in the numerator and denominator, respectively. Easily from (39) and (40), there is $$\left( \sum_{n_1=0}^{L} \cdots \sum_{n_D=0}^{L} b[n_1, \cdots n_D] s_1^{n_1} \cdots s_D^{n_D} \right). \tag{41}$$

$$\left( \sum_{n_1=0}^{\infty} \cdots \sum_{n_D=0}^{\infty} c[n_1, \cdots, n_D] s_1^{n_1} \cdots s_D^{n_D} \right) =$$

$$\left( \sum_{n_1=0}^{L} \cdots \sum_{n_D=0}^{L} a[n_1, \cdots, n_D] s_1^{n_1} \cdots s_D^{n_D} \right) +$$

$$o\left( \sum_{n_1+\cdots+n_D>2L} s_1^{n_1} \cdots s_D^{n_D} \right)$$

in which "o(•)" equals the sum of higher-order terms, representing the truncation error of $[L/L]^{th}$ order Padé approximants.

Since the orders of each s, in both the numerator and denominator in (42) are from 0 to L, a total number of $2(L+1)^D$ coefficients need to be determined.

Figures 5A, 5B:
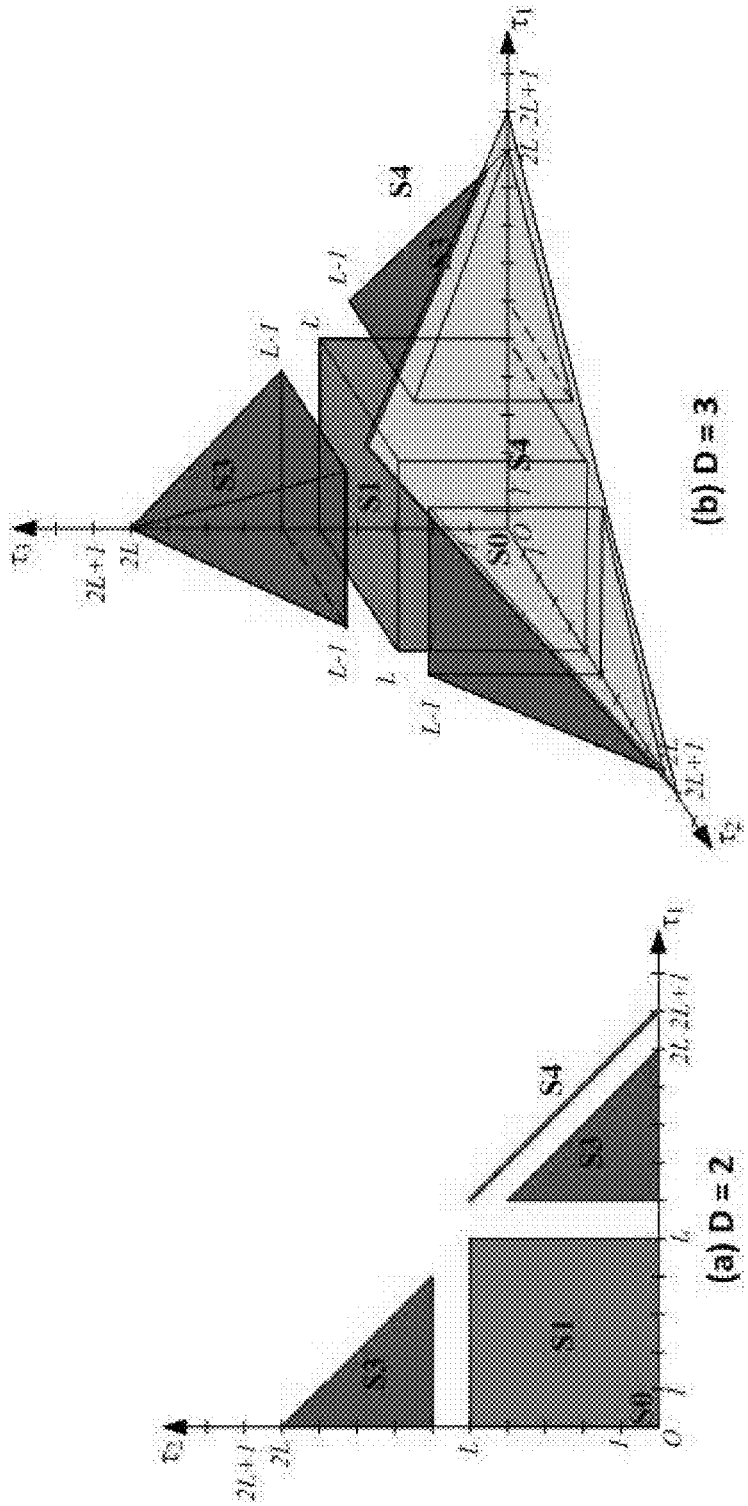
FIGS. 5A and 5B show, respectively, the zones for a two-variable and three-variable diagonal MPA.

At the origin S0 in FIGS. 5A and 5B, the term 0 of eq. (41) satisfies $$S0: \begin{cases} b[0, 0, \cdots, 0] \cdot c[0, 0, \cdots, 0] = a[0, 0, \cdots, 0] \\ b[0, 0, \cdots, 0] = 1 \end{cases} \tag{42}$$

Therefore, the remaining $2(L+1)^D-2$ unknown coefficients still need a number of $2(L+1)^D-2$ equations.

The following three sets of equations, i.e. (43)-(45), are necessary for determining the remaining $2(L+1)^D-2$ unknown coefficients. (43) includes $(L+1)^D-1$ equations defining coefficients in Zone S1, in which all intermediate variables $\tau_i$ are between 0 and L except for the original point (all $\tau_i$ are 0). Furthermore, (44) has $L(L+1)^{D-1}$ equations defining the coefficients regarding $\tau_i$ in Zone S2. The additional $(L+1)^{D-1}-1$ coefficients are defined by (45) to obtain the final unique solution. FIG. 5A and FIG. 5B showcase the zones regarding $\tau_i$ for two-variable and three-variable diagonal Padé approximants, respectively.

$$S1: \sum_{n_1=0}^{\tau_1} \cdots \sum_{n_D=0}^{\tau_D} b[n_1, \cdots, n_D]c[\tau_1 - n_1, \cdots, \tau_D - n_D] = \tag{43}$$

$$a[\tau_1, \cdots, \tau_D],$$

for $0 \leq \tau_i \leq L$ and $\tau_1 \cdots \tau_D \neq 0$ $$S3: \sum_{n_1=0}^{\tau_1} \cdots \sum_{n_D=0}^{\tau_D} b[n_1, \cdots, n_D]c[\tau_1 - n_1, \cdots, \tau_D - n_D] = 0, \tag{44}$$

for $\tau_1 \geq L+1$ or $\tau_2 \geq L+1$ or $\cdots$ or $\tau_D \geq L+1$ $$S4: \sum_{n_1=0}^{\tau_1} \cdots \sum_{n_D=0}^{\tau_D} (b[n_1, \cdots, n_D]c[\tau_1 - n_1, \cdots, \tau_D - n_D] + \tag{45}$$

$$\cdots + b[n_D, \cdots, n_1]c[\tau_D - n_D, \cdots, \tau_1 - n_1]) = 0$$

for $\tau_2 + \cdots + \tau_D = 2L+1$ or $\cdots$ or $\tau_1 + \cdots + \tau_{D-1} = 2L+1$

V. Case Study

A. Demonstration on 4-Bus Power System

Figure 6:
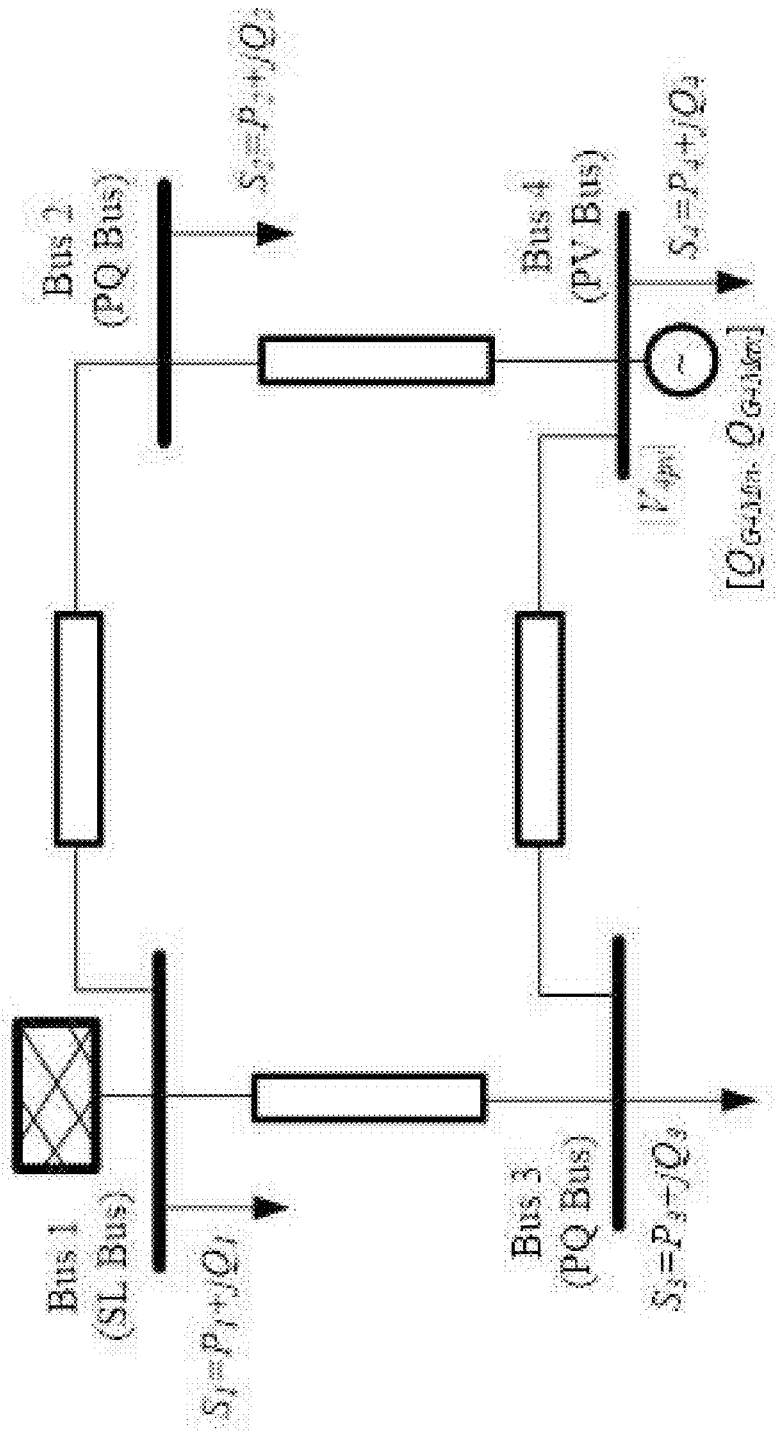
FIG. 6 is a one-line diagram of the 4-bus power system.
Figures 8A, 8B, 8C, 8D:
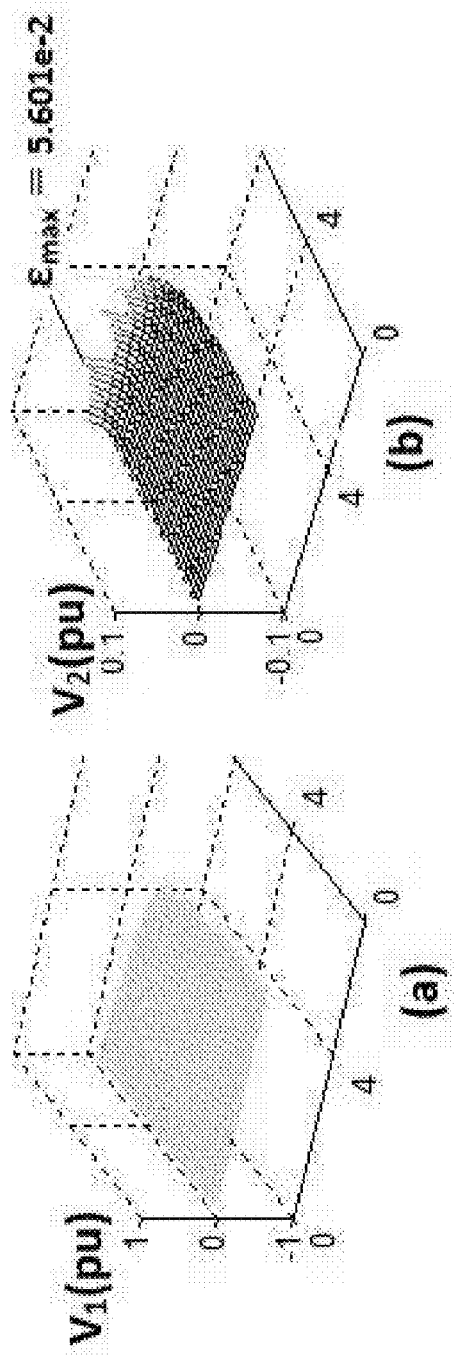
FIGS. 8A, 8B, 8C and 8D show the difference between MDHEM and N-R in Case 1 with a PV bus.

As shown in FIG. 6, a 4-bus system is first used to illustrate the MDHEM by two cases. In Case 1, Bus 1 is the slack bus with fixed voltage 1.02 pu, Bus 2 and Bus 3 are load buses, and Bus 4 is a generator bus maintaining its voltage magnitude at 0.98 pu. Loads at Bus 2 and Bus 3 are scaled by independent $s_1$ and $s_2$ embedded into PFEs, respectively. The MDHEM is implemented in MATLAB using the MATPOWER toolbox, which takes 1.04 sec to obtain the result with maximum error of all bus voltages less than $10^{-8}$ for this 2-D MDHEM. Comparably, it takes 24.1 sec to screen the load flow of all scenarios by using the N-R method. The result is a $14^{th}$ order multivariate power series (i.e. M=14) and the terms of orders up to 2 are given in Table II.

FIGS. 9A, 9B, 9C and 9D show the results of bus voltages by evaluating the MDHEM using the MPA, which are also compared with the results of the N-R method calculated at intervals of $\Delta s_i$=0.2. Notice that for the voltages of two PQ buses, i.e. $V_2$ and $V_3$ in FIG. 9B and FIG. 9C, the singularities of the MPA expression approach the actual edge of voltage collapse. FIGS. 10A, 10B, 10C and 10D show the difference between the results from the N-R and the MDHEM with MPA. The maximum difference of all bus voltages is reduced to $2.221 \times 10^{-2}$ pu at Bus 3.

Figures 11A, 11B:
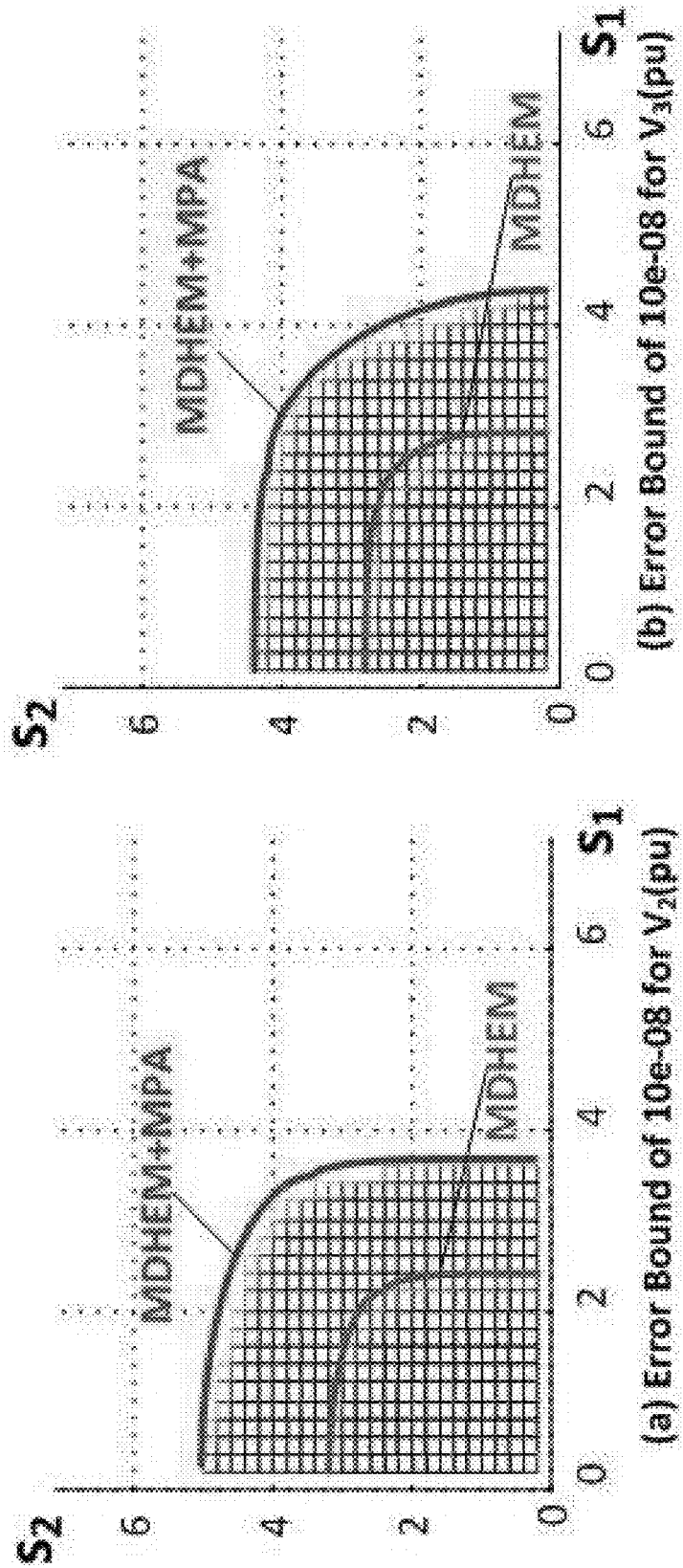
FIGS. 11A and 11B show the convergence region with error bound of $10^{-8}$ for $V_2$ and $V_3$.

FIGS. 11A and 11B show the convergence region with the voltage error bound of $10^{-8}$ with order M=14. It can be noticed that the MPA can significantly improve the convergence region.

FIG. 12 shows the maximum voltage error of the PQ buses in the 2D space by using the multivariate power series and MPA. The error decreases by using a higher-order multivariate power series and the MPA can further extend the convergence region. Note that, the $1^{st}$ order power series analytical solution is equivalent to the linear approximation of load flow solution.

In Case 2, with the increase of loading scales at load buses, the reactive power injection at the generator bus (Bus 2) violates its upper limit of 100 MVar. The PV bus will be transformed to a fixed PQ bus. FIGS. 13A, 13B, 13C and 13D show the results of bus voltages from the multivariate power series compared with the results of the N-R method. FIG. 14 shows their difference. It can be observed that $V_4$ is no longer a PV bus with fixed voltage magnitude and the convergence region is smaller than that in Case 1. The maximum error increases to 0.0529 pu at Bus 2 without the voltage support from PV buses.

Figures 15A, 15B:
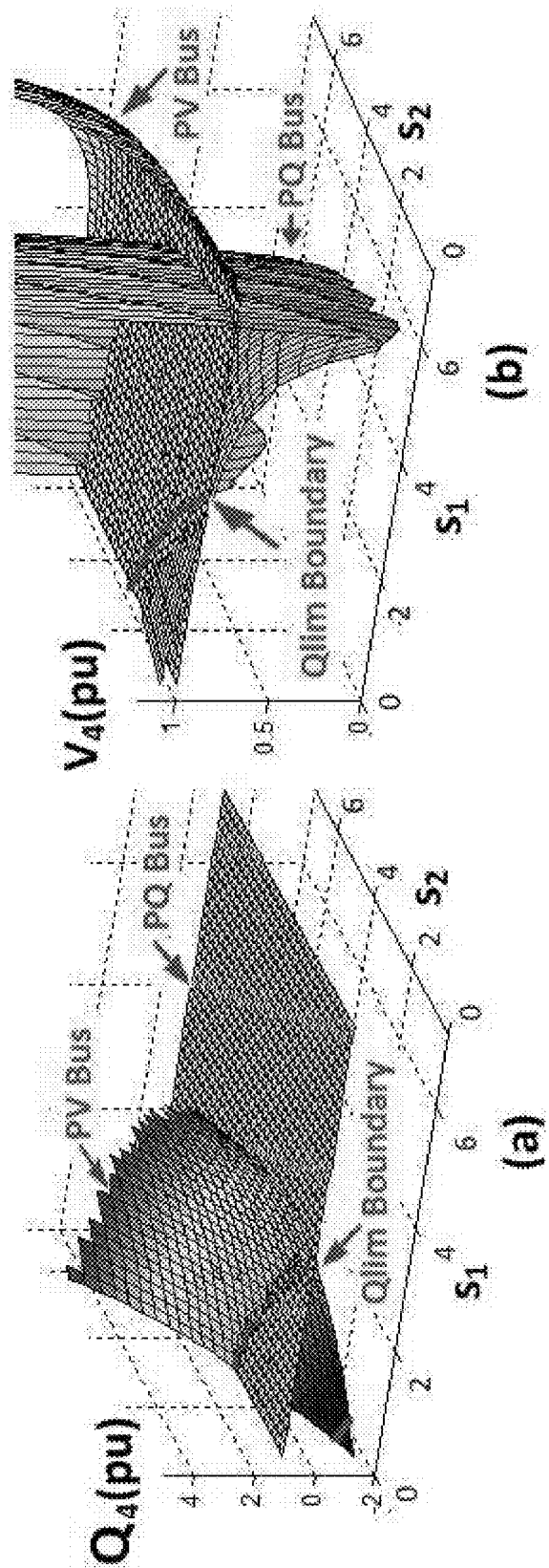
FIGS. 15A and 15B show, respectively, the reactive power and voltage of a PV bus for Case 1 and 2.

FIGS. 15A and 15B show the comparison of reactive powers and voltage magnitudes for Case 1 and Case 2. In FIG. 15A, the reactive power surface of the PV bus follows a multivariate nonlinear function. Its intersection with the reactive power surface of the PQ bus determines the reactive

TABLE II

| | Result of multivariate power series for Bus 2, 3, 4 (M <= 2) | | | | | |
|---|---|---|---|---|---|---|
| Bus | V [0,0] | V [1,0] | V [1,0] | V [2,0] | V [1,1] | V [0,2] |
| $V_2$ | $9.95 \times 10^{-1}$ | $-2.465 \times 10^{-2}$ | $2.248 \times 10^{-3}$ | $-3.232 \times 10^{-3}$ | $-1.338 \times 10^{-3}$ | $-2.458 \times 10^{-4}$ |
| | $+6.861 \times 10^{-2}i$ | $-5.894 \times 10^{-2}i$ | $-1.833 \times 10^{-2}i$ | $+6.562 \times 10^{-6}i$ | $-1.982 \times 10^{-4}i$ | $-4.745 \times 10^{-4}i$ |
| $V_3$ | 1.005 | $1.962 \times 10^{-3}$ | $-3.510 \times 10^{-2}$ | $-3.138 \times 10^{-4}$ | $-1.107 \times 10^{-3}$ | $-3.753 \times 10^{-3}$ |
| | $+4.379 \times 10^{-2}i$ | $-1.601 \times 10^{-2}i$ | $-5.436 \times 10^{-2}i$ | $-3.872 \times 10^{-4}i$ | $+1.600 \times 10^{-4}i$ | $+2.763 \times 10^{-5}i$ |
| $V_4$ | $9.727 \times 10^{-1}$ | $5.323 \times 10^{-3}$ | $3.012 \times 10^{-3}$ | $-8.478 \times 10^{-4}$ | $-1.277 \times 10^{-3}$ | $-4.261 \times 10^{-4}$ |
| | $+1.197 \times 10^{-1}i$ | $-4.326 \times 10^{-2}i$ | $-3.179 \times 10^{-2}i$ | $-1.047 \times 10^{-3}i$ | $-1.291 \times 10^{-3}i$ | $-8.234 \times 10^{-4}i$ |

FIGS. 7A, 7B, 7C and 7D show the results of bus voltages by evaluating the multivariate power series obtained by the MDHEM and compares the results with those from the N-R method at intervals of $\Delta s_i$=0.2.

FIGS. 8A, 8B, 8C and 8D show the difference between the results from the N-R and MDHEM. Although the continuous power flow can also be used here to circumvent the convergence issue, the result is assigned to 0 here for simplicity if the N-R does not converge. The non-convergence of N-R does not theoretically signify the non-existence of a power flow solutions. It can be observed that in the N-R's convergence region, the solutions from the MDHEM show great consistency. The maximum error of bus voltages is $6.522 \times 10^{-2}$ pu at Bus 3 that appears very close to the edge of voltage collapse, and the multivariate power series generated by HDHEM has much less error in most of the region before voltage collapse.

power boundary with respect to different loading scales (i.e. $s_1$ and $s_2$). In FIG. 15B, outside the "Qlim boundary", the voltage of the PV bus type is higher than that of the PQ bus type, since PV bus type is able to maintain the voltage of Bus 4. The MDHEM can clearly tell the reactive power boundary in the multi-dimensional space about scaling factors $s_i$.

B. Demonstration on the 14-Bus Power System

Figure 16:
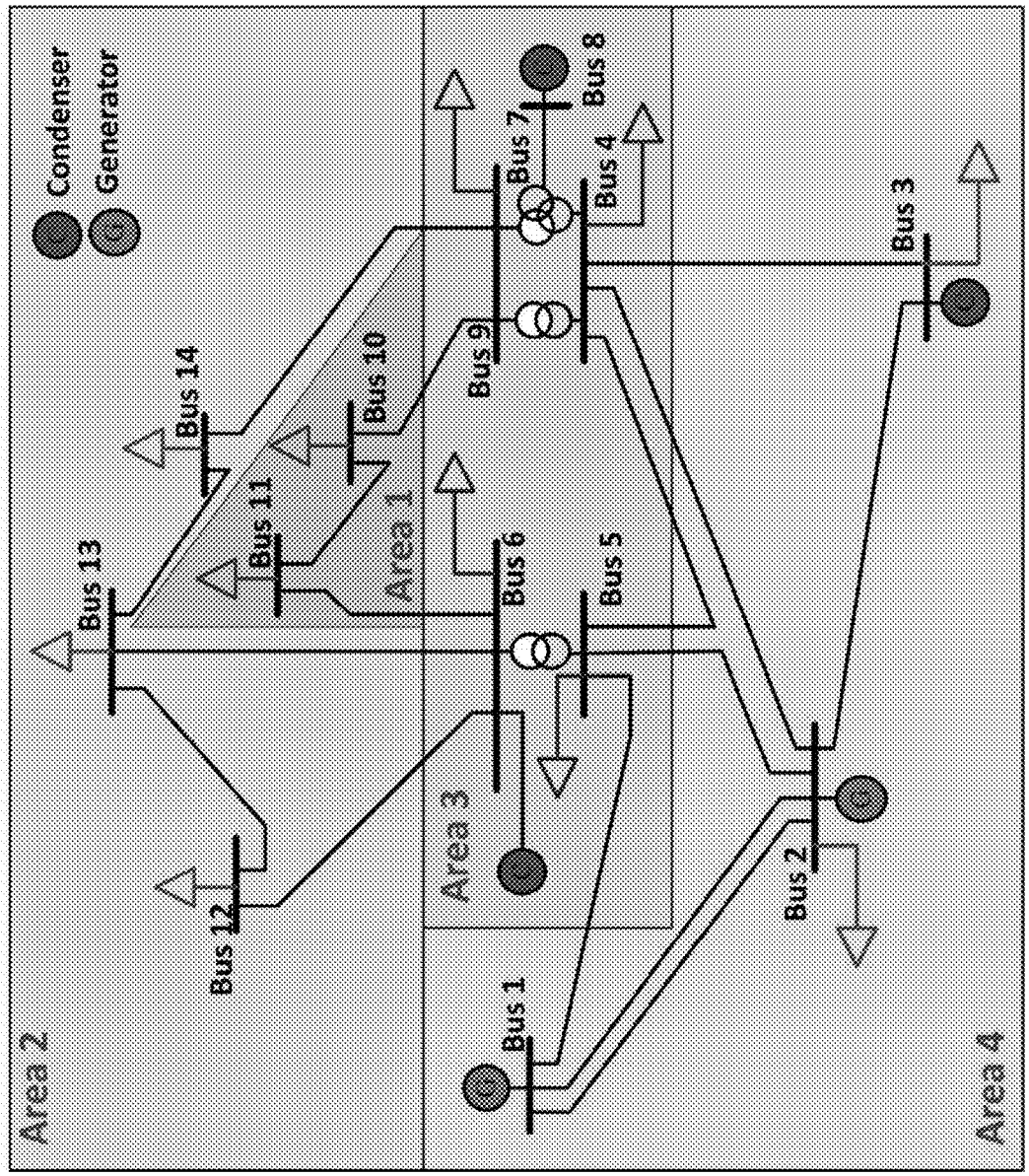
FIG. 16 is a one-line diagram of the demonstrative 14-bus system.

The MDHEM is also demonstrated on the IEEE 14-bus test system. The number and meanings of embedded variables can be defined arbitrarily. Here, we group all buses geographically into 4 areas with respective loading scales $s_1$, $s_2$, $s_3$ and $s_4$, as shown in FIG. 16. Then, a 4-dimensional MDHEM is performed and the result of a $11^{th}$ order 4-D multivariate power series is obtained in 12.56 sec in MATLAB with the error tolerance $1 \times 10^{-8}$ pu. However, it takes 121.01 sec to screen all the 4-D scenarios by using the N-R method in MATLAB.

Figure 17:
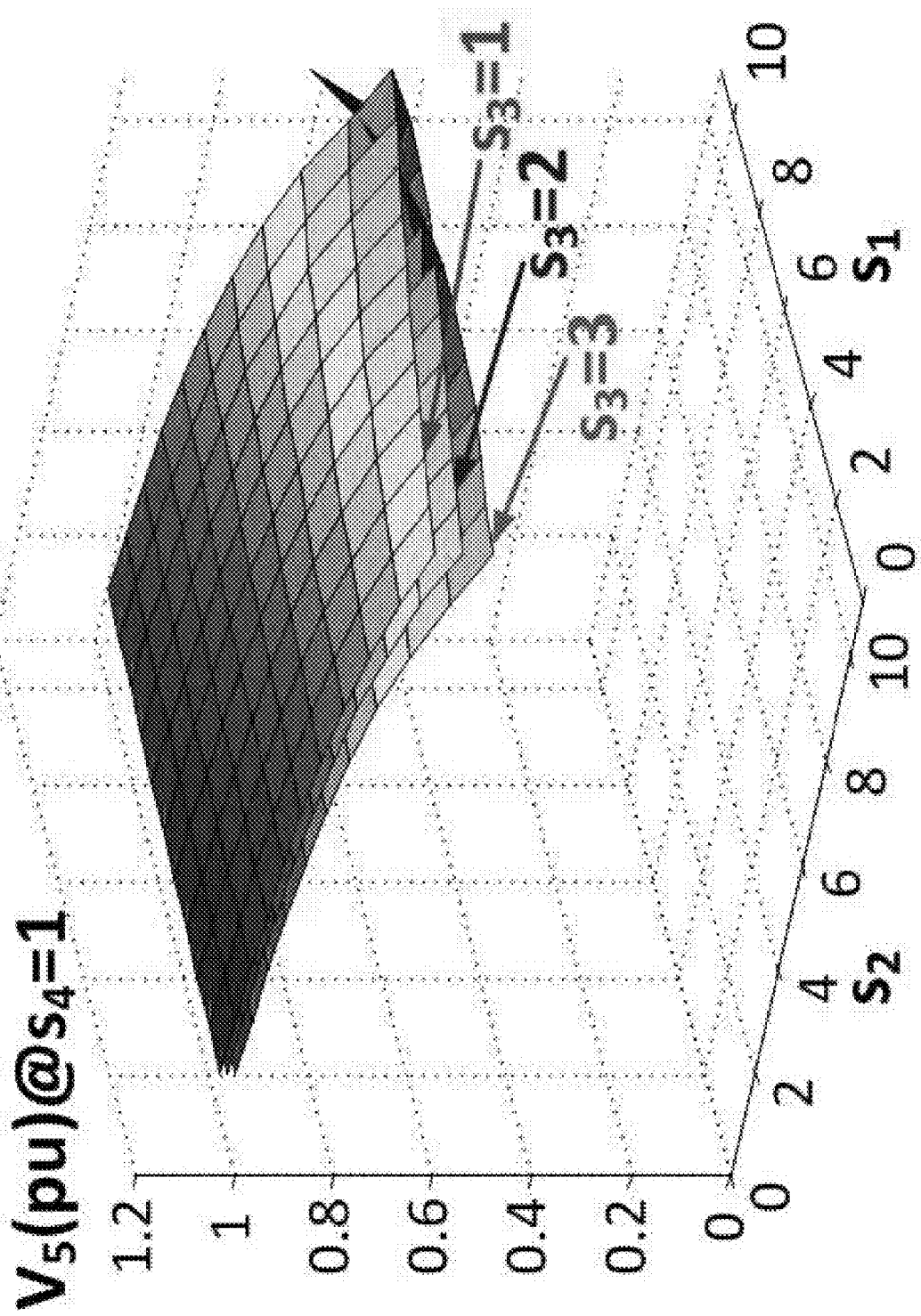
FIG. 17 shows the voltage of Bus 5 with respect to other scales for $s_4=1$.

A load bus, i.e. Bus 5, is arbitrarily selected to observe the voltage with respect to $s_1$, $s_2$, $s_3$ and $s_4$, as shown in FIG. 17. Other bus voltages are similar. Keeping the load of Area 4 unchanged ($s_4=1$), the voltages of load buses decrease with the increase of $s_1$, $s_2$ and $s_3$. Here, we use the X-axis and Y-axis for $s_1$ and $s_2$ respectively, and the different surfaces for $s_3$.

It can also be concluded that although computation speed decreases with the increase of embedded variables, the convergence region does not decrease. This makes the maximum order of multivariate power series manageable.

We have discussed a new multi-dimensional holomorphic embedding method (MDHEM) for solving the power flow equations and the explicit solutions are obtained for all operating conditions in the high-dimensional solution space. The voltage vector and power of each bus can be explicitly expressed by a convergent multivariate power series of all the loads. Compared with the traditional iterative methods for power flow calculations and inaccurate sensitivity analysis method for voltage control, the MDHEM can prepare the algebraic variables of a power system in all operating conditions offline and evaluate them online by only plugging in the values of the required operating conditions into the scales of the non-linear multivariate power series or the MPA. The result of the MDHEM can also predict the reactive power limits for perspective operating conditions in advance, giving operators with enough time to take proactive actions. This method not only provides a tool to obtain the explicit power-flow solutions of any power systems, but may also explore the nonlinearity of power flow equations, e.g. optimal power flow, nonlinear probabilistic power flow.

This new method has been demonstrated on the 4-bus power system and the 14-bus IEEE standard power systems. The error is acceptable and the convergence region can be extended by using multivariate Padé approximants (MPA).

VI. Remote Voltage Control Using the Holomorphic Embedding Load Flow Method

This portion of the paper proposes a remote voltage control method based on the non-iterative HELM, for controlling voltage magnitudes at specified buses in the grid using the local reactive power resources. The remote voltage control concept is firstly embedded into power flow calculations. Then, a general HELM based remote voltage control method utilizing reactive power resources from multiple remote buses is introduced, which applies a matrix of participation factors to distribute reactive power outputs among multiple reactive power resources. The matrix of participation factors is directly integrated into the HELM, succeeding the property of the HELM in terms of the physical meaning guarantee of the converged power flow solutions. The case studies are carried out on the IEEE New England 39-bus system under different conditions. The proposed HELM-based remote voltage control approach is compared with traditional N-R based methods to demonstrate the superiority of the proposed approach in terms of the tractability and convergence performance.

VII. Conventional Holomorphic Embedding Load Flow Method

A. Principle Theory of the HELM

Figure 18:
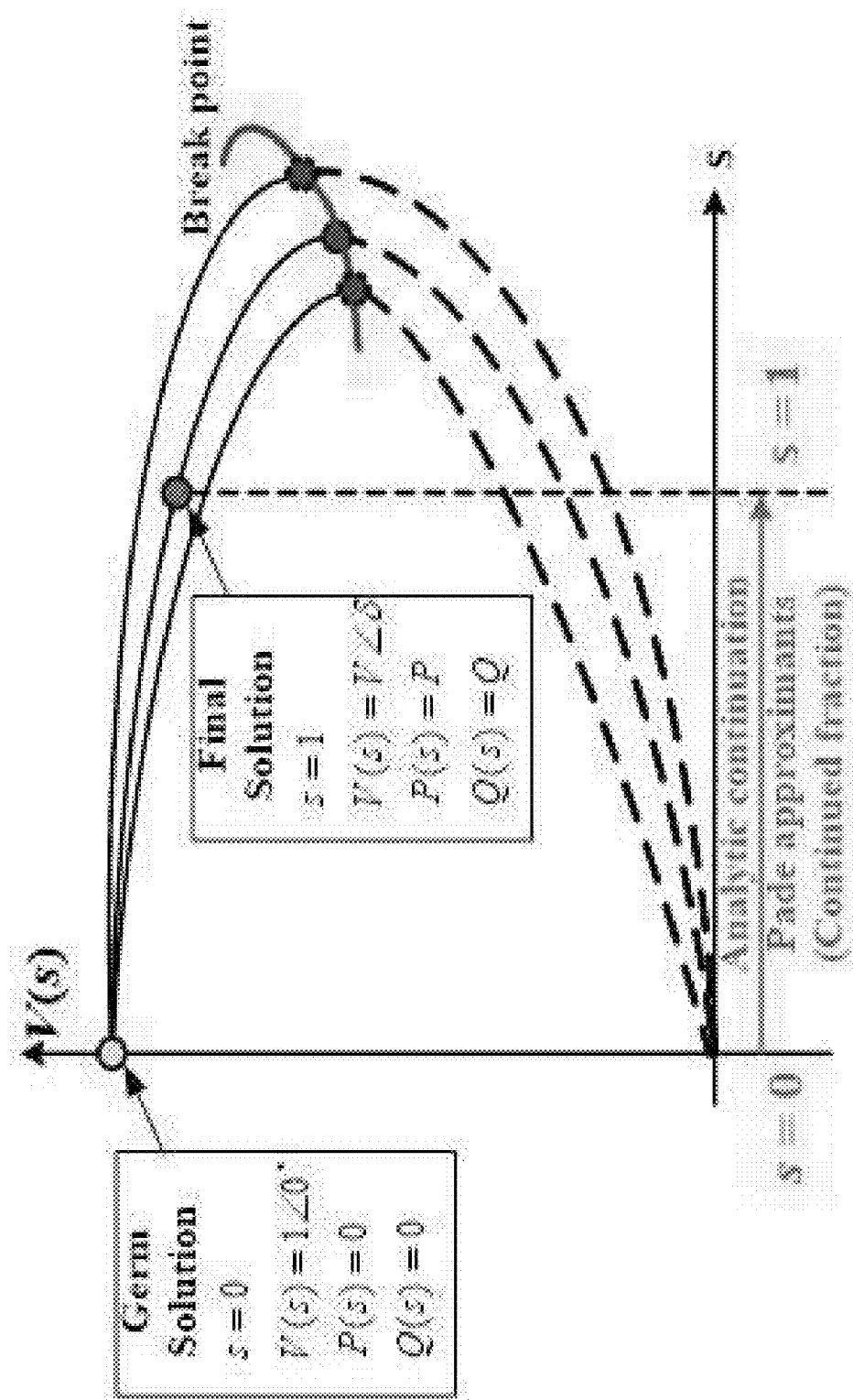
FIG. 18 shows the illustration of the HELM's concept.

As shown in FIG. 18, the concept of using the HELM to solve power flows is to embed a complex variable(s) into the nonlinear PFEs such that in the complex s-plane, an analytical solution is originated from a common germ solution at s=0 and expanded to the objective final solution at s=1 through analytical continuation method. In practice, the process could be summarized as follows:

1) Define a specific holomorphic embedding function for the equations about a complex variable s, such that for s=0 the system has an obvious correct solution, and for s=1, one can recover the original equations.

2) Given this holomorphic embedding, it is now possible to compute univocally power series for voltages as analytic functions of s. The correct power flow solution at s=1 will be obtained by analytic continuation of the known correct solution at s=0.

3) Perform the analytic continuation using the theory of algebraic approximants, which in this case are guaranteed either to converge to the solution if it exists, or not to converge if the solution does not exist (voltage collapse).

In mathematics, a holomorphic function is a complex-valued function about one or more complex variables that is complex-differentiable in the neighborhood of every point in its domain. The holomorphic function is an analytical function that can be represented by a converged power series.

Consider the complex-valued function x(s) of a complex variable s=p+iq, with real part p and imaginary part q. If the embedded function x(p+iq) satisfies Cauchy-Riemann Equation (46), then x(s) is complex-differentiable and thus holomorphic in a neighborhood of the complex s-plane.

$$i\frac{\partial x}{\partial p} = \frac{\partial x}{\partial q} \tag{46}$$

Under this circumstance, x(s) can be represented in the form of power series (47) in s within its convergence region C.

$$x(s) = \sum_{n=0}^{\infty} x[n]s^n, s \subset C \tag{47}$$

In order to solve a nonlinear equation g(x)=0, substitute (47) for x to generate a composite function of embedded variable s:

$$g(x)=g[x(s)]=0 \tag{48}$$

Therefore, the power-flow problem becomes how to design an x(s) satisfying the following four criteria:

1) A common germ solution at s=0 can be found for the equation g[x(s)]=0 (48). For power flow calculation, the germ solution is conventionally designated as the solution under a no-load, no-generation condition.

2) Ensuring that g[x(s)]=0 also holds at s=1 and the power series (47) can be mathematically induced within a defined number of order, through expanding and equating the coefficients of the same order of e in g[x(s)]=0. Thus, the final solution of x is easily obtained by letting s=1 in (47).

3) The s-embedded complex function g[x(s)] is analytically continuous (holomorphic) along the path from the germ solution at s=0 to the final solution at s=1.

4) On the path of s before bifurcation occurs, there is no exceptional point (also called branch point) where multiple solutions of g[x(s)]=0 coalesce with each other. Exceptional points only coincide at the bifurcation point.

B. HELM's Canonical Embedding

Consider an N-bus system composed of PQ buses, PV buses and slack buses, which are denoted as sets of $\mathcal{PQ}$, $\mathcal{PV}$ and $\mathcal{SL}$, respectively. The original PFEs for PQ buses, PV buses and slack buses are expressed as follows, $$\sum_{k=1}^{N} Y_{ik} V_k = \frac{S_i^*}{V_i^*}, \forall i \in \mathcal{PQ} \tag{49}$$

$$\begin{cases} P_i = \mathrm{Re}\left(V_i \sum_{k=1}^{N} Y_{ik}^* V_k^*\right) \\ |V|_i = |V_i^{sp}| \end{cases}, \forall i \in \mathcal{PV} \tag{50}$$

$$V_i = V_i^{SL}, \forall i \in \mathcal{SL} \tag{51}$$

where $P_i$, $Q_i$, $|V_i|$ and $\theta_i$ are the active power injection, reactive power injection, voltage magnitude and phase angle at bus i. $V_k$ is the voltage phasor of bus k adjacent to bus i. $Y_{ik}$ is an element of the admittance matrix about buses i and k. $|V_i^{sp}|$ is the specified voltage magnitude at a PV bus. And, $V_i^{SL}$ is the given voltage of the slack bus.

The HELM's canonical embedding, where the admittance matrix $Y_{ik}$ is split to the transmission admittance matrix, i.e. $Y_{ik}^{tr}$, comprises the series admittance between buses i and k, and the shunt admittance matrix, i.e. $Y_i^{sh}$, composed of the branches charging and shunt admittances at buses i, respectively. Moreover, the voltage of each bus and the reactive power of each PV bus are both represented as power series functions of an embedded complex variable s, denoted by V(s) and Q(s) respectively. Then, the s-embedded equations of PQ buses, PV buses and SL buses in (49)-(51) can be expressed as (52)-(54) respectively. Note that, in order to maintain the holomorphy of V(s), its conjugate [V(s)]* is defined as a separate function V*(s*), not V*(s).

$$\sum_{k=1}^{N} Y_{ik}^{tr} V_k(s) = \frac{sS_i^*}{V_i^*(s^*)} - sY_i^{sh}V_i(s), \forall i \in \mathcal{PQ} \tag{52}$$

$$\begin{cases} \sum_{k=1}^{N} Y_{ik}^{tr} V_k(s) = \frac{sP_i - jQ_i(s)}{V_i^*(s^*)} - sY_i^{sh}V_i(s) \\ V_i(s) V_i^*(s^*) = 1 + (|V_i^{sp}|^2 - 1)s \end{cases}, \forall i \in \mathcal{PV} \tag{53}$$

$$V_i(s) = 1 + (V_i^{SL} - 1)s, \forall i \in \mathcal{SL} \tag{54}$$

TABLE III

THE EMBEDDING OF POWER FLOW EQUATIONS FOR PQ, PV AND SLACK BUSES WITH THE CONVENTIONAL HELM

| Type | Germ Solution (s = 0) | Holomorphic Embedding Method (s = 1 for the original PFEs) |
|---|---|---|
| SL | $V_i(s) = 1$ | $V_i(s) = 1 + (V_i^{SL} - 1)s$ |
| PQ | $\sum_{k=1}^{N} Y_{ik}^{tr} V_k(s) = 0$ | $\sum_{k=1}^{N} Y_{ik}^{tr} V_k(s) = \frac{sS_i^*}{V_i^*(s^*)} - sY_i^{sh}V_i(s)$ |
| PV | $\sum_{k=1}^{N} Y_{ik}^{tr} V_k(s) = 0$ $V_i(s) \cdot V_i^*(s^*) = 1$ | $\sum_{k=1}^{N} Y_{ik}^{tr} V_k(s) = \frac{sP_i - jQ_i(s)}{V_i^*(s^*)} - sY_i^{sh}V_i(s)$ $V_i(s) \cdot V_i^*(s^*) = 1 + (|V_i^{sp}|^2 - 1)s$ |

Referring to the conventional canonical embedding in TABLE III, the voltage at no load condition is assumed to be $1\angle0°$ pu. Under this condition, the voltage at the slack bus propagates to all buses, which results in all voltages being equal to the voltage at the slack bus. The original problem is recovered at s=1, which leads to the voltage changes at all buses.

The unknown voltages and the reactive power injections at PV buses can be expanded to the power series with respect to s, i.e. define the Taylor series for the voltage and the reactive power at PV buses in (55) and (56), respectively. The complex conjugate of voltage reciprocal on the right hand side of (52)-(54) 1/V*(s*) are defined as (57). Eq. (57) is used to convert the polynomial division to the convolution operation, and then to find out the recursive pattern of the complex voltage function with respect to s.

$$V_i(s) = \sum_{n=0}^{\infty} V_i[n]s^n \tag{55}$$

$$Q_i(s) = \sum_{n=0}^{\infty} Q_i[n]s^n \tag{56}$$

$$W_i^*(s) = \frac{1}{V_i^*(s^*)} = \sum_{n=0}^{\infty} W_i^*[n]s^n \tag{57}$$

After substituting (55)-(57) to (52)-(54), the power series coefficients can be obtained by differentiating equations with respect to s at both sides and equating the coefficients of s, $s^2$, ... up to $s^n$ order by order. The procedure is to recursively calculate the unknown variables, i.e. V[n] and Q[n], based on their previous orders coefficients, i.e. V[0]~V[n−1] and Q[0]~Q[n−1].

VIII. Integration of Remote Voltage Control into Power Flow Calculation

A. Remote Voltage Control Based on Traditional N-R Method

The N-R method for solving AC PFEs is an iterative method that linearizes the nonlinear PFEs (58)-(59) at each iteration. Normally, the active power and the reactive power generations and consumptions at PQ buses, the active power generations and the voltage magnitudes at PV buses are given. The iteration starts from initial guesses for unknown network variables and stops if the active power mismatches at PQ and PV buses and the reactive power mismatches at PQ buses are smaller than the error tolerance.

$$P_i = |V_i| \sum_{k=1}^{N} |V_k|(G_{ik} \cos \delta_{ik} + B_{ik} \sin \delta_{ik}) \tag{58}$$

$$Q_i = |V_i| \sum_{k=1}^{N} |V_k|(G_{ik} \sin \delta_{ik} - B_{ik} \cos \delta_{ik}) \tag{59}$$

In (58) and (59), $P_i$ and $Q_i$ are the net active power and the reactive power injections at bus i, respectively. $V_i$ and $V_k$ are the complex bus voltages. $G_{ik}$ and $B_{ik}$ are the conductance and the susceptance between bus i and bus k, respectively. $\delta_{ik}$ is the voltage angle difference between bus i and bus k.

Figure 19:
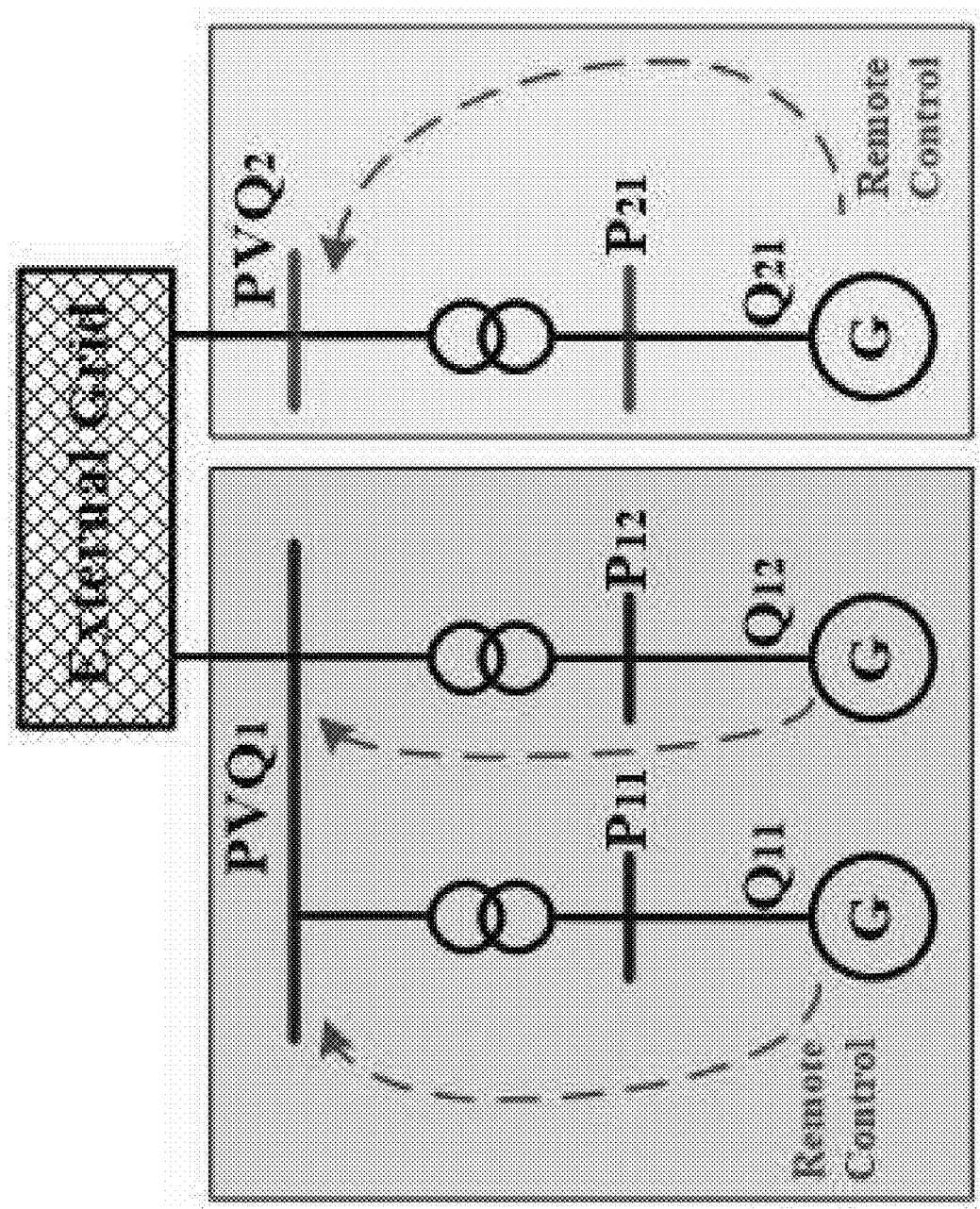
FIG. 19 shows the illustration of generators' remote voltage control functions.

In some practical applications, the voltage magnitudes at some buses are remotely controlled by one generator or a group of generators. As shown in FIG. 19, the bus under control is typically an important load bus, e.g. a pilot bus in the AVC system. In the case of a load bus under remote control, this bus becomes a PVQ bus, as the active power $P_i$, the reactive power $Q_i$ and the voltage magnitude $|V_i|$ are given. The controlling bus that generators are connected with, changes from a PV bus to a P bus, as the generators' reactive power is adjusted according to the needs at the PVQ bus. The voltage magnitudes at P buses are therefore unknown due to the reactive power regulations for maintaining the voltage at the PVQ bus.

In the case that several generators jointly control the voltage at a remote PVQ bus, a participation factor of each generator is specified for the sharing of reactive power outputs among them. Therefore, the PVQ bus and P buses are in groups, i.e. so called "PVQ/P groups", where the voltage magnitudes at PVQ buses are maintained by the corresponding generators at P buses.

The traditional approach based on the N-R method is extended to include the PVQ and P buses. The main extension is to apply the sensitivity of the reactive power output at a PVQ bus with respect to the relevant P bus voltage magnitude in the iteration process. The complete formulation including the new type of buses in the iteration process can be presented by The traditional approach based on the N-R method is extended to include the PVQ and P buses. The main extension is to apply the sensitivity of the reactive power output at a PVQ bus with respect to the relevant P bus voltage magnitude in the iteration process. The complete formulation including the new type of buses in the iteration process can be presented by equation (60) (FIG. 62), $$\begin{bmatrix} \Delta P_m \\ \Delta Q_n \end{bmatrix} = \begin{bmatrix} \frac{\partial P_m}{\partial \delta_{pv}} & \frac{\partial P_m}{\partial \delta_{pq}} & \frac{\partial P_m}{\partial \delta_p} & \frac{\partial P_m}{\partial \delta_{pvq}} & \frac{\partial P_m}{\partial V_{pq}} & \frac{\partial P_m}{\partial V_p} \\ \frac{\partial Q_n}{\partial \delta_{pv}} & \frac{\partial Q_n}{\partial \delta_{pq}} & \frac{\partial Q_n}{\partial \delta_p} & \frac{\partial Q_n}{\partial \delta_{pvq}} & \frac{\partial Q_n}{\partial V_{pq}} & \frac{\partial Q_n}{\partial V_p} \end{bmatrix} \begin{bmatrix} \Delta \delta_{pv} \\ \Delta \delta_{pq} \\ \Delta \delta_p \\ \Delta \delta_{pvq} \\ \Delta V_{pq} \\ \Delta V_p \end{bmatrix}$$

$$m \in \{pv, pq, p, pvq\}$$
$$n \in \{pq, pvq_r, p_{r,2}, \cdots, p_{r,t}, \cdots, p_{r,N_p}\}$$
$$r = 1 \ldots N_{pvq}$$

where m and n represent the index set of the active power and the reactive power gradients and $N_{pvq}$ is the number of PVQ/P groups and $N_p$ is the number of P buses in each PVQ/P groups. The active power mismatches at all buses expect for the slack bus are included in m, whereas the reactive power mismatches only at PQ buses, PVQ buses and P buses are included in n.

A participation factor matrix $K_r$ is specified for the sharing percentages of reactive power outputs among generators in the $r^{th}$ PVQ/P group. Hence, after each iteration, the reactive power generation among generators needs for re-dispatch according to the participation factor matrix. For the $n^{th}$ iteration, the reactive power generation is calculated based on the results of the $(n-1)^{th}$ iteration, as defined in (61), $$Q_{r1}[n] = K_r \sum_{t=1}^{N_p} (Q_{rt}[n-1] + \Delta Q_{rt}[n]) \text{ and } r = 1 \cdots N_{pvq} \quad (61)$$

$$K_r = \begin{bmatrix} \kappa_{r,1} & & & \\ & \ddots & & \\ & & \kappa_{r,t} & \\ & & & \ddots \\ & & & & \kappa_{r,N_p} \end{bmatrix} \quad (62)$$

In (61) and (62), r is the group index in the list of all PVQ/P groups, and t is the index of P buses at certain PVQ/P groups. $K_r$ is the participation factor for the rth PVQ/P group (62), where $$\sum_{t=1}^{N_p} \kappa_{r,t} = 1 \quad (63)$$

The reactive power mismatches at the other P buses of the rth PVQ/P group, i.e. $Q_{r2}[n]$ to $Q_{rt}[n]$, are found after the updating process via the participation factor $K_r$.

Figure 20:
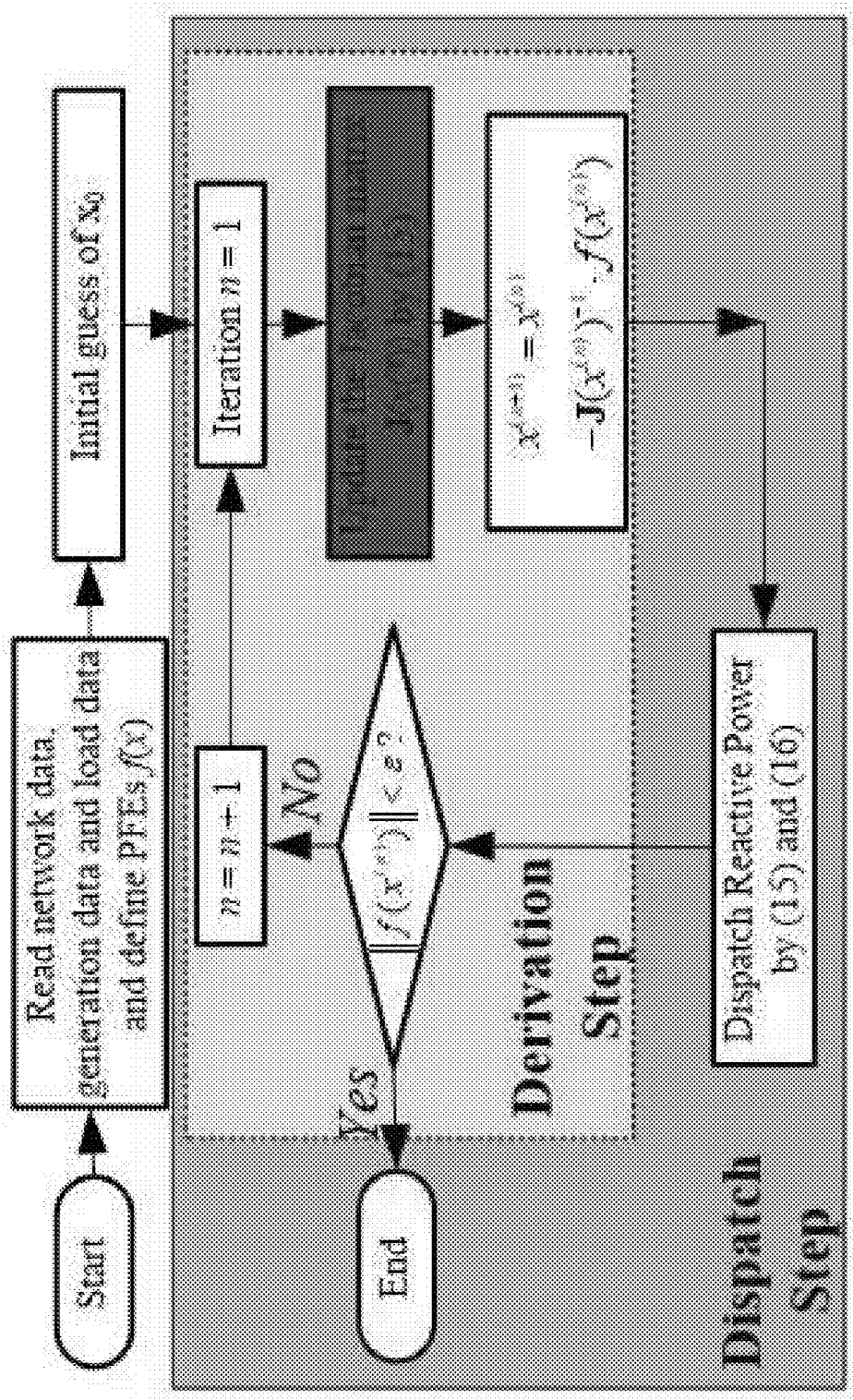
FIG. 20 shows the block diagram of joint remote voltage control based on N-R method.

In summary, the joint remote voltage control algorithm based on the N-R method is separated into an inner loop and an outer loop, as shown in FIG. 20. The inner loop calculates the sensitivity and obtains the power mismatch. While the outer loop re-dispatches the reactive power generation among generators in the PVQ/P group. The process of re-dispatch destructs its quadratic convergence rate.

B. Remote Voltage Control Based on the HELM

In the HELM, all the constraints can be integrated into the matrix equations regarding the unknown values, there is no need of additional loop for constraints. As mentioned above, the PQ buses under remote voltage control are converted to PVQ buses. Meanwhile, the buses connected with reactive power resources are changed to P buses, accordingly. The PVQ buses and P buses are in groups. The supplementary equations to include the so called PVQ/P groups in HELM are presented in (64)-(65), where $\mathcal{PVQ}$ and $\mathcal{P}$ represent sets of PVQ buses and P buses respectively.

$$\begin{cases} \sum_{k=1}^{N} Y_{ik}^{tr} V_k(s) = s\frac{P_i - jQ_i}{V_i^*(s^*)} - sY_i^{sh}V_i(s) \\ V_i(s)V_i^*(s^*) = 1 + (|V_i^{sp}|^2 - 1)s \end{cases}, \forall i \in \mathcal{PVQ} \quad (64)$$

$$\sum_k Y_{ik}^{tr} V_k(s) = s\frac{P_i - j\kappa_i \sum_t Q_i(s)}{V_i^*(s^*)} - sY_i^{sh}V_i(s), \forall i \in \mathcal{P} \quad (65)$$

The active power and the reactive power at PVQ buses are known values. Compared with the PQ bus in Eq. (52), there is one more constraint at PVQ bus, i.e. the specified voltage magnitude in (64). This constraint is maintained by the reactive powers at P buses. The total required reactive power, i.e. $\Sigma Q_i(s)$ to maintain the voltage at the PVQ buses are distributed among the associated P buses with the predefined contribution factor $\kappa_i$ for each PVQ/P group, as defined in (65), by equating the coefficients of power series with respect to s on both sides and assuming $V_i[0]=1\angle 0°$ for the no load condition. The reactive power at P buses defined as new variables will be varied to control the voltage magnitudes at corresponded PVQ buses, with a contribution factor in order to obtain a unique solution.

C. Calculation Procedure

The complete formulations of the embedded power flow equations are presented in (52)-(54) and (64)-(65). The power series can be applied to expand the unknown variables to the power series with respect to s, and then to equate both sides of the complex-valued equations with the same order to solve the coefficients of power series terms. Similar to the mathematical induction method, the calculation of the power series coefficients is carried out order by order, i.e. from the low orders to high orders. The calculation procedure of remote voltage control in the HELM consists of the following four steps.

Step 1: For the order of power series n=0;

Similar to the "flat-start" in N-R method, assume the germ voltage at slack bus is $V_i^{SL}[0]=1\angle 0°$ for no load condition. Then the voltages at all buses are equal to $V_i^{SL}$. As shown in (66) and (67), for the germ solution, all the bus voltages in the network equal to 1, and the reactive powers at P buses and PV buses are 0.

$$V_i[0]=1, \forall i \in \mathcal{N} \tag{66}$$

$$Q_i[0]=0, \forall i \in \mathcal{P} \cup \mathcal{PV} \tag{67}$$

where $\mathcal{N}$ is the set of all buses in the system.

Step 2: For the order of power series n=1;

Differentiating the power flow equation with respect to s at both sides, evaluating at s=0, and substituting the calculated coefficients from Step 1, (68)-(73) are obtained.

Slack bus:

$$V_i[1] = V_i^{SL} - 1, \forall i \in \mathcal{SL} \tag{68}$$

PV buses:

$$\begin{cases} \sum_{k=1}^{N} Y_{ik}^{tr} V_k[1] = P_i - Y_i^{sh} \\ V_{i,re}[1] = \dfrac{|V_i^{sp}|^2 - 1}{2} \end{cases}, \forall i \in \mathcal{PV} \tag{69}$$

PQ buses:

$$\sum_{k=1}^{N} Y_{ik}^{tr} V_i[1] = (P_i - jQ_i) - Y_i^{sh}, \forall i \in \mathcal{PQ} \tag{70}$$

PVQ buses:

$$\begin{cases} \sum_{k=1}^{N} Y_{ik}^{tr} V_k[1] = P_i - jQ_i - Y_i^{sh} \\ V_{i,re}[1] = \dfrac{|V_i^{sp}|^2 - 1}{2} \end{cases}, \forall i \in \mathcal{PVQ} \tag{71}$$

P buses:

$$\sum_{k=1}^{N} Y_{ik}^{tr} V_i[1] = P_i - Y_i^{sh}, \forall i \in \mathcal{P} \tag{72}$$

All buses:

$$W_i[1] = -W_i[0] = -1, \forall i \in \mathcal{N} \tag{73}$$

Step 3: For the order of power series n>1;

Continuously calculate finite numbers of orders using (74)-(79) until the active power mismatches at all buses except the slack bus, and the reactive power mismatches at PQ and PVQ buses are respectively smaller than a pre-defined error tolerance.

Slack bus:

$$V_i[n] = 0, \forall i \in \mathcal{SL} \tag{74}$$

PV buses:

$$\begin{cases} \sum_{k=1}^{N} Y_{ik}^{tr} V_k[n] = P_i W_i^*[n-1] - j\left(\sum_{\tau=1}^{n-1} Q_i[\tau] W_i^*[n-\tau]\right) \\ \quad - Y_i^{sh} V_i[n-1] - jQ_i[n] \\ V_{i,re}[n] = -\dfrac{1}{2}\left(\sum_{\tau=1}^{n-1} V_i[\tau] V_i^*[n-\tau]\right) \end{cases}, \forall i \in \mathcal{PV} \tag{75}$$

PQ buses:

$$\sum_{k=1}^{N} Y_{ik}^{tr} V_i[n] = (P_i - jQ_i) W_i^*[n-1] - Y_i^{sh} V_i[n-1], \forall i \in \mathcal{PQ} \tag{76}$$

PVQ buses:

$$\begin{cases} \sum_{k=1}^{N} Y_{ik}^{tr} V_i[n] = (P_i - jQ_i) W_i^*[n-1] - Y_i^{sh} V_i[n-1] \\ V_{i,re}[n] = -\dfrac{1}{2}\left(\sum_{\tau=1}^{n-1} V_i[\tau] V_i^*[n-\tau]\right) \end{cases}, \forall i \in \mathcal{PVQ} \tag{77}$$

P buses:

$$\sum_{k=1}^{N} Y_{ik}^{tr} V_k[n] = P_i W_i^*[n-1] - j\left(\sum_{\tau=1}^{n-1} Q_i[\tau] W_i^*[n-\tau]\right) - Y_i^{sh} V_i[n-1] - jQ_i[n], \forall i \in \mathcal{P} \tag{78}$$

All buses except for the slack bus:

$$W_i[n] = -\sum_{\tau=0}^{n-1} \dfrac{W_i[\tau] \cdot V_i[n-\tau]}{V_i[0]}, \forall i \in \overline{\mathcal{SL}} \tag{79}$$

The real pa0.rt of the voltage variables at PV and PVQ buses in (69) and (71) for n=1, and (75) and (77) for n>1. For demonstration, the above equations regarding the voltage magnitude constraints are derived in Appendix D.

Since the reactive power Q(s) at PV buses and P buses are real valued, the matrix equations (75)-(78) are separated into real and imaginary parts, respectively. The admittance matrix is also separated into real and imaginary parts, as shown in (80).

$$\Sigma Y^{tr} V = \Sigma((G^{tr} V_{re} - B^{tr} V_{im}) + j(B^{tr} V_{re} - G^{tr} V_{im})) \tag{80}$$

Finally, Eq. (75)-(78) can be represented in (86), where the unknown reactive power injections at PV and PVQ buses are moved to the left hand side of the matrix equation, whereas the known voltage real parts at PV and PVQ buses are moved to the right hand side.

In (86), $\mathcal{PQ}[n-1]$, $\mathcal{PV}[n-1]$, $\mathcal{PVQ}[n-1]$ and $\mathcal{P}[n-1]$ represent the following (81), (82), (83) and (84) respectively. The unknowns $Q_{pv}[n]$ and $Q_p[n]$ are moved to the left hand side of (86).

$$\mathcal{PQ}[n-1] = (P_i - jQ_i)W_i^*[n-1] - Y_i^{sh}V_i[n-1] \tag{81}$$

$$\mathcal{PV}[n-1] = P_iW_i^*[n-1] - j\left(\sum_{\tau=1}^{n-1} Q_i[\tau]W_i^*[n-\tau]\right) - Y_i^{sh}V_i[n-1] \tag{82}$$

$$\mathcal{PVQ}[n-1] = (P_i - jQ_i)W_i^*[n-1] - Y_i^{sh}V_i[n-1] \tag{83}$$

$$\mathcal{P}[n-1] = P_iW_i^*[n-1] - j\left(\sum_{\tau=1}^{n-1} Q_i[\tau]W_i^*[n-\tau]\right) - Y_i^{sh}V_i[n-1] \tag{84}$$

In (86) (FIG. 63), $I_{pv,pv}$ is an identity matrix. $Q_p[n]$ represents the total required reactive power at the corresponding P buses to maintain the voltage magnitude at the associated PVQ buses. $K_{p,pvq}$ is the participation factor matrix for all the $N_{pvq}$ PVQ/P groups, which is presented in form of (85). For calculating the $n^{th}$ order coefficients, the individual reactive power injection at each P bus, i.e. $Q_{p1}[n]$, $Q_{p2}[n]$, ..., $Q_{pN}[n]$, is directly obtained via (61).

order, which theoretically reduce the calculation burden needed in N-R method for updating the Jacobian matrix at each iteration. Moreover, it does not require a separate loop to dispatch the reactive power contributions among different reactive power resources for the PVQ/P groups.

Figure 22:
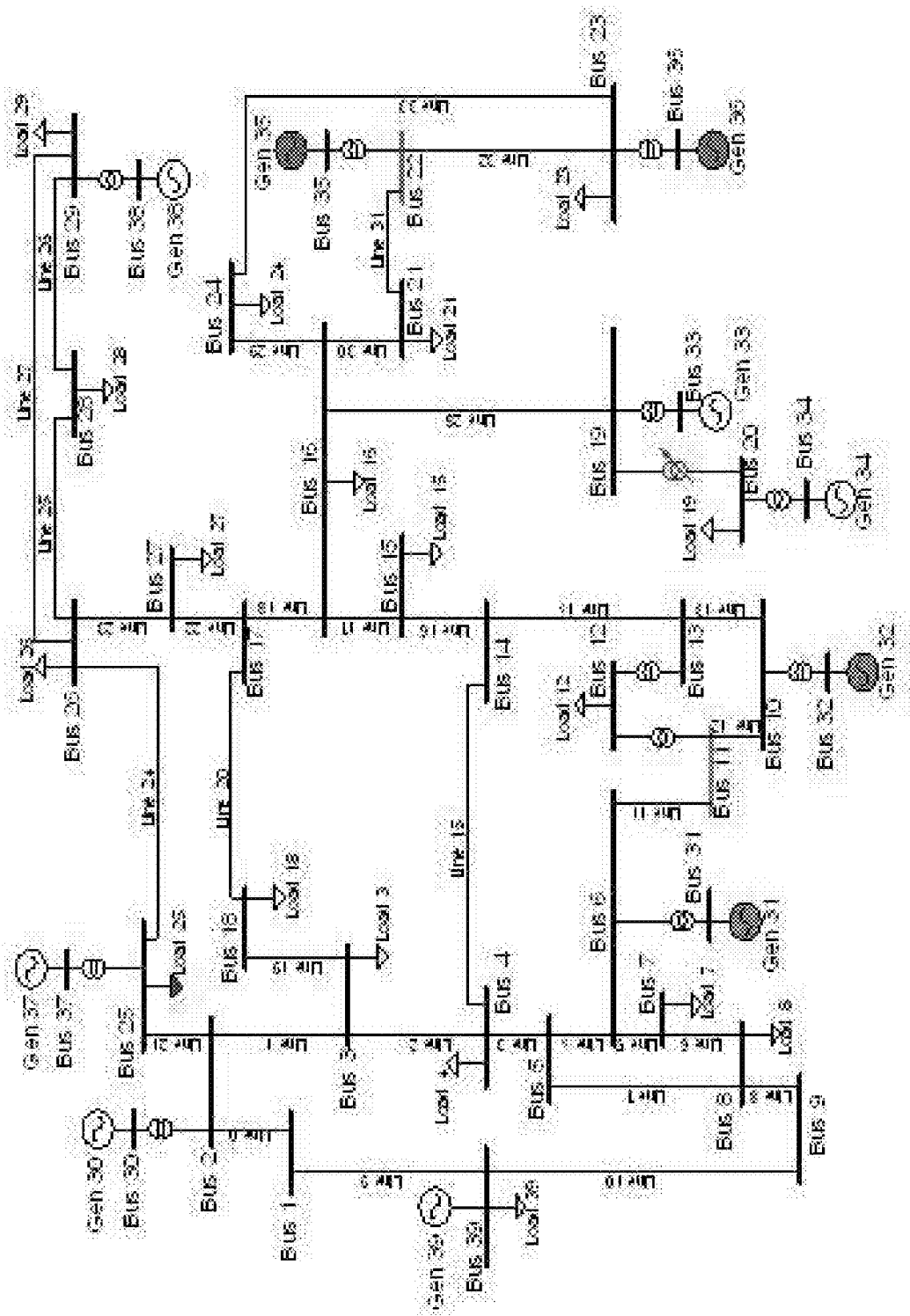
FIG. 22 shows the IEEE New England 39-bus system modified for the case studies.

The proposed HELM-based remote voltage control is tested on the IEEE New England 39-bus system, as shown in FIG. 22. The system is modified to have two remote voltage controllers (two PVQ/P groups). Gen 31 and Gen 32 remotely control the voltage magnitude at Bus 11 and Gen 35 and Gen 36 remotely control the voltage magnitude at Bus 22, marked as Blue and Green respectively in FIG. 22. The elements in the participation matrix is $\kappa_{1,1}=0.468$, $\kappa_{1,2}=0.532$, $\kappa_{2,1}=0.537$ and $\kappa_{1,2}=0.463$. Other generators control the voltage magnitudes of their terminal buses. Bus 39 is the slack bus.

Case studies are carried out using the HELM programmed in the MATPOWER 4.1 on a laptop with an Intel® Core i7-4600M dual 2.9 GHz processor and 16 GB RAM. For the $$K_{p,pvq} = \begin{bmatrix} K_1 & & & & \\ & K_2 & & & \\ & & \ddots & & \\ & & & K_t & \\ & & & & \ddots \\ & & & & & K_{N_{pvq}} \end{bmatrix}^{N_p \times N_{pvq}}$$

$$\begin{bmatrix} G_{pq,pq} & -B_{pq,pq} & -B_{pq,pv} & 0 & B_{pq,pvq} & 0 & G_{pq,p} & -B_{pq,p} \\ B_{pq,pq} & G_{pq,pq} & G_{pq,pv} & 0 & G_{pq,pvq} & 0 & B_{pq,p} & G_{pq,p} \\ B_{pv,pq} & G_{pv,pq} & G_{pv,pv} & I_{pv,pv} & G_{pv,pv} & 0 & B_{pv,p} & G_{pv,p} \\ G_{pv,pq} & -B_{pv,pq} & -B_{pv,pv} & 0 & -B_{pv,pvq} & 0 & G_{pv,p} & -B_{pv,p} \\ B_{pvq,pq} & G_{pvq,pq} & G_{pvq,pv} & 0 & G_{pvq,pvq} & 0 & B_{pvq,p} & G_{pvq,p} \\ G_{pvq,pq} & -B_{pvq,pq} & -B_{pvq,pv} & 0 & -B_{pvq,pvq} & 0 & G_{pvq,p} & -B_{pvq,p} \\ G_{p,pq} & -B_{p,pq} & -B_{p,pv} & 0 & -B_{p,pvq} & 0 & G_{p,p} & -B_{p,p} \\ B_{p,pq} & G_{p,pq} & G_{p,pv} & 0 & G_{p,pvq} & K_{p,pvq} & B_{p,p} & G_{p,p} \end{bmatrix}$$

$$\begin{bmatrix} V_{pq,re}[n] \\ V_{pq,im}[n] \\ V_{pv,im}[n] \\ Q_{pv}[n] \\ V_{pvq,im}[n] \\ Q_p[n] \\ V_{p,re}[n] \\ V_{p,im}[n] \end{bmatrix} = \begin{bmatrix} \text{Re}(\mathcal{PQ}[n-1]) \\ \text{Im}(\mathcal{PQ}[n-1]) \\ \text{Im}(\mathcal{PV}[n-1]) \\ \text{Re}(\mathcal{PV}[n-1]) \\ \text{Im}(\mathcal{PVQ}[n-1]) \\ \text{Re}(\mathcal{PVQ}[n-1]) \\ \text{Re}(\mathcal{P}[n-1]) \\ \text{Im}(\mathcal{P}[n-1]) \end{bmatrix} - \begin{bmatrix} G_{pq,pv} \\ B_{pq,pv} \\ B_{pv,pv} \\ G_{pv,pv} \\ B_{pvq,pv} \\ G_{pvq,pv} \\ G_{p,pv} \\ B_{p,pv} \end{bmatrix} \cdot V_{pv,re}[n] - \begin{bmatrix} G_{pq,pvq} \\ B_{pq,pvq} \\ B_{pv,pvq} \\ G_{pv,pvq} \\ B_{pvq,pvq} \\ G_{pvq,pvq} \\ G_{p,pvq} \\ B_{p,pvq} \end{bmatrix} \cdot V_{pvq,re}[n]$$

Figure 21:
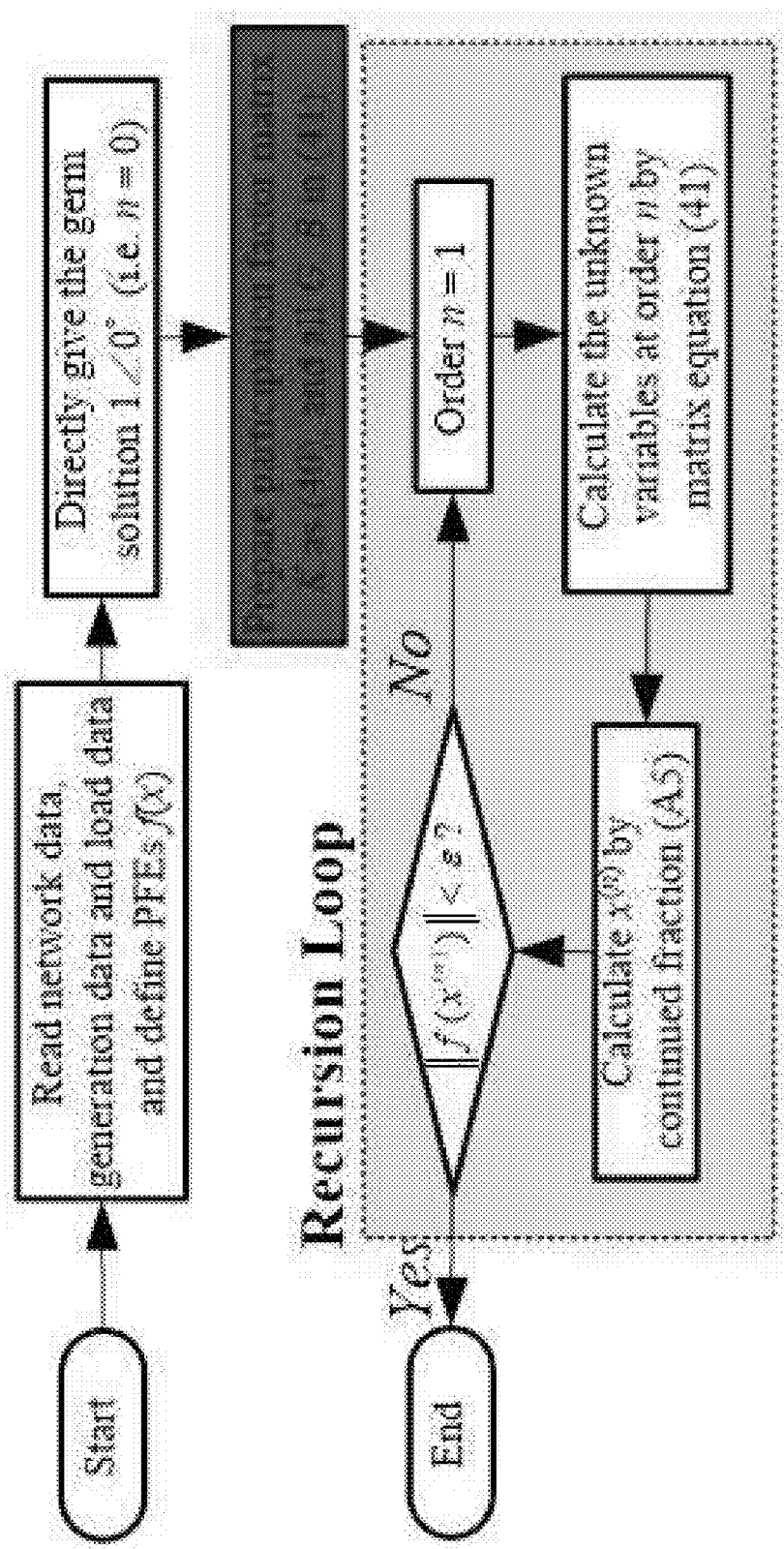
FIG. 21 shows the block diagram of joint remote voltage control based on the HELM.

Step 4: Extending the convergence region to obtain the values;

As long as coefficients of a new order of the power series are obtained, the variables can be found by summation of their power series. However, this approach might be limited by the radius of convergence of the series. Therefore, Padé approximants, or continued fraction are applied to obtain the maximum convergence radius of the power series. In this study, three-term recursion form derived from the normalized Viskovatov method is applied, which is presented in Appendix E. FIG. 21 shows the block diagram of remote voltage control based on the HELM. Comparing to FIG. 20, this approach does not update the impedance matrix at each sake of simplification, no reactive power limits of the generators are taken into account in the case studies. If reactive power limits are considered, the HELM-based remote voltage control needs to be rebuilt and resolved with altered bus types as the reactive power is exhausted at a certain P bus.

A. Simulations with the HELM

In the study case, the active power consumption at Bus 25 is gradually increased from 224 MW until the power flow calculation fails to converge. Every incremental step is 100 MW. The HELM is adopted to find the power flow solution for every scenario with power mismatches of all buses less than a tolerance of $1\times10^{-5}$. If the largest power mismatch cannot meet the tolerance within 60 orders, then it is considered to be a non-convergence case.

Figure 23:
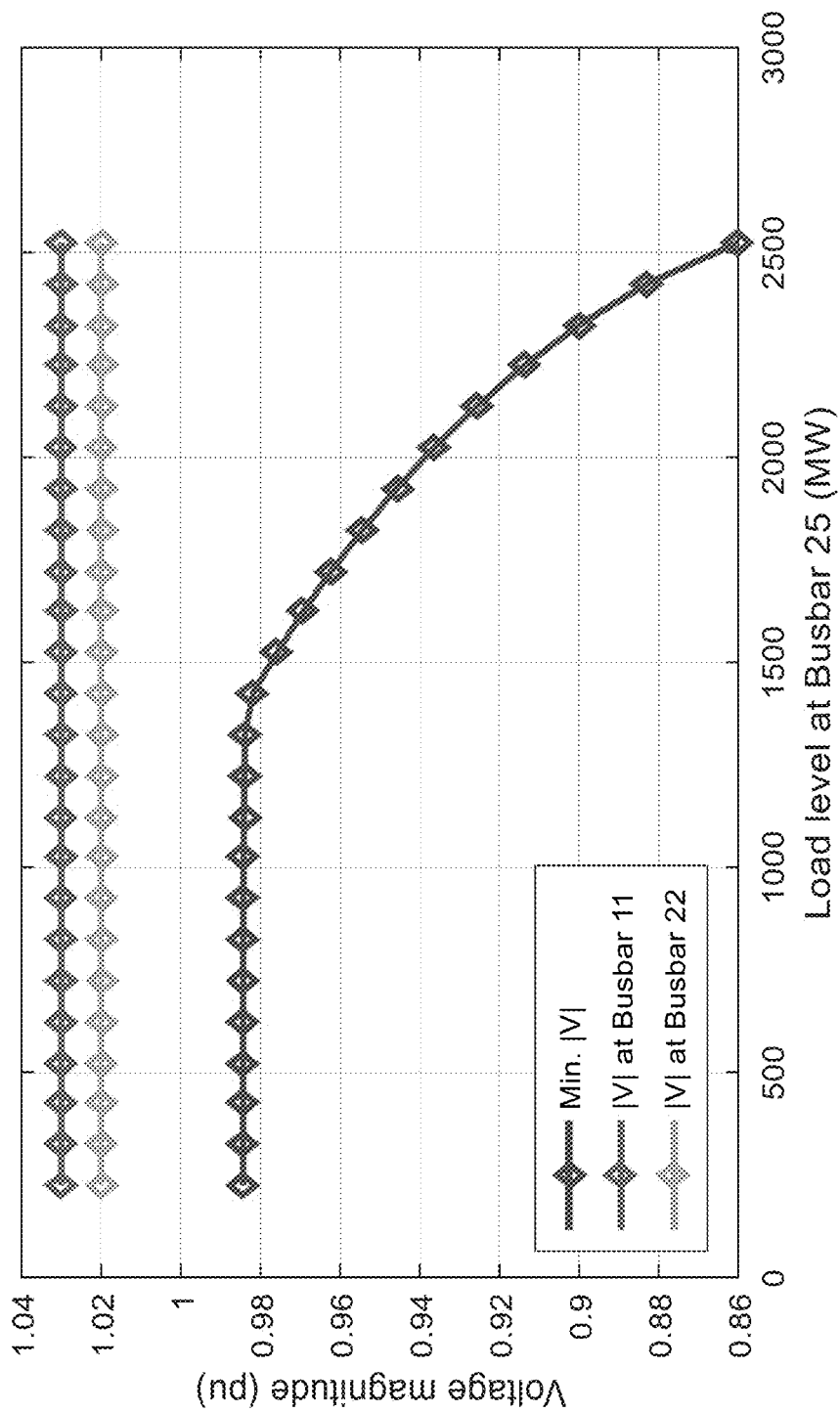
FIG. 23 shows the voltage magnitudes as the load increases at Bus 25.

As shown in FIG. 23, the system voltage collapses when the load at Bus 25 increases beyond 2500 MW. In the HELM, the calculations start from the germ solution $1\angle 0°$ pu. without an initial guess. For all different load levels at Bus 25, the voltage magnitudes at PVQ buses, i.e. Bus 11 and Bus 22, are kept constant due to the remote voltage control functions.

Figure 24:
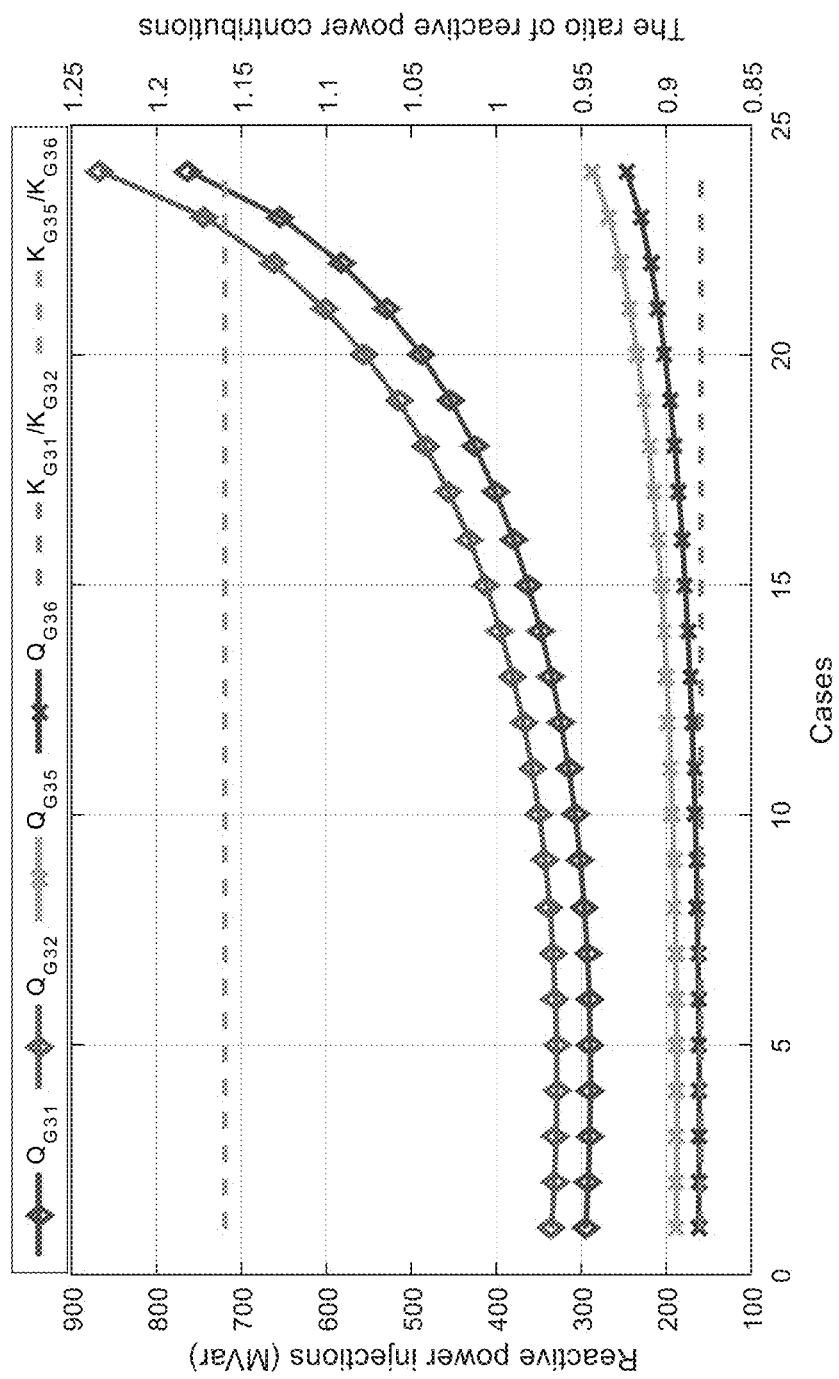
FIG. 24 shows the reactive power contribution at P buses to control the voltage magnitudes at the corresponding PVQ buses.

The reactive power outputs from P buses, Gen 31, Gen 32, Gen 35 and Gen 36 are shown in FIG. 24. Their reactive power contributions are predefined by participation factors, i.e. 1.16 for the ratio of Gen 31 to Gen 32 and 0.88 for the ratio of Gen 35 to Gen 36, respectively. The participation factors are kept constant for all scenarios. It demonstrates that the reactive power contributions from different P buses controlling the corresponding PVQ buses are controlled as expected.

Figure 25:
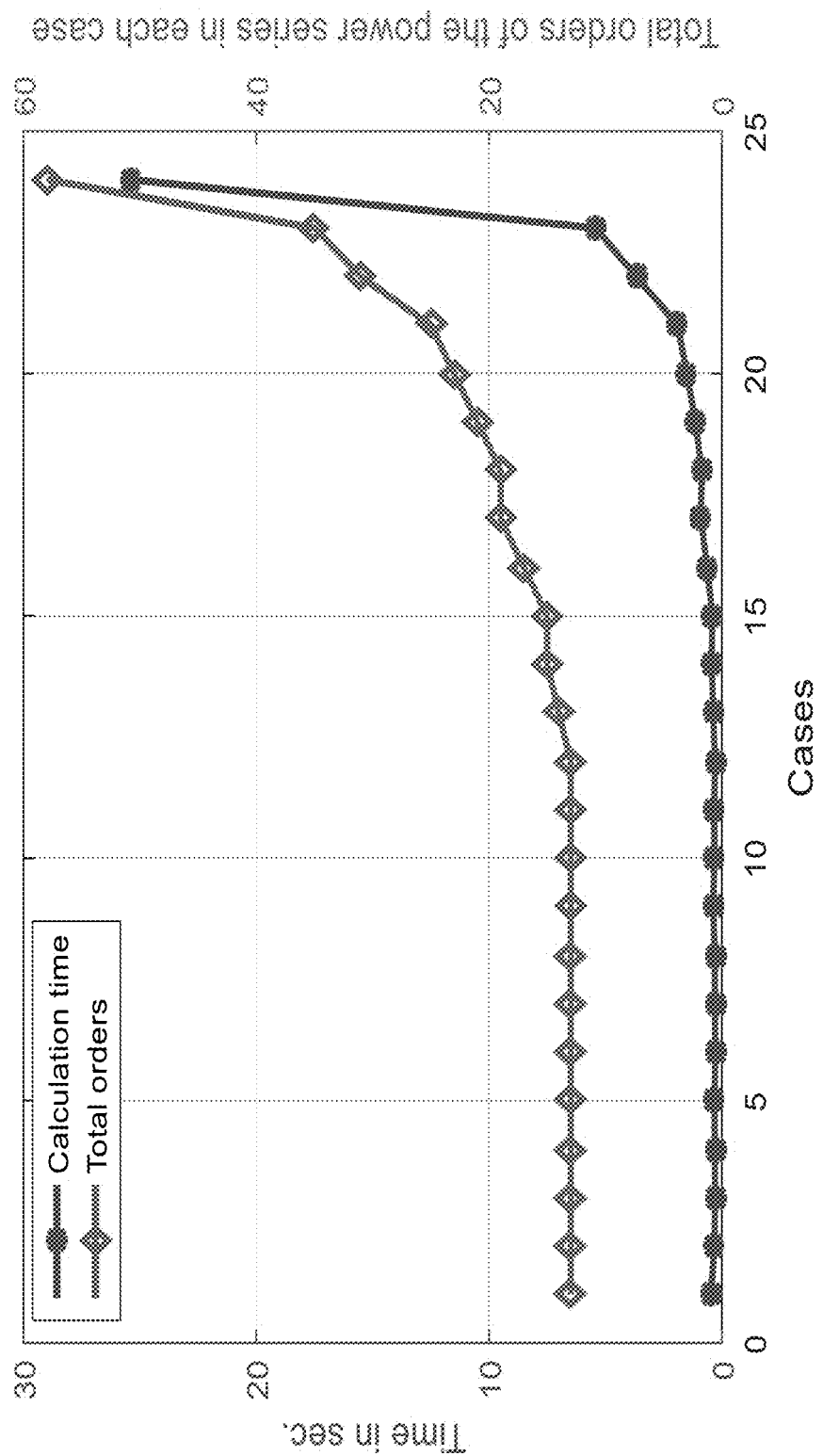
FIG. 25 shows the total required power series orders to solve the power flow equations and the calculation time consumptions for the HELM.

FIG. 25 shows the total required orders of power series to converge to the power flow solution with the error tolerance $1\times 10^{-5}$. It can be observed that more and more power series orders are needed when the system is approaching to the break point. The calculation time is also increased with the increase of load level. However, the convergence process can be much faster and much less power series orders are needed if transferring the power series into continued fractions, introduced in Appendix-E.

B. Remote Voltage Control Using HELM vs. N-R Method

As discussed in previous sections, once the coefficients are found, either the summation of the power series at $s=1$ or the continued fractions can be applied to obtain the values of system states, e.g. $V_i$ and $Q_i$.

Figure 26:
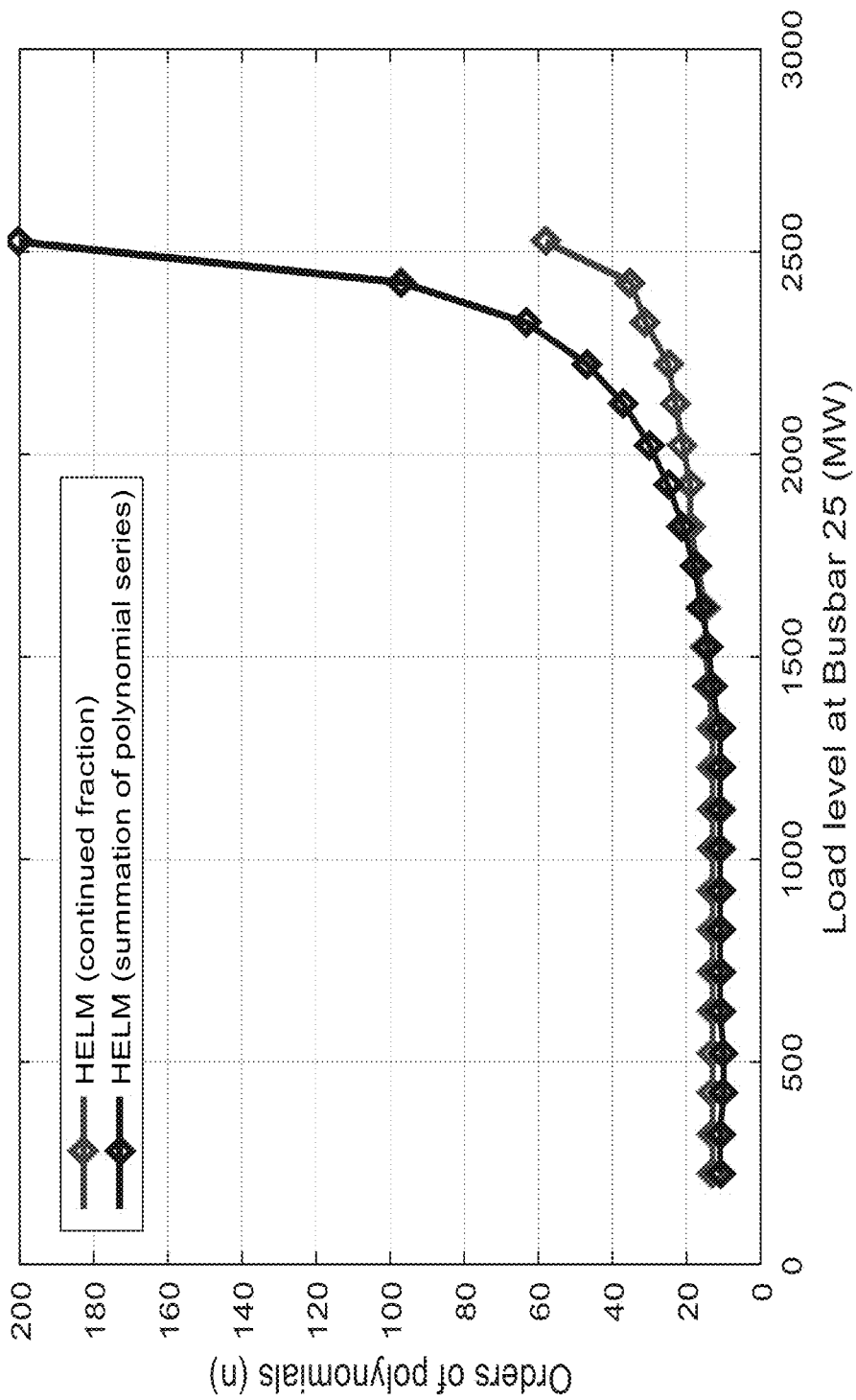
FIG. 26 shows the required orders of summation of the power series vs. the continued fractions with the same error tolerance, i.e. 1×10–5.

FIG. 26 compares the required orders of power series and that of the continued fractions for a converged solution for various scenarios. As the active power consumption at Bus 25 increases towards 2500 MW, the system is approaching the critical point. More and more power series orders are needed to obtain the converged solutions. For the low load scenarios, i.e. the active power consumption at Bus 25 lower than 1700 MW, the summation of power series is more efficient to obtain the solutions. In contrast, for the high load scenarios, the continued fraction is more preferable to obtain the solutions with fewer orders than the direct summation.

As introduced in Section VIII, the HELM is superior to the iterative methods in its independence of initial guess. Meanwhile, the HELM can mathematically guarantee the convergence to a set of meaningful power flow solutions (e.g. the upper operative solutions) from a given germ solution $1\angle 0°$ pu.

Figure 27:
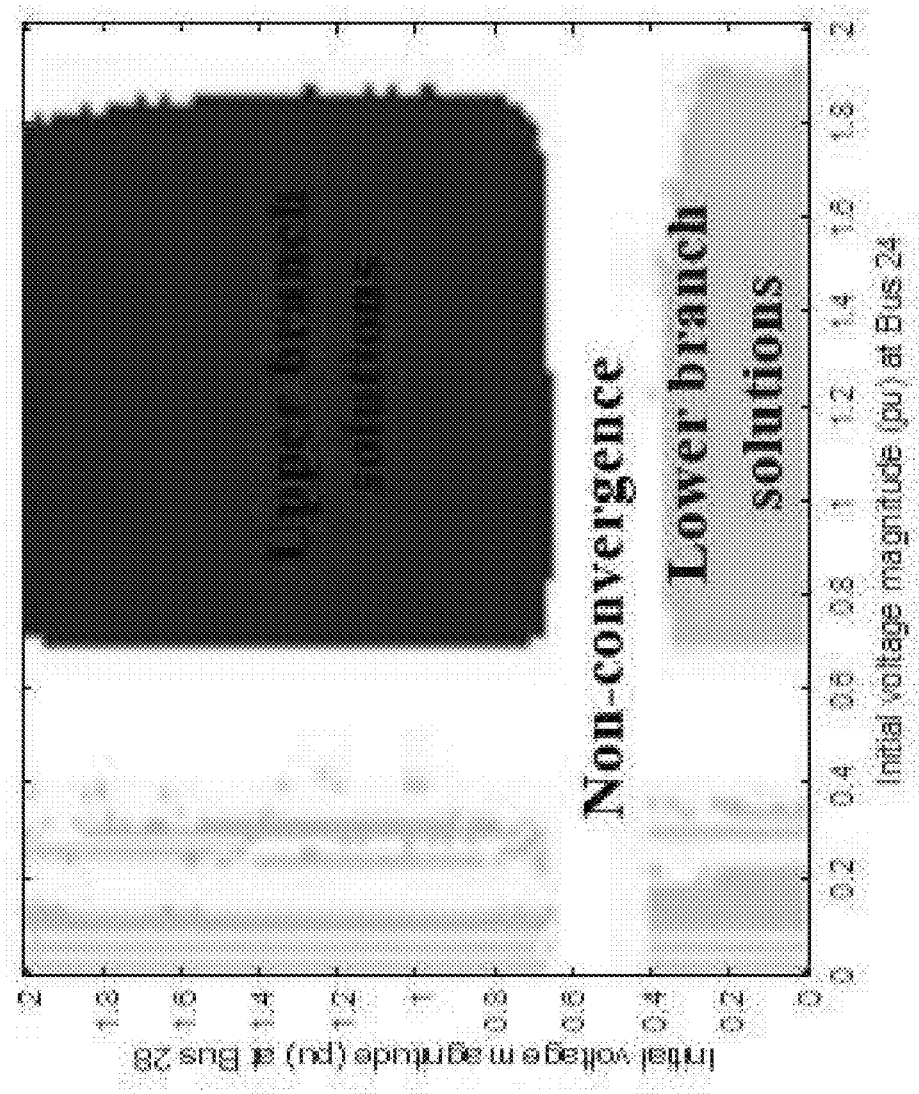
FIG. 27 Case A: shows the convergence map of different initial points for total 101×101 power flow calculations based on the N-R method in the test grid. Red: upper-branch solutions; Green: lower-branch solutions; White: non-convergence region.

Case A is the basic operating condition. FIG. 27 shows the map of convergence by N-R method with respect to different initial guesses. Each pixel in the map represents a power flow calculation with different initial voltage magnitudes at Bus 24 and Bus 28, which vary from 0 to 2 pu. with 0.02 pu. intervals, so a total number of 101×101 power flow calculations are carried out. Initial points from the red region can converge to the meaningful solutions on the upper-branch of P-V curves, while that from the green region converges to the meaningless solutions on the low-branch of P-V curves. White region is the non-convergence region.

Figure 28:
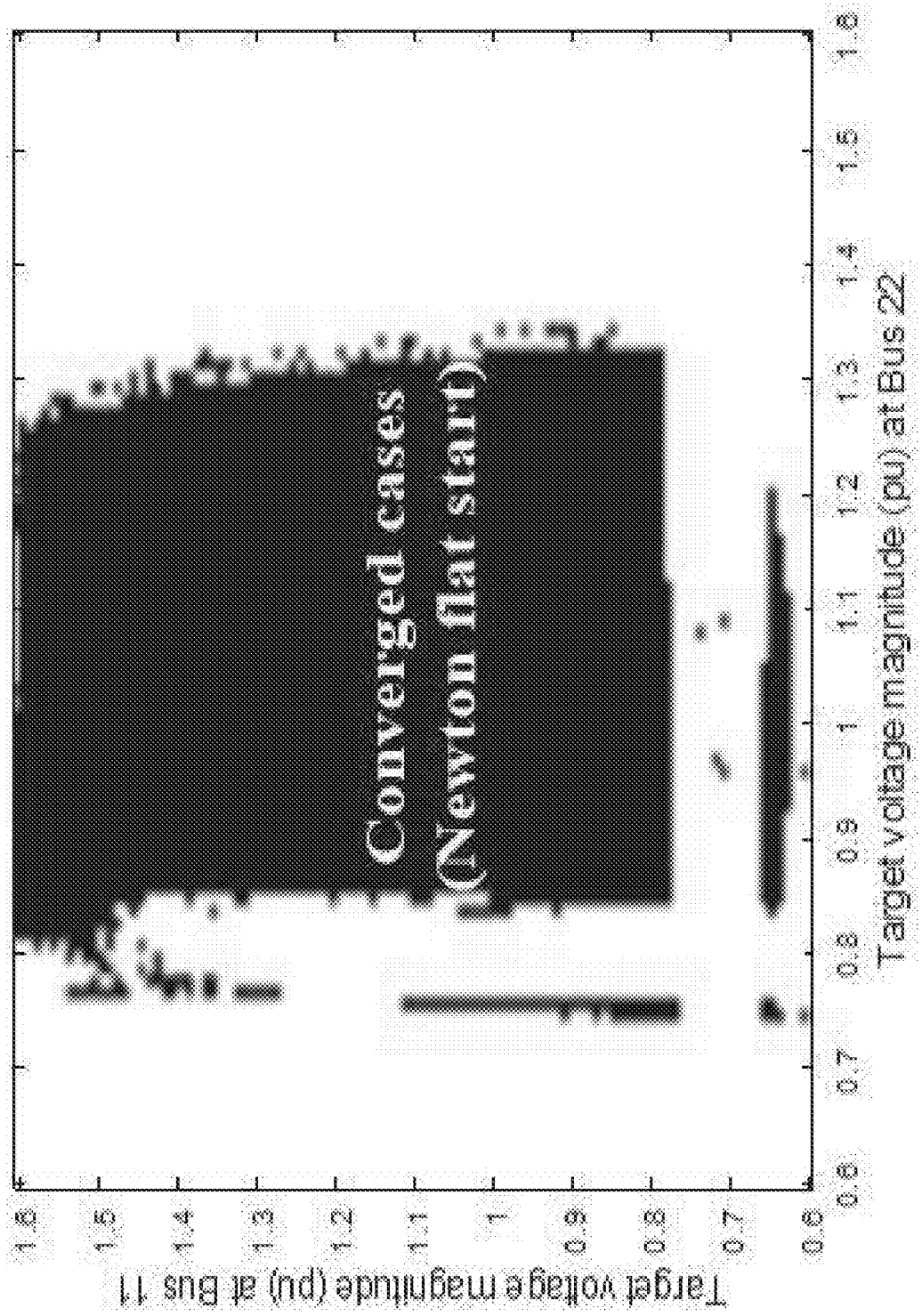
FIG. 28 Case B: shows the convergence map of the N-R method in the test grid with different voltage magnitudes at PVQ buses, i.e. Bus 11 and Bus 22 respectively. Red: the convergence region; White: the non-convergence region.
Figure 29:
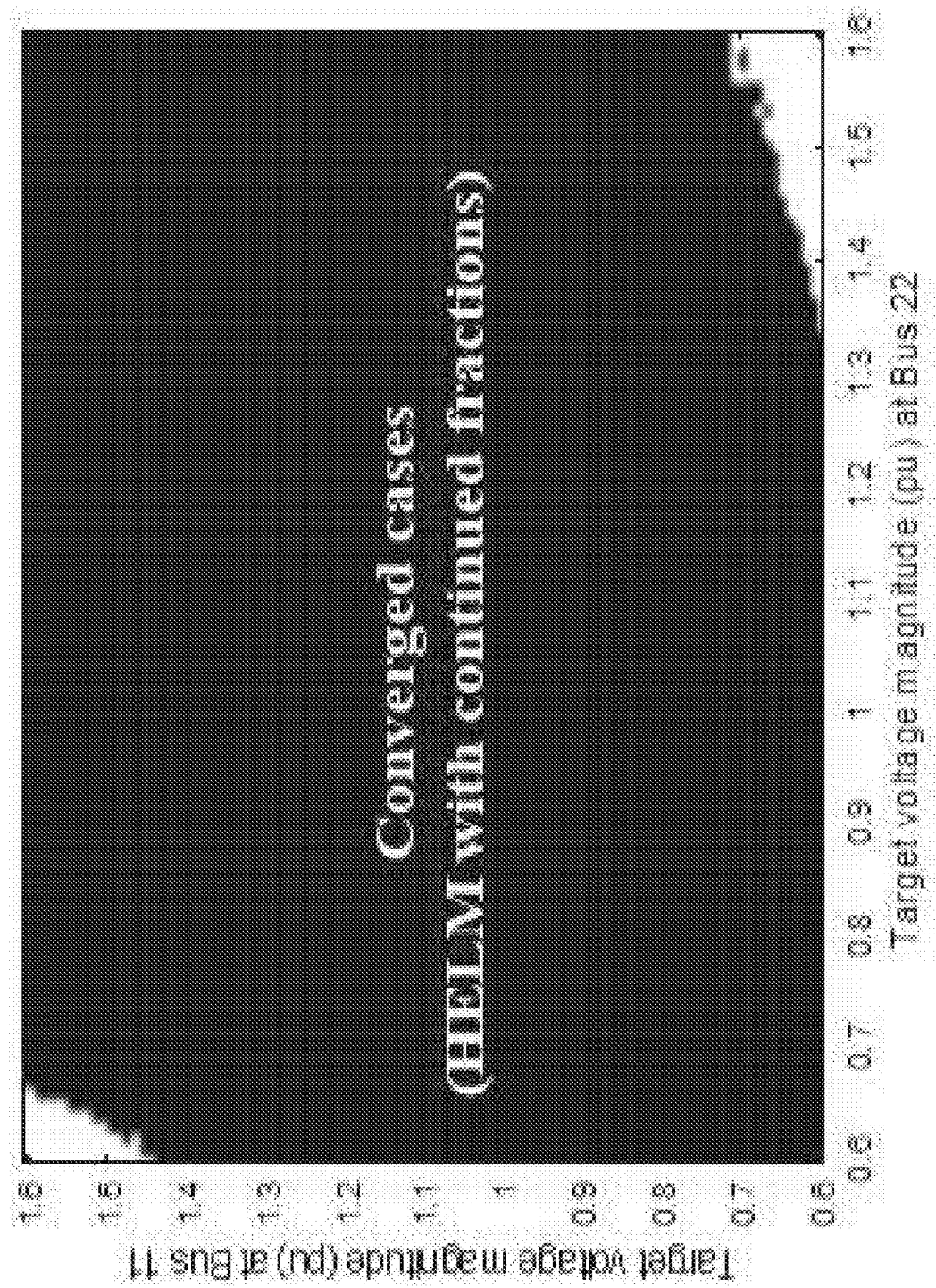
FIG. 29 shows the convergence map of HELM in the test grid with different voltage magnitudes at PVQ buses, i.e. Bus 11 and Bus 22. The target voltage magnitudes at Bus 11 and Bus 22 are varied from 0.6 pu to 1.6 pu with 0.01 pu. intervals. Red: the convergence region; White: the non-convergence region.

In Case B, the system's operating condition is changed, i.e. the active power and the reactive power consumptions at Bus 25 is changed to 100 MW and 500 MVar, respectively. The target voltage magnitudes at PVQ buses, i.e. Bus 11 and Bus 22, vary from 0.6 pu to 1.6 pu with 0.01 pu intervals. A total number of 101×101 power flow calculations are also carried out. FIG. 28 and FIG. 29 show the convergence maps of the N-R method with the flat start and the HELM with the continued fraction, respectively. Both the maximum iteration number of the N-R method and the maximum order of the HELM's power series are set to 50. It is apparent that the convergence region by the HELM in FIG. 29 is much larger than that by the N-R method in FIG. 28. Moreover, the solutions based on the HELM can be guaranteed to be the meaningful power flow solution, but the solutions based on N-R method may be the unstable equilibrium points.

This portion of the paper proposes a remote voltage control function using the non-iterative HELM to online control the voltage magnitude of remote buses. A general voltage control function is introduced in the HELM, in which the voltage magnitudes at specific buses are controlled by multiple reactive power resources from remote buses. A participation factor matrix is integrated into the HELM to distribute the reactive power contribution among multiple reactive power resources.

The simulations implemented in the IEEE New England 39-bus system demonstrate that the HELM integrated with the participation factor matrix has better performance in convergence than the traditional N-R method embedded with the remote voltage control function.

The non-iterative feature, larger convergence region and guarantee of correct operational solution of the proposed HELM make it more suitable for remote voltage control. It is also possible to distribute the calculation of continued fractions into multiple processors. Parallel computation to further improve the computation speed is the future research direction of this approach.

IX. Probabilistic Power Flow Analyze Using Multi-Dimensional Holomorphic Embedding and Generalized Cumulants This portion of the paper proposes a new analytical PPF approach using a nonlinear AC power flow model and generalized cumulants for more accurate estimation of probability distributions. First, it applies a multi-dimensional holomorphic method (MDHEM) to derive an explicit, analytical power flow solution in the form of multivariate power series that are about selected power injections as random inputs. Then, the approach calculates the probability distribution of each output, e.g. a bus voltage or a line flow, by means of generalized cumulants considering the covariance with moderate computational burdens. Superior to other PPF methods, the new approach is able to retain more accurate tail effects of probability distributions for AC power systems. Also, the probability distributions of random inputs fed to the approach can be not only parametric distribution functions but also historical data.

X. Introduction of the PPF Formulation, MDHEM and Linear Cumulant Method

A. Formulation of Probabilistic Power Flows

For a general AC power flow model, its PFEs are in the form of nonlinear equations (87)-(88), where vector x includes the given active and reactive power injections at PQ buses and active power injections at PV buses, vectors y and z respectively include the bus voltages and active and reactive line flows to be solved.

$$x=g(y) \tag{87}$$

$$z=h(y) \tag{88}$$

In a PPF model, assume that randomness is introduced with power injections at some of buses such as those having DERs, say buses 1 to R, and the other buses all have deterministic injections. Thus, $x=[x_R, x_F]^T$ and $x_R=[P_1, Q_1, P_2, Q_2, \ldots, P_R, Q_R]^T$ is composed of random inputs of the system with probabilistic density functions (PDFs) equal to $f_{P1}(P_1)$, $f_{Q1}(Q_1)$, ..., $f_{PR}(P_R)$, $f_{QR}(Q_R)$, respectively. Consider N bus voltages, i.e. $y=[Y_1, \ldots, Y_N]^T$, and M line flows, i.e. $z=[Z_1, \ldots, Z_M]^T$, as output variables. Then, The objective of PPF is to find the distributions of outputs y and z: $f_{Y1}(Y_1)$, $f_{Y2}(Y_2)$, ..., $f_{YN}(Y_N)$ and $f_{Z1}(Z_1)$, $f_{Z2}(Z_2)$, ..., $f_{ZM}(Z_M)$.

Most existing analytical PPF algorithms use DC power flows or (89) with Jacobian matrix J by linearizing (87):

$$\Delta y = J^{-1} \Delta x \tag{89}$$

There are $\Delta y=[\Delta Y_1, \Delta Y_2, \ldots, \Delta Y_N]^T$, where the $n^{th}$ element is $$\Delta Y_n = a_{n1}\Delta X_1 + a_{n2}\Delta X_2 + \ldots + a_{nD}\Delta X_D, n=1,2,\ldots,N \tag{90}$$

where $a_{n1}, a_{n2}, \ldots, a_{nD}$ are from the $n^{th}$ row of $J^{-1}$ or directly from DC power flows. The PDF of $\Delta Y_n$ can be calculated by convolution or a linear cumulant method, which will be presented in Section XII.

The above approach ignores nonlinearities of a power grid, which, however, will be more obvious in a capacitive power network with high penetration of DERs. Intuitively, if a more accurate, nonlinear solution on $\Delta y$ is available, the limitations of PPF using (91) and (92) can be addressed. In general, the PFEs in (87) do not have an analytical solution. However, a solution on $\Delta y$ may be approximated by a multivariate power series about D inputs in the form like (91) that is accurate for a large enough neighborhood of the operating condition and preserves nonlinearities in its explicit expression.

$$\Delta y = A_i \cdot \Delta x_i + A_{i,j} \cdot \Delta x_i \otimes \Delta x_j + A_{i,j,k} \cdot \Delta x_i \otimes \Delta_j \otimes \Delta x_k + \ldots, \forall i, j, k \in \{1,2,\ldots,D\} \tag{91}$$

As an example, a power network with two input variables has $$\Delta y = c_1 \Delta x_1 + c_2 \Delta x_2 + c_{1,1} \Delta x_1^2 + C_{1,2} \Delta x_1 \Delta x_2 + c_{2,2} \Delta X_2^2 + \ldots \tag{92}$$

where coefficients $c_1, c_2, c_{1,1}, C_{1,2}, c_{2,2}, \ldots$ can be calculated from PFEs by the MDHEM to be presented below.

B. Multi-dimensional Holomorphic Embedding Method

The holomorphic embedding load flow method (HELM) proposed by A. Trias is a non-iterative method to solve PFEs (87)-(88) based upon the theory of complex analysis. This method guarantees to give a correct stable power flow solution without the need of an initial guess, so it is particularly suitable for voltage stability assessment and estimation of P-V curves.

A conventional HELM embeds a single complex variable into PFEs that does not need to have a physical meaning. The MDHEM is based on a physical germ solution and can embed multiple independent complex variables into PFEs that have physical meanings, i.e. the scales of power injections at selected buses, respectively. Thus, each bus voltage is equal to a multivariate power series about multiple embedded variables so as to derive analytical power flow solutions. In the following, a brief introduction of the MDHEM is presented. The derived analytical solution will be the basis of PPF analysis in the proposed approach.

The PFEs for an N-bus power network are Eq. (93)-(95), where $S$, $\mathcal{P}$, $\mathcal{V}$ stand for the sets of slack buses, PQ buses and PV buses, respectively.

$$V_e(s) = V_e^{SL}, \forall e \in S \tag{93}$$

$$\sum_{f=1}^{N} Y_{ef} V_f(s) = \frac{S_e^*}{V_e^*}, \forall e \in \mathcal{P} \tag{94}$$

$$P_e = \text{Re}\left(V_e \sum_{f=1}^{N} Y_{ef}^* V_f^*\right) \text{ and } |V_e| = |V_e^{sp}|, \forall e \in \mathcal{V} \tag{95}$$

Suppose the network has D inputs to scale. Then, a D-variable power series is defined for each bus voltage:

$$V_e(s_1, s_2, \cdots, s_j, \cdots, s_D) = \tag{96}$$

$$\sum_{n_D=0}^{\infty} \cdots \sum_{n_j=0}^{\infty} \cdots \sum_{n_1=0}^{\infty} \cdots V_e[n_1, \cdots, n_j, \cdots, n_D] s_1^{n_1} \cdots s_j^{n_j} \cdots s_D^{n_D} =$$

$$\underbrace{V_e[0, 0, \cdots, 0]}_{D\text{-dimensions}} + V_e[1, 0, \cdots, 0] s_1 + V_e[0, 1, \cdots, 0] s_2 + \cdots +$$

$$V_e[2, 0, \cdots, 0] s_1^2 + V_e[1, 1, \cdots, 0] s_1 s_2 + V_e[0, 2 \cdots, 0] s_2^2 + \cdots$$

Substitute (96) into (94)-(95) to obtain the following embedded equations on PQ and PV buses respectively.

$$\sum_{f=1}^{N} Y_{ef} V_f(s_1, \cdots, s_l, s_m, s_n, \cdots, s_D) = \tag{97}$$

$$\frac{(P_{e0} + s_l \cdot \Delta P_e) - j(Q_{e0} + s_m \cdot \Delta Q_e)}{V_e^*(s_1^*, \cdots, s_l^*, s_m^*, s_n^*, \cdots, s_D^*)}, e \in \mathcal{P}$$

$$\sum_{f=1}^{N} Y_{ef} V_f(s_1, \cdots, s_l, s_m, s_n, \cdots, s_D) = \tag{98}$$

$$\frac{(P_{e0} + s_n \cdot \Delta P_e) - j(Q_e(s_1, \cdots, s_l, s_m, s_n, \cdots, s_D))}{V_e^*(s_1^*, \cdots, s_l^*, s_m^*, s_n^*, \cdots, s_D^*)}, e \in \mathcal{V}$$

where $s_l$ and $s_m$ are the scales of active and reactive powers at PQ bus e, $s_n$ is the scale of active power at PV bus e. Usually, set $\Delta P_e = P_{e0}$ and $\Delta Q_e = Q_{e0}$ for simplification, since the scales can directly link to the current powers. Variable $Q_e(s_1, \ldots, s_l, s_m, s_n, \ldots, s_D)$ in (98) is the injected reactive power at PV bus, which is also a D-variable power series regarding all scales, similar to $V_e(s_1, \ldots, s_l, s_m, s_n, \ldots, s_D)$ in (96).

Let $K=n_1+n_2+\ldots+n_D$ denote the order of multivariate power series, where $n_1, n_2, \ldots, n_D$ are the indices of coefficients for voltage power series in (96). So $V_e[0, 0, \ldots, 0]$ is the physical germ solution for $K=0$, which can be solved by conventional power flow calculation. Given a germ solution, with $V_e[0, 0, \ldots, 0]$ and $Q_e[0, 0, \ldots, 0]$, and then equate both sides of the multi-valued embedded equations by terms on $s_1, s_2, \ldots, s_1^2, s_1 s_2, s_1^2, \ldots$, to obtain coefficients of the power series on $V_e[n_1, n_2, \ldots, n_D]$ and $Q_e[n_1, n_2, \ldots, n_D]$ in a recursive manner. For example, the $K^{th}$-order coefficients of the multivariate power series are calculated up to the $(K-1)^{th}$ order.

Finally, the whole analytical solution of PFEs can be obtained. The MDHEM theory is based on the holomorphicity of the PFEs with $s_l$ embedded, so each multivariate power series has its convergence region, in which the power series can converge to a correct power flow solution. A higher order multivariate power series has a smaller error and correspondingly a larger convergence region. Usually, a truncated order multivariate power series is given as the analytical expression to preserve the nonlinearity of the AC power flow model with moderate computational burden.

C. Conventional Linear Cumulant Method

1) Moments, Cumulants, Joint Moments and Joint Cumulants

In statistics, a moment is quantitative measure describing the shape of a dataset or a random variable. For a random variable X subjected to PDF $f(x)$ or cumulative distribution function (CDF) $F(x)$, the $v^{th}$ order moment of its distribution is defined by $$\alpha_v = E(X^v) = \int_{-\infty}^{+\infty} x^v f(x)dx = \int_{-\infty}^{+\infty} x^v dF(x) \quad (99)$$

The moment about the mean value $\mu$ of X is called the $v^{th}$ order central moment defined as $$\beta_v = E[(X-\mu)^v] = \int_{-\infty}^{+\infty} (x-\mu)^v f(x)dx \quad (100)$$

Providing an alternative to moments, cumulants are also a set of quantitative measures for a probability distribution. Two distributions whose moments are identical will have the identical cumulants as well. The cumulants of X are defined using a characteristic function:

$$\psi(t) = E(e^{itX}) = \int_{-\infty}^{+\infty} e^{itx} f(x)dx \quad (101)$$

where i is the imaginary unit and t is a real number.

The cumulants are obtained from a power series expansion of logarithm of $\psi(t)$, so $v^{th}$ order cumulants can also be calculated from the $1^{st}$ to $v^{th}$ orders moments:

$$\kappa_1 = \mu \quad (102)$$

$$\kappa_v = \alpha_v - \sum_{j=1}^{v-1} \binom{v-1}{j-1} \times \alpha_{v-j} \kappa_j$$

If D random inputs are dependent, it is necessary to calculate cumulants of outputs based on their joint moments. Similar to the calculation of moments in (99), the $v^{th}$ order joint moments is calculated by the n-multiple integral ($n \leq D$):

$$\alpha_{v1,v2,\cdots,vn} = E(x_1^{v1} x_2^{v2} \cdots x_n^{vn}) = \quad (103)$$

$$\underbrace{\int_{-\infty}^{+\infty} \int_{-\infty}^{+\infty} \cdots \int_{-\infty}^{+\infty}}_{n\text{-multiple integral}} x_1^{v1} x_2^{v2} \cdots x_n^{vn} f(x_1, x_2, \cdots, x_n) dx_1 dx_2 \cdots dx_n$$

where $v_1 + v_2 + \ldots + v_n = v$.

Then the $v^{th}$ order joint cumulants can be calculated from the $1^{st}$ to $v^{th}$ order moments and joint moments, defined by $$\kappa_v(\gamma_p) = \sum_{\gamma_p} (-1)^{v-1} (v-1)! \alpha(v_1) \alpha(v_2) L \; \alpha(v_n) \quad (104)$$

where $k = \{v_1, v_2, \ldots, v_v\}$ and $\gamma_p$ is partition of a set of p indices into v non-empty blocks. As an example, the $2^{nd}$, $3^{rd}$ and $4^{th}$ order joint moments are given by (105).

$$\kappa_{i,j} = \alpha_{ij} - \alpha_i \alpha_j$$

$$\kappa_{i,j,k} = \alpha_{ijk} - (\alpha_i \alpha_{jk} + \alpha_j \alpha_{ik} + \alpha_k \alpha_{ij})_{[3]} + 2\alpha_i \alpha_j \alpha_k$$

$$\kappa_{i,j,k,l} = \alpha_{ijkl} - (\alpha_i \alpha_{jkl} + \alpha_j \alpha_{ikl} + \alpha_k \alpha_{ijl} + \alpha_l \alpha_{ijk})_{[4]}$$

$$- (\alpha_{ij} \alpha_{kl} + \alpha_{ik} \alpha_{jl} + \alpha_{il} \alpha_{jk})_{[3]}$$

$$+ 2! \times (\alpha_i \alpha_j \alpha_{kl} + \alpha_i \alpha_k \alpha_{jl} + \alpha_i \alpha_l \alpha_{jk} + \alpha_j \alpha_k \alpha_{il} + \alpha_j \alpha_l \alpha_{ik} + \alpha_k \alpha_l \alpha_{ij})_{[6]}$$

$$-3! \times \alpha_i \alpha_j \alpha_k \alpha_l \quad (105)$$

where i, j and k are the indices of some inputs permuting from the set of $\{1, 2, \ldots, D\}$. In particular, if all the inputs subject to Gaussian distribution, i.e. $N_i(\mu_i, \sigma_i^2)$ for the $i^{th}$ input, then the self-cumulants for which $v>2$ are zero, and the joint-cumulant between $\Delta X_i$ and $\Delta X_j$ are the covariance between them.

$$\kappa_{i,2} = \sigma_i^2, \kappa_{i,j} = \text{cov}(X_i, X_j), \kappa_{i,j,k} = \kappa_{i,j,k,l} = L = 0 \quad (106)$$

2) Cumulants of Linear Functions

For linear functions, the output $\Delta Y$ is expressed as $$\Delta Y = \sum_{i=1}^{D} a_i \Delta X_i = a_1 \Delta X_1 + a_2 \Delta X_2 + \cdots + a_D \Delta X_D \quad (107)$$

If the input variables $\Delta X_i$ are independent, the $v^{th}$ order cumulants of $\Delta Y$ can be directly calculated by the $v^{th}$ order cumulants of $\Delta X_i$.

$$\kappa_{Y,v} = \sum_{i=1}^{D} a_i^v \kappa_{X_i,v} = a_1^v \kappa_{X_1,v} + a_2^v \kappa_{X_2,v} + \cdots + a_D^v \kappa_{X_D,v} \quad (108)$$

If the input variables $\Delta X_i$ are dependent, then the $v^{th}$ order cumulants of $\Delta Y$ should consider the joint cumulants, i.e. $\kappa_{Xi,Xj}$ and $\kappa_{Xi,Xj,Xk}$. As an example, the $1^{st}$, $2^{nd}$ and $3^{rd}$-order cumulants of outputs are given by $$\kappa_{Y,1} = \sum_i^D a_i \kappa_{Xi,1} = \sum_{i=1}^D a_i \alpha_{Xi,1} \quad (109)$$

$$\kappa_{Y,2} = \sum_{i,j}^D a_i a_j \kappa_{Xi,Xj} = \sum_{i=1}^D a_i^2 \kappa_{Xi,2} + \sum_{\substack{i=1,j=1,\\i \neq j}}^D a_i a_j \kappa_{Xi,Xj}$$

$$\kappa_{Y,3} = \sum_{i,j,k}^D a_i a_j a_k \kappa_{Xi,Xj,Xk}$$

$$= \sum_{i=1}^D a_i^3 \kappa_{Xi,3} + 3 \sum_{\substack{i=1,j=1\\i \neq j}}^D a_i^2 a_j \kappa_{Xi,Xi,Xj} + \sum_{\substack{i=1,j=1,k=1,\\i \neq j \neq k}}^D a_i a_j a_k \kappa_{Xi,Xj,Xk}$$

3) Approximation Expansions of CDF and PDF

Once the cumulants of the output are known, the final step is to obtain its PDF or CDF, which can be approximated by expansions. Most of the expansions are based on the orthogonal basis functions and their truncated forms. The coefficients of the distributions are computed from the moments of the output. As one well-known expansion method, the Gram-Charlier expansion is used in this paper. Set basis functions x subjecting to a normal distribution function $x \sim N(0, 1)$, whose PDF and CDF are $\varphi(x)$ and $\Phi(x)$. The PDF and CDF of outputs can be approximated by summation of multiple normal distribution functions, expressed as (110) and (111), respectively.

$$f(x) = \varphi(x) + c_1\varphi'(x) + \frac{c_2}{2!}\varphi''(x)L + \frac{c_n}{n!}\varphi^{(n)}(x) + L \quad (110)$$

$$F(x) = \Phi(x) + c_1\Phi'(x) + \frac{c_2}{2!}\Phi''(x) + L + \frac{c_n}{n!}\Phi^{(n)}(x) + L \quad (111)$$

$c_n$ are the coefficients calculated from the moments of outputs.

XI. Proposed Probabilistic Power Flow Approach

A. Objective of the Approach

Figures 30A, 30B:
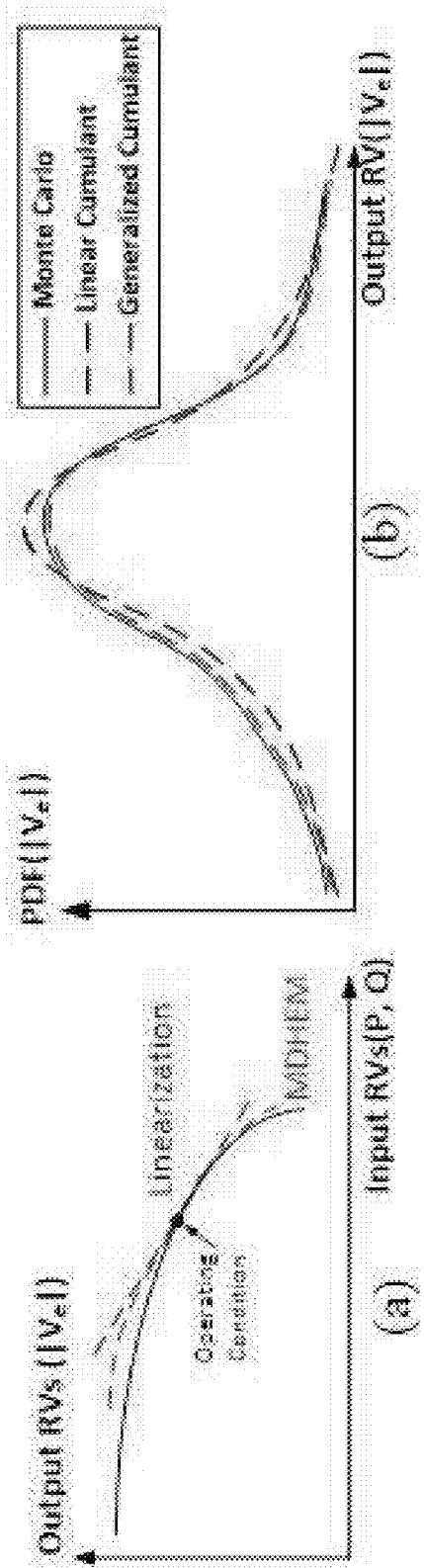
FIGS. 30A and 30B show the illustration of LCM and the proposed GCM for voltage magnitude.

Consider a specific operating condition as illustrated by the dot on the P-V (Power-Voltage) curve in 30A. Assume all inputs are active and reactive power injections at buses obeying Gaussian distributions. The PPF aims at calculating voltage magnitudes as the outputs. The conventional linear cumulant method (LCM) applies the affine transformation to linearize PFEs, as shown by the blue dashed line in FIG. 30A. So the PDF of an output is also a Gaussian distribution, as shown by the blue dashed line in FIG. 30B. However, the actual PDF always leans slightly left compared to that of a Gaussian distribution, shown by black line in FIG. 30B. The reason is that operating conditions with positive deviations, i.e. increased loads, result in negative derivations, i.e. reduced voltage magnitudes. The proposed PPF by the MDHEM and generalized cumulant method (GCM) preserving nonlinearity of PFEs is expected to reduce this error, as shown by red dashed line in FIGS. 30A and 30B.

The rest of the section presents the details of the proposed PPF approach: first, analytical expressions of line flows and voltages are derived from the MDHEM, and then the GCM is proposed to calculate the PDFs of outputs.

B. Analytical Expression of Line Flows and Voltages $$P_{ef}+jQ_{ef}=[V_e(s_1,\ldots,s_D)]\cdot[V_e(s_1,\ldots,s_D)-V_f(s_1,\ldots,s_D))/Z_{ef}]^* \quad (112)$$

From the $K^{th}$ order power series expression of each bus voltage, the analytical expression of a line flow can be easily calculated by (112). The $1^{st}$ term is the voltage at bus e, and the $2^{nd}$ term is a simple subtraction representing the current flowing from bus e to its adjacent bus $f$ via impedance $Z_{ef}$. Then the multiplication is truncated to the $K^{th}$ order so as to be consistent with voltage expressions.

The MDHEM are performed in the Cartesian coordinates, since the power injections in (97) and (98) are separated to active and reactive powers. Therefore, the calculation process of the complex-valued equations should also be separated into real and imaginary parts. Finally, the resultant analytical expression of voltages is in the Cartesian coordinates, so the complex-valued coefficients, i.e. $V_e[n_1, n_2, \ldots, n_D]$ in (96), can be expressed by real part and imaginary part in (113).

$$V_e[n_1,L,n_j,L,n_D]=V_{e,re}[n_1,L,n_j,L,n_D]+jV_{e,im}[n_1,L,n_j,L,n_D] \quad (113)$$

However, in practice, the objective of PPF is to find the distributions of a voltage magnitude, so it is necessary to transform the analytical expression on the voltage from the Cartesian coordinates to the Polar coordinates, or in other words, to find these expressions:

$$|V_e(s_1, s_2, \cdots, s_j, \cdots, s_D)| = \quad (114)$$

$$\sum_{n_D=0}^{\infty} \cdots \sum_{n_j=0}^{\infty} \cdots \sum_{n_1=0}^{\infty} M_e[n_1, \cdots, n_j, \cdots n_D] s_1^{n_1} \cdots s_j^{n_j} \cdots s_D^{n_D} =$$

$$M_e[\underbrace{0, 0, \cdots, 0}_{D\text{-dimensions}}] + M_e[1, 0, \cdots, 0]s_1 + M_e[0, 1, \cdots, 0]s_2 +$$

$$\cdots + M_e[2, 0, \cdots, 0]s_1^2 + M_e[1, 1, \cdots, 0]s_1 s_2 +$$

$$M_e[0, 2 \cdots, 0]s_2^2 + \cdots = |V_e[0, 0, \cdots, 0]| + \sum_{n_D=1}^{N_D} \cdots$$

$$\sum_{n_j=1}^{N_j} \cdots \sum_{n_1=1}^{N_1} M_e[n_1, \cdots, n_j, \cdots, n_D] s_1^{n_1} \cdots s_j^{n_j} \cdots s_D^{n_D}$$

where $M_e[n_1, n_2, \ldots, n_D]$ are real-valued coefficients regarding $|V_e|$ at bus e and are calculated by (115) from the complex-valued coefficients obtained by the MDHEM based on the theory of L'Hôpital's Rule.

$$M_e[n_1, L, n_j, L, n_D] \approx \frac{V_e[n_1, L, n_j, L, n_D]\cdot V_e^*[0, 0, L, 0] + V_e^*[n_1, L, n_j, L, n_D]\cdot V_e[0, 0, L, 0]}{2|V_e[0, 0, L, 0]|} \quad (115)$$

C. Generalized Cumulants for Nonlinear Functions without Covariance

If the network has D inputs, a D-variable power series can be derived in the form of (116), where $s_j$ is the scale of the $j^{th}$ input on active or reactive power injections, which is considered as the input random variables, i.e. $\Delta X_j$.

$$Y = Y_0 + \Delta Y \quad (116)$$

$$= Y_0 + \sum_{n_D=1}^{N_D} L \sum_{n_j=1}^{N_j} L \sum_{n_1=1}^{N_1} M_e[n_1, L, n_j, L, n_D] s_1^{n_1} L s_j^{n_j} L s_D^{n_D}$$

Therefore, different from (107), the proposed method expresses outputs $\Delta Y$, e.g. variance of voltage magnitudes or line powers, by nonlinear homogeneous polynomial functions of input variables, expressed as (117).

$$\Delta Y = \quad (117)$$

$$\sum_{i=1}^{D} a_i \Delta X_i + \sum_{i=1,j=1}^{D} a_{ij}\Delta X_i \Delta X_j + \sum_{i=1,j=1,k=1}^{D} a_{ijk}\Delta X_i \Delta X_j \Delta X_k + \cdots$$

where $a_i$, $a_{ij}$, $a_{ijk}$ are coefficients calculated by the MDHEM and $\Delta X_i$, $\Delta X_j$, $\Delta X_k$ are inputs. i,j and k are the indices of the D input RVs permuting from the set of $\{1, 2, \ldots, D\}$. $a_i$ is the $1^{st}$ order coefficient of the multivariate power series regarding the $i^{th}$ dimension. $\Delta S_i$ in (118) is the $i^{th}$ dimension power scaled by $s_i$, which can also be either the active power $\Delta P_i$ or reactive power injections $\Delta Q_i$.

$$a_i = M_e[0, \cdots, 0, \underset{ith\ dimension}{1}, 0 \cdots, 0](s_i \Delta S_i), \forall i \in D \tag{118}$$

$a_{ij}$ and $a_{ijk}$ are the $2^{nd}$ and $3^{rd}$ order coefficients of the multivariate power series, expressed in (119) and (120), respectively. Note that in (120), since usually the Pearson's correlation coefficients (linear correlation) are given to describe the covariance of the inputs, the joint coefficients for orders >2, e.g. coskewness and cokurtosis, can be neglected.

$$a_{ij} = \begin{cases} M_e[0, \cdots, 2, \cdots, 0](\Delta S_i)^2 & \text{if } i = j \\ M_e[0, \cdots, 1, \cdots, 1, \cdots, 0](\Delta S_i \cdot \Delta S_j) & \text{otherwise} \end{cases} \tag{119}$$

$$a_{ijk} = \begin{cases} M_e[0, \cdots, 3, \cdots, 0](\Delta S_i)^3 & \text{if } i = j = k \\ 0 & \text{otherwise} \end{cases} \tag{120}$$

If the inputs are independent, then output $\Delta Y$ is a nonlinear function in a form having power functions of $\Delta X_i$, and the cross terms, e.g. $\Delta X_i \Delta X_j$ ($i \neq j$), are neglected. As expressed as (121), the cumulants of a sum are the sums of the cumulants.

$$\kappa_{Y,v} = \sum_i^D \kappa_{X'_i,v} \tag{121}$$

where $\kappa_{X'_i,v}$ is the $v^{th}$ order self-cumulant of new created independent random inputs, i.e. $X'_i$, which is the summation of power series only related to the $i^{th}$ dimension, defined in (122).

$$X'_i = \sum_{n_i=1}^{K} M_e \left[ 0, \cdots, 0, \underset{ith\ dimension}{n_i}, 0, \cdots, 0 \right] \cdot (\Delta X_i)^{n_i}, \forall i \in D \tag{122}$$

D. Generalized Cumulants for Nonlinear Functions with Covariance

If inputs in $\Delta X_i$ are dependent, then the high-order joint-cumulants should be considered for calculating the output. The first four order cumulants of the output are $$\kappa_{Y,1} = \sum_i^D a_i \alpha_{X_i} + \sum_{i,j}^D a_{ij} \alpha_{X_i,X_j} + \sum_{i,j,k}^D a_{ijk} \alpha_{X_i,X_j,X_k} + L \tag{123}$$

$$\kappa_{Y,2} = \sum_{i,j}^D a_i a_j \kappa_{X_i,X_j} + \sum_{i|jk[2]}^D a_i a_{jk} \kappa_{X_i,X_jX_k} + \sum_{i,j,k,l}^D a_{ij} a_{kl} \kappa_{X_iX_j,X_kX_l} + L$$

$$\kappa_{Y,3} = \sum_{i,j,k}^D a_i a_j a_k \kappa_{X_i,X_j,X_k} + \sum_{i|jkl[3]}^D a_i a_j a_{kl} \kappa_{X_i,X_j,X_kX_l} + $$

$$\sum_{i|jk|lm[3]}^D a_i a_{jk} a_{lm} \kappa_{X_i,X_jX_k,X_lX_m} + L$$

$$\kappa_{Y,4} = \sum_{i,j,k,l}^D a_i a_j a_k a_l \kappa_{X_i,X_j,X_k,X_l} + \sum_{i|jk|lm[4]}^D a_i a_j a_k a_{lm} \kappa_{X_i,X_j,X_k,X_lX_m} + L$$

where, for example, $i|jk$ means there are 2 distinct types for partitions $i|jk$, i.e. $i|jk$ and $i|kj$.

Pearson's correlation coefficients are used for estimating the correlation between different inputs, so the joint-cumulants for orders >2 are very small values and can be neglected $$\kappa_{X_i,X_j} = \text{cov}(X_i, X_j)$$

$$\alpha_{X_i,v^v X_j,v^v X_k,v^v} = \alpha_{X_i,v^v X_j,v^v X_k,v^v X_l,v^v} = L = 0$$

$$\kappa_{X_i,v^v X_j,v^v X_k,v^v} \approx 0 \kappa_{X_i,v^v X_j,v^v X_k,v^v X_l,v^v} \approx 0 L \tag{124}$$

As an example, the $1^{st}$-, $2^{nd}$- and $3^{rd}$-order generalized cumulants of the output are given by (125), in which $X'_i$ and $X'_j$ are the random variables calculated by (122).

$$\kappa_{Y,1} = \sum_i^D \kappa_{X'_i,1} + \sum_{\substack{i,j \\ i \neq j}}^D a_{ij} \alpha_{X_i,X_j} \tag{125}$$

$$\kappa_{Y,2} = \sum_i^D \kappa_{X'_i,2} + \sum_{\substack{i,j \\ i \neq j}}^D a_i a_j \kappa_{X_i,X_j}$$

$$\kappa_{Y,3} = \sum_i^D \kappa_{X'_i,3}$$

E. Flowchart of the Proposed PPF Approach

Figure 31:
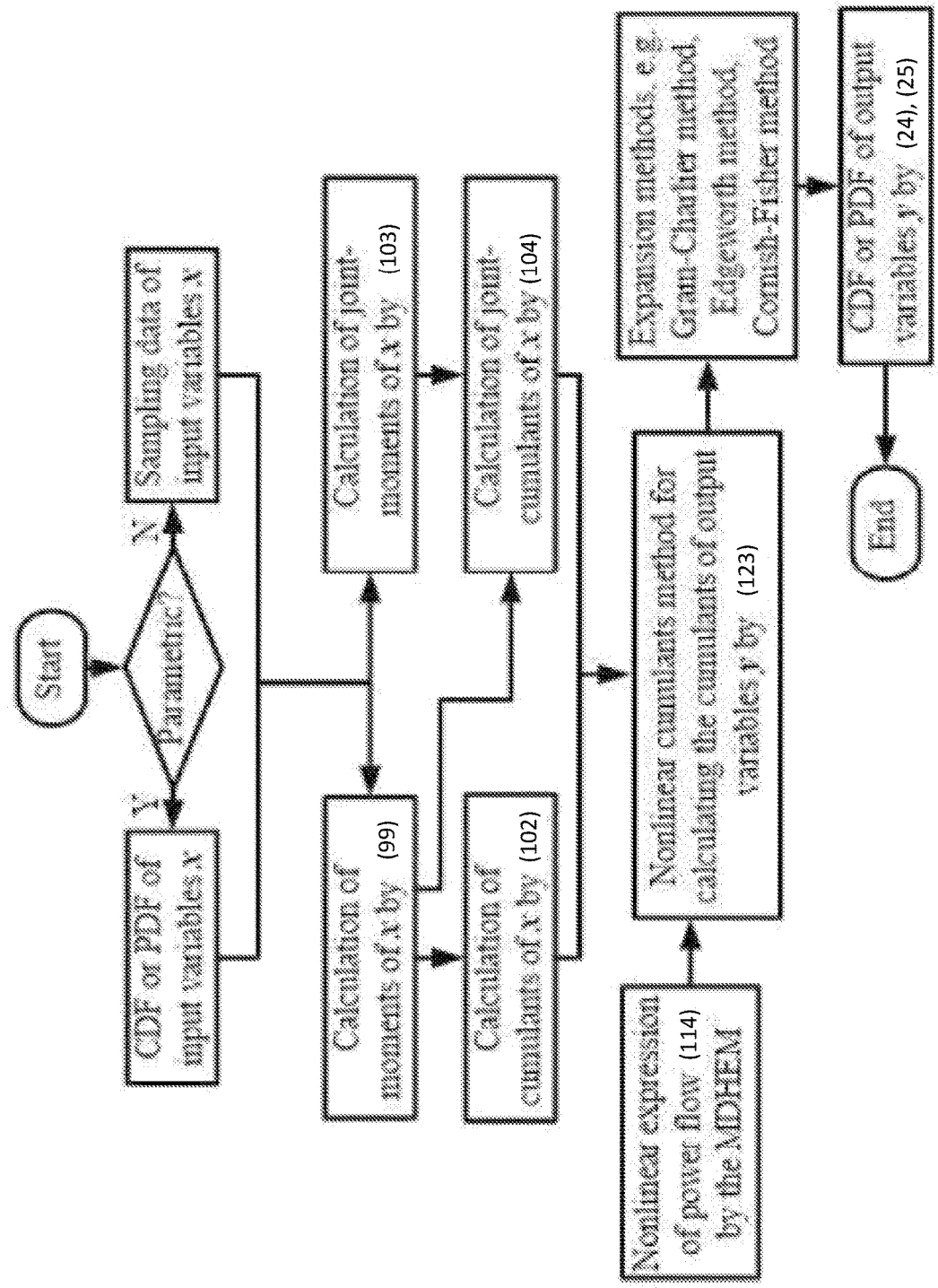
FIG. 31 shows the flowchart of the proposed PPF approach based on GCM.

In summary, the procedure of this PPF approach is shown in the flowchart in FIG. 31.

XII. Case Study

Figure 32:
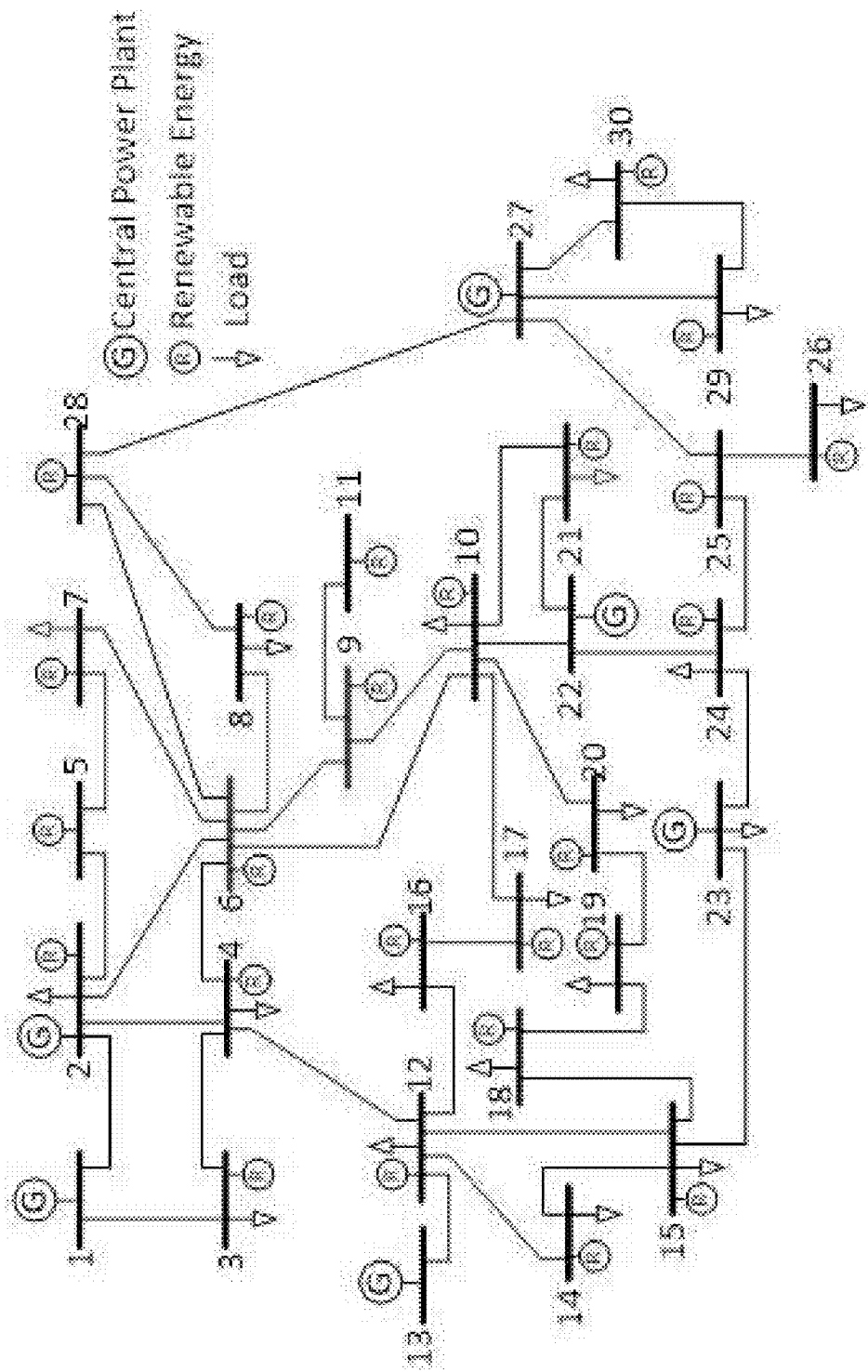
FIG. 32 is a one-line diagram of the 30-bus power system.

The proposed approach is implemented in MATLAB, and tested on the IEEE 30-bus system shown in FIG. 32, based on available data. In this context, the uncertainties associated with network topology or network parameter are not considered. Aggregated loads and DERs are modeled and connected directly to buses. Additionally, since this paper evaluates how the uncertainties of DERs and loads under a certain operating condition, power outputs of conventional generation are fixed. The generator at Bus 1 is selected as the swing bus. The PPF analysis is carried out on a desktop computer with Intel Core i7-6700 CPU @ 3.40 GHz with 16.00 GB RAM.

A. Nonlinear Analytical Expression from the MDHEM

Figure 33A:
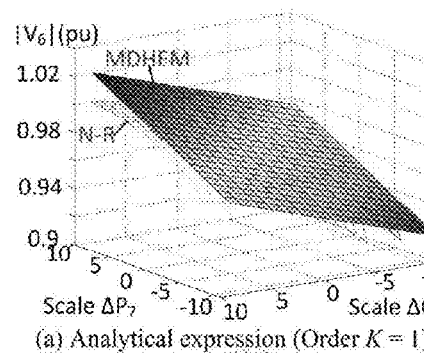
FIGS. 33A, 33B, 33C, 33D, 33E and 33F show the evaluation of the voltage magnitude at Bus 6, with respect to $\Delta P7$ and $\Delta Q21$.
Figure 33B:
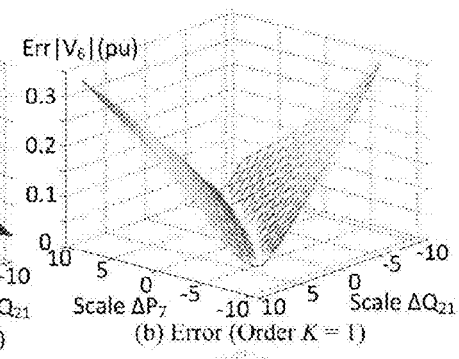
Figure 33C:
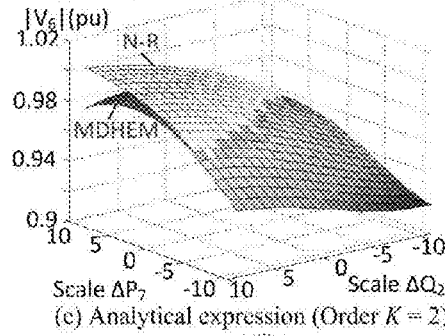
Figure 33D:
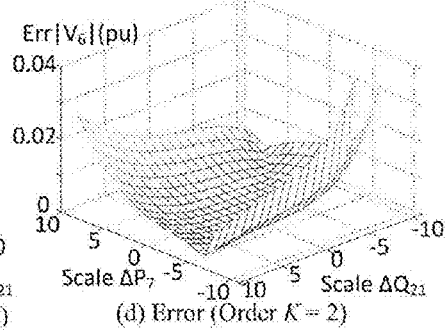
Figure 33E:
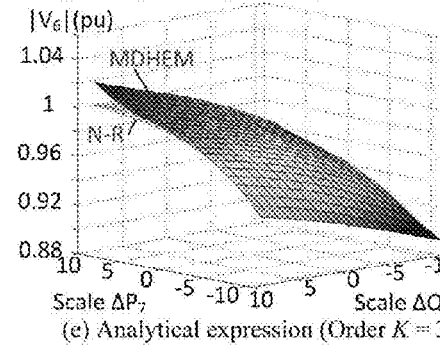
Figure 33F:
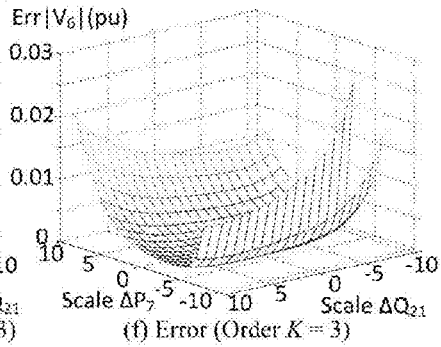
Figure 35:
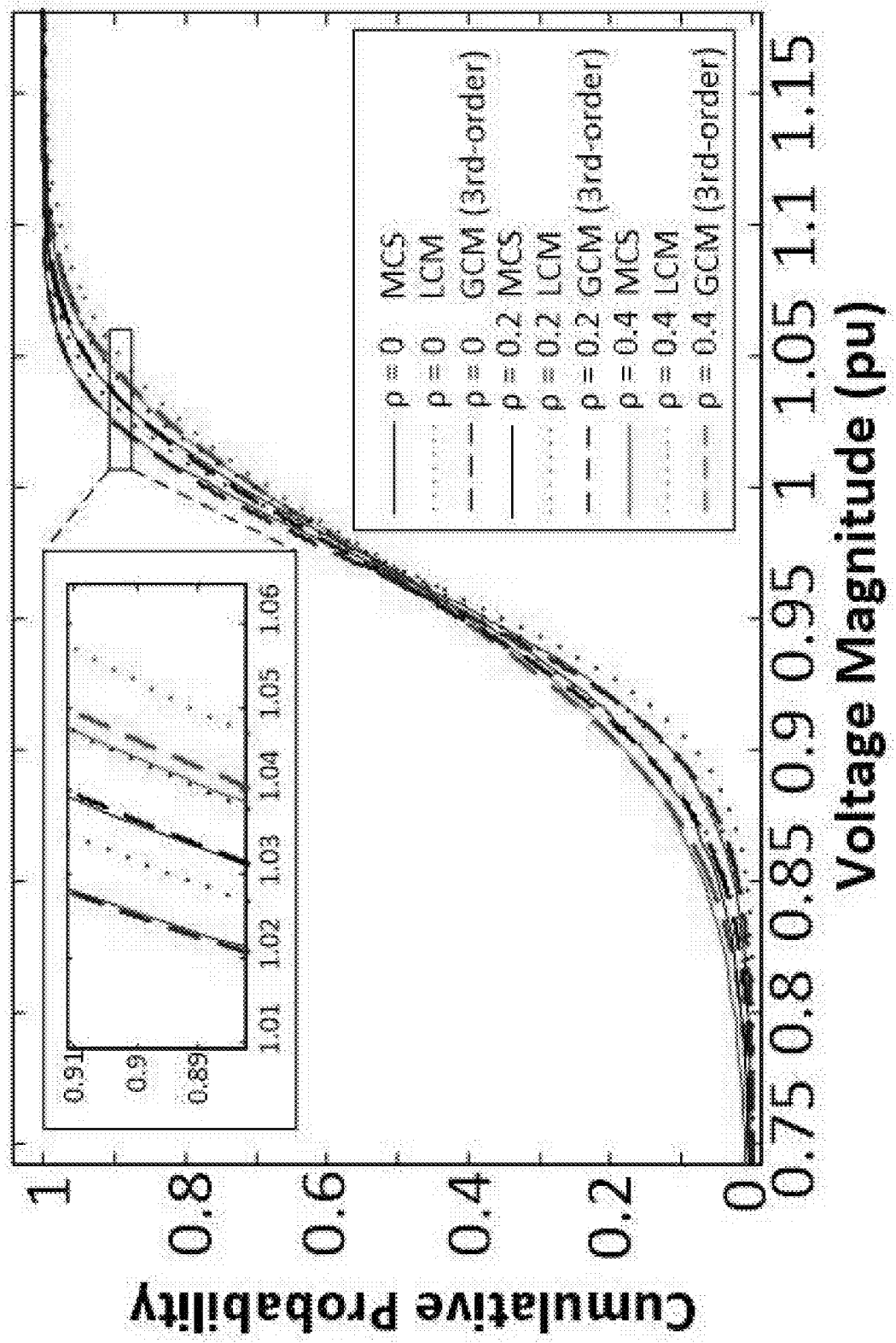
FIG. 35 shows the CDF curves of voltage magnitude at Bus 9 for Case B.

The MDHEM is firstly implemented to solve the PFEs so as to give a nonlinear analytical solution regarding different operating conditions, which takes 15.92 sec and 131.37 sec to obtain the $2^{nd}$ and $3^{rd}$ order multivariate power series expressions of all bus voltages. The 3-D figures in FIGS. 33A, 33B, 33C, 33D, 33E and 33F evaluate the voltage magnitude at Bus 6 regarding 2 randomly selected dimensions: $\Delta P_7$ and $\Delta Q_{21}$ i.e. deviations of the active power at Bus 7 and reactive power at Bus 21. FIGS. 33B, 33D and 33F show the errors of conventional linear expression, and $2^{nd}$ order and $3^{rd}$ order nonlinear expressions, respectively. It is observed that the error of the analytical expression regarding different operating conditions is significantly reduced when the higher order of multivariate power series is used.

In other words, the nonlinear expression in (117) is expected to reduce the error of analytical PPF. The coefficients of the multivariate power series are recorded for the evaluation of generalized cumulants in the study cases. The following three cases are conducted: Case A and Case B consider the uncertainties from loads. Case C considers uncertainties from both the loads and generation from DERs.

B. Case A: Gaussian Distribution without Covariance

In Case A, the active and reactive power injections at all load buses is described by Gaussian distributions with zero covariance, i.e. $N_i(\mu_i, \sigma_i^2)$. For each bus, the mean value $\mu_i$ is the power injection of current operating condition, $\sigma_i$ is assumed to be $0.6\mu_i$. In all case studies, the results from MCS is selected as the reference, whose required sampling number is dependent on the estimation of maximum variance coefficient of the outputs, i.e. $\beta_{max} < 0.1\%$ for all buses. The average root mean square (ARMS) error is computed as the accuracy index of the output distribution, $$ARMS = \frac{1}{N}\sqrt{\sum_{i=1}^{N}(F_{PPF,i} - F_{MCS,i})^2} \times 100\% \quad (126)$$

where $F_{PPF,i}$ and $F_{MCS,i}$ are the $i^{th}$ value on the CDF curves by the analytical PPF methods and MCS method, respectively. N is the number of selected points on the CDF curves. In this study, N=100. The GCM and LCM calculate the cumulants up to the $6^{th}$ order and Gram-Charlier expansion is adopted to recover the distributions of outputs.

TABLE IV

COMPARISON ON BUS 9 VOLTAGE FOR CASE A*

|  | MCS | LCM | $2^{nd}$ order GCM | $3^{rd}$ order GCM |
|---|---|---|---|---|
| ARMS/% | 0 | .049 | .010 | .008 |
| 10% CL/pu | .8948 | .0905 | .8974 | .8967 |
| 25% CL/pu | .9307 | .9349 | .9299 | .9303 |
| 75% CL/pu | .9987 | 1.0013 | .997 | .9976 |
| 90% CL/pu | 1.0257 | 1.0312 | 1.0245 | 1.0257 |
| mean/pu | .9750 | .9805 | .9726 | .9748 |
| std. dev./pu | .05067 | .04933 | .04945 | .05082 |
| OVP(>1.05pu) | .0342 | .0492 | .0276 | .0310 |
| UVP(<0.85pu) | .0250 | .00846 | .0189 | .0195 |
| Com. time/s | 920.3 | 10.1 | 45.3 | 180.8 |

*CL—confidence level; OVP—over-voltage probability; UVP—under-voltage probability; MCS—Monte-Carlo simulation; LCM—linear cumulant method; GCM—generalized cumulant method.

As an example, FIGS. 34A and 34B show, respectively, the PDF and CDF curves of LCM and the proposed GCM regarding the voltage magnitude at Bus 9. It can be observed that the results from the proposed GCM has higher accuracy than the LCM. The tail effect and some nonlinearities of the power network can be preserved. The details of the probability distributions from LCM and GCM are also compared with the MCS in TABLE IV. The $3^{rd}$ order GCM has the highest accuracy with the lowest ARMS=0.008% while the $2^{nd}$ order GCM has a slightly higher ARMS=0.010% and the conventional LCM has much a higher ARMS=0.049%. The computation times of the $3^{rd}$ and $2^{nd}$ orders GCMs are respectively about 18 times and 4.5 times of that of the LCM, but about 20% and 5% of that of the MCS.

C. Case B: Gaussian Distribution with Covariance

In Case B, the active and reactive power injections at all load buses are assumed to follow Gaussian distributions with non-zero covariance. The correlation coefficient ρ between active and reactive powers at the same bus are set as 0.8, the powers at different buses are 0.2 and 0.4 for Case B-I and Case B-II, respectively.

TABLE V

COMPARISON ON BUS 9 VOLTAGE FOR CASE B*

|  | Case B-I: ρ = 0.2 | | | Case B-II: ρ = 0.4 | | |
|---|---|---|---|---|---|---|
|  | MCS | LCM | GCM3 | MCS | LCM | GCM3 |
| ARMS/% | 0 | .054 | .009 | 0 | .087 | .012 |
| 10% CL/pu | .8806 | .8948 | .8824 | .8691 | .8840 | .8719 |
| 25% CL/pu | .9245 | .9297 | .9219 | .9061 | .9241 | .9174 |
| 75% CL/pu | 1.0048 | 1.0080 | 1.0033 | 1.0092 | 1.0077 | 1.0095 |
| 90% CL/pu | 1.0360 | 1.0365 | 1.0436 | 1.0441 | 1.0531 | 1.0461 |
| mean/pu | .9741 | .9805 | .9740 | .9736 | .9805 | .9733 |
| std. dev./pu | .0593 | .0562 | .0599 | .0673 | .0606 | .0675 |
| OVP (>1.05pu) | .0584 | .0823 | .0617 | .0820 | .1086 | .0887 |
| UVP (<0.85pu) | .0487 | .0195 | .0396 | .0691 | .0362 | .0589 |
| Com. time/s | 1831.1 | 111.3 | 257.3 | 1948.7 | 137.6 | 291.8 |

*GCM3 - $3^{rd}$ order generalized cumulant method.

Fig. shows the CDF of the LCM and the $3^{rd}$ order GCM regarding voltage magnitude at Bus 9 in Case B-I and B-II. The larger covariance of input powers results in larger variances of the outputs. The details of probability distribution from LCM and the $3^{rd}$ order GCM are also compared with the MCS in TABLE V. The proposed GCM has higher accuracy. The LCM in Case B is much slower than that of Case A, because it is also necessary for the LCM to calculate the joint-cumulants between inputs.

D. Case C: Non-Gaussian Distribution with Covariance

In Case C, the active and reactive power injections at all load buses follow Gaussian distributions that are the same as Case B-I ($\rho$=0.2). DERs are integrated into every load bus, as shown in FIG. 32. The penetration levels are 20%, 40%, 60% and 80% for Case C-I, Case C-II Case-III and Case-IV, respectively. DERs are assumed to have reactive power control capabilities. In this paper, they are set in the power factor control mode with fixed power factor 0.95. The power generation of a DER complies with the beta distribution. The PDF of the capacity factor is (127), in which $\alpha$=2 and $\beta$=5. The covariance of capacity factors between two DERs is set as 0.2.

$$f(x \mid \alpha, \beta) = \frac{\Gamma(\alpha)\Gamma(\alpha)}{\Gamma(\alpha+\beta)} x^{\alpha-1}(1-x)^{\beta-1} \qquad (127)$$

FIGS. 36A and 36B show the CDF curves of the LCM, $2^{nd}$ order GCM and the $3^{rd}$ order GCM in Case C-I, C-II, C-III and C-IV regarding the voltage magnitude at Bus 9 and active power flow in Line 6-8, respectively. It can be concluded from Table III that, with increasing penetration of DERs, the accuracy of conventional LCM reduces obviously: the ARMS increases sharply from 0.010 for the 20% penetration level to 0.121 for the 80% penetration level. The proposed GCM can significantly compensate this error to achieve a low ARMS. Therefore, the proposed GCM shows greater superiority over the conventional methods on accuracy for power systems with higher penetration of DERs.

E. Simulation Results Analysis

The simulation results uncover the following phenomena:

1) Higher covariance of loads may lead to higher variances on voltage magnitudes. The traditional LCM has increased error with the increased penetration of DERs, while the GCM can keep high accuracy for all cases.

2) Compared with the reference, the traditional LCM gives higher mean values but lower stand deviations on voltage magnitudes as outputs. The proposed GCM based on a nonlinear expression is closer to the reference.

3) The traditional LCM based on linearized power flows trends to underestimate the under-voltage risk but overestimate the over-voltage risk. The proposed GCM can mitigate that problem.

4) A higher order of GCM has slightly better accuracy in PPF analysis but a heavier computational burden.

This portion of the paper proposes a novel analytical PPF approach to evaluate the impacts of uncertain loads and DERs on power system operations. The MDHEM is adopted to give an explicit nonlinear analytical power flow solution, based on which of the GCM is used to retain the tail effects of probability distributions. The result of PPF analysis is then benchmarked with the MCS based on a large number of numerical power flow calculations. Compared with traditional LCM, the proposed approach has increased accuracy in PPF analysis with an increased expense for computation.

XIII. Online Voltage Stability Assessment Fr Load Areas Based on the Holomorphic Embedding Method This portion of the paper proposes an online hybrid VSA scheme to predict voltage instability of a load area by power flow calculations using a derivative holomorphic embedding method (HEM). An accurate loading limit at each load bus in the load area can be calculated based on online state estimation on the entire load area and a measurement-based equivalent for the external system. A power series in an embedded complex variable on the load level is derived by the HEM. A physical germ solution is proposed to ensure that the embedded value of the power series is always equal to the overall loading level of the load area. Therefore, fed by on-line data on active and reactive powers at each load

TABLE VI

COMPARISON ON BUS 9 VOLTAGE FOR CASE C

|  | MCS | LCM | GCM3 | MCS | LCM | GCM3 |
| --- | --- | --- | --- | --- | --- | --- |
|  | Case C-I: 20% Ptr. | | | Case C-II: 40% Ptr. | | |
| ARMS/% | 0 | .010 | .008 | 0 | .067 | .010 |
| 10% CL/pu | .9727 | .9728 | .9727 | .9770 | .9772 | .9771 |
| 25% CL/pu | .9740 | .9741 | .9740 | .9795 | .9797 | .9797 |
| 75% CL/pu | .9773 | .9774 | .9773 | .9860 | .9863 | .9862 |
| 90% CL/pu | .9789 | .9790 | .9790 | .9891 | .9897 | .9894 |
| mean/pu | .9753 | .9754 | .9753 | .9819 | .9823 | .9819 |
| std. dev./pu | .00237 | .00244 | .00239 | .00463 | .00484 | .00466 |
| Com. time/s | 2123.1 | 154.3 | 293.1 | 2093.9 | 141.2 | 302.8 |
|  | Case C-III: 60% Ptr. | | | Case C-IV: 80% Ptr. | | |
| ARMS/% | 0 | .087 | .012 | 0 | 0.121 | .013 |
| 10% CL/pu | .9813 | .9816 | .9814 | .9854 | .9860 | .9856 |
| 25% CL/pu | .9850 | .9855 | .9851 | .9904 | .9912 | .9905 |
| 75% CL/pu | .9944 | .9954 | .9946 | 1.0027 | 1.0045 | 1.0030 |
| 90% CL/pu | .9990 | 1.0004 | .9993 | 1.0087 | 1.0112 | 1.0092 |
| mean/pu | .9897 | .9920 | .9898 | .9963 | .9976 | .9965 |
| std. dev./pu | 0.00690 | .00728 | 0.00694 | 0.0091 | .00973 | 0.00916 |
| Com. time/s | 2169.5 | 147.6 | 281.8 | 2130.3 | 160.0 | 278.0 | bus, the P-V (Power-Voltage) curve for every bus can be accurately calculated by performing only a one-time HEM calculation compared to many iterative computations with CPF. Besides, the adoption of adaptive Padé approximant (PA) for the power series given by the HEM can guarantee its convergence near voltage collapse, so as to accurately locate the voltage collapse point. Superior to other power-flow calculation methods, the HEM analytically gives the P-V curve connecting the current operating point to the voltage collapse point for an anticipated scenario of load increase, such that the VSM is directly obtained. Compared with other VSA methods, the proposed online HEM-based VSA approach can estimate the VSM at each bus of a load area and predict voltage instability with better time performance.

As a promising non-iterative method for solving PFEs of large power systems, the HEM was first proposed by A. Trias. Its basic idea is to design a holomorphic function and adopt its analytic continuation in the complex plane in order to find a power flow solution in a form of power series. The coefficients of power series are calculated in a recursive manner, whose numerical divergence means non-existence of the solution. The HEM was first demonstrated on systems having only PQ buses and a slack bus, and then on systems having PV buses as well. To enhance the convergence of the derived power series, some references suggest using PA, continued fractions or a multi-stage strategy. Reported HEM applications include analysis of saddle-node bifurcation, power flows of hybrid AC/DC systems, finding unstable equilibrium points, network reduction, and analysis of limit-induced bifurcation.

Although the superiority of the HEM can be seen in literatures, its practical implementation may encounter a precision issue especially for heavily loaded systems. Moreover, these previous HEMs are devoted to find the solution of one specific load condition, so their embedded variables unnecessarily have a physical meaning, e.g. the actual loading level. The HEM has been applied to estimate the saddle-node bifurcation point of static power flow conditions, in which the loads and total generation are scaled at the same rate. Compared with this, a hybrid VSA approach is applied and demonstrated on a realistic power network, where loads and generation can be scaled independently.

The P-V curve can be drawn by a derivative HEM using the error embedding algorithm. However, it is a multi-stage method, so the analytical solutions of the P-V curve cannot be directly obtained from one-time computation. Furthermore, supplemented with load trending prediction, this approach can predict the trend of voltage for early warning of voltage instability for system operators. Fast performance of the HEM gives the operators enough time to respond to foreseen instability and take necessary remedial actions.

XIV. Conventional Holomorphic Embedding Load Flow Method

Consider a complex-valued function x(s) of complex variable s=p+iq, with real part p and imaginary part q. If the embedded complex-valued function x(p+iq) satisfies Cauchy-Riemann equation (128), x(s) is complex-differentiable and thus holomorphic in a neighborhood of the complex s-plane.

$$i\frac{\partial x}{\partial p} = \frac{\partial x}{\partial q} \tag{128}$$

Under this circumstance, x(s) can be represented in the form of power series (129) in s within its convergence region C.

$$x(s) = \sum_{n=0}^{\infty} x[n]s^n, s \subset C \tag{129}$$

In order to solve a nonlinear equation g(x)=0, substitute (129) for x to generate a composite function of embedded variable s:

$$g(x)=g[x(s)]=0. \tag{130}$$

The idea of using the HEM to solve power flows is to embed a complex variable s into the nonlinear PFEs such that in the complex s-plane, an analytical solution is originated from a common germ solution and expanded to the objective final solution. Therefore, the power-flow problem becomes how to design an x(s) satisfying the following four criteria:

1) A common germ solution at s=0 can be found for the equation g[x(s)]=0. For power flow calculation, the germ solution is conventionally designated as the solution under a no-load, no-generation condition.

2) Ensuring that g[x(s)]=0 also holds at s=1 and the power series (129) can be mathematically induced within a defined number of order N, through expanding and equating the coefficients of the same order of $s^n$ in g[x(s)]=0. Thus, the final solution of x is easily obtained by letting s=1 in (129).

3) The s-embedded complex function g[x(s)] is analytically continuous (holomorphic) along the path from the germ solution at s=0 to the final solution at s=1.

4) On the path of s before bifurcation occurs, there is no exceptional point (also called branch point) where multiple solutions of g[x(s)]=0 coalesce with each other. Exceptional points only coincide at the bifurcation point.

Consider an N-bus system composed of PQ buses, PV buses and slack buses, which are denoted as sets of $\mathcal{P}, \mathcal{V}$ and $\mathcal{S}$ respectively. The original PFEs for PQ buses, PV buses and slack buses are expressed in the following (131)-(133) respectively, $$\sum_{k=1}^{N} Y_{ik} V_k = \frac{(P_i + jQ_i)^*}{V_i^*}, \forall i \in \mathcal{P} \tag{131}$$

$$\begin{cases} P_i = \text{Re}\left(V_i \sum_{k=1}^{N} Y_{ik}^* V_k^*\right), \forall i \in \mathcal{V} \\ |V_i| = |V_i^{sp}| \end{cases} \tag{132}$$

$$V_i = V_i^{SL}, \forall i \in \mathcal{S} \tag{133}$$

where $P_i$, $Q_i$, $|V_i|$ and $\theta_i$ are the active power injection, reactive power injection, voltage magnitude and phase angle at bus i. $V_k$ is the voltage phasor of bus k adjacent to bus i. $Y_{ik}$ is the admittance between bus i and bus k.

By the HEM formulation, the voltage of each bus and the reactive power of each PV bus are both represented as power series functions of an embedded complex variable s, denoted by V(s) and Q(s) respectively. Then, the s-embedded equations of PQ buses, PV buses and SL buses in (131)-(133) can be expressed as (134)-(136) respectively. Note that, in order to maintain the holomorphy of V(s), its conjugate V* is defined as a separate function V*(s*), not V*(s).

$$\sum_{k=1}^{N} Y_{ik,trans} V_k(s) = \frac{sS_i^*}{V_i^*(s^*)} - sY_{i,shunt} V_i(s), \forall i \in \mathcal{P} \quad (134)$$

$$\begin{cases} \sum_{k=1}^{N} Y_{ik,trans} V_k(s) = \frac{sP_i - jQ_i(s)}{V_i^*(s^*)} - sY_{i,shunt} V_i(s) \\ V_i(s)V_i^*(s^*) = 1 + (|V_i^{sp}|^2 - 1)s \end{cases}, \forall i \in \mathcal{V} \quad (135)$$

$$V_i(s) = 1 + (V_i^{SL} - 1)s, \forall i \in \mathcal{S} \quad (136)$$

XV. New Hem with Physical Germ Solution

Figures 37A, 37B:
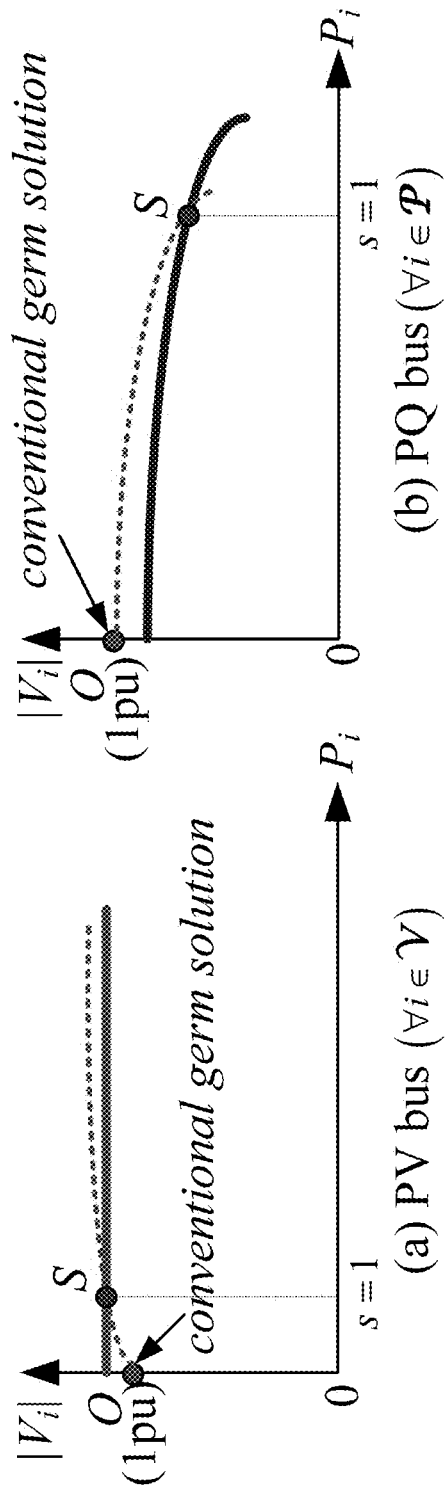
FIGS. 37A and 37B show the procedure of the conventional HEM.

In Eq. (134) and (135), the conventional method decomposes the admittance matrix $Y_{ik}$ into series part $Y_{ik,trans}$ and shunt part $Y_{i,shunt}$ to ensure that the common germ solution has the voltage equal to $1\angle 0°$ under the no-load, no-generation and no-shunt condition at every bus in the network, i.e. Point O in FIGS. 37A and 37B. Therefore, the power series expression created by the HEM (as indicated by the red dotted line) intersect the true P-V curve only at s=1, i.e. Point S in FIGS. 37A and 37B for the PV bus and PQ bus respectively. However, the embedded s does not mean a physical power flow solution at its other values, because $Y_{i,shunt}$ is also scaled by s in (134) and (135).

Figures 38A, 38B:
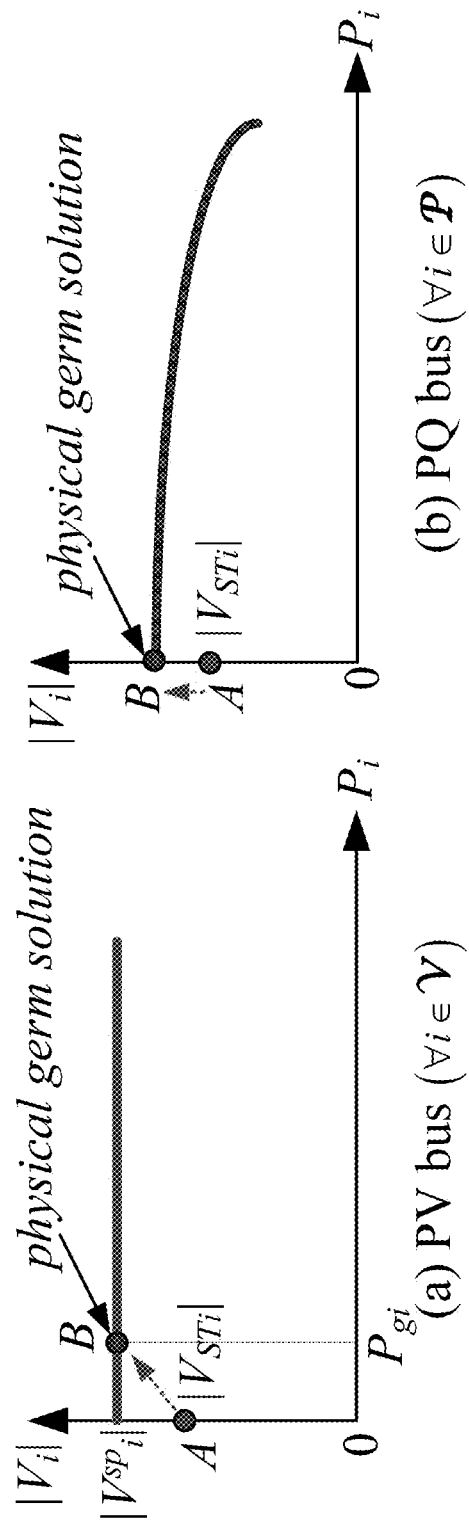
FIGS. 38A and 38B show the procedure of finding the physical germ solution.

As illustrated in FIGS. 38A and 38B, different from the germ solution for the conventional HEM, a physical germ solution is proposed in this paper with the no-load no-generation assumption only for PQ buses while non-zero active power is specified and reactive power is injected into PV buses to adjust their voltage magnitudes specifically to $|V_i^{sp}|$, i.e. Point B in FIGS. 38A and 38B.

Therefore, to find the physical germ, the s-embedded equations of PQ buses, PV buses and SL buses in (131)-(133) are expressed as in (137)-(139) respectively, where notations with subscript gi indicates the physical germ solution of bus i.

$$\sum_{k=1}^{N} Y_{ik} V_k(s) = 0, \forall i \in \mathcal{P} \quad (137)$$

$$\begin{cases} \sum_{k=1}^{N} Y_{ik} V_k(s) = \frac{sP_{gi} - jQ_{gi}(s)}{V_{gi}^*(s^*)} \\ V_{gi}(s)V_{gi}^*(s^*) = |V_{STi}|^2 + (|V_{gi}^{sp}|^2 - |V_{STi}|^2)s \end{cases}, \forall i \in \mathcal{V} \quad (138)$$

$$V_{gi}(s) = V_{gi}^{SL}, \forall i \in \mathcal{S} \quad (139)$$

The procedure of finding this physical germ solution consists of two steps. The first step is to find the starting voltage under which the slack bus propagates its voltage to every bus of the network, while all PV and PQ buses have zero injection to the grid, i.e. Point A in FIG. 38(a) and FIG. 38(b) for PV bus and PQ bus, respectively. $V_{STi}$ in (138) represents the starting voltage of bus i, which is calculated by (140)-(141).

$$\sum_{k=1}^{N} Y_{ik} V_{STk} = V_i^{SL}, \forall i \in \mathcal{S} \quad (140)$$

$$\sum_{k=1}^{N} Y_{ik} V_{STk} = 0, \forall i \in \mathcal{P} \cup \mathcal{V} \quad (141)$$

Then the second step is to gradually adjust the reactive powers of PV buses to control their voltage magnitudes from the starting voltage $|V_{STi}|$ to the specified voltage $|V_i^{sp}|$ by recursively embedding a series of reactive power equal to $Q_{gi}(s)$. Meanwhile, the active power of each PV bus is fixed at the base value of the original condition $P_{gi}$, i.e. Point B in FIG. 38(a) and FIG. 38(b) for PV bus and PQ bus respectively.

Define the voltage of the physical germ solution for bus i as $V_{gi}(s)$, which is expanded to a power series in s.

$$V_{gi}(s) = V_{STi} + V_{gi}[1]s + V_{gi}[2]s^2 + L \quad (142)$$

Then define another power series $W_{gi}(s)$ as its inverse:

$$W_{gi}(s) = \frac{1}{V_{gi}(s)} = W_{gi}[0] + W_{gi}[1]s + W_{gi}[2]s^2 + L \quad (143)$$

Since starting voltage $V_{STi}$ is calculated by (140)-(141), $W_{gi}[n]$, i.e. the coefficient of term n, can be calculated by convolution of coefficients of terms 1 to n−1 of $V_{gi}(s)$ and $W_{gi}(s)$ by $$W_{gi}[0] = 1/V_{STi} \quad (144)$$

$$W_{gi}[n]V_{STi} + W_{gi}[0]V_{gi}[n] = -\sum_{m=1}^{n-1} W_{gi}[m]V_{gi}[n-m], n \geq 1 \quad (145)$$

Substitute $W_{gi}(s)$ to embedded PFEs (137)-(138) and expand them as (146) and (147) for PQ and PV buses, respectively.

$$\sum_{k=1}^{N} Y_{ik}(V_{STk} + V_{gk}[1]s + V_{gk}[2]s^2 + L) = 0, \forall i \in \mathcal{P} \quad (146)$$

$$\begin{cases} \sum_{k=1}^{N} Y_{ik}(V_{STk} + V_{gk}[1]s + V_{gk}[2]s^2 + L) = \\ [sP_{gi} - j(Q_{gi}[1]s + Q_{gi}[2]s^2 + L)](W_{gi}^*[0] + W_{gi}^*[1]s + L), \forall i \in \mathcal{V} \\ (V_{STi} + V_{gi}[1]s + L)(V_{STi}^* + V_{gi}^*[1]s + L) = \\ |V_{STi}|^2 + (|V_{gi}^{sp}|^2 - |V_{STi}|^2)s \end{cases} \quad (147)$$

Equating the coefficients of s, $s^2$, ... up to $s^n$ on both sides of (146) and (147), $V_{gi}[n]$ and $Q_{gi}[n]$ are obtained by the terms 0 to n−1 of $W_{gi}(s)$ and $Q_{gi}(s)$ from (148) and (149).

$$\sum_{k=1}^{N} Y_{ik} V_{gk}[n] = 0, \forall i \in \mathcal{P} \quad (148)$$

-continued $$\begin{cases} \sum_{k=1}^{N} Y_{ik} V_{gk}[n] = P_i W_{gi}^*[n-1] - jQ_{gi}[n]W_{gi}^*[0] - j\left(\sum_{m=1}^{n-1} Q_{gi}[m]W_{gi}^*[n-m]\right) \\ V_{gi}[n]V_{gi}^*[0] + V_{gi}[n]V_{gi}^*[0] = \varepsilon_i[n-1] \end{cases}, \forall i \in \mathcal{V} \quad (149)$$

$\varepsilon_i[n-1]$ defined by (150) can quickly converge with a few terms since it contains the high order terms of $V_{gi}[n]s^n$.

$$\varepsilon_i[n-1] = \delta_{n1} \cdot \frac{1}{2}(|V_{gi}^{sp}|^2 - |V_{STi}|^2) - \frac{1}{2}\left(\sum_{m=1}^{n-1} V_{gi}[m]V_{gi}^*[n-m]\right) \quad (150)$$

$\delta_{nj}$ in (150) is the Kronecker delta function:

$$\delta_{nj} = \begin{cases} 1 & \text{if } n = j \\ 0 & \text{otherwise} \end{cases} \quad (151)$$

In (149), $V_{gi}[n]$ and $W_{gi}[n]$ are unknown complex numbers, and $Q_{gi}[n]$ is an unknown real number. Move all unknowns of the nth order coefficients to the left hand side and break the PFEs into real and imaginary parts. Then, a matrix equation is created containing all $V_{gi}[n]$, $W_{gi}[n]$ and $Q_{gi}[n]$. There are 5 real unknowns in total for each PV bus, as $V_{gi}[n]$ and $W_{gi}[n]$ are complex values and $Q_{gi}[n]$ is a real number. Assume that there are l slack buses, m PQ buses and p PV buses in the N-bus network. Then, the dimension of the matrix equation equals to 2l+2m+5p. The matrix equation to find the physical germ solution of a demonstrative 3-bus system is introduced in detail in APPENDIX-F.

After obtaining the physical germ solution, the final process of the proposed HEM is similar to the conventional HEM. Table VII shows the embedding method of HEM with the proposed physical germ solution for PQ, PV and SL buses, respectively, where s represents the loading level only for PQ buses. The difference mainly lies on the right hand side of PQ bus equation in Table I, that s is multiplied by the complex load of the PQ bus. Note that, different from the conventional HEM during the process of embedding, the active powers of PV buses are not multiplied by s, indicating invariant generation outputs under load increase. However, if frequency regulation is considered with PV buses, which typically models generator buses, an additional term with generation regulation factor $\alpha_i$ can be attached as shown in (152) to represent the effect of frequency regulation. Here $\alpha_i P_i$ represents the increase rate of active power of generator i with respect to the overall load variation.

$$\sum_{k=1}^{N} Y_{ik} V_k(s) = \frac{(P_{gi} - jQ_{gi}) + s(\alpha_i P_i) - jQ_i(s)}{V_i^*(s^*)}, \forall i \in \mathcal{V} \quad (152)$$

TABLE VII

Solutions of PFEs for different bus types with the proposed HEM

| Type | Physical germ solution (s = 0) | Final solution (s ≠ 0) |
|---|---|---|
| PQ | $\sum_{k=1}^{N} Y_{ik} V_k(s) = 0$ | $\sum_{k=1}^{N} Y_{ik} V_k(s) = \frac{s(P_i - jQ_i)}{V_i^*(s^*)}$ |

TABLE VII-continued

Solutions of PFEs for different bus types with the proposed HEM

| Type | Physical germ solution (s = 0) | Final solution (s ≠ 0) |
|---|---|---|
| PV | $\sum_{k=1}^{N} Y_{ik} V_k(s) = \frac{P_{gi} - jQ_{gi}}{V_{gi}^*}$ $V_i(s)V_i^*(s^*) = |V_{gi}|^2$ | $\sum_{k=1}^{N} Y_{ik} V_k(s) = \frac{(P_{gi} - jQ_{gi}) - jQ_i(s)}{V_i^*(s^*)}$ $V_i(s)V_i^*(s^*) = |V_{gi}|^2 + (|V_i^{sp2}| - |V_{gi}|^2)s$ |
| SL | $V_i(s) = V_i^{SL}$ | $V_i(s) = V_i^{SL}$ |

XVI. Adaptive Two-Stage PADÉ Approximants

As mentioned in the previous section, voltage can be expressed in the form of power series (153) by the HEM. However, the precision issue could have a non-ignorable impact on the performance of HEM, especially when the loading level s extends to the heavily stressed conditions. The reason of this problem lies in the limited convergence region of a truncated power series with limited arithmetic precision. In addition, the double-precision calculation with about 16-digits practically becomes exhausted to decrease the errors of PFEs to $1 \times 10^{-13}$ or lower. An alternative solution is to increase the arithmetic precision to much more digits, i.e. 2000 digits, but the convergence region still cannot reach the actual stability boundary.

From Stahl's Padé convergence theory, the diagonal or close to diagonal PA converge to the original function in the maximum domain if the original function is holomorphic. In other words, PA have the best convergence performance with equal or nearly equal orders between the numerator and denominator, i.e. $|L-M| \leq 1$ in (154). Different from the conventional HEM using PA to determine the convergence of PFEs, an adaptive two-stage algorithm is proposed here to find the optimal order of PA for each voltage. Viskovatov's method is adopted here to find the coefficients of PA. This is carried out with the double precision arithmetic computation after the HEM is performed.

$$V_i(s) = \sum_{n=0}^{N} V_i[n]s^n \quad (153)$$

$$V_i(s) = \sum_{l=0}^{L} a_l s^l \bigg/ \sum_{m=0}^{M} b_m s^m = \frac{a_0 + a_1 s + a_2 s^2 + \cdots + a_L s^L}{b_0 + b_1 s + b_2 s^2 + \cdots + a_M s^M} \quad (154)$$

Figure 39:
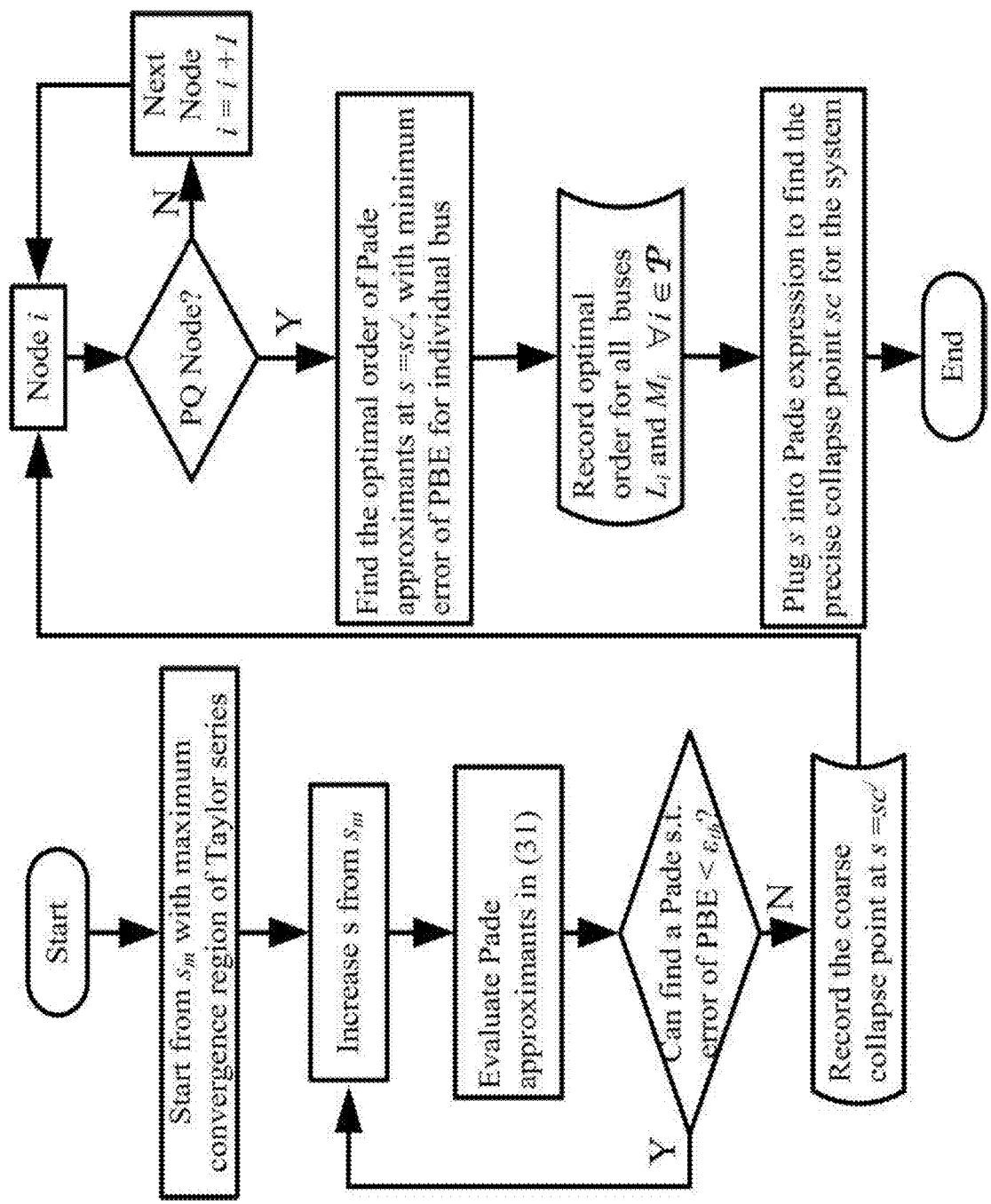
FIG. 39 shows the flowchart of adaptive two-stage PA to find the collapse point of the power system.
Figure 40:
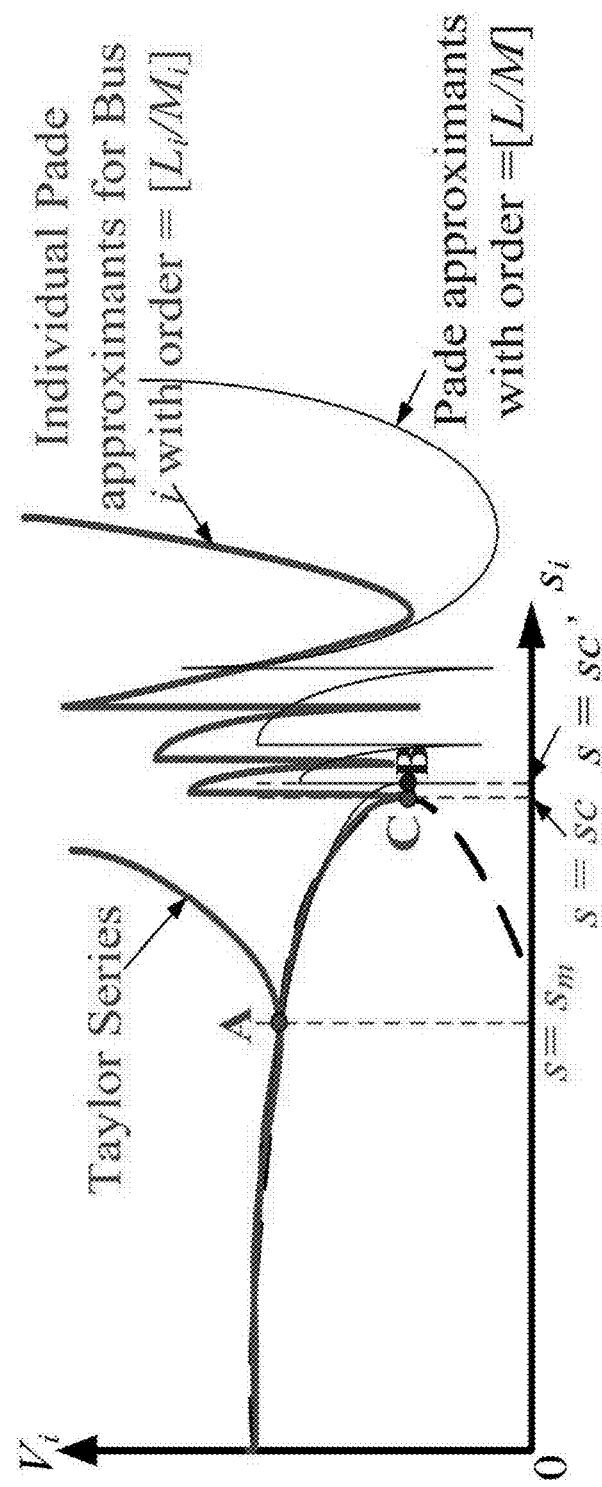
FIG. 40 is the illustration of adaptive two-stage PA.

As shown by the flowchart in FIG. 39, the adaptive PA method consists of two stages, i.e. finding a coarse collapse point at sc' and then identifying a precise collapse point at sc. The first stage is to plug values of s into the power series about PQ buses created by the HEM to find the maximum convergence region at $s=s_m$, shown by point A in FIG. 40. Then the full order PA, i.e. [L/M] for the power series can improve the convergence region from s $s_m$ to the coarse collapse point s=sc', where the maximum ε(s) of all PQ buses can be less than a preset threshold $\varepsilon_{th}$, shown by point B in FIG. 40. This process is defined by equation (155).

$$sc' = \max s, \text{ s.t.} \tag{155}$$

$$\varepsilon(s) = \max_i \left| \sum_{k=1}^{N} Y_{ik} V_k(s) - \frac{sS_i^*}{V_i^*(s^*)} \right|_{i \neq k} < \varepsilon_{th}, \forall i \in \mathcal{P}$$

The second stage is to find the optimal order of PA for individual bus i to achieve the minimum error of PBEs at s=sc' (154). The optimal order for individual bus i is recorded as $L_i$ and $M_i$, so the Padé expression of voltage is obtained by truncating $[L_i/M_i]$ orders in (154) while still satisfying $|L_i - M_i| \le 1$. The collapse point of bus i is the nearest pole of the truncated PA, i.e. $sc_i$. Finally, the final collapse point predicted at time t, i.e. $sc_t$ in (156), is found by selecting the minimum $sc_i$ of all buses, shown by point C in FIG. 40.

$$sc_t = \min_i sc_i = \min_i \left( \min_{(M_i \& L_i)} \varepsilon(sc') \right), \forall i \in \mathcal{P} \tag{156}$$

This adaptive two-stage method finds a good tradeoff between the error tolerance in the solution and the condition number of the Padé matrix. When evaluating a diagonal [L/M] Padé, coefficients of terms up to $s^{L+M}$ are required for the power series. The condition number of the Padé matrix increases as the degree of the diagonal PA increases. Due to the adopted double-precision arithmetic and the round-off errors in the calculation process, evaluating the highest degree of PA usually means adding inaccurate numbers very close to zero to the numerators and denominators of (154), which leads to an inaccurate estimation of collapse point. Therefore, adaptively adjusting to an appropriate degree of PA for each load bus can increase the accuracy.

XVII. Online Voltage Stability Assessment

Online VSA scheme by the HEM is proposed to predict voltage instability of a load area. The parameters of equivalent circuit are identified to represent the external grid. Then, an accurate loading limit at each load bus in the load area can be calculated based on the state estimation on the entire load area.

A. Identification of External System Parameters

Figure 41:
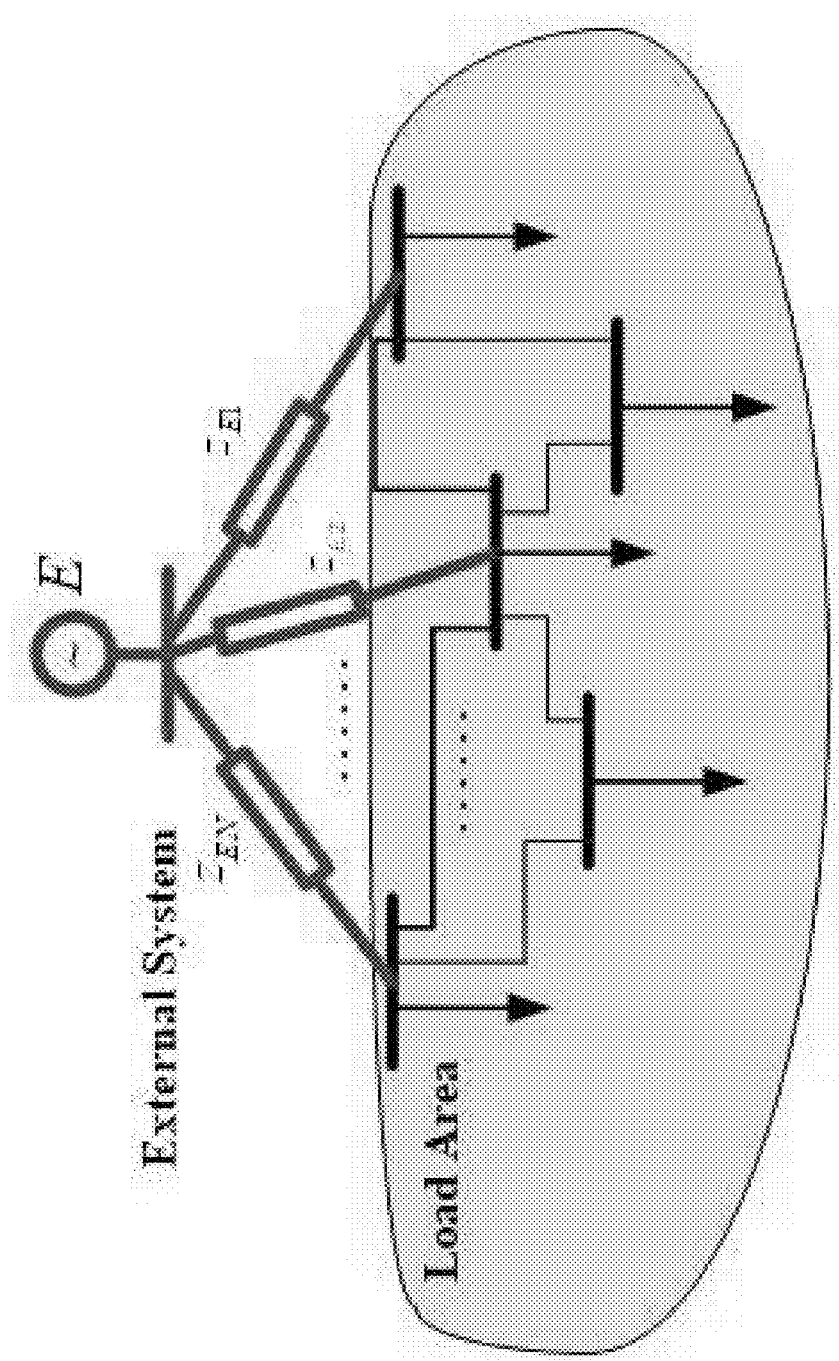
FIG. 41 shows the reduction of the external system to an N+1 equivalent circuit.

Suppose a load area fed by an external system through multiple tie lines. These tie lines may have different power transfer limits in terms of voltage stability. As shown in red in FIG. 41, an N+1 buses equivalent system representing the external grid is proposed. The external grid is regarded as a single voltage source E connected to N boundary buses of the load area respectively by N branches with impedances $z_{E1}$ to $z_{EN}$. Therefore, the coupling relationship among tie lines and boundary buses are retained, so the HEM-based online VSA scheme can be performed directly on the reduced system as in FIG. 41, while retaining all load buses in the load area.

The Sequential Quadratic Programming (SQP) method is applied to identify the parameters of the equivalent circuit, i.e. E and $z_{E1}$ to $z_{EN}$, using synchronized data of complex power $S_i$ and voltage phasor $V_i$ measured at the boundary buses. Assume that a time window of K measurement points is obtained by PMUs. $V_i(k)=|V_i(k)|\angle\theta_i(k)$ and $S_i(k)=P_i(k)+jQ_i(k)$ are defined respectively as the received complex power and voltage phasor at boundary bus i at time point k (k=1~K). Therefore, the parameters of the external system can be obtained by solving the following optimization problem, $$\min J^{ex} = \sum_{k=1}^{K} \sum_{i=1}^{N} \frac{\omega_e}{N} [e_i^{ex}(k)]^2 + \tag{157}$$

$$\sum_{i=1}^{N} \omega_z \left(\frac{r_{Ei}}{r_{EP}} - 1\right)^2 + \sum_{i=1}^{N} \omega_z \left(\frac{x_{Ei}}{x_{EP}} - 1\right)^2 \text{ s.t. } E > 1, r_{Ei} \ge 0$$

where the $1^{st}$ term gives the estimation errors for power flow equations for all the time instants. The error at time instant k is defined as (31)

$$e_i^{ex}(k) = E - |(P_i(k) - jQ_i(k))(r_{Ei} + jx_{Ei}) + (V_i(k))^2|/V_i(k) \tag{158}$$

The $2^{nd}$ and $3^{rd}$ terms summate normalized differences in resistance $r_{Ei}$ and reactance $x_{Ei}$ of $z_{Ei}$ between the estimates for the current and previous time windows. $\omega_e$ and $\omega_z$ are the weighting factors respectively for variances of E and $z_{Ei}$ over the time window.

B. Voltage Stability Assessment Algorithm

Figure 42:
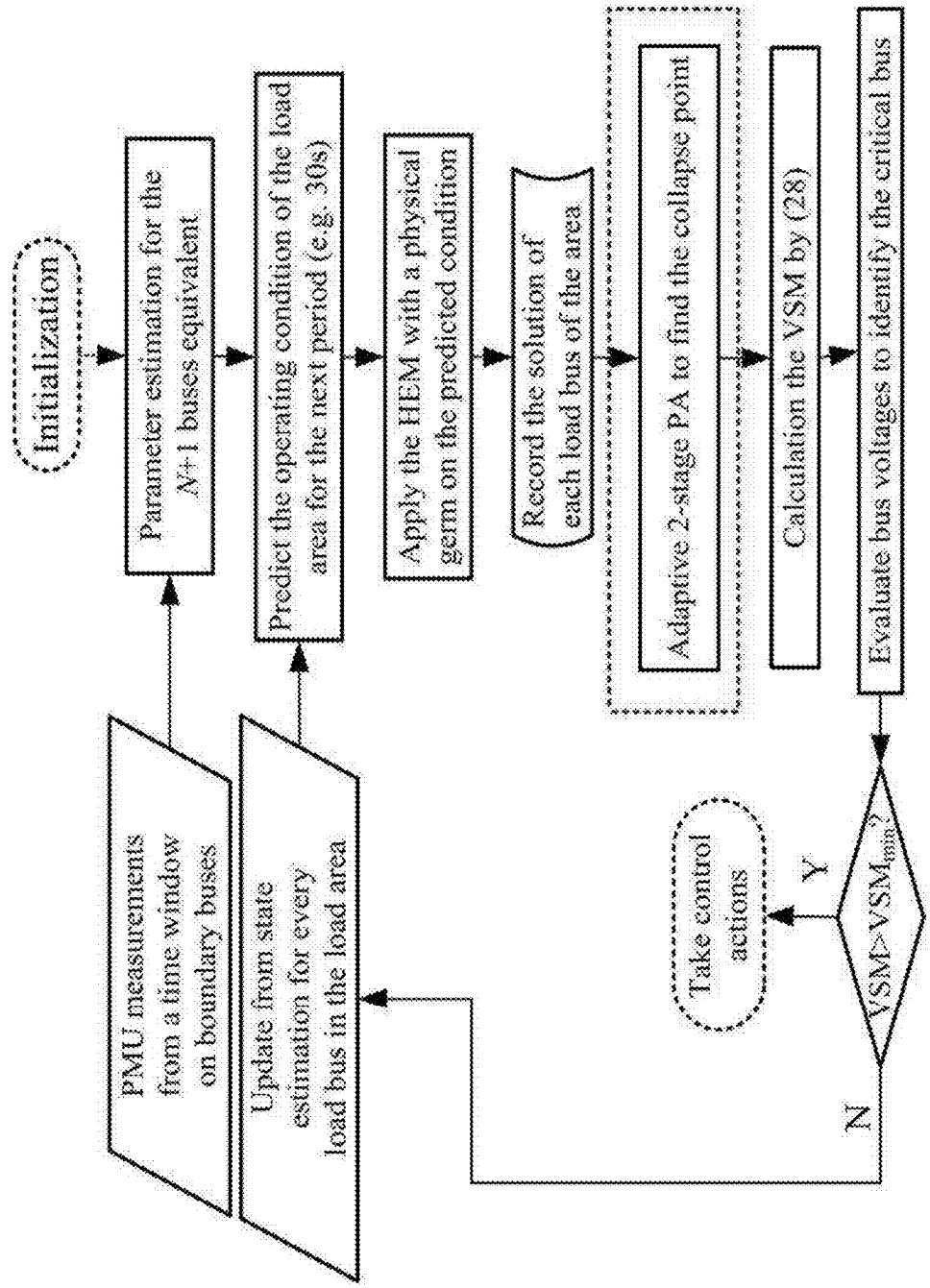
FIG. 42 shows the flowchart of the HEM-based online VSA scheme.

As shown by the flowchart of the HEM-based online VSA scheme in FIG. 42, the scheme is applied to an offline selected load area with N branches supported by the external grid. Then, fed by the synchronized PMU measurements for a sliding time window, the parameters of the equivalent circuit can be estimated online to represent the external grid. Meanwhile, the state of each bus in the load area is updated from the state estimation. It can be assumed that the active power, reactive power and voltage of every bus of the load area are obtained from the state estimator, e.g. every 30 seconds. Practically, the loads may vary randomly in a load area, so load trending prediction for the next 30 seconds is adopted. Applying the forecasted loading condition and identified parameters of the equivalent external system, the proposed HEM generates the power series for every bus regarding the overall loading scale of the load area. Further, an adaptive 2-stage PA method is used to find the accurate collapse point and then the corresponding VSM can be calculated. Additionally, the voltage of each bus with respect to overall load increase can be evaluated by plugging in the loading scale into the analytical expression of the PA. Hence, the critical bus with the lowest voltage can be identified. Finally, if the voltage margin VSM for the next period violates a pre-specified threshold $VSM_{min}$, control actions may be taken immediately on that critical bus.

Figure 43:
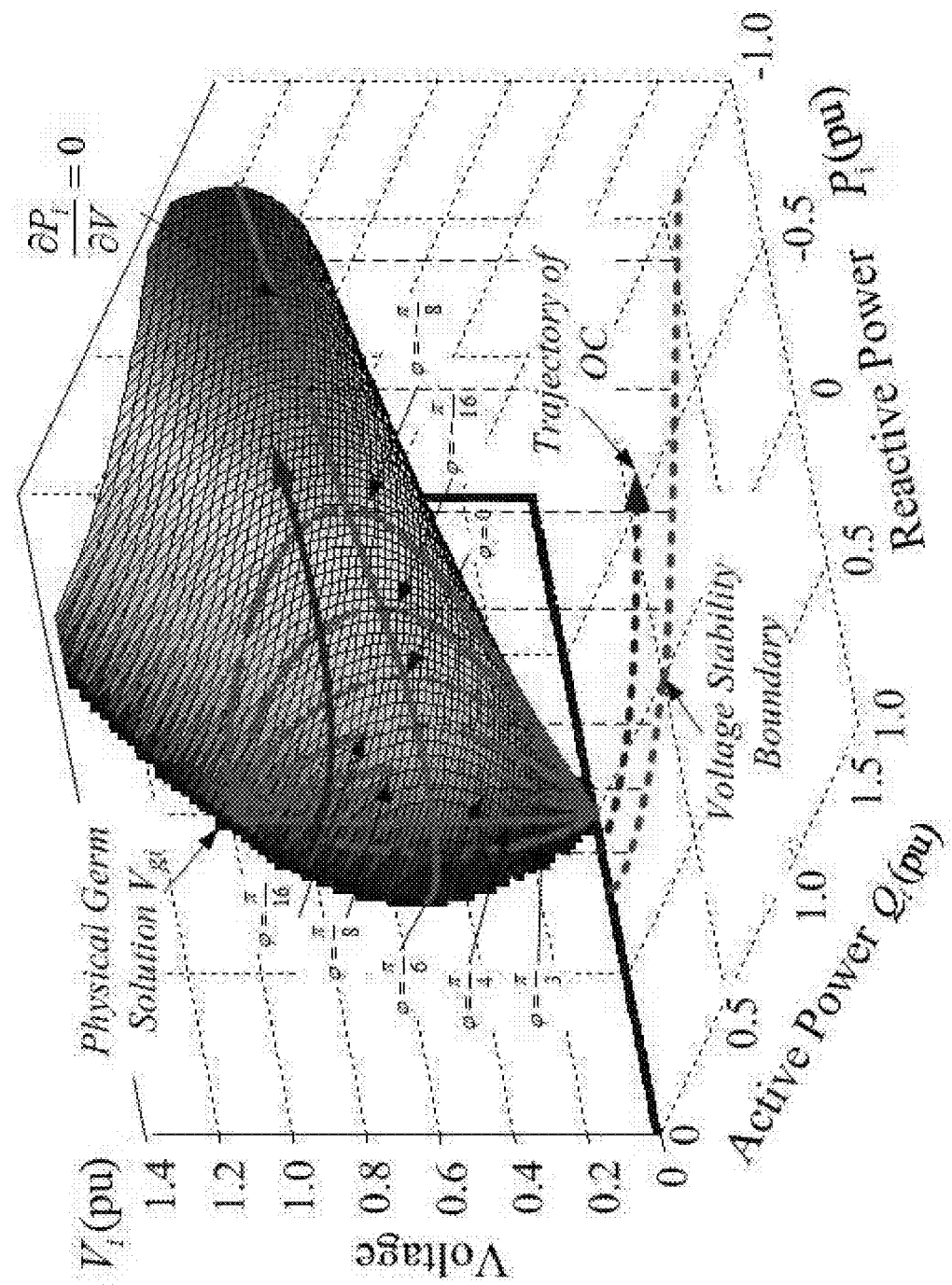
FIG. 43 is the illustration of the voltage with respect to its active and reactive powers and the voltage stability boundary for a load bus.

In FIG. 43, the surface in the 3-dimensional space illustrates how the voltage magnitude of a load bus i changes with its active and reactive powers. The physical germ solution $V_{gi}$ clearly shows the no-load condition of the load bus. The green line highlights the voltage stability boundary of the load bus i with respect to different power factors, while the arrowed blue line illustrates the trajectory of the operating condition (OC).

Figure 44:
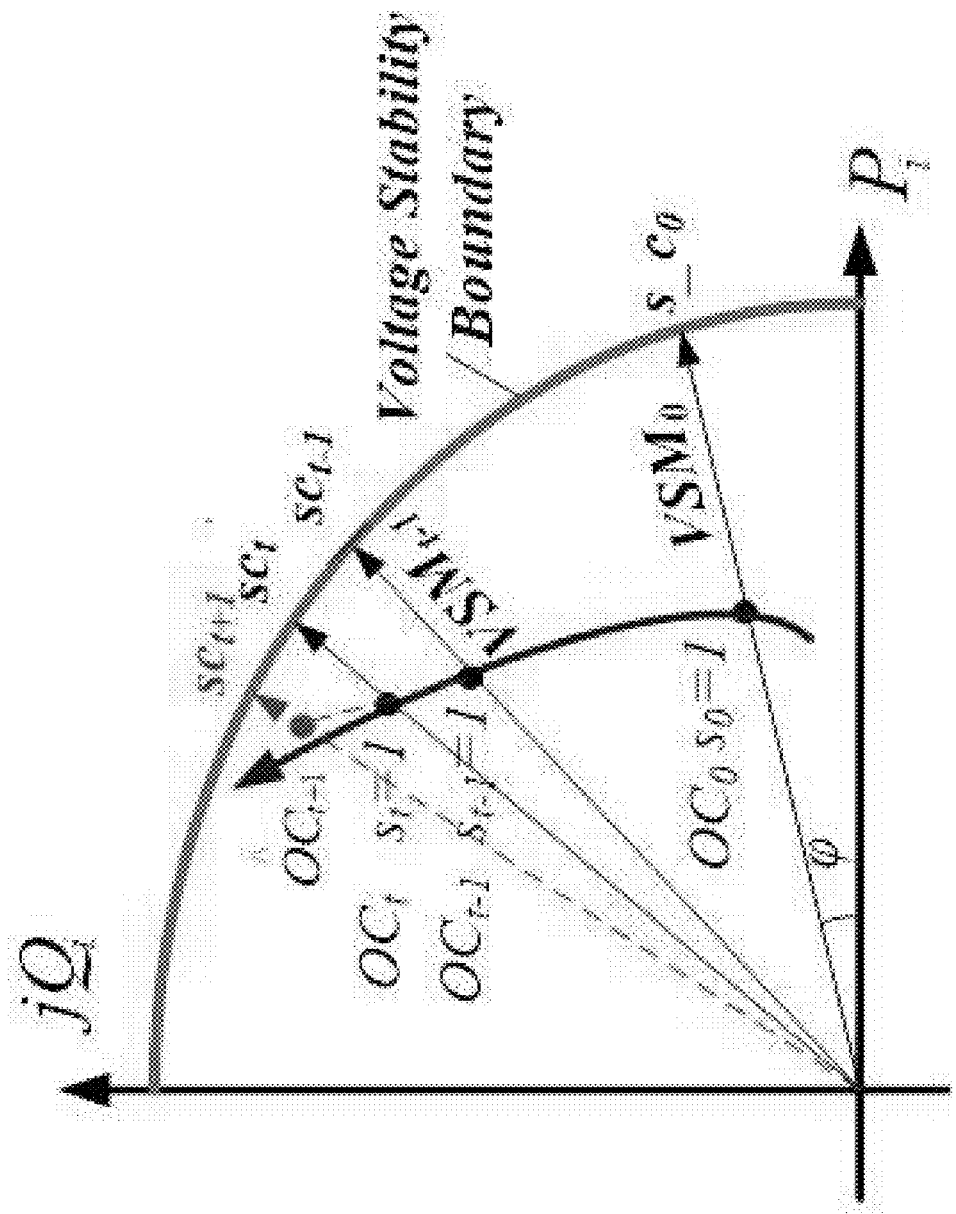
FIG. 44 is the illustration of HEM-based VSA scheme.

FIG. 44 depicts the projection of FIG. 43 onto the P-Q plane to illustrate the procedure of this HEM-based online VSA scheme. The x-axis and y-axis represent the active and reactive powers of bus i. The voltage stability boundary represents the voltage collapse point with respect to different power factor angles φ. The point $OC_0$ is the original operating condition with $s_0$=1. After implementation of this proposed HEM, the P-V curve can be obtained by plugging various values of s into the power series of V(s) under the assumption that all loads are scaled up simultaneously at the same rate and the power factor of each load is maintained invariant.

Then adaptive PA help to accurately predict the voltage collapse point $sc_t$, which will be introduced in the next sub-section. The VSM of the overall system is defined in (159), where $sc_t$ represents the maximum loading scale at time t until the voltage collapses. VSM physically means the maximum limit of the loading scale in percentage to maintain the voltage stability of the load area.

As shown in FIG. 44, assuming the current operating condition (at time t) is the point $OC_t$, the load trending prediction for the next 30 seconds period is adopted, which is based on the linear extrapolation of previous periods. In (160), $S_{i,t}$ denotes the complex power of bus i at time t.

$$VSM_t = (sc_t - 1) \times 100\% \quad (159)$$

$$S_{i,t+1} = S_{i,t} + \Delta S_{i,t} = 2S_{i,t} - S_{i,t-1} \quad (160)$$

C. Considering Different Load Models

Even for steady-state analysis, load models are important in the VSA especially when voltage dependent loads exist. For example, the actual voltage collapse point no longer coincides with the nose point of the P-V curve when load cannot be modelled as 100% constant power load. A new power series about the voltage magnitude, i.e. $M_i(s) = |V_i(s)|$, should be integrated to represent the dependence between the loading level and the voltage magnitude. When ZIP load exists, the actual load varies nonlinearly with s. APPENDIX-G demonstrates the embedding method and the final matrix equation on a 3-bus system with ZIP load.

D. Computational Burden of the Proposed Scheme

After the data collected from the state estimation, the ideal computation time of the proposed VSA scheme includes three parts, i.e. (i) the time $T_{Germ}$ for finding the physical germ solution, (ii) the time $T_{PS}$ for finding the power series by the HEM using the physical germ solution, and (iii) the time $T_{Padé}$ for calculating the collapse point by the adaptive PA.

$$T_{HEM} = T_{Germ} + T_{PS} + T_{Pade} \quad (161)$$

$$T_{Germ} = N_{Germ} \cdot t_M \quad (162)$$

$$T_{PS} = N_{PS} \cdot t_M \quad (163)$$

Since each term is calculated by a matrix multiplication and several convolutions, the computation times $T_{Germ}$ and $T_{PS}$ mainly depend on the numbers of terms required to meet the error tolerance, i.e. $N_{Germ}$ and $N_{PS}$ in (162) and (163), respectively. $t_M$ indicates the average computation time for each term. Less error tolerance implies more terms in the power series to approximate the P-V curve. Practically, the maximum number of terms is in the range of 40-60 since the float point precision can be exhausted. The computation burden of $T_{Padé}$ mainly depends on the number of PQ buses in the network.

Compared with the CPF, which starts from a certain power flow solution and linearly predicts and corrects an adjacent point on the P-V curve step by step using the Newton-Raphson (N-R) method, the proposed HEM has better time performance. Although it also starts from a certain point, the HEM predicts the P-V curve nonlinearly and directly to the branch point.

Assume that there are l slack buses, m PQ buses and p PV buses in the N-bus network. The dimension of the matrix equation equals $D_m = 2l + 2m + 5p$ and a number of $C_m = m + 2p$ convolutions are involved in the calculation of each term. The computational complexity of the proposed HEM is (164).

$$O(D_m^3) + N_{PS} \cdot O(D_m^3) + C_m N_{PS} \cdot O(N_{PS}^2) \quad (164)$$

The 1$^{st}$ term is the computational complexity of matrix inverse. The 2$^{nd}$ and 3$^{rd}$ parts are the complexities with matrix multiplications and convolutions, respectively. The HEM algorithm contains one matrix inverse operation, $N_{PS}$ matrix multiplication operations and $C_m N_{PS}$ convolutions.

The computational complexity of CPF also depends on the size of the network and the iterations of the prediction-correction scheme. Assume the CPF contains $N_{step}$ prediction steps and each step contains $N_{Iter}$ correction iterations on average. The computational complexity is (165).

$$N_{Step} N_{Iter} [3 \cdot O(E_m^3)] \quad (165)$$

The computational complexity of finding the $E_m \times E_m$ ($E_m = 2m + p$) Jacobian matrix per iteration is $O(E_m^3)$. Then the Jacobian matrix is inversed and multiplied with the error matrix of PFEs. All the 3 operations are with computational complexity of $O(E_m^3)$. The prediction-correction steps are normally much more than the terms of the HEM (i.e. $N_{Step} > N_{PS}$). So the proposed HEM has higher efficiency over the conventional CPF. The computation time of CPF and the proposed method will be compared in the following sections.

XVIII. Illustration on a 4-Bus Power System

Figures 45A, 45B:
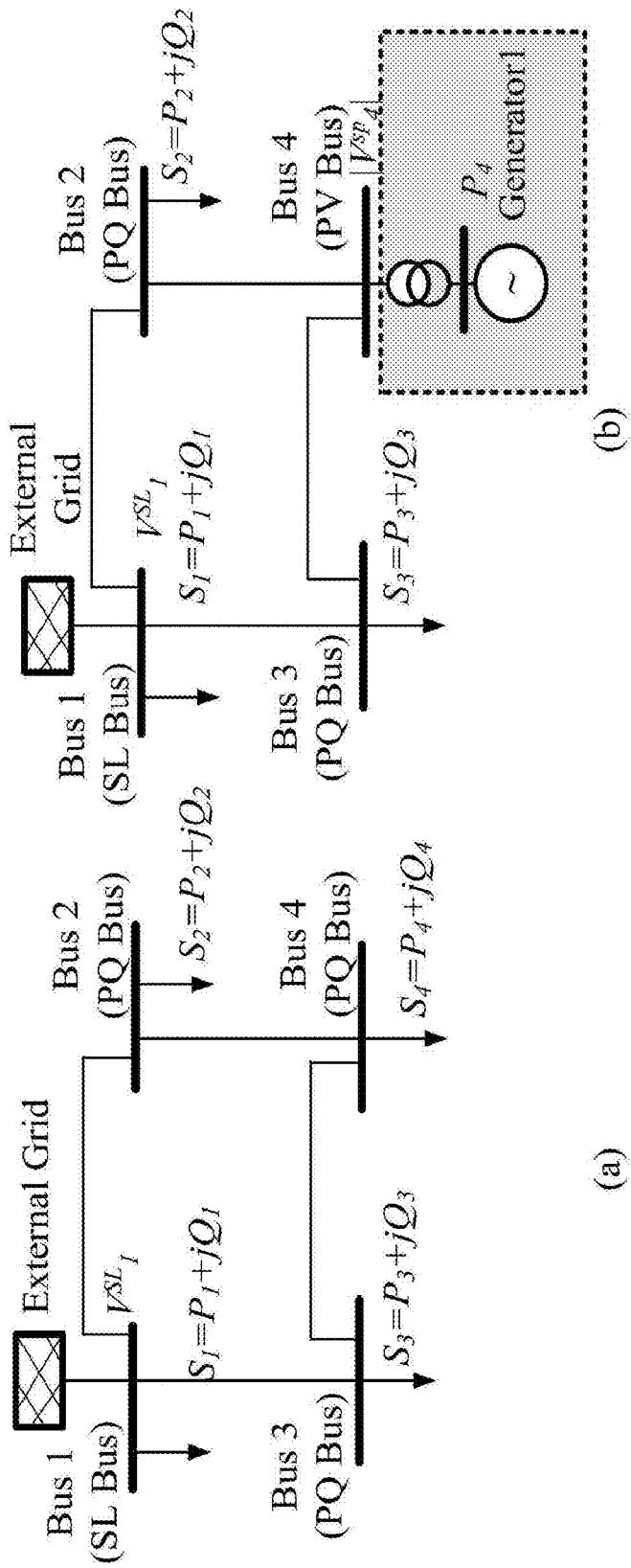
FIGS. 45A and 45B show, respectively, the 4-bus power system for Case A and Case B, and Case C.

As shown in FIG. 45A, a 4-bus test system modified from that in is first used to demonstrate the proposed VSA approach. It has an external grid supporting three constant power loads. The external grid model is provided by the software DIgSILENT PowerFactory. The time-domain simulation is executed by DIgSILENT PowerFactory with gradual load increases from the original operating condition. Then the proposed HEM-based VSA is implemented in MATLAB, and compared with the CPF using the MATPOWER 6.0 toolbox. Case A and Case B are quasi-dynamic simulations considering different types of load profiles. Case C conducts dynamic simulation with ZIP models for loads and a generator connected to Bus 4 as shown in FIG. 45B. Data for Cases A-C are given in APPENDIX-H.

A. Case A: Increasing Loads at the Same Rate

Figures 46A, 46B:
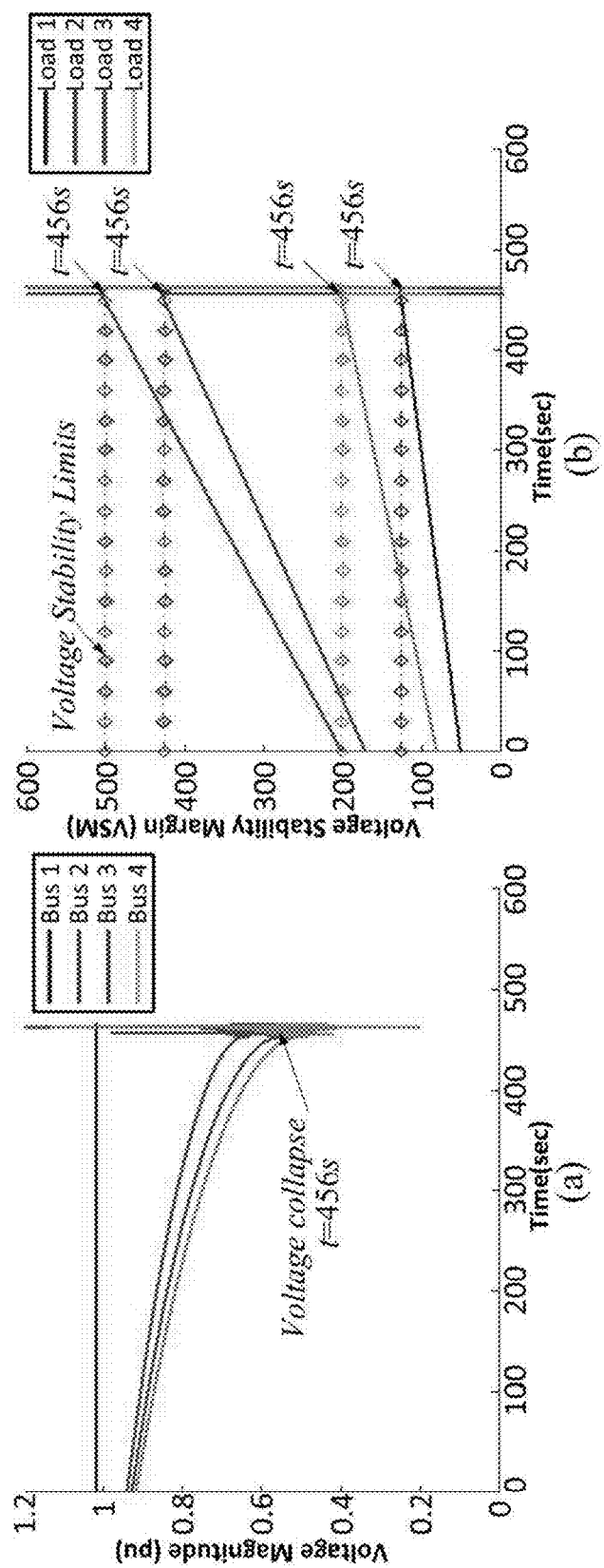
FIGS. 46A and 46B show, respectively, the voltage magnitudes and active powers vs. limits for Case A.

In Case A, the power consumption of all loads is gradually ramped up at the same rate from their original loads while their power factors are kept unchanged. It can be identified by the voltage magnitudes in FIG. 46A that voltage collapse happens at t=456 s, which is accurately predicted by the results from the HEM calculated every 30 seconds, as shown in FIG. 46B, where active powers at all buses cross their respective voltage stability limits at the same time. The diamond markers connected to horizontal dash-dot lines in FIG. 46B indicate the voltage stability limit of each bus calculated by the HEM and updated every 30 seconds (assumed to be the time interval of state estimation). Note from FIG. 46B that this case has invariant voltage stability limits for all buses since all loads increase uniformly.

Figures 47A, 47B:
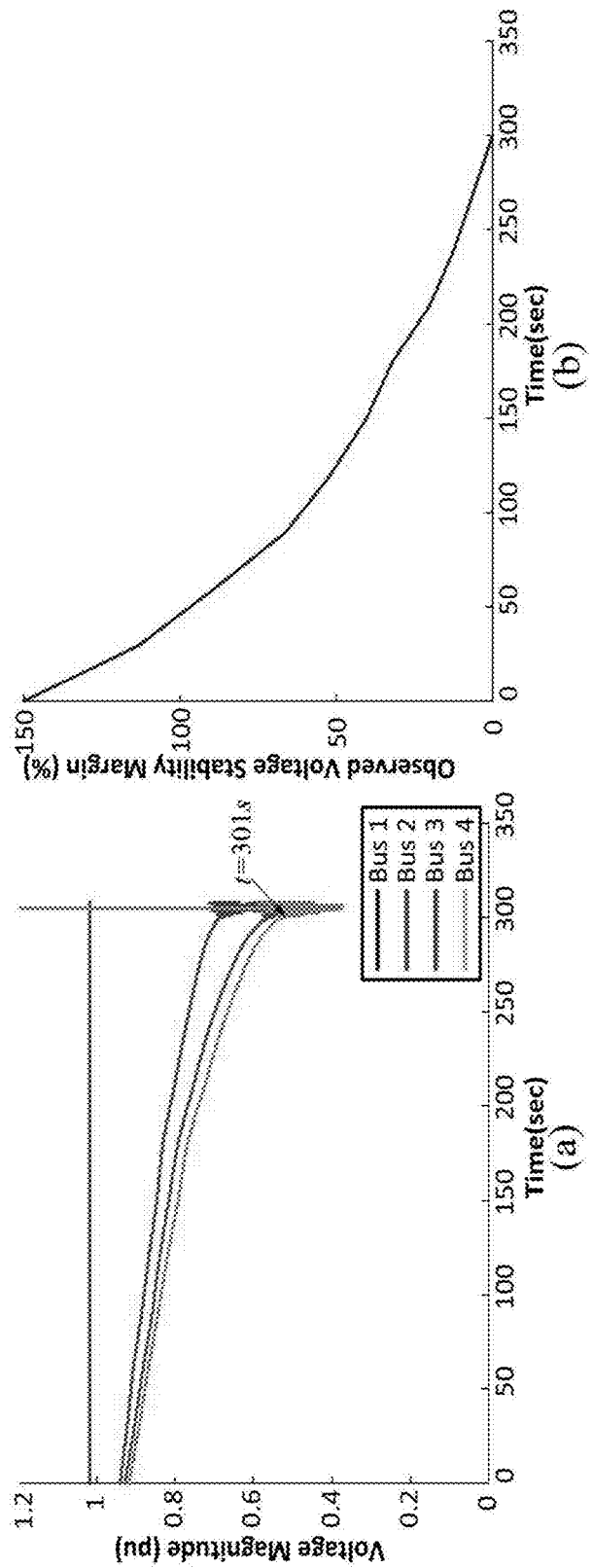
FIGS. 47A and 47B show, respectively, the voltage magnitudes and VSM for Case B.
Figures 48A, 48B:
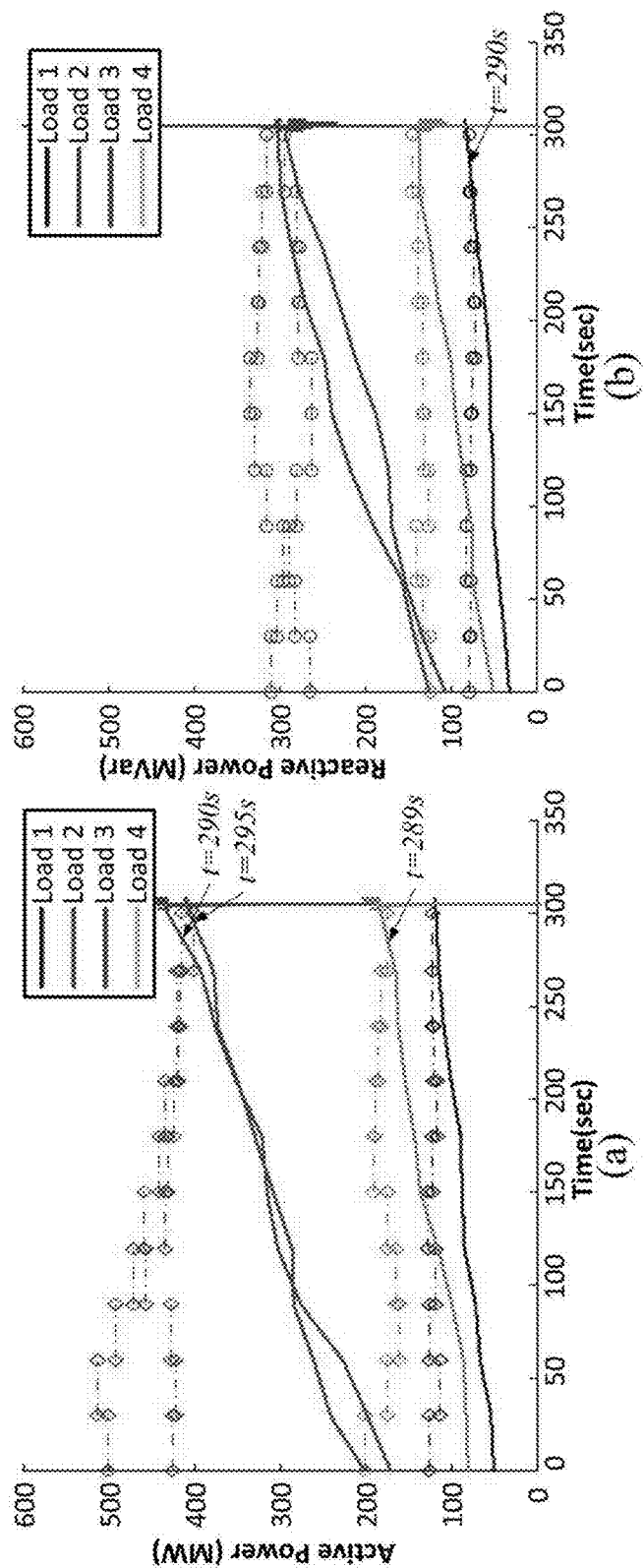
FIGS. 48A and 48B show, respectively, the active powers and reactive powers vs. limits for Case B.

B. Case B: Increasing Loads at Different Random Rates with Variable Power Factors In the time-domain simulation of Case B, the active power and reactive power of all loads are gradually increased every 30 seconds at random rates, ranging between 0% and 30% of their original loads. Seen from voltage magnitudes of the 4-bus system in FIG. 47A, voltage collapse happens at t=301 s. This voltage collapse is also accurately predicted by the overall VSM calculated by (159) from the HEM in FIG. 47B. FIGS. 48A and 48B compare the active and reactive powers of each load to the voltage stability limits, which are shown by the dash-dot lines and updated every 30 seconds based on the result of state estimation and load trending prediction. Also, note that, in FIG. 48A, the active powers of loads at Buses 2, 3 and 4 cross their limits at different times, i.e. t=290 s, 295 s and 289 s, respectively. In FIG. 48B, the reactive power of load at Bus 4 crosses the limit at t=290 s.

Figure 49:
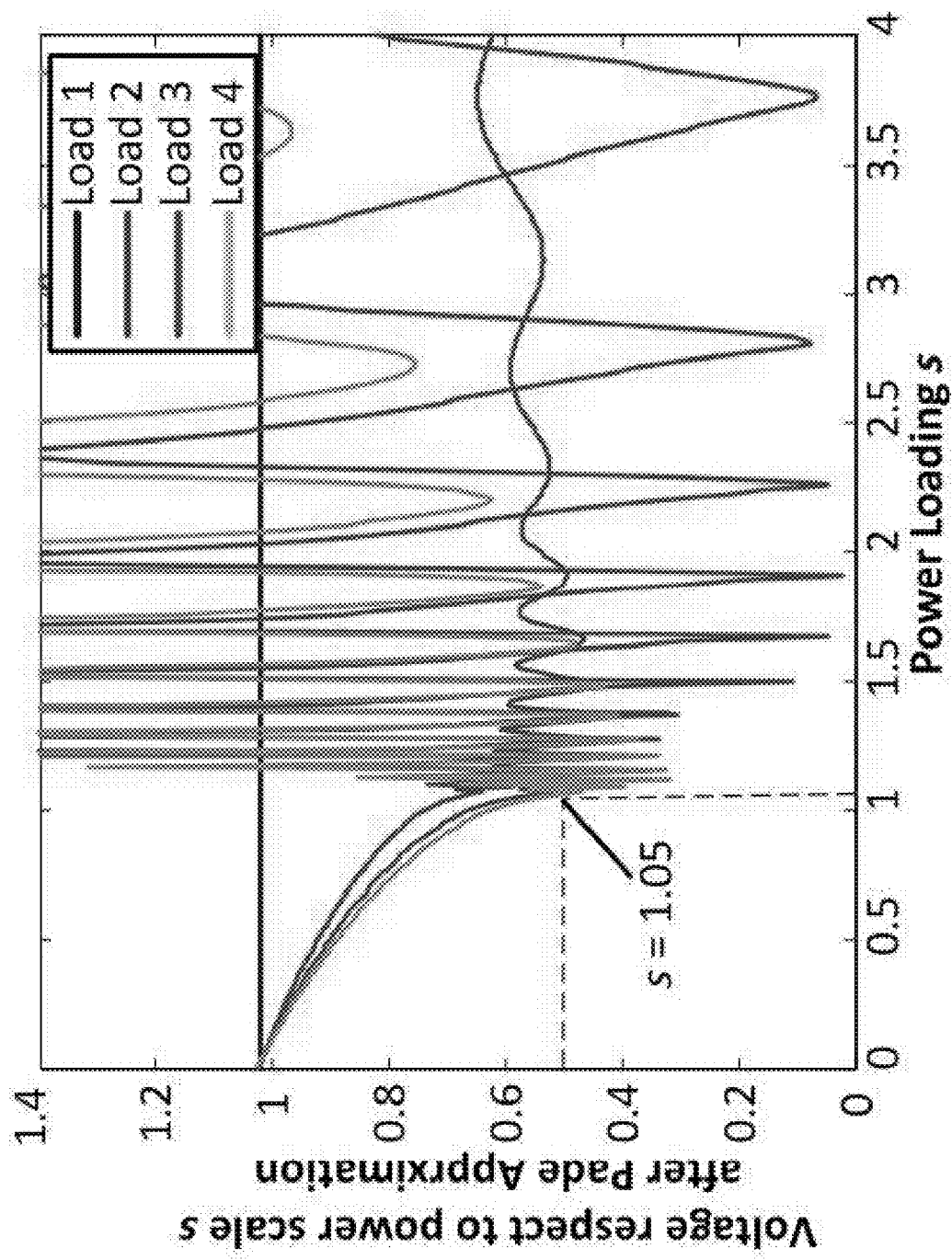
FIG. 49 shows the voltage vs. loading scale s at t=240 s for Case B.

FIG. 49 shows the voltage with respect to the overall loading scale predicted by the HEM at t=240 s. The collapse loading scale sc is 1.05, so the VSM is only 5%, which means that if the loads in the next 30 seconds ramp up at the same rate, the total load can only increase by 5% at the end of the next period, i.e. at t=270 s. From FIG. 49, Bus 4 is the critical bus having the lowest voltage, where remedial control actions should be taken first.

Figures 9A, 9B, 9C, 9D:
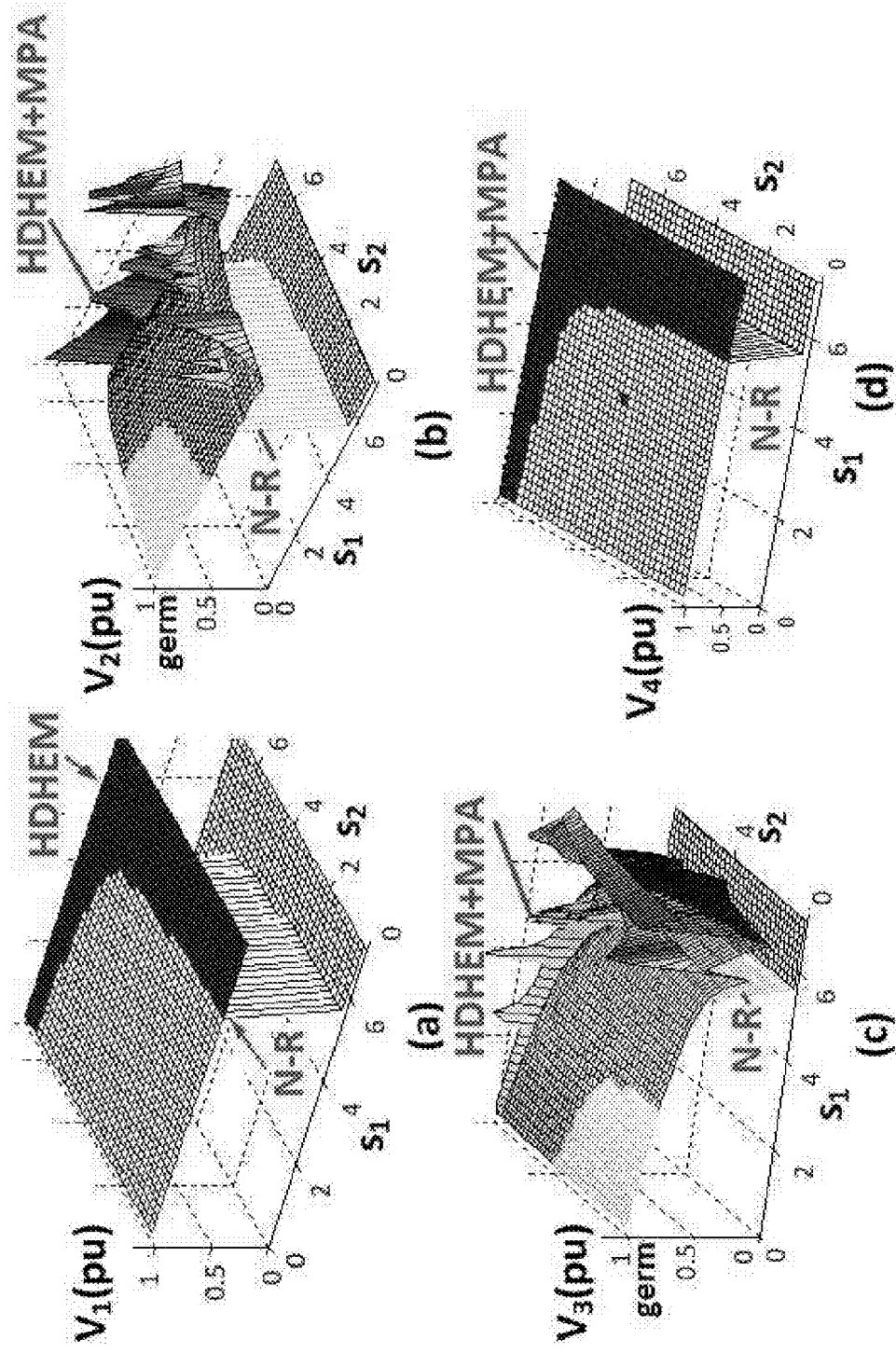
FIGS. 9A, 9B, 9C and 9D is a comparison of results with a PV bus between N-R and MDHEM with multivariate Padé approximants (MDHEM+MPA).

C. Case C: Increasing Loads at Different Random Rates and Considering ZIP Load and Dynamics of the Generator As shown in FIG. 9(b), Bus 4 is connected to a generator with 238MW active power output. The generator is with $6^{th}$ order detailed model and equipped with IEEE Type 3 speed-governor model and IEEE Type 1 excitation model with over excitation limit. During the simulation, around 20% of the total active power load increase is picked up by the generator, while the remaining is balanced by the external grid, i.e. $\alpha_i$=20% in (25). ZIP load model is considered with the percentages of constant Z, constant I and constant P as 10%, 30% and 60% respectively.

Figures 50A, 50B:
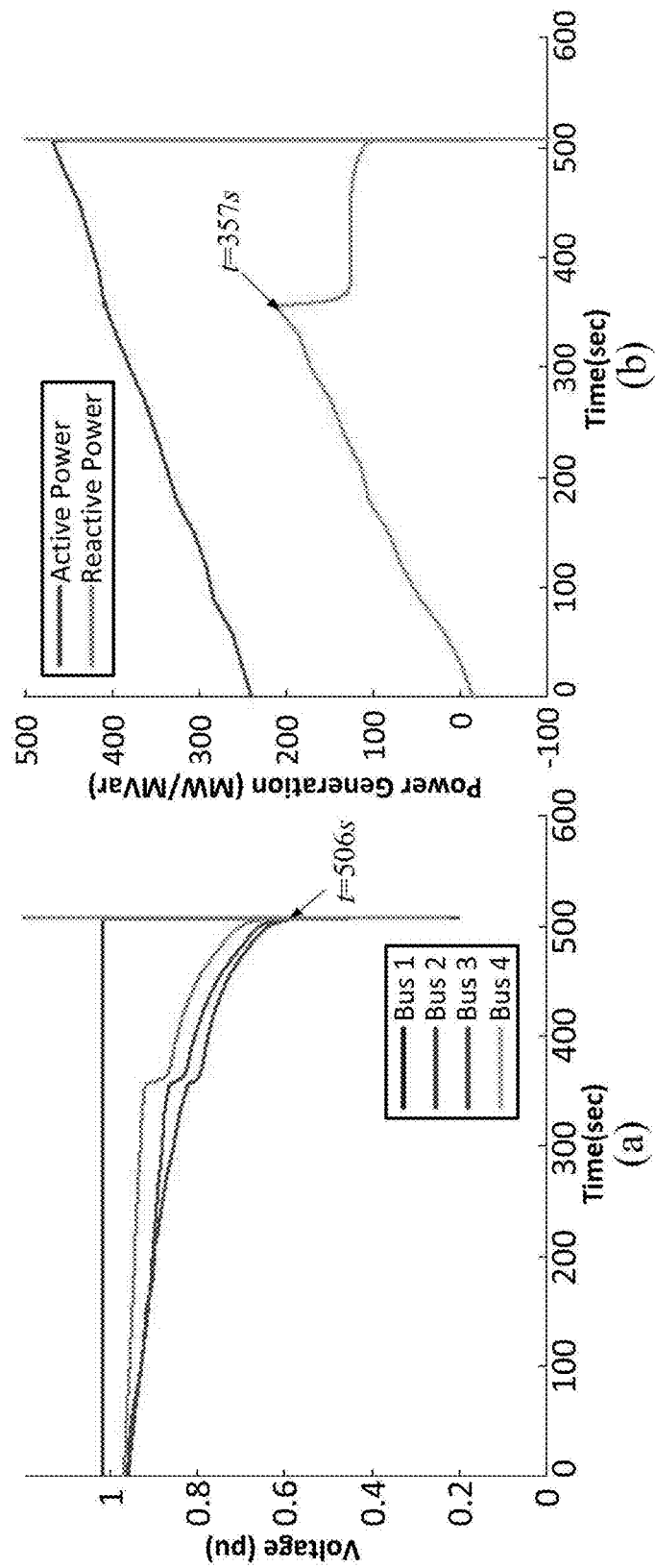
FIGS. 50A and 50B show, respectively, the voltage magnitudes and generator output for Case C.

The active and reactive powers of all loads are gradually increased at random rates, the same as Case B. Seen from voltage magnitudes of the time-domain simulation in FIG. 50A, with voltage support from the generator at Bus 4, voltage collapse happens at t=506 s, later than Case B. FIG. 50B shows the active and reactive power outputs of the generator with the over excitation limit activated at t=357 s.

Figure 51:
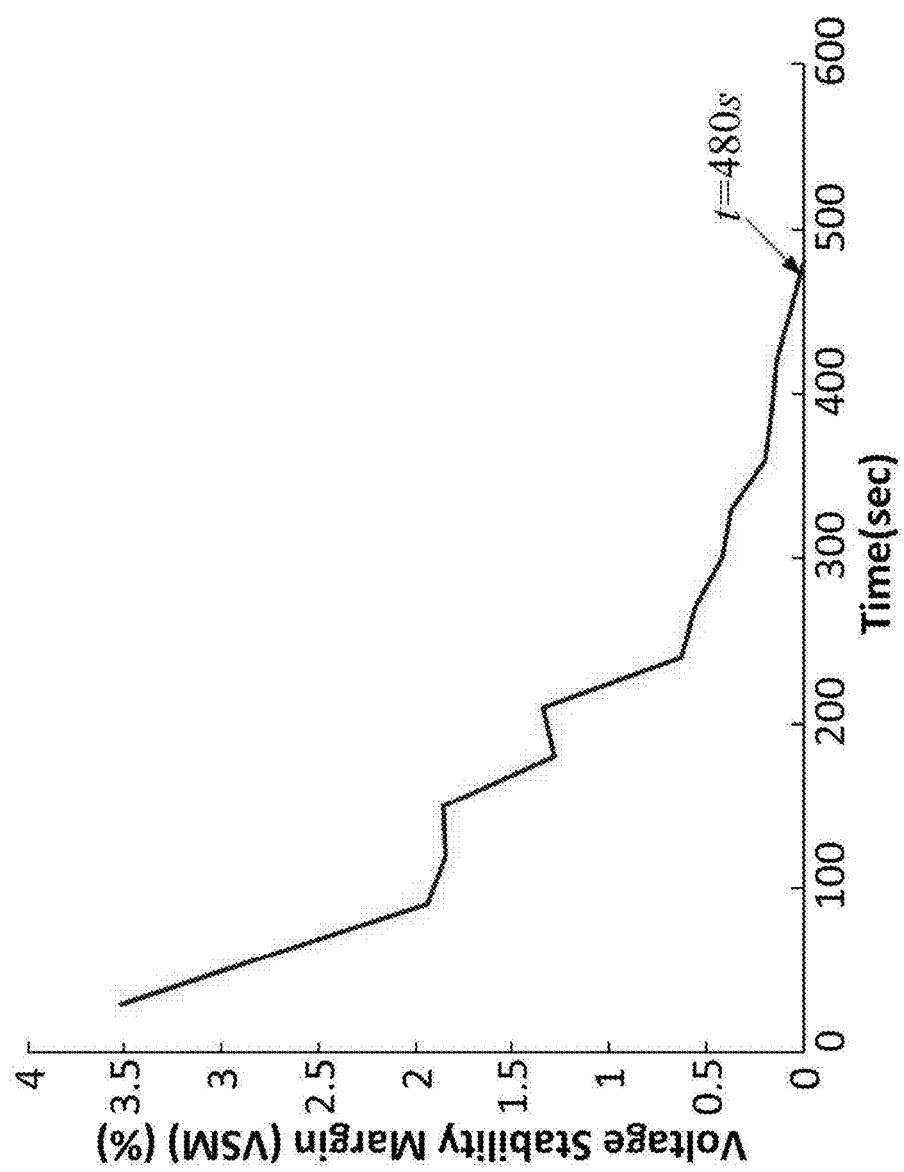
FIG. 51 is the VSM for Case C.
Figures 52A, 52B:
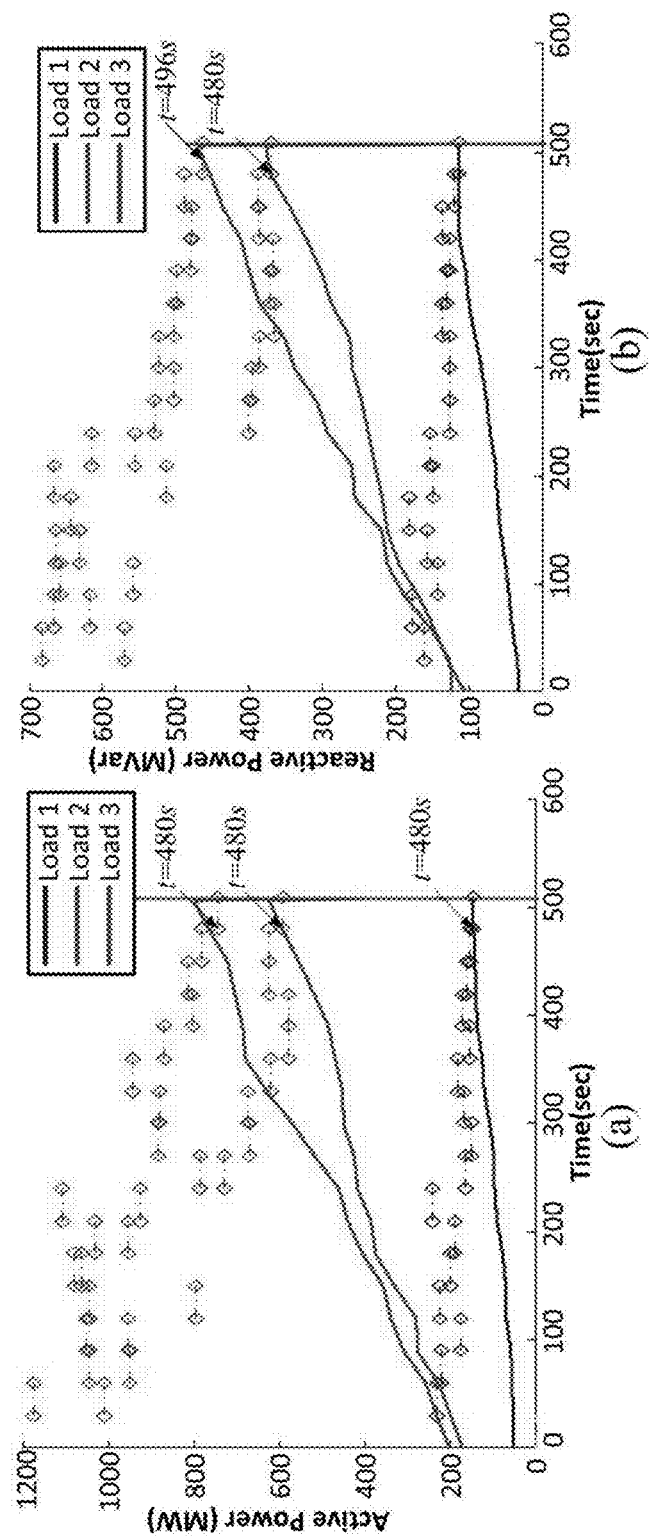
FIGS. 52A and 52B show, respectively, the active powers and reactive powers vs. limits for Case C.
Figure 53:
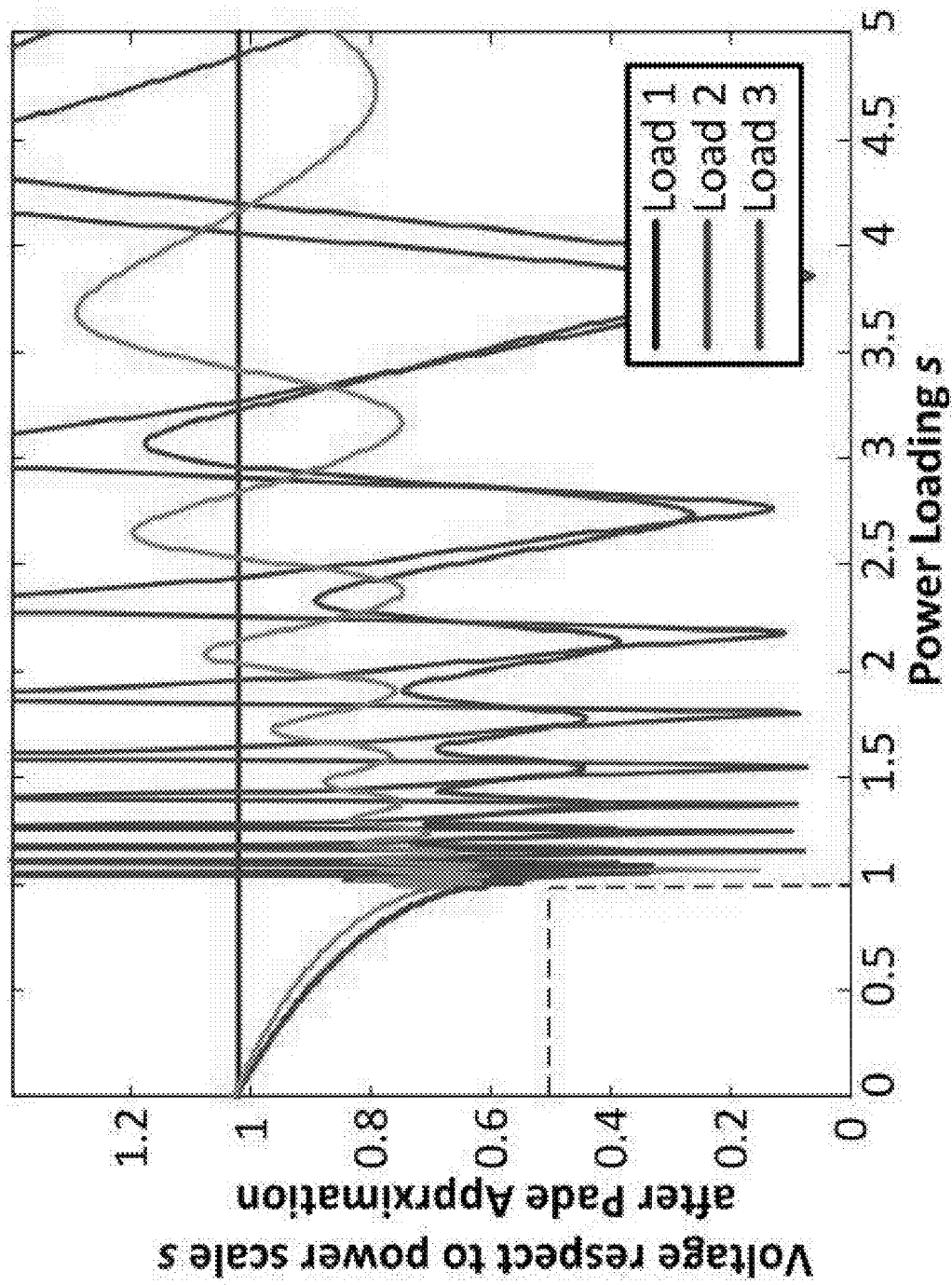
FIG. 53 shows the voltage vs. loading scale s at t=480 s for Case C.

This voltage collapse can be predicted by the overall VSM from the HEM in FIG. 51. The VSM approaches 0 at t=480 s. FIGS. 52A and 52B compare the active and reactive powers of each load to the voltage stability limits. In FIG. 52A, the active loads at buses 1, 2 and 3 cross their respective limits at the same time with the update of state estimation, i.e. t=480 s. In FIG. 52B, the reactive loads at buses 2 and 3 cross the limits at different time, i.e. t=480 s and 496 s. FIG. 53 shows the voltage with respect to the overall loading scale screened by the HEM at t=480 s. It can be noticed that voltage at Bus 3 has the lowest voltage and is thus identified as the critical bus where remedial actions should be taken first.

In order to show the advantage of the proposed method for VSA, the computation time is compared between the proposed HEM-based VSA and the CPF. Table VIII shows the maximum computation time among all scenarios using the proposed method and the CPF. The CPF is carried out in MATPOWER 6.0 adopting natural parameterization and adaptive step length control. Both algorithms are executed on a PC with Intel Core i5-3210M 2.50 GHz CPU and 4 GB RAM and both algorithms are configured with an error tolerance of 10e-6. It can be noted that the CPF has a number of prediction-correction steps $N_{Step}$ and its maximum computation time among all scenarios is between 11.10 s and 20.64 s, while the proposed method is much faster, with maximum computation time between 0.873s and 1.473s. This can be simply explained by the non-iterative nature of the HEM. For a single loading level with the same precision, the numbers of terms ($N_{Germ}$ and $N_{PS}$) to be calculated by the proposed HEM-based VSA scheme are smaller than the steps of the CPF ($N_{Step}$), and each term is calculated by matrix multiplication instead of the iterative computations of the N-R method for each step of the CPF.

TABLE II

TIME PERFORMANCES OF THE PROPOSED METHOD AND CPF METHOD

| Max. term/ | Method | | | | | | | |
|---|---|---|---|---|---|---|---|---|
| | HEM-based VSA | | | | | | CPF | |
| Time (s) | $N_{Germ}$ | $N_{PS}$ | $T_{Germ}$ | $T_{PS}$ | $T_{Pade}$ | $T_{HEM}$ | $N_{Step}$ | $T_{CPF}$ |
| Case A | 6 | 14 | 0.003 s | 0.55 s | 0.32 s | 0.873 s | 232 | 11.10 s |
| Case B | 6 | 15 | 0.003 s | 0.64 s | 0.65 s | 1.293 s | 238 | 13.33 s |
| Case C | 6 | 29 | 0.003 s | 0.9 s | 0.57 s | 1.473 s | 266 | 20.64 s |

IXX. Case Study on the NPCC Power System

Figure 54:
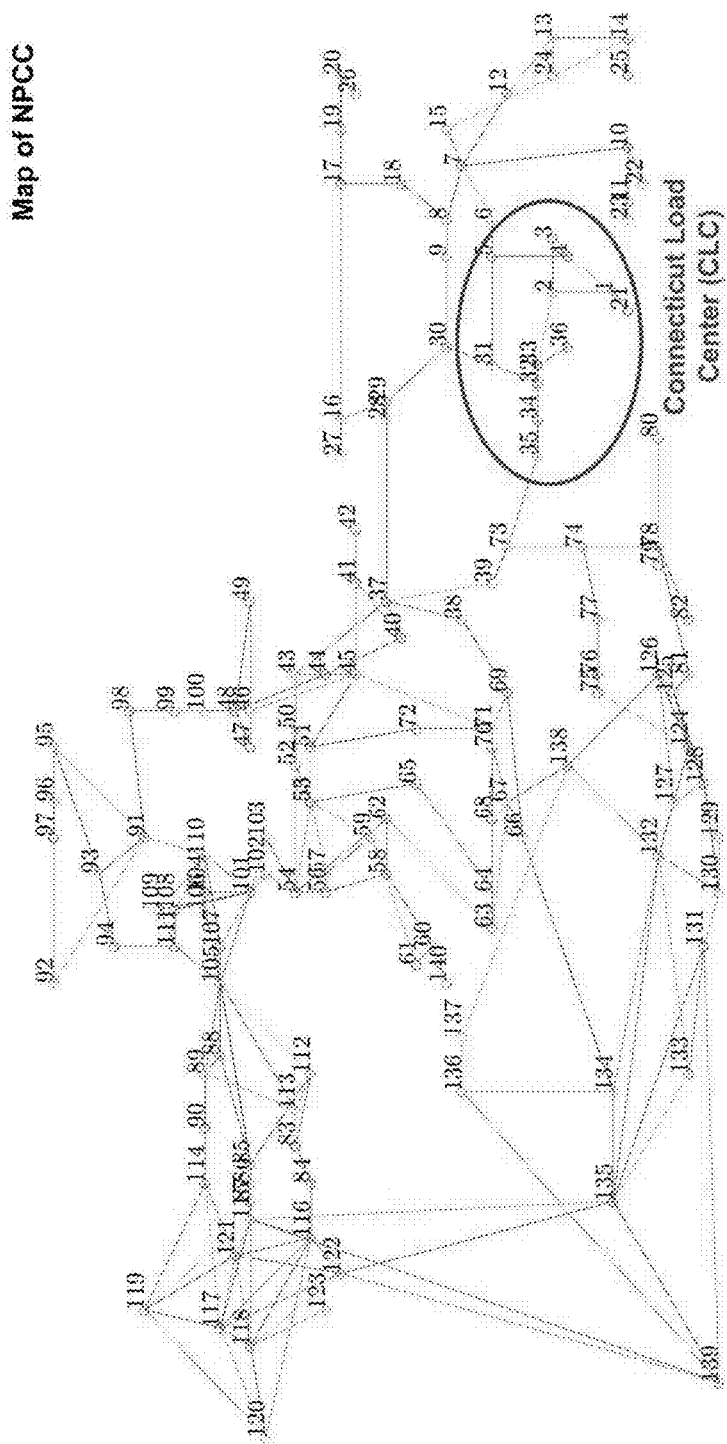
FIG. 54 shows the map of NPCC system and the CLC load area.

The NPCC system with 48 generators and 140 buses is adopted to demonstrate the proposed HEM-based VSA method. As shown in FIG. 54, the Connecticut Load Center (CLC) area is supported by three tie lines, i.e. 73-35, 30-31 and 6-5. Assume that all 3 tie lines are equipped with PMUs at boundary buses 35, 31 and 5 of the load area. PowerFactory is used to simulate the voltage instability scenarios in the following cases. The load at each bus of the area is modelled as constant power load. All buses in load area are measured by SCADA system and the state estimation results on the load area are also assumed to be updated every 30 seconds. Thus, the HEM-based VSA scheme aims at predicting voltage instability in the next 30 seconds period.

A. Case D: Increasing Loads at Same Rate

Figures 55A, 55B:
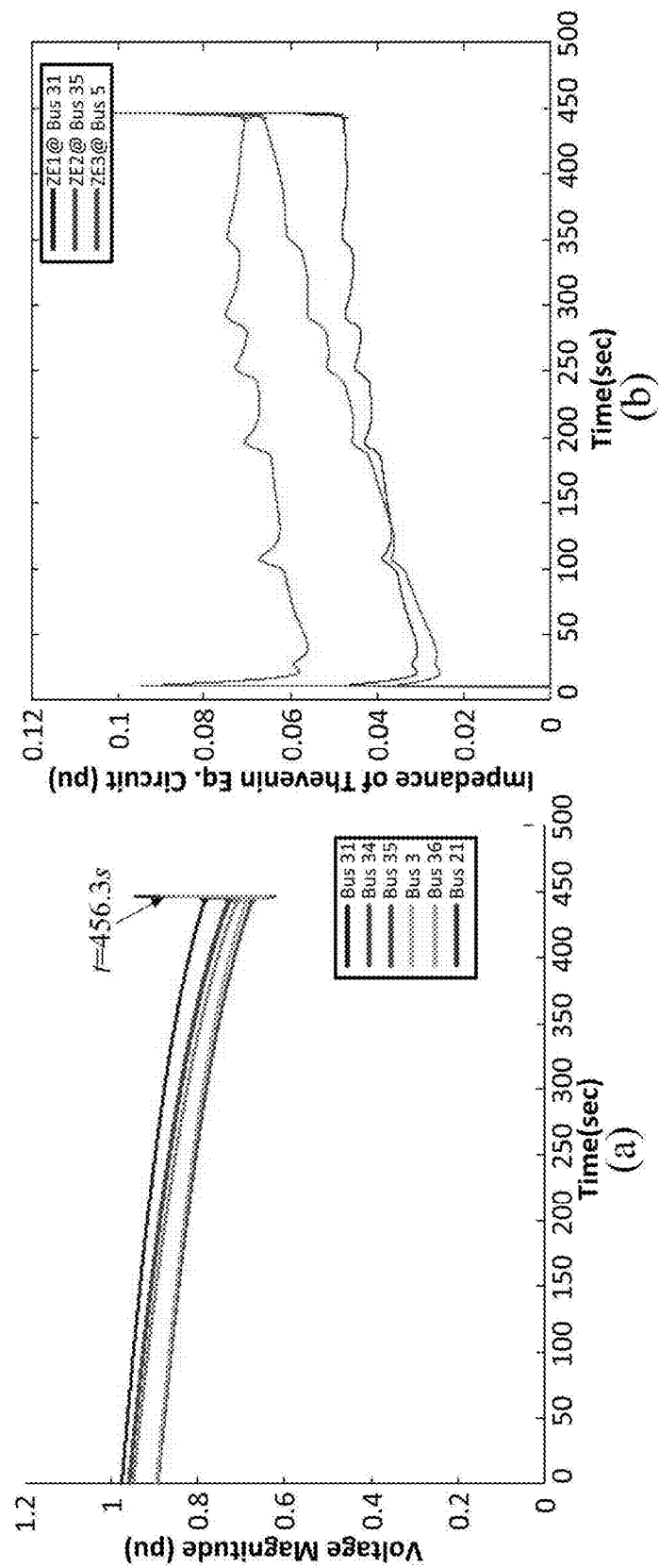
FIGS. 55A and 55B show, respectively, the voltage magnitudes and online estimated impedances' magnitude of equivalent branches for Case D.
Figures 56A, 56B:
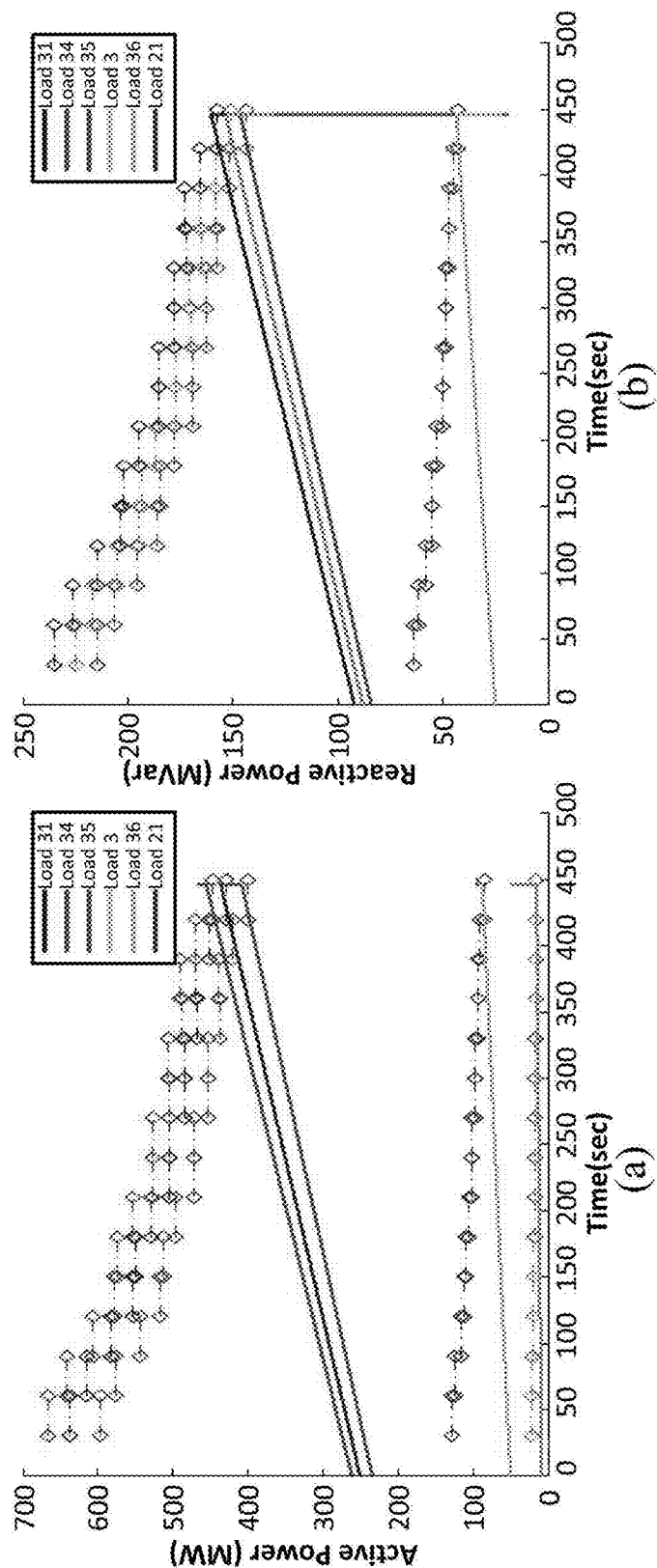
FIGS. 56A and 56B show, respectively, the active powers and reactive powers vs. limits for Case D.
Figures 57A, 57B:
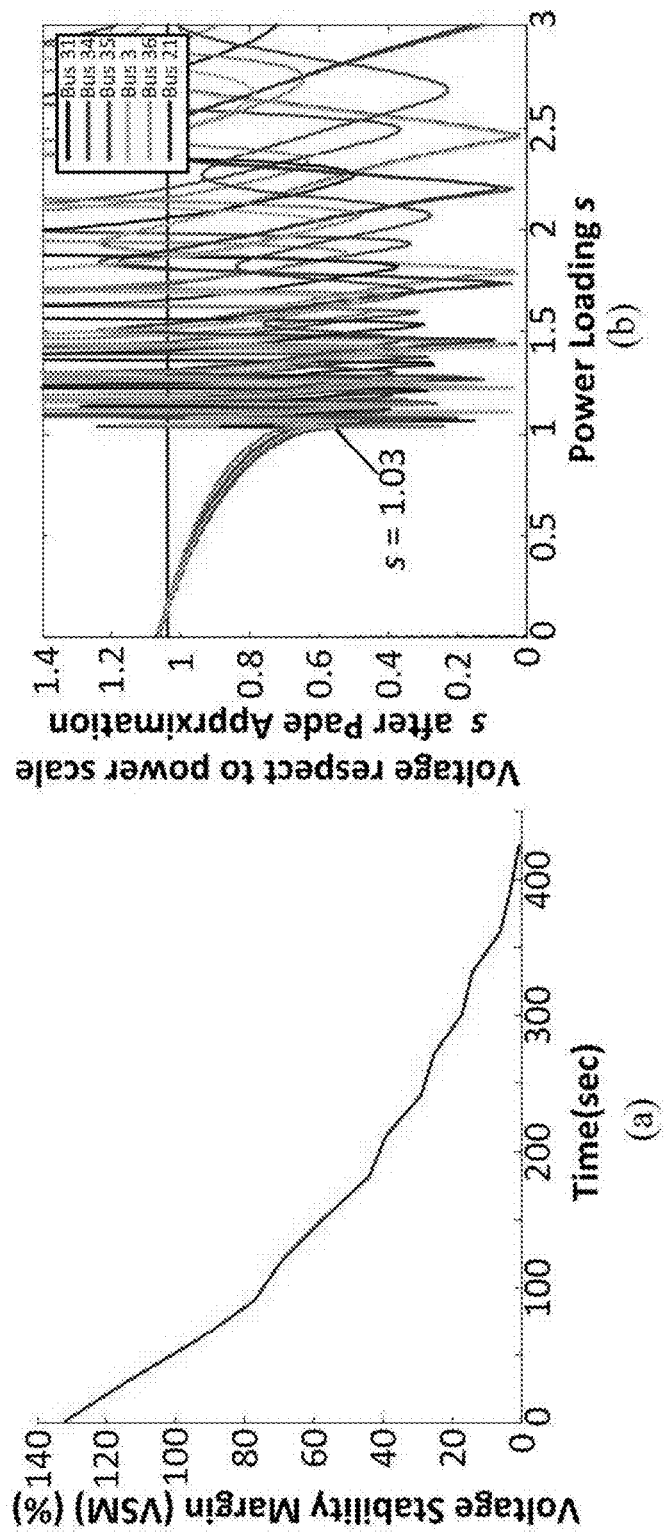
FIGS. 57A and 57B show, respectively, VSM and Voltage vs. loading scale at t=420 s for Case D.

II. In the dynamic simulation of Case D, loads at all buses of the area increase at a same rate of 0.16% per second. FIG. 55A shows that voltages gradually decrease and then collapse at t=456.3 s. The external system is aggregated to an equivalent voltage source E directly connected to three boundary buses of the load area by three branches. FIG. 55B gives the estimates of the branch impedance to buses 31, 35 and 5. Voltage collapse is predicted when the active and reactive powers meeting their limits during t=420-450 s, as shown by dash-dot lines in FIGS. 56A and 56B. Compared to Case A of the 4-bus system, the variations in stability limits are caused by the changes in the external system and consequently in their equivalent parameters. As shown in FIG. 57A, at t=420 s the VSM decreases to only 3%. Assuming a threshold of control activation is preset, e.g. 10%, the action should have been taken, e.g. switching in a shunt capacitor at the critical bus having the lowest voltage, i.e. Bus 34. FIG. 57B gives the voltage with respect to loading scale s predicted by the HEM at t=420 s, and a precise collapse load scale sc=1.03.

Figure 58:
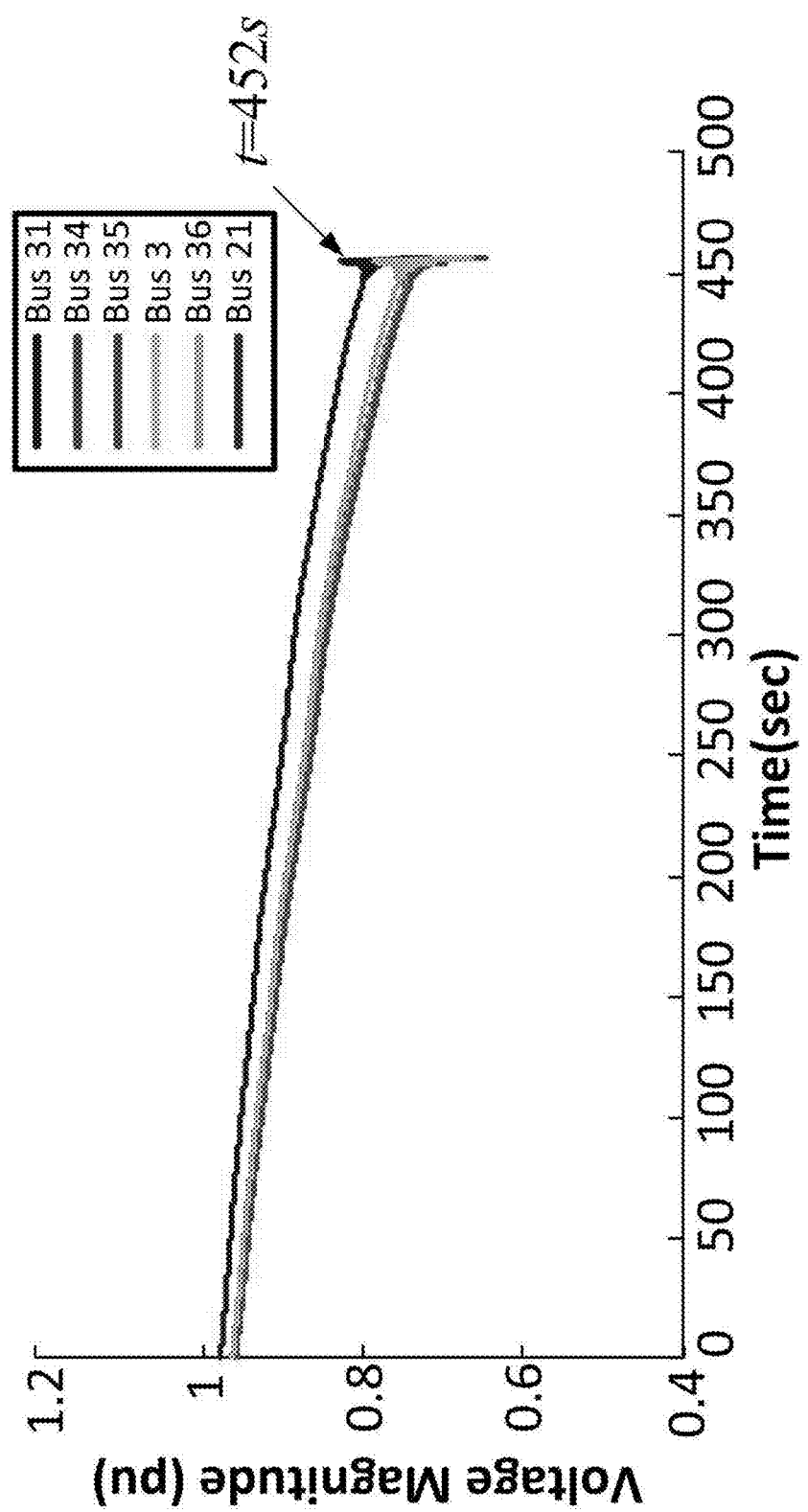
FIG. 58 shows the voltage magnitudes for Case E.
Figures 59A, 59B:
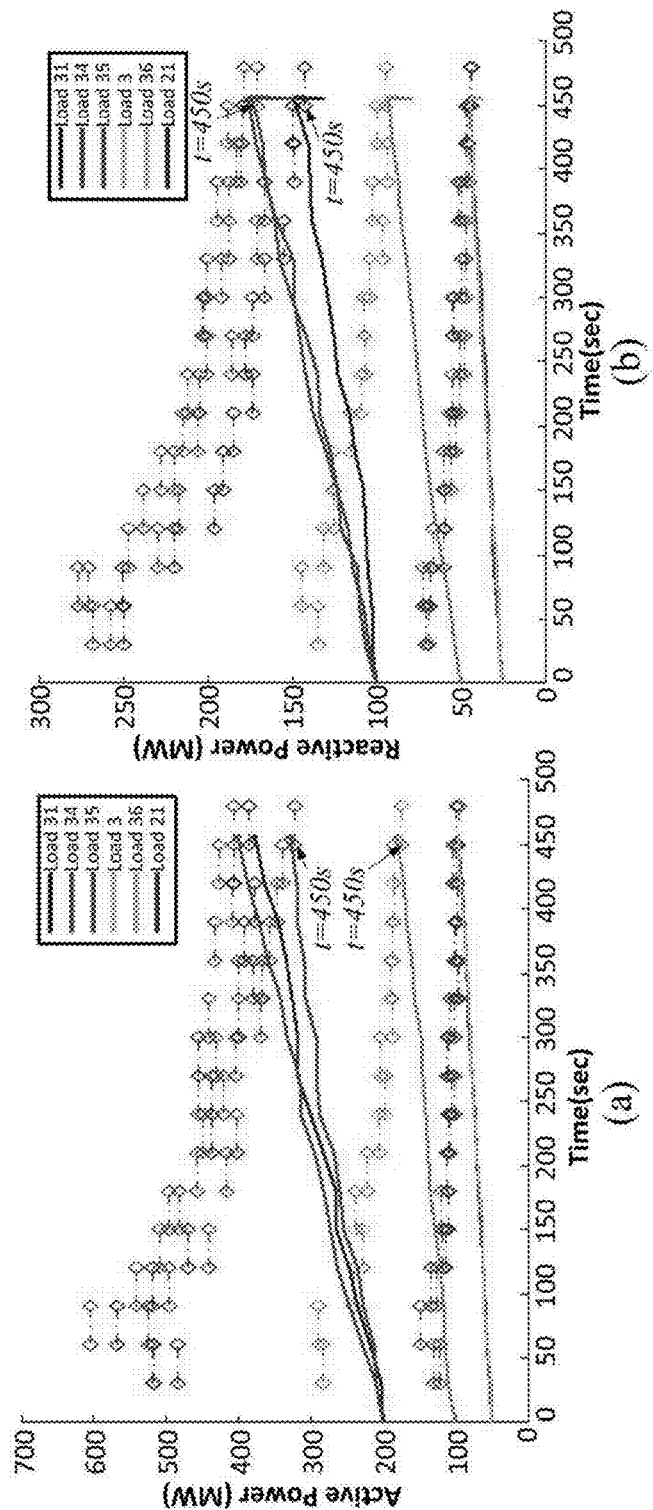
FIGS. 59A and 59B show, respectively, the active powers and reactive powers vs. limits for Case E.
Figure 60:
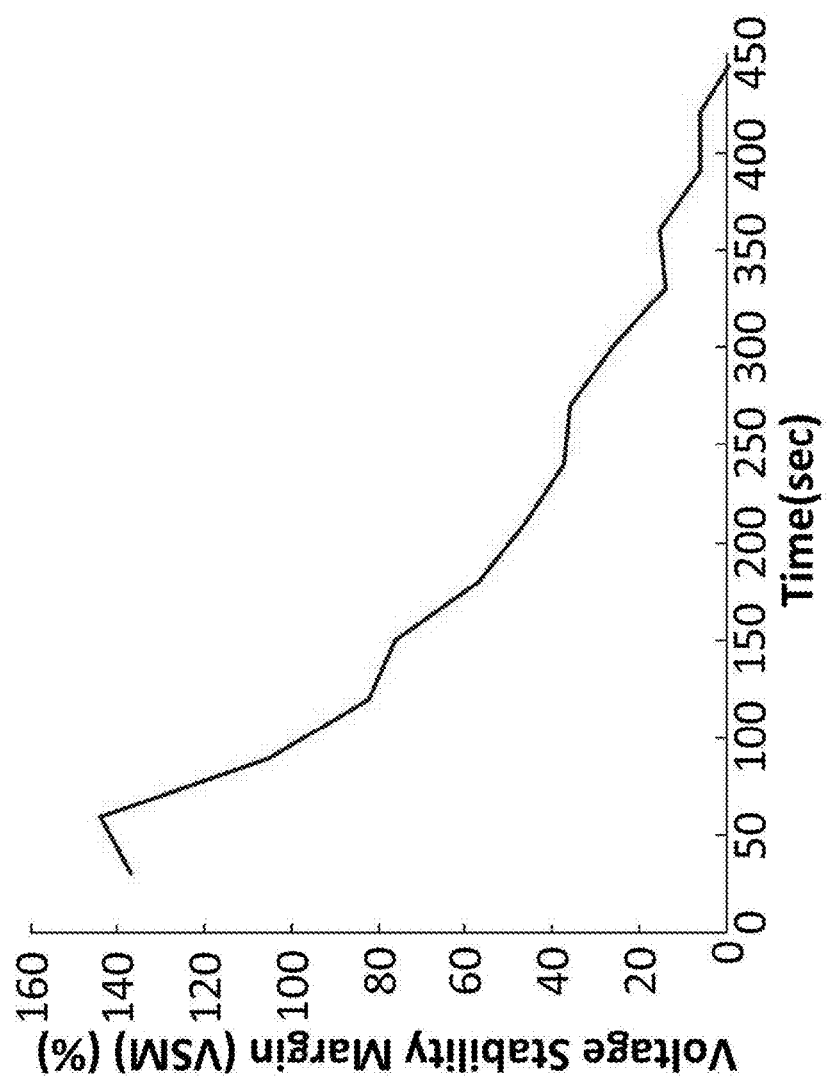
FIG. 60 is the VSM for Case E.
Figure 61:
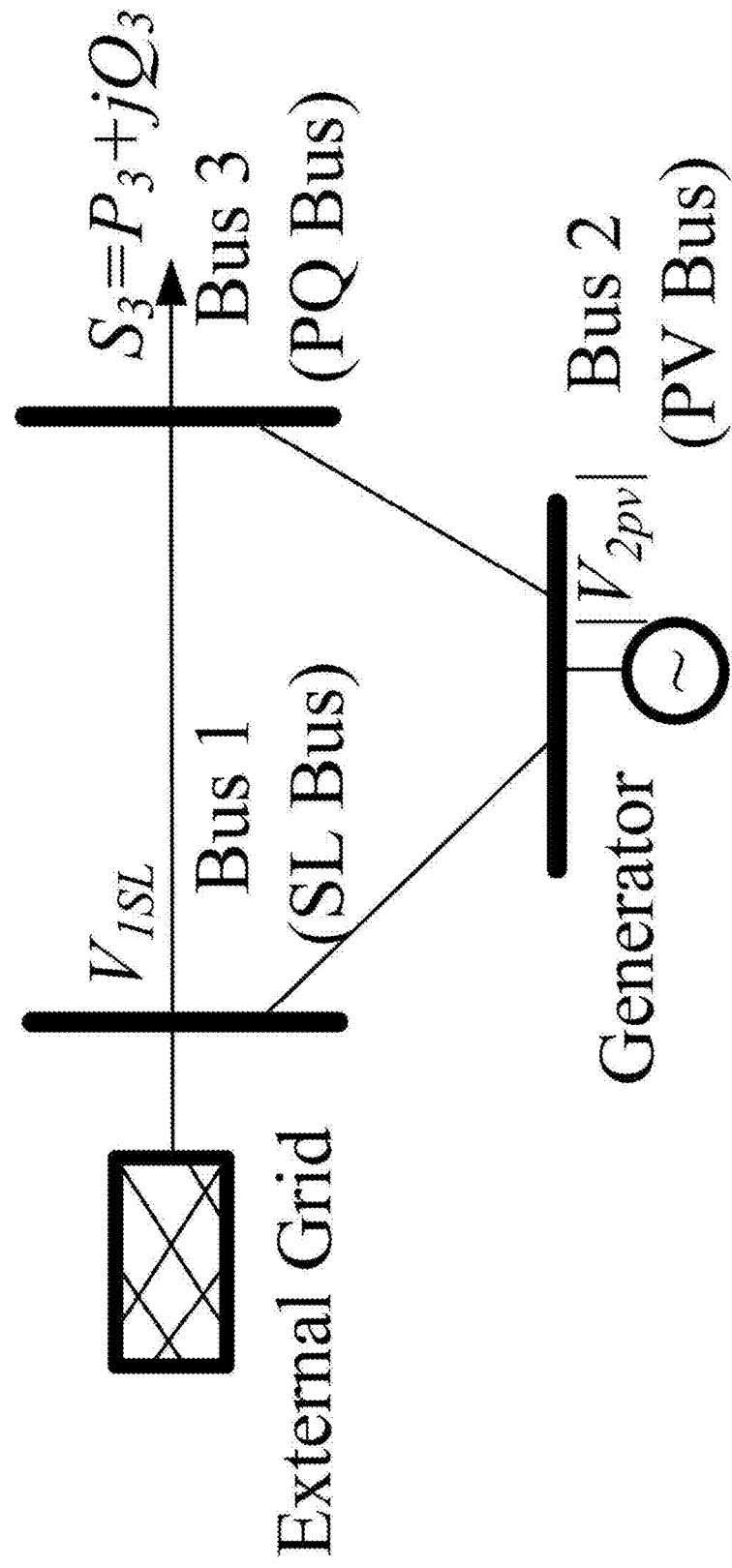
FIG. 61 is the demonstrative 3-bus system.

B. Case E: Increasing Loads at Different Random Rates with Variable Power Factors In this case, a more realistic scenario with loads increasing at a random rate in 0-10% every 30 seconds is tested. Voltage collapse happens at t=452 s, as shown in FIG. 58. The last warning should be armed between t=420 s and t=450 s with a more conservative threshold, since loads at Buses 31, 34, 35 and 3 cross their individual stability limits at t=450 s, as shown in FIGS. 59A and 59B for active and reactive powers, respectively. From FIG. 60, the VSM drops to 0 at t=450 s, indicating the occurrence of voltage instability.

The online HEM-based VSA scheme is able to provide system operators with a timely and accurate indication of the VSM. Practically, a more conservative threshold of VSMs should be preset, e.g. 5-10%. On one hand, that gives operators enough time to activate emergency voltage control; on the other hand, it leaves enough stability margin to prevent voltage collapse. All computations of this new scheme can be finished within 2 seconds in MATLAB, including external parameter identification, load flow trending prediction, the proposed HEM, and adaptive PA, so the overall VSM and individual VSM for each bus is predicted about 28 seconds ahead. If each bus is equipped with a PMU to provide synchronized phasor data at a higher frequency, e.g. 30-60 Hz, operators can monitor the load change and the VSM at each load bus with higher accuracy so as to decide more precisely whether and when a remedial action is needed.

Table IX compares the maximum computation time among all scenarios in Case D and Case E using the proposed method and the CPF with the same error tolerance, i.e. 10e-6. It can be noted that the proposed HEM-based VSA scheme has better time performance.

TABLE IX

COMPARISON OF MAXIMUM COMPUTATION TIME BETWEEN THE PROPOSED METHOD AND THE CONTINUATION POWER FLOW METHOD

| Max. term/ | Method | | | | | | | |
|---|---|---|---|---|---|---|---|---|
| | HEM-based VSA | | | | | | CPF | |
| Time (s) | $N_{Germ}$ | $N_{PS}$ | $T_{Germ}$ | $T_{PS}$ | $T_{Pade}$ | $T_{HEM}$ | $N_{Step}$ | $T_{CPF}$ |
| Case D | 8 | 21 | 0.005 s | 0.9 s | 0.52 s | 1.425 s | 228 | 14.10 s |
| Case E | 8 | 23 | 0.005 s | 1.1 s | 0.63 s | 1.735 s | 235 | 16.36 s |

This portion of the paper proposes a new online VSA scheme for a load area based on a new HEM with a physical germ solution. The physical germ solution endows the physical meaning of the analytical expression, i.e. the loading level. Based on the HEM result, the scheme can online monitor the VSM of a load area, predict the voltage instability and suggest system operators the timing and location to take remedial actions. An adaptive two-stage PA method is also proposed to extend the convergence region of the power series, making the prediction of voltage collapse more accurate. These methods jointly enable the performance of this new VSA scheme and are demonstrated on a 4-bus system and the 140-bus NPCC system. Compared with model-based VSA methods, the proposed scheme has better online time performance by using the non-iterative HEM to give the whole P-V curve. Unlike most of measurement-based methods, it avoids network reduction in the load area. Also, this scheme can integrate load trending prediction at each bus for look-ahead stability monitoring.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as Read Only Memory (ROM) devices and information alterably stored on writeable storage media such as floppy disks, magnetic tapes, Compact Discs (CDs), Random Access Memory (RAM) devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

APPENDIX A

Proof of holomorphicity for a general multivariate continuous function

Theorem: If a multivariate continuous function $f(z_1, z_2, \ldots, z_D)$ defined on a domain U in the D-dimensional complex-valued space of $C^D$ does not depend on any $z_i^*$, i.e.

$$\frac{\partial f}{\partial z_i^*} = 0, i \in (1, 2, L\ D) \tag{A1}$$

then $f(z_1, z_2, \ldots, z_D)$ is holomorphic.

Proof: According to Weierstrass approximation theorem, the continuous function $f(z_1, z_2, \ldots, z_D)$ can be uniformly approximated by a polynomial functions $$f(z_1, z_2, L, z_D) = \sum_{n_D=0}^{\infty} L \sum_{n_2=0}^{\infty} \sum_{n_1=0}^{\infty} a[n_1, n_2, L, n_D] z_1^{n_1} z_2^{n_2} L\ z_D^{n_D} \tag{A2}$$

According to the generalized Cauchy-Riemann equations, if $f(z_1, z_2, \ldots, z_D)$ satisfies $$\frac{\partial f}{\partial z_i^*} = \frac{\partial \sum_{n_D=0}^{\infty} \cdots \sum_{n_2=0}^{\infty} \sum_{n_1=0}^{\infty} a[n_1, n_2, \cdots, n_D] z_1^{n_1} z_2^{n_2} \cdots z_D^{n_D}}{\partial z_i^*} = 0 \tag{A3}$$

Then $f(z_1, z_2, \ldots, z_D)$ is holomorphic.

(A3) can be developed to (A4), by assuming $z_k$ ($k \neq i$) hold as constant values $b_k$ in the partial derivatives with respect to $z_i$.

$$\frac{\partial f}{\partial z_i^*} = \frac{\partial \sum_{n_i=0}^{\infty} b[n_i] z_i^{n_i}}{\partial z_i^*} = 0 \tag{A4}$$

where $b[n_i]$ is a coefficient:

$$b[n_i] = \sum_{\substack{n_k=0 \\ i \neq k}}^{\infty} a[n_1, n_2, \cdots, n_{k-1}, n_k, n_{k+1}, \ldots, n_D] \tag{A5}$$

$$b_1^{n_1} b_2^{n_2} \cdots b_{k-1}^{n_{k-1}} b_{k+1}^{n_{k+1}} \cdots b_D^{n_D}$$

Set $g(z) = b[n_i] z_i^n$. Therefore, if $g(z)$ is holomorphic for any $i$, satisfying another Cauchy-Riemann equations (A6), then the sum of $g(z)$, i.e. $f(z)$ in (A4), is holomorphic.

$$\left(\frac{\partial g_r}{\partial x} - \frac{\partial g_i}{\partial y}\right) + j\left(\frac{\partial g_r}{\partial y} + \frac{\partial g_i}{\partial x}\right) = 0 \tag{A6}$$

where $z_i = x + jy$, $g = g_r + jg_i$.

Now set $b[n_i] = p + jq$, where $p$ and $q$ are real-valued, then $g(z)$ can be derived to (A7).

$$g(z) = b[n_i] z_i^n = (p + jq)(x + jy)^n = (p + jq)\left(\sum_{k=0}^{n} C_n^k x^{n-k} (jy)^k\right) \tag{A7}$$

in which $$g_r = p\left(\sum_{k_1=0}^{n} C_n^{4k_1} x^{n-4k_1} y^{4k_1} - \sum_{k_2=0}^{n} C_n^{4k_2+2} x^{n-(4k_2+2)} y^{4k_2+2}\right) - q\left(\sum_{k_3=0}^{n} C_n^{4k_3+1} x^{n-(4k_3+1)} y^{4k_3+1} - \sum_{k_4=0}^{n} C_n^{4k_4+3} x^{n-(4k_4+3)} y^{4k_4+3}\right) \tag{A8}$$

$$g_i = q\left(\sum_{k_1=0}^{n} C_n^{4k_1} x^{n-4k_1} y^{4k_1} - \sum_{k_2=0}^{n} C_n^{4k_2+2} x^{n-(4k_2+2)} y^{4k_2+2}\right) + p\left(\sum_{k_3=0}^{n} C_n^{4k_3+1} x^{n-(4k_3+1)} y^{4k_3+1} - \sum_{k_4=0}^{n} C_n^{4k_4+3} x^{n-(4k_4+3)} y^{4k_4+3}\right) \tag{A9}$$

So the real part of Cauchy-Riemann equations (A6) is zero by setting $k_1 = k_3 - 1$ and $k_2 = k_4 - 1$.

$$\left(\frac{\partial g_r}{\partial x} - \frac{\partial g_i}{\partial y}\right) = 0 \tag{A10}$$

Similarly, it can be proved the imaginary part of (A6) is also 0.

$$\left(\frac{\partial g_r}{\partial y} + \frac{\partial g_i}{\partial x}\right) = 0 \tag{A11}$$

Therefore, $g(z)$ is holomorphic, then $f(z_1, z_2, \ldots, z_D)$ is also holomorphic.

APPENDIX B

Example-1: Physical Germ Solution of the 3-Bus System

A 3-bus system, shown in FIG. 1, is adopted to demonstrate the procedure of finding the physical germ solution. The first step is to calculate the initial no-load no-generation condition (Point A in FIG. 2). Only the slack bus propagates its voltage to the whole passive network.

$$\begin{bmatrix} 1 & & & & & \\ & 1 & & & & \\ G_{21} & -B_{21} & G_{22} & -B_{22} & G_{23} & -B_{23} \\ B_{21} & G_{21} & B_{22} & G_{22} & B_{23} & G_{23} \\ G_{31} & -B_{31} & G_{32} & -B_{32} & G_{33} & -B_{33} \\ B_{31} & G_{31} & B_{32} & G_{32} & B_{33} & G_{33} \end{bmatrix} \begin{bmatrix} V_{ST1re} \\ V_{ST1im} \\ V_{ST2re} \\ V_{ST2im} \\ V_{ST3re} \\ V_{ST3im} \end{bmatrix} = \begin{bmatrix} \text{Re}(V_1^{SL}) \\ \text{Im}(V_1^{SL}) \\ 0 \\ 0 \\ 0 \\ 0 \end{bmatrix} \tag{B12}$$

The second step is to find the physical germ solution by a simple embedding, i.e. $3^{rd}$ column in TABLE I. The right hand side of the PQ bus (i.e. Bus 3) is 0, since no-load condition is held for the physical germ solution. Thus, the embedding of PV bus (i.e. Bus 2) is needed to gradually adjust its voltage magnitude to the specified value $|V_{2pv}^{sp}|$.

$$\begin{cases} \sum_{k=1}^{N} Y_{ik} V_{gk}[n] = P_{G2} W_{g2}^*[n-1] - jQ_{g2}[n]W_{ST2}^* - j\left(\sum_{\tau=1}^{n-1} Q_{g2}[\tau]W_{g2}^*[n-\tau]\right) \\ V_{ST2} V_{g2}^*[n] + V_{g2}[n]V_{ST2}^* + \frac{1}{2}\text{Conv}(V*V^*)\Big|_1^{n-1} = \delta_{n1} \cdot \frac{1}{2}(|V_{2pv}^{sp}|^2 - |V_{ST2}|^2) \end{cases} \quad (B13)$$

where $\delta_{ni}$ is Kronecker delta function defined by (11).

Separate the real and imaginary parts of the matrix equation and put all the $n^{th}$ order terms (i.e. the unknowns) to the left hand side and leave terms 0 to (n−1) (i.e. the knowns) the right hand side. The matrix equation is extended by adding $W_{g2}(s)$ and $Q_{g2}(s)$ to the left hand side. The error of physical germ in PFE will quickly converge to 0 just in several recursions, since the deviation of voltage at PV Bus 2 contains high order terms of $V_{g2}(s)$. There is (B14).

APPENDIX C

Example-2: MDHEM for the 3-Bus System

Assume that $s_1$ and $s_2$ scale the active and reactive powers of the PQ bus respectively. The matrix equation for $M^{th}$ order is shown correspondingly in (C15), where $n_1+n_2=M$.

$$\begin{bmatrix} 1 & 0 & 0 & 0 & 0 & 0 & 0 & 0 & 0 \\ 0 & 1 & 0 & 0 & 0 & 0 & 0 & 0 & 0 \\ G_{21} & -B_{21} & G_{22} & -B_{22} & G_{23} & -B_{23} & 0 & 0 & W_{ST2im} \\ B_{21} & G_{21} & B_{22} & G_{22} & B_{23} & G_{23} & 0 & 0 & W_{ST2re} \\ G_{31} & -B_{31} & G_{32} & -B_{32} & G_{33} & -B_{33} & 0 & 0 & 0 \\ B_{31} & G_{31} & B_{32} & G_{32} & B_{33} & G_{33} & 0 & 0 & 0 \\ 0 & 0 & W_{ST2re} & -W_{ST2im} & 0 & 0 & V_{ST2re} & -V_{ST2im} & 0 \\ 0 & 0 & W_{ST2im} & W_{ST2re} & 0 & 0 & V_{ST2im} & V_{ST2re} & 0 \\ 0 & 0 & V_{ST2re} & V_{ST2im} & 0 & 0 & 0 & 0 & 0 \end{bmatrix} \begin{bmatrix} V_{g1re}[n] \\ V_{g1im}[n] \\ V_{g2re}[n] \\ V_{g2im}[n] \\ V_{g3re}[n] \\ V_{g3im}[n] \\ W_{g2re}[n] \\ W_{g2im}[n] \\ Q_{g2}[n] \end{bmatrix} = \quad (C14)$$

$$\begin{bmatrix} 0 \\ 0 \\ \text{Re}\left(P_2 W_{g2re}[n-1] + \text{Conv}(Q_2 * W_2^*)\big|_1^{n-1}\right) \\ \text{Im}\left(P_2 W_{g2re}[n-1] + \text{Conv}(Q_2 * W_2^*)\big|_1^{n-1}\right) \\ 0 \\ 0 \\ -\text{Re}\left(\text{Conv}(W_2 * V_2)\big|_1^{n-1}\right) \\ -\text{Im}\left(\text{Conv}(W_2 * V_2)\big|_1^{n-1}\right) \\ \frac{1}{2}\delta_{n1} \cdot \varepsilon[1] - \frac{1}{2}\text{Conv}(V_2 * V_2^*)\big|_1^{n-1} \end{bmatrix} \quad \text{where } \varepsilon[1] = |V_{2pv}^{sp}|^2 - |V_{ST2}|^2$$

$$\begin{bmatrix} 1 & 0 & 0 & 0 & 0 & 0 & 0 & 0 & 0 \\ 0 & 1 & 0 & 0 & 0 & 0 & 0 & 0 & 0 \\ G_{21} & -B_{21} & G_{22} & -B_{22} & G_{23} & -B_{23} & -P_{2g} & Q_{2g} & W_{g2im} \\ B_{21} & G_{21} & B_{22} & G_{22} & B_{23} & G_{23} & Q_{2g} & P_{2g} & W_{g2re} \\ G_{31} & -B_{31} & G_{32} & -B_{32} & G_{33} & -B_{33} & 0 & 0 & 0 \\ B_{31} & G_{31} & B_{32} & G_{32} & B_{33} & G_{33} & 0 & 0 & 0 \\ 0 & 0 & W_{g2re} & -W_{g2im} & 0 & 0 & V_{g2re} & -V_{g2im} & 0 \\ 0 & 0 & W_{g2im} & W_{g2re} & 0 & 0 & V_{g2im} & V_{g2re} & 0 \\ 0 & 0 & V_{g2re} & V_{g2im} & 0 & 0 & 0 & 0 & 0 \end{bmatrix} \times \quad (C15)$$

-continued $$\begin{bmatrix} V_{1re}[M,0] & V_{1re}[M-1,1] & \cdots & V_{1re}[n_1,n_2] & \cdots & V_{1re}[0,M] \\ V_{1im}[M,0] & V_{1im}[M-1,1] & \cdots & V_{1im}[n_1,n_2] & \cdots & V_{1im}[0,M] \\ V_{2re}[M,0] & V_{2re}[M-1,1] & \cdots & V_{2re}[n_1,n_2] & \cdots & V_{2re}[0,M] \\ V_{2im}[M,0] & V_{2im}[M-1,1] & \cdots & V_{2im}[n_1,n_2] & \cdots & V_{2im}[0,M] \\ V_{3re}[M,0] & V_{3re}[M-1,1] & \cdots & V_{3re}[n_1,n_2] & \cdots & V_{3re}[0,M] \\ V_{3im}[M,0] & V_{3im}[M-1,1] & \cdots & V_{3im}[n_1,n_2] & \cdots & V_{3im}[0,M] \\ W_{2re}[M,0] & W_{2re}[M-1,1] & \cdots & W_{2re}[n_1,n_2] & \cdots & W_{2re}[0,M] \\ W_{2im}[M,0] & W_{2im}[M-1,1] & \cdots & W_{2im}[n_1,n_2] & \cdots & W_{2im}[0,M] \\ Q_2[M,0] & Q_2[M-1,1] & \cdots & Q_2[n_1,n_2] & \cdots & Q_2[0,M] \end{bmatrix} =$$

$$\begin{bmatrix} 0 & \cdots & 0 & \cdots & 0 \\ 0 & \cdots & 0 & \cdots & 0 \\ \operatorname{Im}\left(\underset{k_1=1}{\overset{M-1}{\operatorname{Conv}}}(Q_2 * W_2^*)\right) & \cdots & \operatorname{Im}\left(\underset{k_1=1,k_2=1}{\overset{n_1-1,n_2-1}{\operatorname{Conv}}}(Q_2 * W_2^*)\right) & \cdots & \operatorname{Im}\left(\underset{k_1=1}{\overset{M-1}{\operatorname{Conv}}}(Q_2 * W_2^*)\right) \\ -\operatorname{Re}\left(\underset{k_1=1}{\overset{M-1}{\operatorname{Conv}}}(Q_2 * W_2^*)\right) & \cdots & -\operatorname{Re}\left(\underset{k_1=1,k_2=1}{\overset{n_1-1,n_2-1}{\operatorname{Conv}}}(Q_2 * W_2^*)\right) & \cdots & -\operatorname{Re}\left(\underset{k_1=1}{\overset{M-1}{\operatorname{Conv}}}(Q_2 * W_2^*)\right) \\ \operatorname{Re}(P_3 W_3^*[M-1,0]) & \cdots & \operatorname{Re}(P_3 W_3^*[n_1-1,n_2] - jQ_3 W_3^*[n_1,n_2-1]) & \cdots & \operatorname{Re}(-jQ_3 W_3^*[0,M-1]) \\ \operatorname{Im}(P_3 W_3^*[M-1,0]) & \cdots & \operatorname{Im}(P_3 W_3^*[n_1-1,n_2] - jQ_3 W_3^*[n_1,n_2-1]) & \cdots & \operatorname{Im}(-jQ_3 W_3^*[0,M-1]) \\ -\operatorname{Re}\left(\underset{k_1=1}{\overset{M-1}{\operatorname{Conv}}}(W_2 * V_2)\right) & \cdots & -\operatorname{Re}\left(\underset{k_1=1,k_2=1}{\overset{n_1-1,n_2-1}{\operatorname{Conv}}}(W_2 * V_2)\right) & \cdots & -\operatorname{Re}\left(\underset{k_2=1}{\overset{M-1}{\operatorname{Conv}}}(W_2 * V_2)\right) \\ -\operatorname{Im}\left(\underset{k_1=1}{\overset{M-1}{\operatorname{Conv}}}(W_2 * V_2)\right) & \cdots & -\operatorname{Im}\left(\underset{k_1=1,k_2=1}{\overset{n_1-1,n_2-1}{\operatorname{Conv}}}(W_2 * V_2)\right) & \cdots & -\operatorname{Im}\left(\underset{k_2=1}{\overset{M-1}{\operatorname{Conv}}}(W_2 * V_2)\right) \\ -\frac{1}{2}\underset{k_1=1}{\overset{M-1}{\operatorname{Conv}}}(V_2 * V_2^*) & \cdots & -\frac{1}{2}\underset{k_2=1,k_2=1}{\overset{n_1-1,n_2-1}{\operatorname{Conv}}}(V_2 * V_2^*) & \cdots & -\frac{1}{2}\underset{k_2=1}{\overset{M-1}{\operatorname{Conv}}}(V_2 * V_2^*) \end{bmatrix}$$

APPENDIX D

The Derivation of the Constraints Regarding Voltage Magnitudes at PV and PVQ Buses The real part of the voltage magnitude at PV and PVQ buses can be derived analytically, as shown in (D1)-(D3), in which $V_i[0]=1$.

$$\sum_{n=0}^{\infty} V_i[n]s^n \cdot \sum_{n=0}^{\infty} V_i^*[n]s^n = V_i[0]V_i^*[n] + s\sum_{k=0}^{1} V_i[1-k]V_i^*[k] + \quad (D1)$$

$$s^2 \sum_{k=0}^{2} V_i[2-k]V_i^*[k] + \cdots +$$

$$s^n \sum_{k=0}^{2} V_i[n-k]V_i^*[k]$$

$$= 1 + s(|V_i^{sp}|^2 - 1)$$

$$V_{i,re}[1] = \frac{|V_i^{sp}|^2 - 1}{2} \quad (D2)$$

$$V_{i,re}[n] = -\frac{1}{2}\left(\sum_{\tau=1}^{n-1} V_i[\tau]V_i^*[n-\tau]\right) \quad (D3)$$

APPENDIX E

The Continued Fraction from the Power Series

The voltage at each bus is modelled as a power series with respect to the embedded complex variable s. For each bus, the voltage is expressed as $$V = C[0] + C[1]s + C[2]s^2 + \ldots + C[n]s^n \quad (E4)$$

where $C[n]$ are the coefficients of the power series.

The Taylor series (E4) can be converted to the continued fraction in (E5). In the proposed HELM embedding, the voltages at $s=0$ are $1\angle 0°$, therefore $C[0]=1$.

$$V == C[0] + \underset{m=1}{\overset{\infty}{K}}\left(\frac{\overline{C}_{m0}}{1}\right) = C[0] + \cfrac{\overline{C}_{10}}{1 + \cfrac{\overline{C}_{20}}{1 + \cfrac{\overline{C}_{30}}{1 + \cdots}}}, \quad (E5)$$

and $\overline{C}_{m0} \neq 0, \forall m \geq 1$ where K represents the continued fraction operator. $\overline{C}_{m0}$ are the numerator of the $m^{th}$ degree of the continued fraction. As the HELM is solved recursively order by order, there will be more and more $\overline{C}_{m0}$ available. For each busbar, the variables can be constructed where $s=1$. The first and the second rows are filled with the power series coefficients. The other entries can be derived by (E7).

$$\begin{bmatrix} 1 & 0 & 0 & 0 & 0 & \cdots \\ C[1]s & C[2]s^2 & C[3]s^3 & C[4]s^4 & C[5]s^5 & \cdots \\ \overline{C}_{2,0} & \overline{C}_{2,1} & \overline{C}_{2,2} & \overline{C}_{2,3} & \overline{C}_{2,4} & \cdots \\ \overline{C}_{3,0} & \overline{C}_{3,1} & \overline{C}_{3,2} & \overline{C}_{3,3} & \overline{C}_{3,4} & \cdots \\ \overline{C}_{4,0} & \overline{C}_{4,1} & \overline{C}_{4,2} & \overline{C}_{4,3} & \overline{C}_{4,4} & \cdots \\ \vdots & \vdots & \vdots & \vdots & \vdots & \ddots \end{bmatrix} \quad (E6)$$

$$\overline{C}_{m,j} = \frac{\overline{C}_{m-2,j+1}}{\overline{C}_{m-2,0}} - \frac{\overline{C}_{m-1,j+1}}{\overline{C}_{m-1,0}}, \forall\, m \geq 2 \text{ and } j \geq 0 \quad (E7)$$

The three terms recursive rational approximation for the power series is applied to obtain the maximum radius of the convergence of the power series, as shown in (A8).

$$\begin{bmatrix} A_m \\ B_m \end{bmatrix} := \begin{bmatrix} A_{m-1} \\ B_{m-1} \end{bmatrix} + \overline{C}_{m,0} \begin{bmatrix} A_{m-2} \\ B_{m-2} \end{bmatrix}, \text{ and } \overline{C}_{m0} \neq 0, \forall\, m \geq 1 \quad (E8)$$

where $A_{-1} := 1$, $B_{-1} := 0$, $A_0 := C_0$ and $B_0 := 1$. Finally, the voltage at each busbar is calculated as (E9).

$$V = \frac{A_n}{B_n} \quad (E9)$$

where n is the degree of continued fractions. The voltage will be converged and the power flow equations are satisfied, if the solution exists.

APPENDIX F

Physical Germ Solution of a 3-Bus System

A 3-bus system having 1 slack bus, 1 PV bus and 1 PQ bus, shown in FIG. 63, is adopted to illustrate the procedure of finding a physical germ solution. The first step is to calculate the starting no-load no-generation condition. Only the slack bus propagates its voltage to the whole passive network:

$$\begin{bmatrix} 1 & & & & & \\ & 1 & & & & \\ G_{21} & -B_{21} & G_{22} & -B_{22} & G_{23} & -B_{23} \\ B_{21} & G_{21} & B_{22} & G_{22} & B_{23} & G_{23} \\ G_{31} & -B_{31} & G_{32} & -B_{32} & G_{33} & -B_{33} \\ B_{31} & G_{31} & B_{32} & G_{32} & B_{33} & -B_{33} \end{bmatrix} \begin{bmatrix} V_{ST1re} \\ V_{ST1im} \\ V_{ST2re} \\ V_{ST2im} \\ V_{ST3re} \\ V_{ST3im} \end{bmatrix} = \begin{bmatrix} \text{Re}(V_1^{SL}) \\ \text{Im}(V_1^{SL}) \\ 0 \\ 0 \\ 0 \\ 0 \end{bmatrix} \quad (F1)$$

The second step is to find the physical germ solution by an embedding. The right hand side of the PQ bus (i.e. Bus 3) is 0, since no-load condition is held for the physical germ solution. Thus, the embedding of PV bus (i.e. Bus 2) is needed to adjust its voltage magnitude to the specified value $|V_{2pv}|$, while keep the active power generation as the specified value $P_2$.

Move all the $n^{th}$ order terms (i.e. the unknowns) to the left hand side and leave terms 0 to (n−1) (i.e. the knowns) on the right hand side of (A2). The matrix equation is extended by moving the unknown variables of PV bus (Bus 2), i.e. $W_{g2re}[n]$, $W_{g2im}[n]$ and $Q_{g2}[n]$ to the left hand side.

$$\begin{bmatrix} 1 & 0 & 0 & 0 & 0 & 0 & 0 & 0 & 0 \\ 0 & 1 & 0 & 0 & 0 & 0 & 0 & 0 & 0 \\ G_{21} & -B_{21} & G_{22} & -B_{22} & G_{23} & -B_{23} & 0 & 0 & W_{ST2im} \\ B_{21} & G_{21} & B_{22} & G_{22} & B_{23} & G_{23} & 0 & 0 & W_{ST2re} \\ G_{31} & -B_{31} & G_{32} & -B_{32} & G_{33} & -B_{33} & 0 & 0 & 0 \\ B_{31} & G_{31} & B_{32} & G_{32} & B_{33} & G_{33} & 0 & 0 & 0 \\ 0 & 0 & W_{ST2re} & -W_{ST2im} & 0 & 0 & V_{ST2re} & -V_{ST2im} & 0 \\ 0 & 0 & W_{ST2im} & W_{ST2re} & 0 & 0 & V_{ST2im} & V_{ST2re} & 0 \\ 0 & 0 & V_{ST2re} & V_{ST2im} & 0 & 0 & 0 & 0 & 0 \end{bmatrix} \begin{bmatrix} V_{g1re}[n] \\ V_{g1im}[n] \\ V_{g2re}[n] \\ V_{g2im}[n] \\ V_{g3re}[n] \\ V_{g3im}[n] \\ W_{g2re}[n] \\ W_{g2im}[n] \\ Q_{g2}[n] \end{bmatrix} = \begin{bmatrix} 0 \\ 0 \\ \text{Re}\left(P_2 W_{g2}[n-1] + \overset{n-1}{\underset{1}{\text{Conv}}}(Q_{g2} * W_{g2}^*)\right) \\ \text{Im}\left(P_2 W_{g2}[n-1] + \overset{n-1}{\underset{1}{\text{Conv}}}(Q_{g2} * W_{g2}^*)\right) \\ 0 \\ 0 \\ -\text{Re}\left(\overset{n-1}{\underset{1}{\text{Conv}}}(W_{g2} * V_{g2})\right) \\ -\text{Im}\left(\overset{n-1}{\underset{1}{\text{Conv}}}(W_{g2} * V_{g2})\right) \\ \varepsilon_2[n-1] \end{bmatrix} \quad (F2)$$

where $$\overset{n-1}{\underset{1}{\text{Conv}}}(Q_{g2} * W_{g2}^*) = \sum_{m=1}^{n-1} Q_{g2}[n-m] W_{g2}^*[m] \quad (F3)$$

$$\overset{n-1}{\underset{1}{\text{Conv}}}(W_{g2} * V_{g2}) = \sum_{m=1}^{n-1} W_{g2}[n-m] V_{g2}[m] \quad (F4)$$

APPENDIX G

Considering Zip Load for PQ Buses

Consider a PQ bus i with ZIP load given by (G5), where $p_Z$, $p_I$ and $p_P$ are the percentages of constant impedance, current and power components in active power load $P_i$, and $q_Z$, $q_I$ and $q_P$ are the percentages of constant impedance, current and power components of reactive power load $Q_i$. $P_{i0}$ and $Q_{i0}$ are the active and reactive powers at the voltage equal to 1.0 pu. The PFE for each ZIP load bus becomes (G6) and (G7).

$$\begin{cases} P_i = P_{i0}(p_Z|V_i|^2 + p_I|V_i| + p_P) \\ Q_i = Q_{i0}(q_Z|V_i|^2 + q_I|V_i| + q_P) \end{cases}, \forall i \in \mathcal{P} \quad (G5)$$

$$\sum_{k=1}^{N} Y_{ik} V_k(s) = \frac{s(P_{i0}(p_Z|V_i|^2 + p_I|V_i| + p_P) - jQ_{i0}(q_Z|V_i|^2 + q_I|V_i| + q_P))}{V_i^*(s^*)} \quad (G6)$$

$$\sum_{k=1}^{N} Y_{ik}(V_k[0] + V_k[1]s + V_k[2]s^2 + L) = \quad (G7)$$

$$s\left\{S_{Zi}^* V_i(s) + \frac{S_{Pi}^* + S_{Ii}^*|V_i|(s)}{V_i^*(s^*)}\right\} =$$

$$sS_{Zi}^*(V_i[0] + V_i[1]s + L) + sS_{Pi}^*(W_{ig}^* + W_i^*[1]s + L) +$$

$$sS_{Ii}^*(M_i[0] + M_i[1]s + L)(W_{ig}^* + W_i^*[1]s + L)$$

where $S_{Zi}$, $S_{Ii}$, $S_{Pi}$ are the complex power of the load for constant impedance, current and power components respectively at bus i and $M_i(s)$ is the series of voltage magnitude at bus i, i.e. $M_i(s)=|V_i(s)|$, satisfying (G9)

$$\begin{cases} S_{Zi} = P_{i0}p_Z + jQ_{i0}q_Z \\ S_{Ii} = P_{i0}p_I + jQ_{i0}q_I \\ S_{Pi} = P_{i0}p_P + jQ_{i0}q_P \end{cases} \quad (G8)$$

$$M_i(s) \cdot M_i(s) = V_i(s) \cdot V_i^*(s^*) \quad (G9)$$

Finally, if the ZIP load model is considered, the final recursive matrix equation of the demonstrative 3-bus system in Appendix A becomes (G10) and (G11).

$$\begin{bmatrix} 1 & 0 & 0 & 0 & 0 & 0 & 0 & 0 & 0 \\ 0 & 1 & 0 & 0 & 0 & 0 & 0 & 0 & 0 \\ G_{21} & -B_{21} & G_{22} & -B_{22} & G_{23} & -B_{23} & -P_{g2} & Q_{g2} & W_{g2im} \\ B_{21} & G_{21} & B_{22} & G_{22} & B_{23} & G_{23} & Q_{g2} & P_{g2} & W_{g2re} \\ G_{31} & -B_{31} & G_{32} & -B_{32} & G_{33} & -B_{33} & 0 & 0 & 0 \\ B_{31} & G_{31} & B_{32} & G_{32} & B_{33} & -G_{33} & 0 & 0 & 0 \\ 0 & 0 & W_{g2re} & -W_{g2im} & 0 & 0 & V_{g2re} & -V_{g2im} & 0 \\ 0 & 0 & W_{g2im} & W_{g2re} & 0 & 0 & V_{g2im} & V_{g2re} & 0 \\ 0 & 0 & V_{g2re} & V_{g2im} & 0 & 0 & 0 & 0 & 0 \end{bmatrix} \begin{bmatrix} V_{1re}[n] \\ V_{1im}[n] \\ V_{2re}[n] \\ V_{2im}[n] \\ V_{3re}[n] \\ V_{3im}[n] \\ W_{2re}[n] \\ W_{2im}[n] \\ Q_2[n] \end{bmatrix} = \begin{bmatrix} 0 \\ 0 \\ \text{Re}\left(\underset{1}{\overset{n-1}{\text{Conv}}}(Q_2 * W_2^*)\right) \\ \text{Im}\left(\underset{1}{\overset{n-1}{\text{Conv}}}(Q_2 * W_2^*)\right) \\ \text{Re}\left(S_{3P}^* W_3^*[n-1] + S_{3Z}^* V_3[n-1] + S_{3I}^* \underset{0}{\overset{n-1}{\text{Conv}}}(M_3 * W_3^*)\right) \\ \text{Im}\left(S_{3P}^* W_3^*[n-1] + S_{3Z}^* V_3[n-1] + S_{3I}^* \underset{0}{\overset{n-1}{\text{Conv}}}(M_3 * W_3^*)\right) \\ -\text{Re}\left(\underset{1}{\overset{n-1}{\text{Conv}}}(W_2 * V_2)\right) \\ -\text{Im}\left(\underset{1}{\overset{n-1}{\text{Conv}}}(W_2 * V_2)\right) \\ \delta_{n1} \cdot \frac{1}{2}(|V_2^{sp}|^2 - |V_{g2}|^2) - \frac{1}{2}\left(\sum_{m=1}^{n-1} V_2[m]V_2^*[n-m]\right) \end{bmatrix} \quad (G10)$$

where $$\text{Conv}_0^{n-1}(M_3 * W_3^*) = \sum_{m=0}^{n-1} M_3[n-m]W_3^*[m] \quad \text{(G11)}$$

APPENDIX H

Data of the 4-Bus System

Data of the 4-bus system in Section V are given in Tables IV-VI respectively for transmission lines, buses (Cases A-C), and the generator.

TABLE IV

TRANSMISSION LINE DATA FOR 4-BUS SYSTEM

| From Bus-To Bus | Resistance R (pu) | Reactance X (pu) | Shunt admittance Y (pu) |
|---|---|---|---|
| 1-2 | 0.01008 | 0.0504 | 0.1025 |
| 1-3 | 0.00744 | 0.0372 | 0.0775 |
| 2-4 | 0.00744 | 0.0372 | 0.0775 |
| 3-4 | 0.01272 | 0.0636 | 0.1275 |

TABLE V

BUS DATA FOR 4-BUS SYSTEM FOR CASES A-C

| Bus No. | Bus Type | $V_{sp}$ (pu) | Generation $P_G$ (MW) | Generation $Q_G$ (MVar) | Load $P_L$ (MW) | Load $Q_L$ (MVar) |
|---|---|---|---|---|---|---|
| 1 | SL | 1.02 | — | — | 50 | 30.99 |
| 2 | PQ | — | 0 | 0 | 170 | 105.35 |
| 3 | PQ | — | 0 | 0 | 200 | 123.94 |
| 4 | PQ | —/0.98 | 0/238 | 0/[−100, 200] | 80 | 49.58 |

TABLE VII

GENERATOR DATA FOR CASE C

| H | Inertia time constant (s) | 4.2 |
|---|---|---|
| $x_l$ | Leakage reactance (p.u.) | 0.125 |
| $X_d, X_q$ | Synchronous reactances (p.u.) | 1, 0.69 |
| $X_d', X_q'$ | Transient reactances (p.u.) | 0.31, 0.5 |
| $X_d'', X_q''$ | Sub-transient reactances (p.u.) | 0.25, 0.25 |
| $T_{d0}', T_{q0}'$ | Transient time constants (s) | 10.2, 0.41 |
| $T_{d0}'', T_{q0}''$ | Sub-transient time constants (s) | 0.05, 0.035 |

What is claimed is:

1. A multi-dimensional holomorphic embedding method for voltage control of an AC power system:

by one or more processors,
embedding multiple independent symbolic variables representing multiple control elements of the AC power system into AC power flow equations that describe the AC power system,
analytically solving voltages for targeted buses of the AC power system in a form of multivariate power series about the multiple independent symbolic variables or multivariable Padé approximants about the multiple independent symbolic variables such that coefficients of the multivariate power series or multivariable Padé approximants are obtained non-iteratively, and
jointly adjusting the multiple control elements according to the multivariate power series or multivariable Padé approximants to control voltages of the targeted buses.

2. The multi-dimensional holomorphic embedding method of claim 1 further comprising performing probabilistic power flow analysis on status of the AC power system based on the multivariate power series.

3. The multi-dimensional holomorphic embedding method of claim 2, wherein the multiple independent symbolic variables are input random variables describing power injections to the AC power system, further comprising deriving cumulants of the voltages or line power of the AC power system by a generalized cumulant method.

4. The multi-dimensional holomorphic embedding method of claim 3 further comprising obtaining distributions of the voltages or line power of the AC power system based on the cumulants by Gram-Charlier method, Edgeworth method, or Cornish-Fisher method.

5. The multi-dimensional holomorphic embedding method of claim 1, wherein the multiple control elements include generators, shunt capacitors, shunt reactors, static synchronous compensators, or static VAR compensators.

6. The multi-dimensional holomorphic embedding method of claim 1, wherein the analytically solving includes identifying a physical germ solution describing initial physical conditions of the AC power system.

7. The multi-dimensional holomorphic embedding method of claim 1, wherein the analytically solving includes expressing variables of the AC power flow equations in the form of the multivariate power series.

8. The multi-dimensional holomorphic embedding method of claim 1, wherein the analytically solving includes recursively obtaining the coefficients of the multivariate power series.

9. The multi-dimensional holomorphic embedding method of claim 1, wherein the analytically solving includes transforming the multivariate power series into multivariable Padé approximants to increase a radius of convergence of analytical solutions of all variables in the AC power flow equations.

10. A method for voltage stability assessment and control for AC power system load areas to prevent voltage collapse, the method comprising:

by one or more processors,
embedding multiple independent symbolic variables representing a next-period load increase for all load buses of the AC power system load areas into AC power flow equations, analytically expressing power-voltage curves for the load buses in a form of multivariate power series about the multiple independent symbolic variables or Padé approximants about the multiple independent symbolic variables to identify a voltage stability margin for each of the load buses, and controlling load consumption of the load buses according to minima of the voltage stability margins to prevent voltage collapse on the load buses.

11. The method of claim 10, wherein the Padé approximants are adaptive two-stage Padé approximants.

12. A method for distributing reactive power among a plurality of reactive power resources of an AC power system to remotely control voltages of the AC power system, the method comprising:

by one or more processors, modifying bus-types of buses of AC power flow equations describing remote voltage control functionality of the AC power system such that each of the bus-types corresponds to an embedding method of the AC power flow equations, embedding participation factors, that define how the reactive power is to be distributed among the plurality of reactive power resources, into the AC power flow equations, solving the AC power flow equations in a form of multivariate power series about multiple independent symbolic variables or Padé approximants about multiple independent symbolic variables such that coefficients of the power series or Padé approximants are obtained non-iteratively, wherein references of the plurality of reactive power resources are calculated from the coefficients, and controlling outputs of the plurality of reactive power resources in an operational environment according to the references to maintain bus voltage magnitudes of selected ones of the buses.

13. The method of claim 12, wherein the plurality of reactive power resources includes condensers, generators, static synchronous compensators, static VAR compensators, or voltage source converters-high voltage direct current.

* * * * *